(12) United States Patent
Na et al.

(10) Patent No.: US 11,637,142 B2
(45) Date of Patent: *Apr. 25, 2023

(54) HIGH-SPEED LIGHT SENSING APPARATUS III

(71) Applicant: Artilux, Inc., Menlo Park, CA (US)

(72) Inventors: Yun-Chung Na, Zhubei (TW); Che-Fu Liang, Zhubei (TW); Shu-Lu Chen, Zhubei (TW); Szu-Lin Cheng, Zhubei (TW); Han-Din Liu, Zhubei (TW); Chien-Lung Chen, Taoyuan (TW); Yuan-Fu Lyu, Taoyuan (TW); Chieh-Ting Lin, Zhubei (TW); Bo-Jiun Chen, Zhubei (TW); Hui-Wen Chen, Zhubei (TW); Shu-Wei Chu, Zhubei (TW); Chung-Chih Lin, Zhubei (TW); Kuan-Chen Chu, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 902 days.

This patent is subject to a terminal disclaimer.

(21) Appl. No.: 16/521,974

(22) Filed: Jul. 25, 2019

(65) Prior Publication Data

US 2019/0348463 A1    Nov. 14, 2019

Related U.S. Application Data

(63) Continuation of application No. 15/944,658, filed on Apr. 3, 2018, now Pat. No. 10,418,407, which is a (Continued)

(51) Int. Cl.
*H01L 27/146* (2006.01)
*G01S 7/486* (2020.01)
(Continued)

(52) U.S. Cl.
CPC ...... *H01L 27/14643* (2013.01); *G01S 7/4816* (2013.01); *G01S 7/4863* (2013.01);
(Continued)

(58) Field of Classification Search
CPC ......... H01L 27/14643; H01L 27/14629; H01L 29/161; H01L 31/1037; H01L 27/14609;
(Continued)

(56) References Cited

U.S. PATENT DOCUMENTS 3,621,466 A    11/1971    Toshio
4,341,918 A    7/1982    Evans, Jr. et al.
(Continued)

FOREIGN PATENT DOCUMENTS

CN    1853276    10/2006
CN    1866531    11/2006
(Continued)

OTHER PUBLICATIONS

PCT International Preliminary Report on Patentability in International Appln. No. PCT/US2018/020262, dated Sep. 3, 2019, 11 pages.
(Continued)

*Primary Examiner* — Daniel L Murphy
(74) *Attorney, Agent, or Firm* — Fish & Richardson P.C.

(57) ABSTRACT

A circuit, including: a photodetector including a first readout terminal and a second readout terminal different than the first readout terminal; a first readout circuit coupled with the first readout terminal and configured to output a first readout voltage; a second readout circuit coupled with the second readout terminal and configured to output a second readout voltage; and a common-mode analog-to-digital converter (ADC) including: a first input terminal coupled with a first voltage source; a second input terminal coupled with a common-mode generator, the common-mode generator con-
(Continued)

figured to receive the first readout voltage and the second readout voltage, and to generate a common-mode voltage between the first and second readout voltages; and a first output terminal configured to output a first output signal corresponding to a magnitude of a current generated by the photodetector.

19 Claims, 83 Drawing Sheets

Related U.S. Application Data continuation-in-part of application No. 15/908,447, filed on Feb. 28, 2018, now Pat. No. 10,886,309, which is a continuation-in-part of application No. 15/338,660, filed on Oct. 31, 2016, now Pat. No. 10,254,389.

(60) Provisional application No. 62/465,139, filed on Feb. 28, 2017, provisional application No. 62/479,322, filed on Mar. 31, 2017, provisional application No. 62/504,531, filed on May 10, 2017, provisional application No. 62/485,003, filed on Apr. 13, 2017, provisional application No. 62/511,977, filed on May 27, 2017, provisional application No. 62/534,179, filed on Jul. 18, 2017, provisional application No. 62/561,266, filed on Sep. 21, 2017, provisional application No. 62/613,054, filed on Jan. 3, 2018, provisional application No. 62/617,317, filed on Jan. 15, 2018, provisional application No. 62/271,386, filed on Dec. 28, 2015, provisional application No. 62/251,691, filed on Nov. 6, 2015, provisional application No. 62/294,436, filed on Feb. 12, 2016, provisional application No. 62/481,131, filed on Apr. 4, 2017, provisional application No. 62/511,977, filed on May 27, 2017, provisional application No. 62/542,329, filed on Aug. 8, 2017, provisional application No. 62/561,256, filed on Sep. 21, 2017, provisional application No. 62/581,720, filed on Nov. 5, 2017, provisional application No. 62/581,777, filed on Nov. 5, 2017, provisional application No. 62/596,914, filed on Dec. 11, 2017.

(51) Int. Cl.
  *H01L 31/103* (2006.01)
  *G01S 7/481* (2006.01)
  *G01S 7/491* (2020.01)
  *G01S 7/4863* (2020.01)
  *H01L 29/161* (2006.01)
  *G01S 7/4914* (2020.01)
  *G01S 17/36* (2006.01)

(52) U.S. Cl.
  CPC ............ *G01S 7/4914* (2013.01); *G01S 17/36* (2013.01); *H01L 27/14609* (2013.01); *H01L 27/14612* (2013.01); *H01L 27/14629* (2013.01); *H01L 27/14634* (2013.01); *H01L 27/14681* (2013.01); *H01L 29/161* (2013.01); *H01L 31/1037* (2013.01); *H01L 27/1463* (2013.01); *H01L 27/14627* (2013.01); *H01L 27/14636* (2013.01)

(58) Field of Classification Search
  CPC ......... H01L 27/14634; H01L 27/14612; H01L 27/14681; H01L 27/14627; H01L 27/1463; H01L 27/14636; G01S 7/4863; G01S 7/4816; G01S 7/4914; G01S 17/36; G01S 17/89
  USPC ......................................................... 257/16
  See application file for complete search history.

(56) References Cited

U.S. PATENT DOCUMENTS

| | | |
|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,789,964 A | 12/1988 | Krilic |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,509,203 B2 | 1/2003 | Spartiotis et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,495,202 B2 | 2/2009 | Sctaey et al. |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,888,763 B2 | 2/2011 | Qian et al. |
| 7,961,301 B2 | 7/2011 | Earhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,378,398 B2 | 2/2013 | Doan et al. |
| 8,405,823 B2 | 3/2013 | Pfaff |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,419,044 B2 | 8/2016 | Yang et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,254,389 B2 | 4/2019 | Na et al. |
| 10,269,855 B2 | 4/2019 | Sallin et al. |
| 10,310,060 B2 | 6/2019 | Na et al. |
| 10,353,056 B2 | 7/2019 | Na et al. |
| 10,418,407 B2 | 9/2019 | Na et al. |
| 10,613,202 B2 | 4/2020 | Roy et al. |
| 10,690,495 B2 | 6/2020 | Takagi et al. |
| 10,707,260 B2 | 7/2020 | Na et al. |
| 10,739,443 B2 | 8/2020 | Na et al. |
| 10,741,598 B2 | 8/2020 | Na et al. |
| 10,777,692 B2 | 9/2020 | Cheng et al. |
| 10,795,003 B2 | 10/2020 | Na et al. |
| 10,861,888 B2 | 12/2020 | Na et al. |
| 10,886,309 B2 | 1/2021 | Na et al. |
| 10,886,311 B2 | 1/2021 | Na et al. |
| 10,886,312 B2 | 1/2021 | Na et al. |
| 10,964,742 B2 | 3/2021 | Na et al. |
| 11,105,928 B2 | 8/2021 | Cheng et al. |
| 11,131,757 B2 | 9/2021 | Na et al. |
| 11,448,830 B2 | 9/2022 | Na et al. |
| 2003/0042500 A1 | 3/2003 | Rhodes et al. |
| 2003/0127672 A1 | 7/2003 | Rata et al. |
| 2003/0189159 A1 | 10/2003 | Lnoue |
| 2004/0121507 A1 | 6/2004 | Bude et al. |
| 2005/0051730 A1 | 3/2005 | Kuijk et al. |
| 2005/0077588 A1 | 4/2005 | Kasuga |

(56) References Cited

U.S. PATENT DOCUMENTS

| | | |
|---|---|---|
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0221452 A1 | 10/2006 | Chen |
| 2006/0289957 A1 | 12/2006 | Morse et al. |
| 2007/0114626 A1 | 5/2007 | Kang et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2007/0290763 A1 | 12/2007 | Partridge et al. |
| 2008/0017883 A1 | 1/2008 | Sarid et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0173976 A1 | 7/2009 | Augusto |
| 2009/0200589 A1 | 8/2009 | Qian et al. |
| 2009/0237770 A1 | 9/2009 | Kim et al. |
| 2010/0078680 A1 | 4/2010 | Cheng et al. |
| 2010/0102409 A1 | 4/2010 | Hansson |
| 2010/0184246 A1 | 7/2010 | Sakai |
| 2010/0194956 A1 | 8/2010 | Yuan et al. |
| 2010/0291730 A1 | 11/2010 | Uya et al. |
| 2011/0018625 A1 | 1/2011 | Hodel et al. |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0001234 A1 | 1/2012 | Lim et al. |
| 2012/0044398 A1 | 2/2012 | Chou et al. |
| 2012/0080726 A1 | 4/2012 | Sakano |
| 2012/0133922 A1 | 5/2012 | Pfaff |
| 2012/0181589 A1 | 7/2012 | Zhu et al. |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2012/0326259 A1 | 12/2012 | Huang et al. |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0214161 A1 | 8/2013 | Cazuax et al. |
| 2013/0248865 A1 | 9/2013 | Toriyama et al. |
| 2013/0278631 A1 | 10/2013 | Border et al. |
| 2013/0280879 A1 | 10/2013 | Steelier et al. |
| 2013/0283213 A1 | 10/2013 | Guendelman et al. |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0225173 A1 | 8/2014 | Kim et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0291793 A1 | 10/2014 | Tanaka |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitus |
| 2015/0060951 A1 | 3/2015 | Hynecek |
| 2015/0092983 A1 | 4/2015 | Nguyen et al. |
| 2015/0171146 A1 | 6/2015 | Ooki et al. |
| 2015/0187923 A1 | 7/2015 | Kawahito |
| 2015/0193938 A1 | 7/2015 | Freedman et al. |
| 2015/0331508 A1 | 9/2015 | Nho et al. |
| 2015/0281618 A1 | 10/2015 | Saito |
| 2015/0286340 A1 | 10/2015 | Send et al. |
| 2016/0014352 A1 | 1/2016 | Moriyama et al. |
| 2016/0027837 A1 | 1/2016 | Webster et al. |
| 2016/0049476 A1 | 2/2016 | Rachmady et al. |
| 2016/0056315 A1 | 2/2016 | Shibata et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0211402 A1 | 7/2016 | Joo et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0025454 A1 | 1/2017 | Cheng et al. |
| 2017/0040361 A1 | 2/2017 | Ikeda et al. |
| 2017/0040362 A1 | 2/2017 | Na et al. |
| 2017/0041589 A1 | 2/2017 | Patil et al. |
| 2017/0062508 A1 | 3/2017 | Na et al. |
| 2017/0068319 A1 | 3/2017 | Viswanathan |
| 2017/0074643 A1 | 3/2017 | Chang et al. |
| 2017/0075421 A1 | 3/2017 | Na et al. |
| 2017/0084648 A1 | 3/2017 | Liu et al. |
| 2017/0123233 A1 | 5/2017 | Sabovic |
| 2017/0131389 A1 | 5/2017 | Na et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2017/0317116 A1 | 11/2017 | Celo et al. |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru |
| 2018/0175084 A1 | 6/2018 | Na et al. |
| 2018/0175095 A1 | 6/2018 | Sallin |
| 2018/0180546 A1 | 6/2018 | Rothberg et al. |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0261645 A1 | 9/2018 | Na et al. |
| 2018/0269239 A1 | 9/2018 | Na et al. |
| 2018/0308882 A1 | 10/2018 | Cheng et al. |
| 2019/0001984 A1 | 1/2019 | Na et al. |
| 2019/0033432 A1 | 1/2019 | Na et al. |

(56) References Cited

U.S. PATENT DOCUMENTS

| | | |
|---|---|---|
| 2019/0049564 A1 | 2/2019 | Na et al. |
| 2019/0103435 A1 | 4/2019 | Na et al. |
| 2019/0081095 A1 | 5/2019 | Hanzawa et al. |
| 2019/0267498 A1 | 8/2019 | Cheng et al. |
| 2019/0267507 A1 | 8/2019 | Takeuchi et al. |
| 2019/0302243 A1 | 10/2019 | Na et al. |
| 2019/0312158 A1 | 10/2019 | Na et al. |
| 2019/0319139 A1 | 10/2019 | Cho et al. |
| 2019/0378872 A1 | 12/2019 | Chen |
| 2020/0018833 A1 | 1/2020 | Ding et al. |
| 2020/0028000 A1 | 1/2020 | Wang et al. |
| 2020/0052016 A1 | 2/2020 | Na et al. |
| 2020/0161364 A1 | 5/2020 | Na et al. |
| 2020/0192032 A1 | 6/2020 | Na et al. |
| 2020/0194480 A1 | 6/2020 | Na et al. |
| 2020/0249327 A1 | 8/2020 | Na et al. |
| 2020/0319345 A1 | 10/2020 | Cheng et al. |
| 2020/0395393 A1 | 12/2020 | Na et al. |
| 2020/0400797 A1 | 12/2020 | Liang |
| 2021/0058042 A1 | 2/2021 | Na et al. |
| 2021/0126027 A1 | 4/2021 | Na et al. |
| 2021/0225922 A1 | 7/2021 | Na et al. |
| 2021/0302549 A1 | 9/2021 | Na et al. |
| 2021/0391370 A1 | 12/2021 | Lu et al. |
| 2022/0262835 A1 | 8/2022 | Chen et al. |
| 2022/0262974 A1 | 8/2022 | Lu et al. |

FOREIGN PATENT DOCUMENTS

| | | |
|---|---|---|
| CN | 101310387 | 11/2008 |
| CN | 101800837 | 8/2010 |
| CN | 108470742 | 8/2010 |
| CN | 101902583 | 12/2010 |
| CN | 103929600 | 7/2014 |
| CN | 102446940 | 10/2014 |
| CN | 104617119 | 5/2015 |
| CN | 105322001 | 2/2016 |
| CN | 105762220 | 7/2016 |
| CN | 104535179 | 9/2016 |
| CN | 106449684 | 2/2017 |
| CN | 107403814 | 11/2017 |
| CN | 109270547 | 1/2019 |
| EP | 0278408 | 8/1988 |
| EP | 2081004 | 7/2009 |
| EP | 2224319 | 9/2010 |
| EP | 2330637 | 6/2011 |
| JP | H0548139 | 2/1993 |
| JP | H05211321 | 8/1993 |
| JP | H06334168 | 12/1994 |
| JP | 2000-133791 | 5/2000 |
| JP | 2002-368205 | 12/2002 |
| JP | 2003-051988 | 2/2003 |
| JP | 2003-225207 | 8/2003 |
| JP | 2004-103 964 | 4/2004 |
| JP | 2004-309701 | 11/2004 |
| JP | 2005-123674 | 5/2005 |
| JP | 2007-150261 | 6/2007 |
| JP | 2009-025225 | 2/2009 |
| JP | 2009-047658 | 3/2009 |
| JP | 2011-66097 | 3/2011 |
| JP | 2011-128024 | 6/2011 |
| JP | 2011-211019 | 10/2011 |
| JP | 2012-146920 | 8/2012 |
| JP | 2012-217059 | 11/2012 |
| JP | 2014-107562 | 6/2014 |
| JP | 2015-194838 | 11/2015 |
| JP | 2016-533648 | 10/2016 |
| JP | 2017-220581 | 12/2017 |
| JP | 2019-510365 | 4/2019 |
| KR | 10-2006-0077183 | 7/2006 |
| TW | 201508938 | 3/2015 |
| TW | 201541624 | 11/2015 |
| TW | 201640663 | 11/2016 |
| WO | WO 2005/036647 | 4/2005 |
| WO | WO 2013/104718 | 7/2013 |
| WO | WO 2014/085789 | 6/2014 |
| WO | WO 2014/192989 | 12/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |
| WO | WO 2018021126 | 2/2018 |
| WO | WO 2018/191539 | 10/2018 |
| WO | WO 2019/165229 | 8/2019 |
| WO | WO 2019165220 | 8/2019 |
| WO | WO 2019199691 | 10/2019 |

OTHER PUBLICATIONS

Wang et al., "35GB/s Ultralow-Voltage Three-Terminal Si—Ge Avalanche Photodiode," 2019 Optical Fiber Communications Conference and Exhibitition, Mar. 3, 2019, 3 pages.
Kang et al., "Monolithic Ge/Si Avalanche Photodiodes," IEEE Xplore, 2009, 3 pages.
Ramirez et al., "Recent progress on the quantum-dot avalanche photodiode," 22nd Annual Meeting of the IEEE Lasers and Electro-optics Society, Oct. 4, 2009, 2 pages.
EP Extended European Search Report in European Application No. 18781691.3, dated Jan. 27, 2020, 5 pages.
PCT International Preliminary Report on Patentability in International Appln. No PCT/US2018/025949, dated Oct. 8, 2019, 7 pages.
EP Extended European Search Report in European Application No. 21182787.8, dated Aug. 19, 2021, 5 pages.
EP Search Report in European Application No. EP18189000, dated Jan. 9, 2019, 17 pages.
Extended European Search Report in European Application No. 16828622, dated Sep. 7, 2018, 6 pages.
Extended European Search Report in European Application No. 16833863, dated Jul. 18, 2018, 6 pages.
Extended European Search Report in European Application No. 168630325, dated Aug. 23, 2018, 5 pages.
Extended European Search Report in European Application No. 181602004, dated Jul. 18, 2018, 6 pages.
Extended European Search Report in European Application No. 181602053, dated Jul. 18, 2018, 6 pages.
Extended European Search Report in European Application No. 181760315, dated Aug. 27, 2018, 6 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
International Preliminary Report on Patentability in International Application No. PCT/US2016/048915, dated Feb. 27, 2018, 8 pages.
International Preliminary Report on Patentability in International Application No. PCT/US2016/060493, dated May 8, 2018, 11 pages.
International Preliminary Report on Patentability in International Application No. PCT/US2016/066073, dated Jul. 12, 2018, 7 pages.
International Search Report and Written Opinion in International Application No. PCT/US2016/043609, dated Nov. 1, 2016, 21 pages.
International Search Report and Written Opinion in International Application No. PCT/US2016/045526, dated Nov. 22, 2016, 15 pages.
International Search Report and Written Opinion in International Application No. PCT/US2016/048915, dated Nov. 22, 2016, 17 pages.

(56) References Cited

OTHER PUBLICATIONS

International Search Report and Written Opinion in International Application No. PCT/US2016/060493, dated Jan. 10, 2017, 20 pages.
International Search Report and Written Opinion in International Application No. PCT/US2016/066073, dated May 6, 2018, 16 pages.
International Search Report and Written Opinion in International Application No. PCT/US2018/020262, dated Jun. 6, 2018, 14 pages.
International Search Report and Written Opinion in International Application No. PCT/US2018/025949, dated Jul. 10, 2018, 14 pages.
International Search Report and Written Opinion in International Application No. PCT/US2018/027369, dated Jul. 31, 2018, 14 pages.
Alsam et al.: "What the Eye Did Not See—A Fusion Approach to Image Coding", Advances in Visual Computing, dated Jan. 1, 2012, pp. 199-208 (with partial english translation).
Bamji et al., "A 0.13 μm CMOS System-on-Chip for a 512 × 424 Time-of-Flight Image Sensor With Multi-Frequency Photo-Demodulation up to 130 MHz and 2 GS/s ADC," IEEE J. Solid-State Circuits, Jan. 2015, 50(1):303-319.
Bianco et al., "A Comparative Analysis between Active and Passive Techniques for Underwater 3D Reconstruction of Close-Range Objects," Sensors, Aug. 20, 2013, 13(8):11007-11031.
Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.
Dalla Betta et al., "Design and Characterization of Current-Assisted Photonic Demodulators in 0.18-μm CMOS Technology," IEEE Trans. Electron. Dev., Jun. 2011, 58(6):1702-1709.
Fang et al., "An Integration PIN/MISS OEIC for High Current Photoreceiver Applications," IEEE Transactions on Electron Devices, Jan. 1997, 44(1):34-38.
Feng et al., "Vertical p-i-n germanium photodetector with high external responsivity integrated with large core Si waveguides," Optics Express, Jan. 4, 2010, 18(1):96-101.
Foix et al., "Lock-in Time-of-Flight (ToF) Cameras: A Survey," IEEE Sensors J., Sep. 2011, 11(9):1917-1926.
Fossum et al., "A Review of the Pinned Photodiode for CCD and CMOS Image Sensors," IEEE J. Electron Devices Soc. May 1, 2014, 2(3):33-43.
Hutchinson et al., "High-Resolution Aliasing-Free Optical Beam Steering," Optica, vol. 3, No. 8, dated Aug. 5, 2016, 4 pages.
Geng, "Structured-light 3D surface imaging: a tutorial," Advances in Optics and Photonics, Jun. 30, 2011, 3(2):128-160.
Gulden et al., "Novel optical distance sensor based on MSM technology." IEEE Sensors Journal. Oct. 2004, 4(5):612-8.
Joo et al., "High-sensitivity 10 Gbps Ge-on-Si photoreceiver operating λ~1.55 μm," Optics Express, Aug. 2, 2010, 18(16):16474-16479.
Kato et al., "320 × 240 Back-Illuminated 10-μm CAPD Pixels for High-Speed Modulation Time-of-Flight CMOS Image Sensor," IEEE J. Solid-State Circuits Apr. 2018, 53(4): 1071-1078.
Kawahito et al., "A CMOS Time-of-Flight Range Image Sensor With Gates-on-Field-Oxide Structure," IEEE Sensors J. Dec. 2007, 7(12): 1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Place et al., "Rad tolerant CMOS image sensor based on hole collection 4T pixel pinned photodiode." IEEE Transactions on Nuclear Science. Dec. 6, 2012, 59(6):2888-93.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 GB/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.
Zanuttigh et al.: "ToF Depth Camera Components", Time-of-Flight and Structured Light Depth Cameras: Technology and Applications, dated May 24, 2016, pp. 31-33.
Extended European Search Report in European Application No. 16840192.5, dated Mar. 19, 2019, 7 pages.
Extended European Search Report in European Application No. 18189000.5. dated Apr. 2, 2019, 14 pages.
PCT International Search Report and Written Opinion in International Appln. PCT/US19/19167, dated May 14, 2019, 15 pages.
Bandaru et al., "Fabrication and characterization of low temperature (<450 °C.) grown p-Ge/n-Si photodetectors for silicon based photonics," Materials Science and Engineering B, 2004, 113:79-84.
Li et al., "High-responsivity vertical illumination Si/Ge uni-traveling carrier photodiodes based on silicon-on-insulator substrate," Science Reports, Jun. 9, 2016, 6(27743):1-9.
Piels et al., "40 GHz Si/Ge Uni-Traveling Carrier Waveguide Photodiode," Journal of Lightwave Technology, Oct. 15, 2014, 32(20):3502-2508.
Office Action in Japanese Appln. No. 2021-167356, dated Nov. 21, 2022, 10 pages (with English Translation).

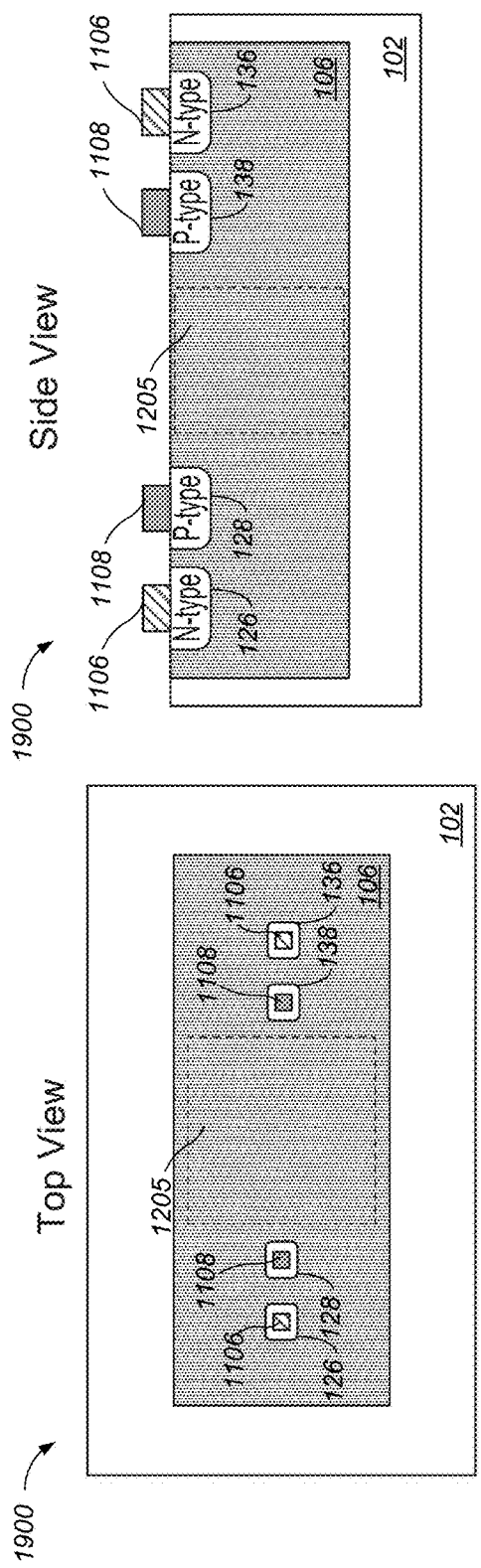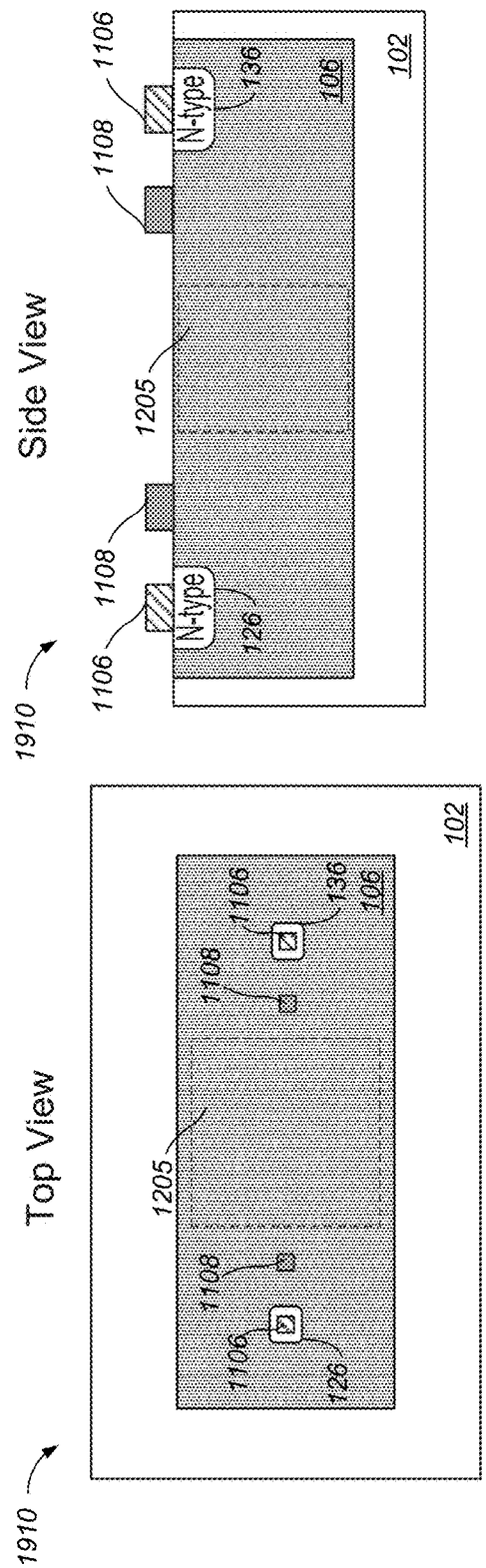
FIG. 19B
FIG. 19D
FIG. 19A
FIG. 19C

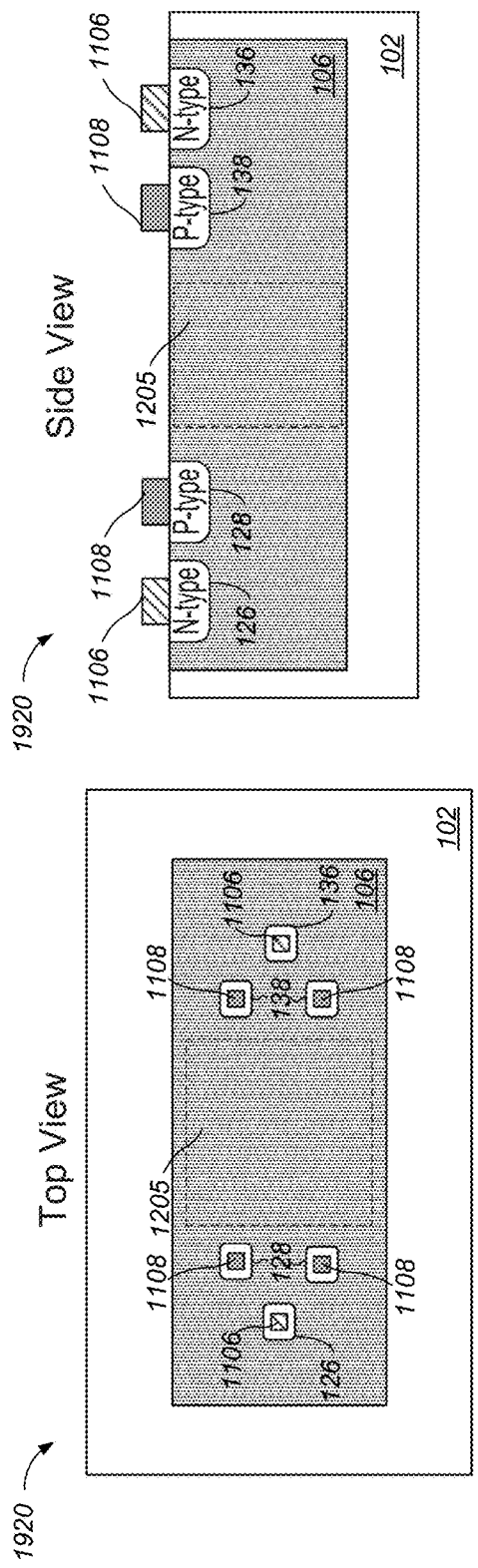
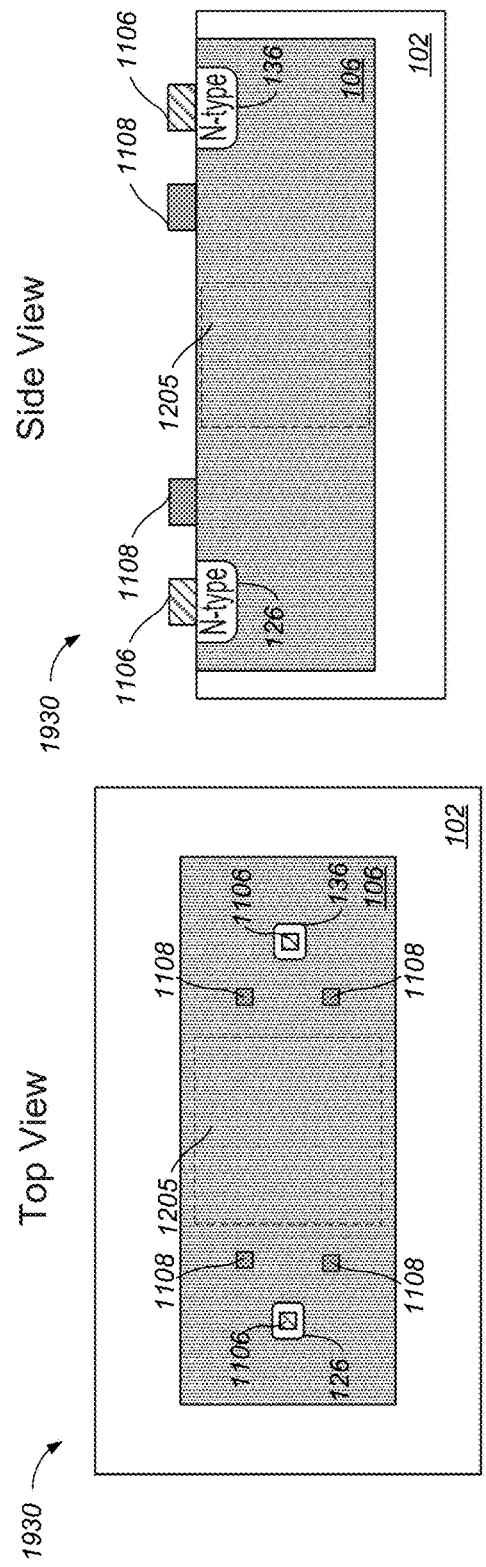
FIG. 19E
FIG. 19F
FIG. 19G
FIG. 19H

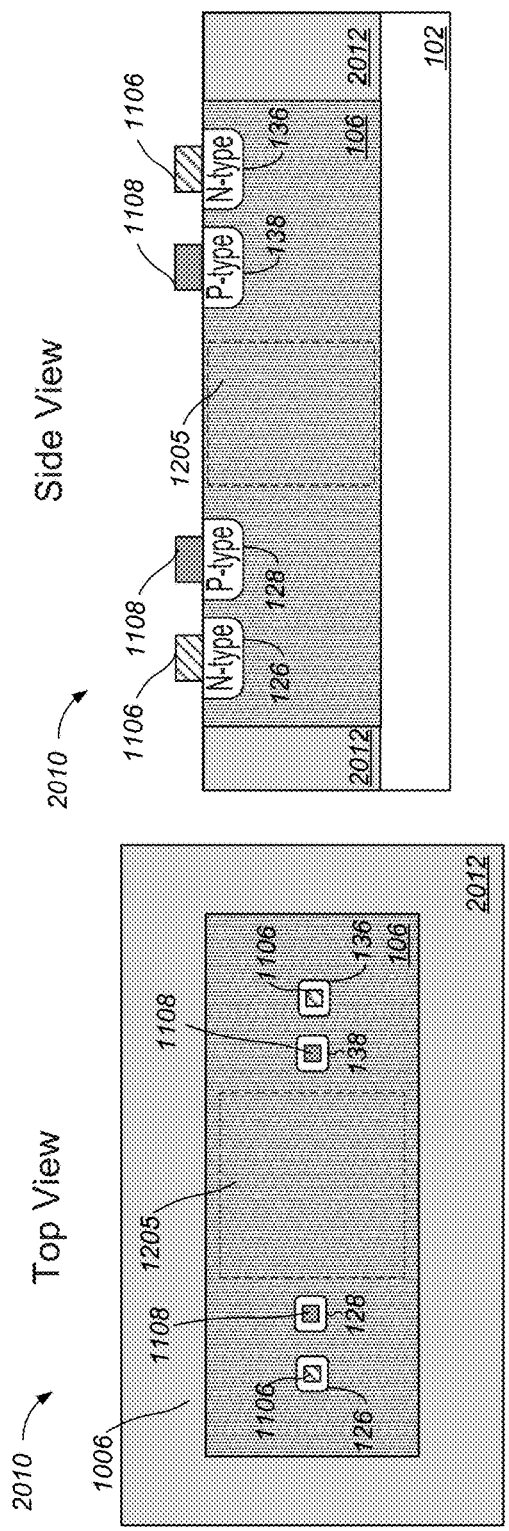
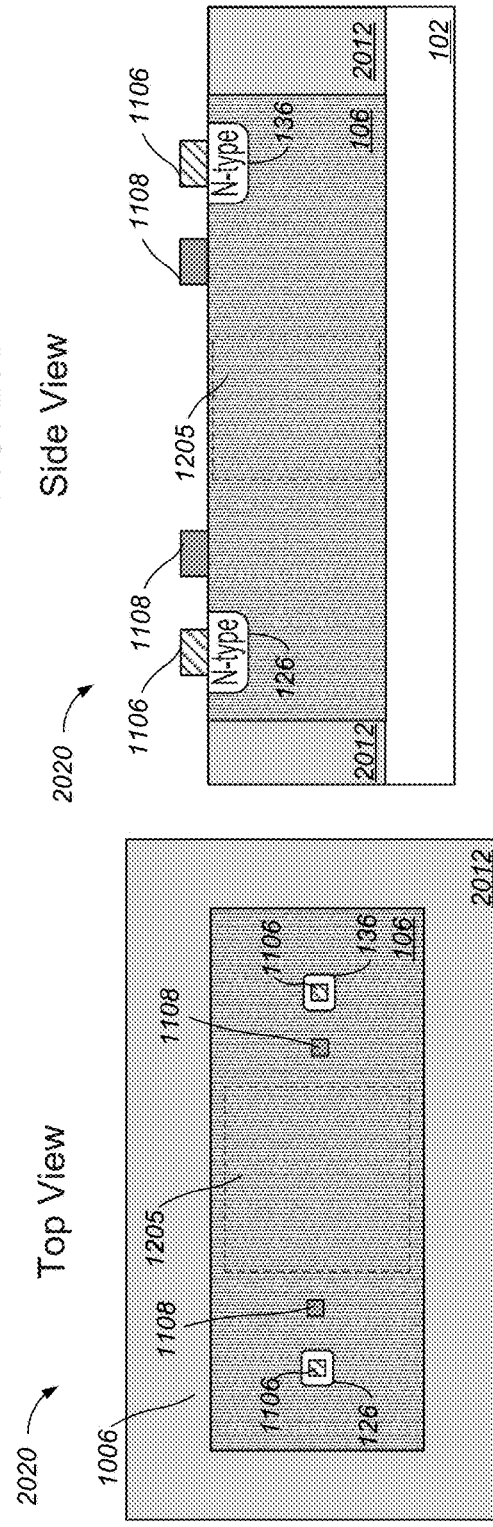

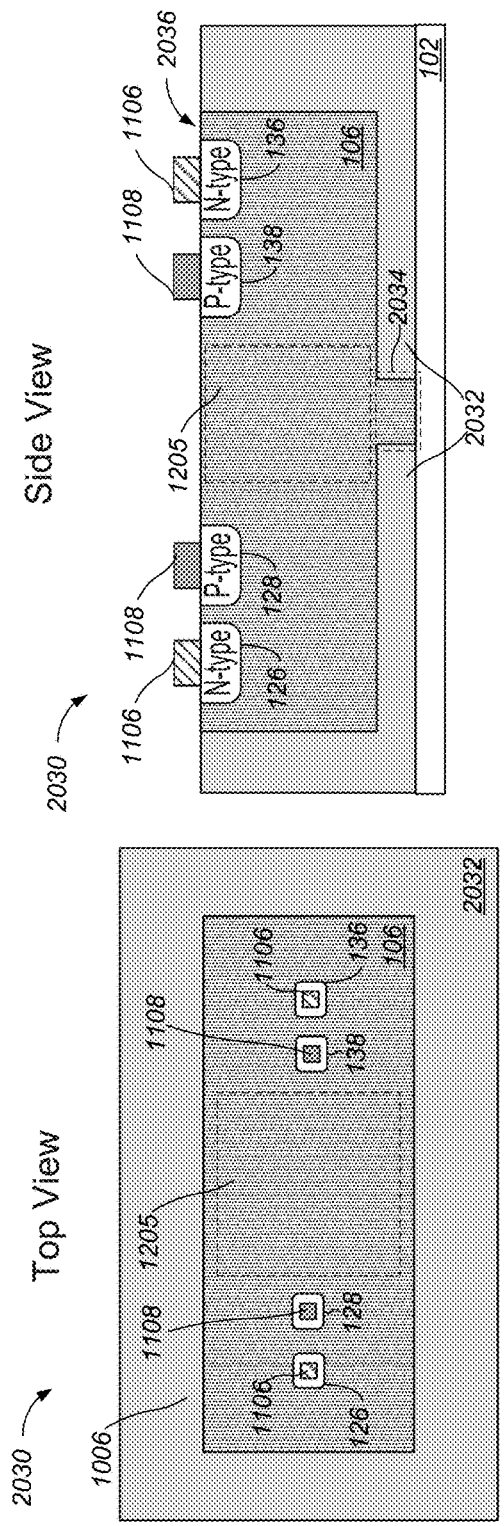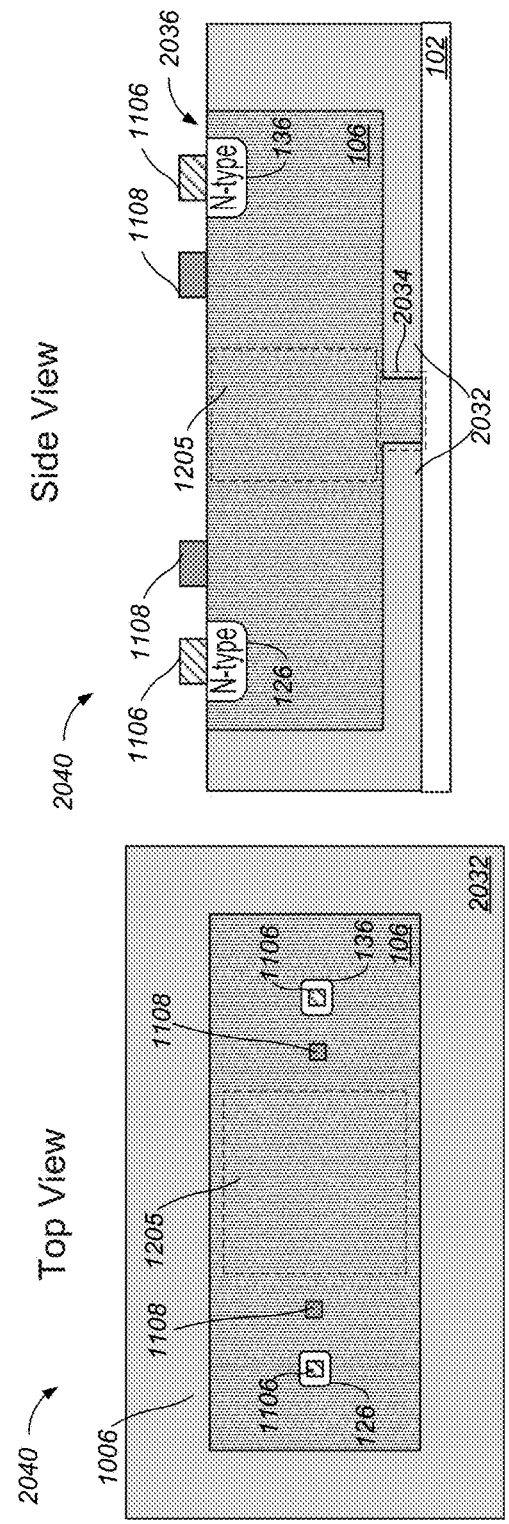

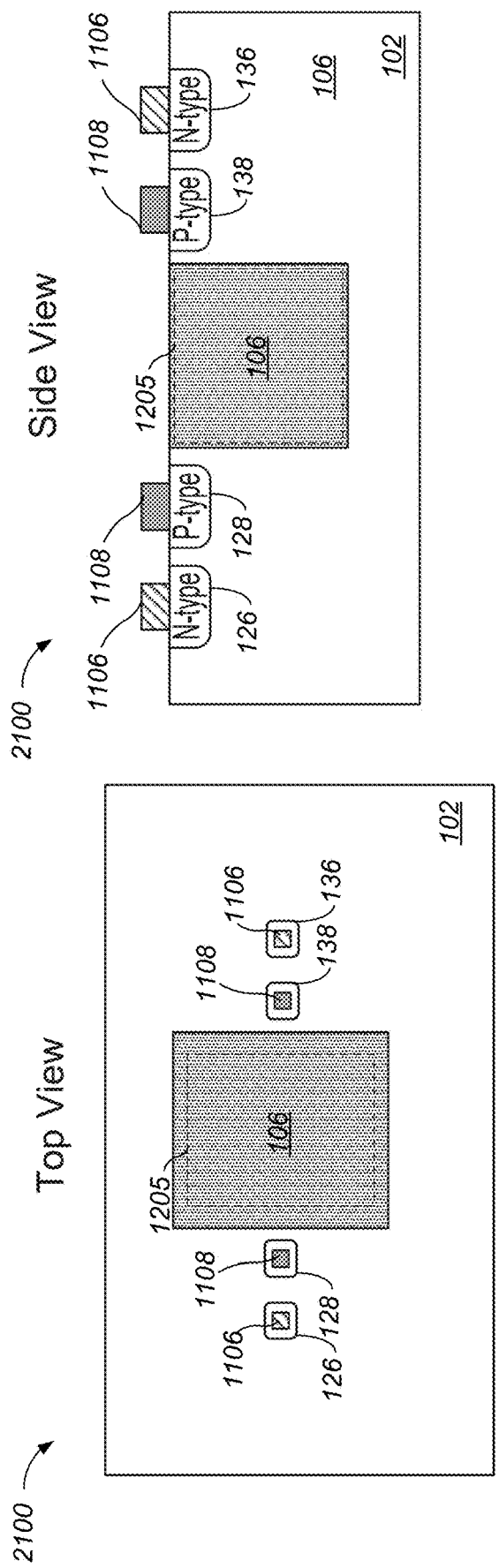

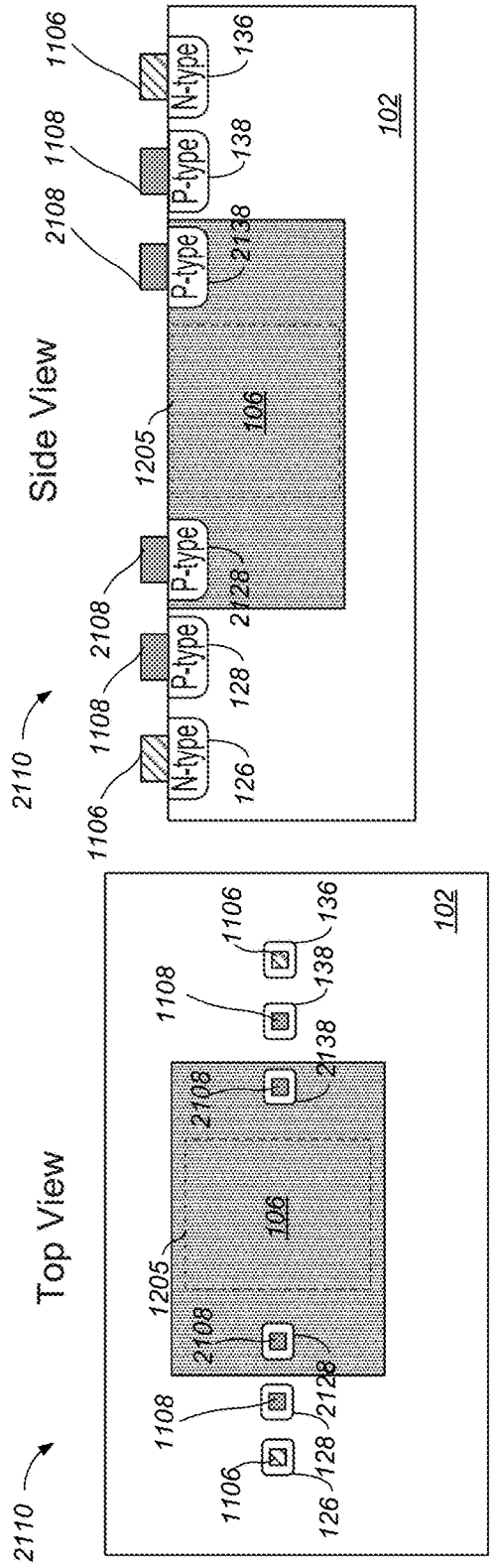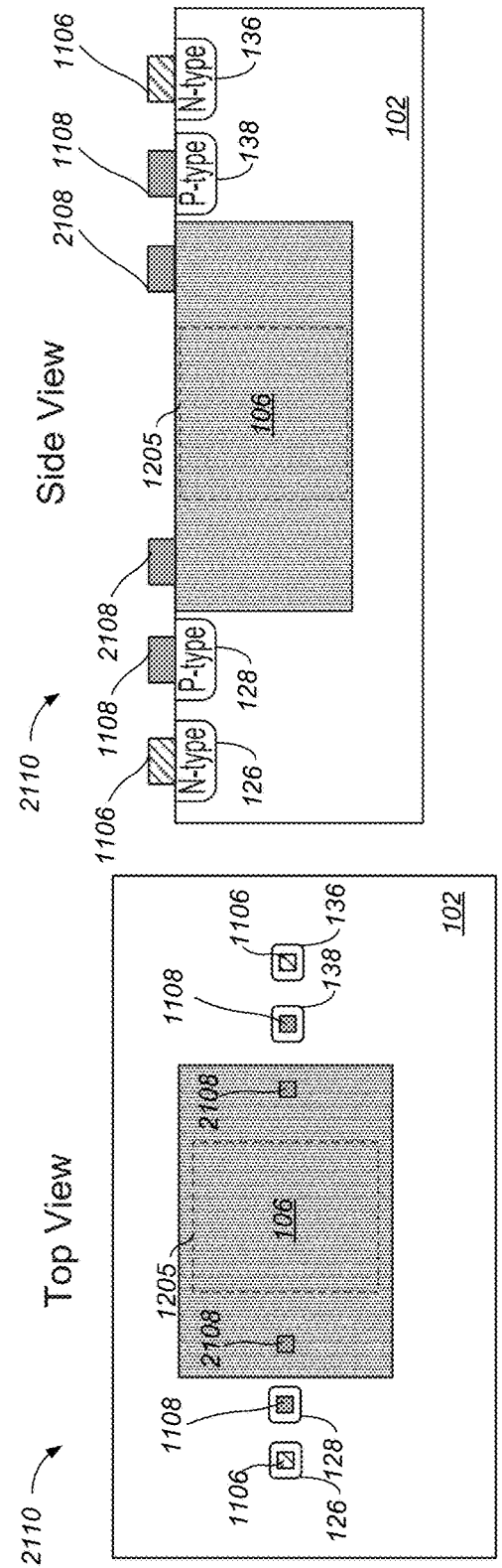
FIG. 21C
FIG. 21D
FIG. 21E
FIG. 21F

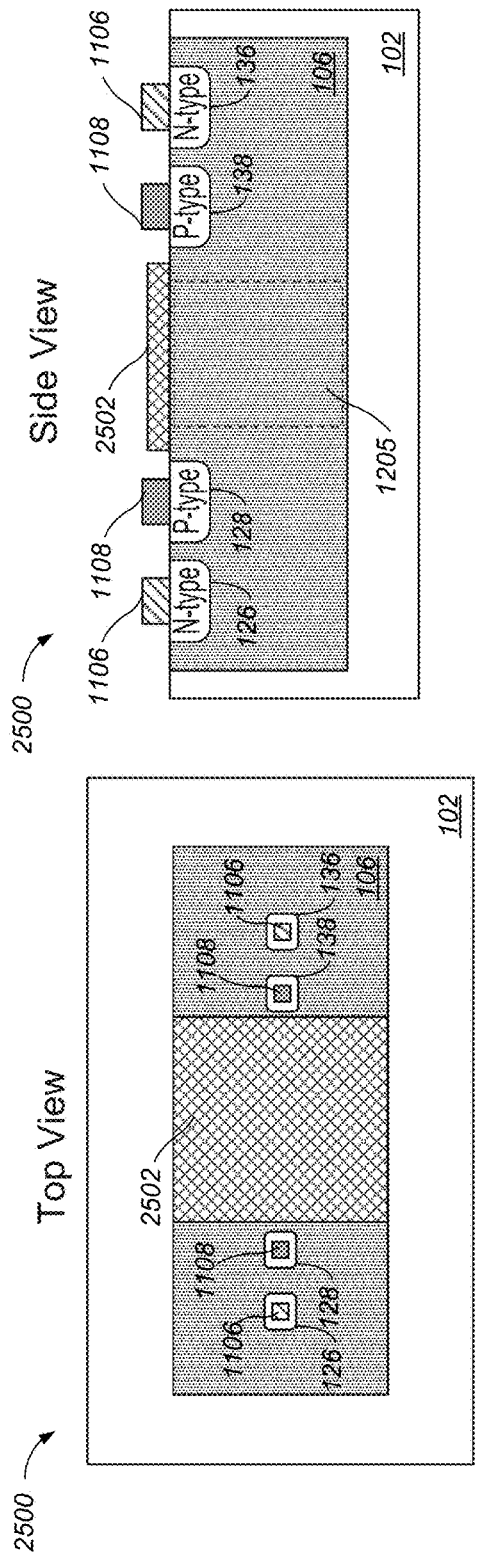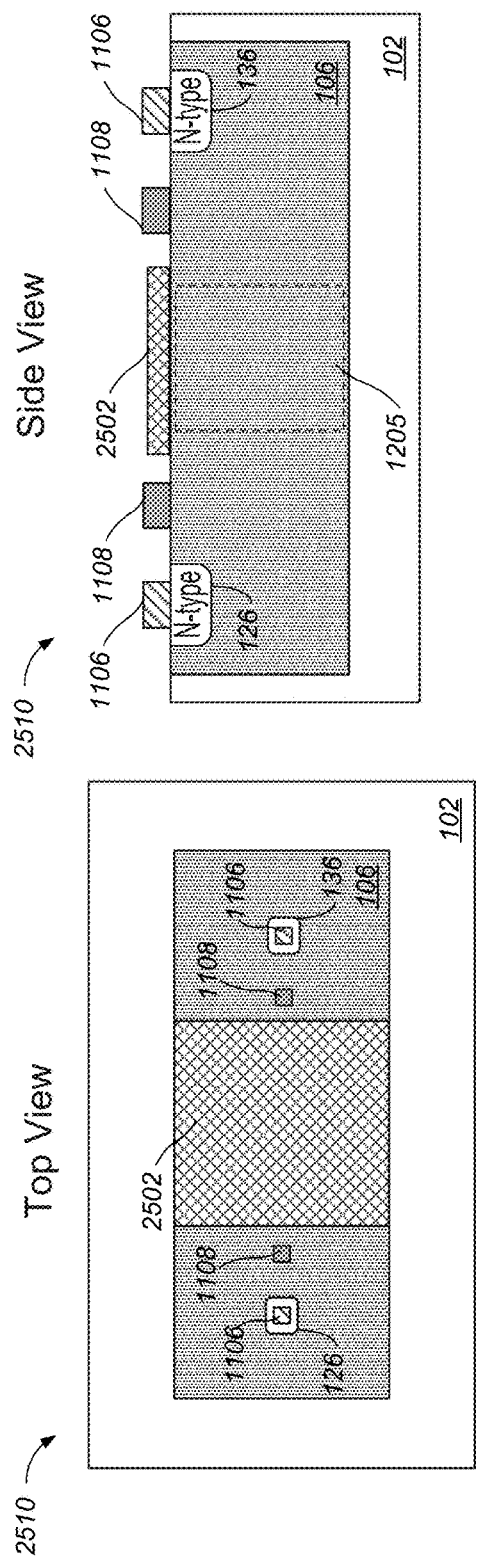

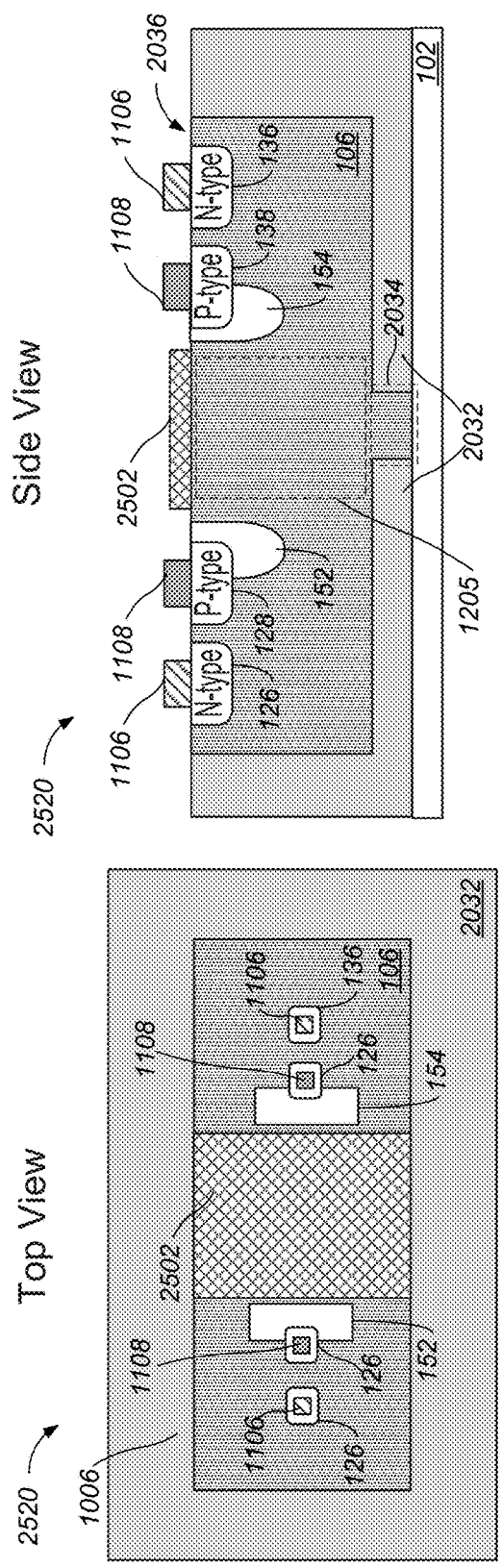
FIG. 25E
FIG. 25F
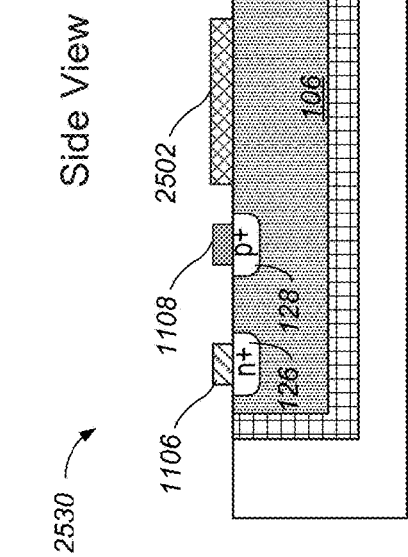
FIG. 25G
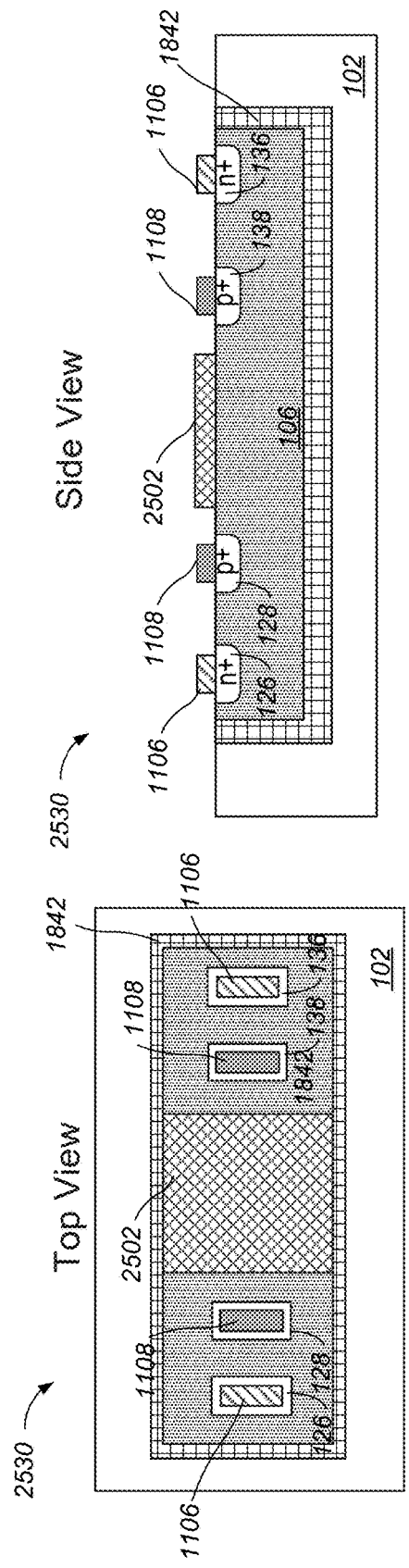
FIG. 25H

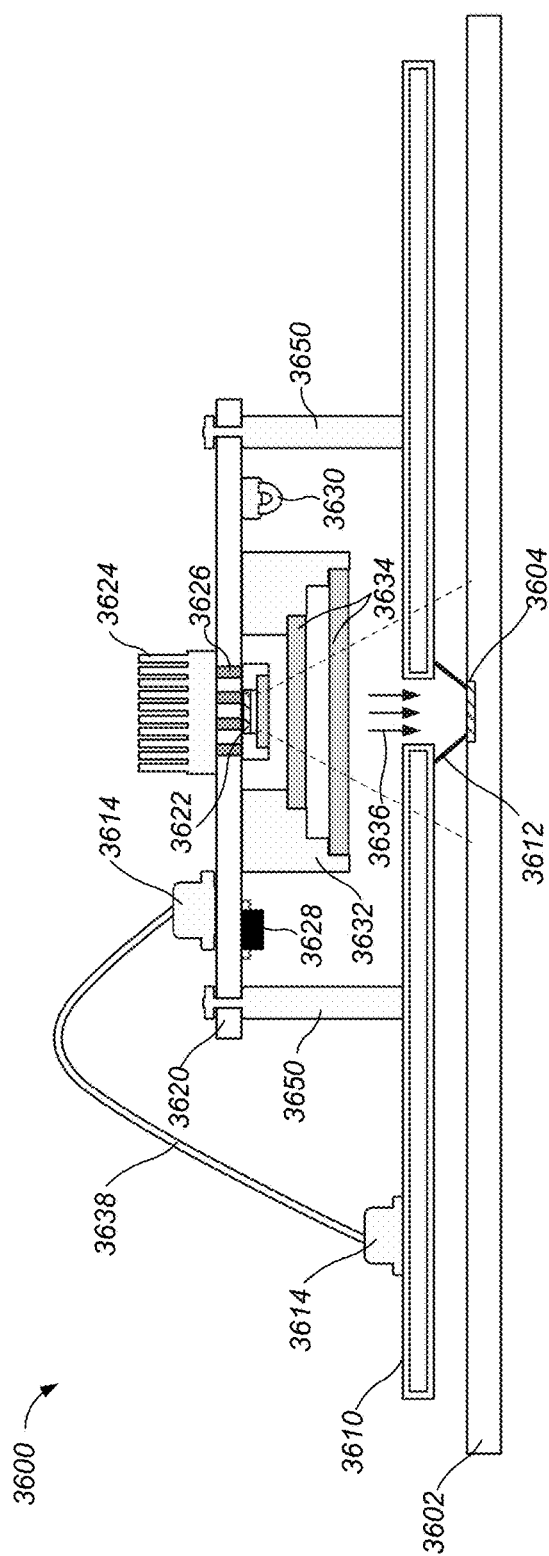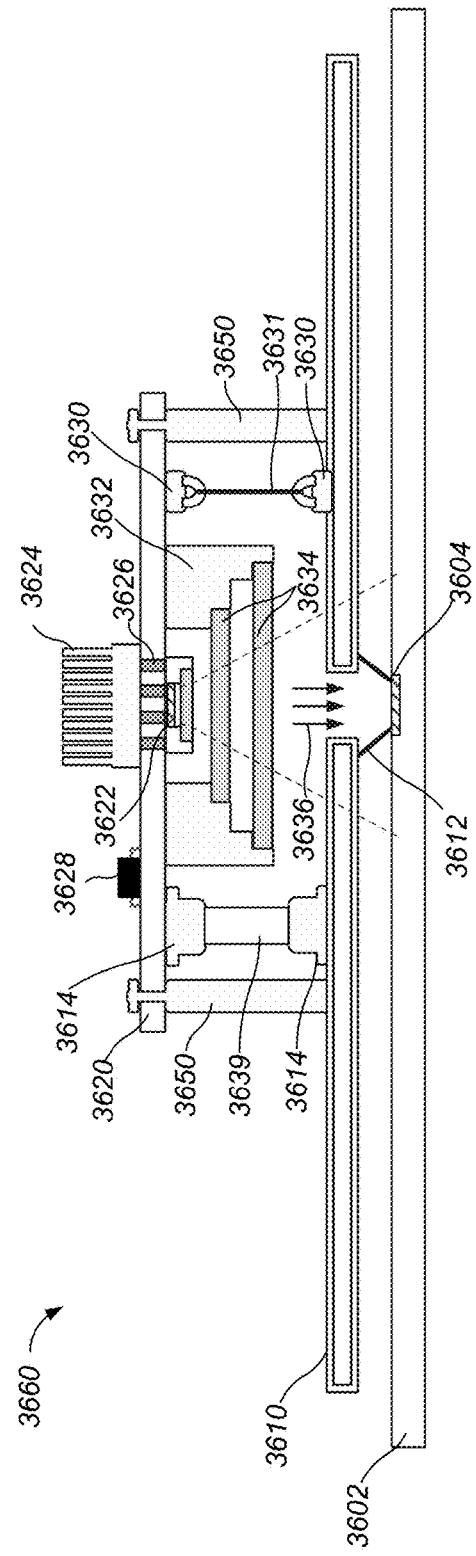
FIG. 36A
FIG. 36B

HIGH-SPEED LIGHT SENSING APPARATUS III

CROSS-REFERENCE TO RELATED APPLICATIONS

This application is a continuation of U.S. patent application Ser. No. 15/944,658, filed on Apr. 3, 2018, which is a continuation in part of and claims the benefit of U.S. patent application Ser. No. 15/908,447, filed on Feb. 28, 2018, which claims the right of priority to U.S. Provisional Application No. 62/465,139, filed on Feb. 28, 2017; U.S. Provisional Patent Application No. 62/479,322, filed on Mar. 31, 2017; U.S. Provisional Patent Application No. 62/504,531, filed on May 10, 2017; U.S. Provisional Patent Application No. 62/485,003, filed on Apr. 13, 2017; U.S. Provisional Patent Application No. 62/511,977, filed on May 27, 2017; U.S. Provisional Patent Application No. 62/534,179, filed on Jul. 18, 2017; U.S. Provisional Patent Application No. 62/561,266, filed on Sep. 21, 2017; U.S. Provisional Patent Application No. 62/613,054, filed on Jan. 3, 2018; U.S. Provisional Patent Application No. 62/617,317, filed on Jan. 15, 2018; and which is a continuation in part of and claims the benefit of U.S. patent application Ser. No. 15/338,660, filed on Oct. 31, 2016, now U.S. Pat. No. 10,254,389, which claims the right of priority to U.S. Provisional Patent Application No. 62/294,436, filed on Feb. 12, 2016; U.S. Provisional Patent Application No. 62/271,386, filed on Dec. 28, 2015; and U.S. Provisional Patent Application No. 62/251,691, filed on Nov. 6, 2015, all of which are incorporated by reference in their entirety.

The U.S. patent application Ser. No. 15/944,658, filed on Apr. 3, 2018, also claims the right of priority to U.S. Provisional Application No. 62/481,131, filed on Apr. 4, 2017, U.S. Provisional Application No. 62/511,977, filed on May 27, 2017, U.S. Provisional Application No. 62/542,329, filed on Aug. 8, 2017, U.S. Provisional Application No. 62/561,256, filed on Sep. 21, 2017, U.S. Provisional Application No. 62/581,720, filed on Nov. 5, 2017, U.S. Provisional Application No. 62/581,777, filed on Nov. 5, 2017, and U.S. Provisional Application No. 62/596,914, filed on Dec. 11, 2017, all of which are incorporated by reference in their entirety.

BACKGROUND

This specification relates to detecting light using a photodetector.

Light propagates in free space or an optical medium is coupled to a photodetector that converts an optical signal to an electrical signal for processing.

SUMMARY

According to one innovative aspect of the subject matter described in this specification, light reflected from a three-dimensional object may be detected by photodetectors of an imaging system. The photodetectors convert the detected light into electrical charges. Each photodetector may include two groups of switches that collect the electrical charges. The collection of the electrical charges by the two groups of switches may be altered over time, such that the imaging system may determine phase information of the sensed light. The imaging system may use the phase information to analyze characteristics associated with the three-dimensional object including depth information or a material composition. The imaging system may also use the phase information to analyze characteristics associated with eye-tracking, gesture recognition, 3-dimensional model scanning/video recording, motion tracking, and/or augmented/virtual reality applications.

In general, one innovative aspect of the subject matter described in this specification can be embodied in a circuit that includes: a photodetector including a first readout terminal and a second readout terminal different than the first readout terminal; a first readout subcircuit including a first MOSFET transistor and a second MOSFET transistor, the first MOSFET transistor including a first gate terminal coupled with a first control voltage source, a first channel terminal, and a second channel terminal coupled with the first readout terminal of the photodetector, and the second MOSFET transistor including a second gate terminal coupled with a second control voltage source, a third channel terminal coupled with a supply voltage node, and a fourth channel terminal coupled with the first channel terminal; and a second readout subcircuit including a third MOSFET transistor and a fourth MOSFET transistor, the third MOSFET transistor including a third gate terminal coupled with the first control voltage source, a fifth channel terminal, and a sixth channel terminal coupled with the second readout terminal of the photodetector, and the fourth MOSFET transistor including a fourth gate terminal coupled with the second control voltage source, a seventh channel terminal coupled with the supply voltage node, and an eighth channel terminal coupled with the fifth channel terminal. During operation of the circuit, the first control voltage source generates a first control voltage configured to create a first voltage difference between a supply voltage of the supply voltage node and a first voltage of the first readout terminal, and to create a second voltage difference between the supply voltage of the supply voltage node and a second voltage of the second readout terminal.

Embodiments of the circuit can include one or more of the following features. For example, during operation of the circuit, the first control voltage is configured to operate the first and third MOSFET transistors in respective subthreshold regions or saturation regions.

In some embodiments, the first voltage difference and the second voltage difference are greater than or equal to 10% of the supply voltage.

In some embodiments, during operation of the circuit, the first control voltage source reduces a first dark current collected through the first readout terminal, and a second dark current collected through the second readout terminal relative to a comparable circuit without the first and third MOSFET transistors.

In some embodiments, the photodetector further includes a p-doped body; the first and second readout terminals include n-doped regions; and the first and the third MOSFET transistors are n-type MOSFET transistors.

In some embodiments, the photodetector further includes a n-doped body; the first and second readout terminals include p-doped regions; and the first and the third MOSFET transistors are p-type MOSFET transistors.

In some embodiments, the photodetector is a switched photodetector configured for time-of-flight detection.

In some embodiments, the photodetector further includes a light absorption region including germanium. The photodetector can further include a first control terminal and a second control terminal. The photodetector can include a recess, and at least a portion of the light absorption region can be embedded in the recess.

Another innovative aspect of the subject matter described in this specification can be embodied in a method for operating a circuit including a photodetector having a first readout terminal coupled with a first readout subcircuit and a second readout terminal coupled with a second readout subcircuit, the method including: generating, through a first control voltage source coupled with the first readout subcircuit and the second readout subcircuit, a first control voltage configured to operate a first MOSFET transistor of the first readout subcircuit and a third MOSFET transistors of the second readout subcircuit in respective subthreshold regions or saturation regions; and performing a photodetector readout step including setting a first output terminal of the first readout subcircuit to a fifth voltage and a second output terminal of the second readout subcircuit to a sixth voltage, wherein controlling of the first control voltage source creates a first voltage difference between a supply voltage of the first and second readout subcircuits and a first voltage of the first readout terminal, and creates a second voltage difference between the supply voltage and a second voltage of the second readout terminal.

Another innovative aspect of the subject matter described in this specification can be embodied in a circuit, including: a light emitting device including a cathode coupled with a first supply voltage node and an anode; a MOSFET transistor including a gate terminal coupled with an input signal source, a first channel terminal coupled with the anode of the light emitting device, and a second channel terminal coupled with a second supply voltage node; a first inductor including a first terminal coupled with a third supply voltage node or a current source and a second terminal coupled with the anode of the light emitting device; and a second inductor including a third terminal coupled with the gate terminal of the MOSFET transistor and a fourth terminal. A second inductance of the second inductor is set such that a LC resonance frequency associated with the gate terminal of the MOSFET transistor corresponds to an input frequency of the input signal source.

Embodiments of the circuit can include one or more of the following features. For example, the circuit can further include a first capacitor arranged between the input signal source and the gate terminal of the MOSFET transistor, the first capacitor including a first terminal coupled with the gate terminal of the MOSFET transistor and a second terminal coupled with the input signal source, and the fourth terminal of the second inductor can be coupled with a MOSFET bias voltage source.

In some embodiments, during operation of the circuit, the MOSFET bias voltage source is controlled to adjust a duty cycle of light output by the light emitting device.

In some embodiments, the light emitting device includes a light emitting diode array or a laser diode array.

Another innovative aspect of the subject matter described in this specification can be embodied in a circuit, including: a photodetector including a first readout terminal and a second readout terminal different than the first readout terminal; a first readout circuit coupled with the first readout terminal and configured to output a first readout voltage; a second readout circuit coupled with the second readout terminal and configured to output a second readout voltage; and a common-mode analog-to-digital converter (ADC) including: a first input terminal coupled with a first voltage source; a second input terminal coupled with a common-mode generator, the common-mode generator configured to receive the first readout voltage and the second readout voltage, and to generate a common-mode voltage between the first and second readout voltages; and a first output terminal configured to output a first output signal corresponding to a magnitude of a current generated by the photodetector.

Embodiments of the circuit can include one or more of the following features. For example, the circuit can further include a differential-mode ADC including: a third input terminal coupled with the first readout circuit and configured to receive the first readout voltage; a fourth input terminal coupled with the second readout circuit and configured to receive the second readout voltage; and a second output terminal configured to output a second output signal corresponding to a time-of-flight information generated by the photodetector, wherein the circuit is operable to simultaneously generate the first output signal and the second output signal.

In some embodiments, the first readout circuit includes: a first capacitor coupled with the first readout terminal; and a first source follower circuit coupled with the first capacitor and configured to generate the first readout voltage, and the second readout circuit includes: a second capacitor coupled with the second readout terminal; and a second source follower circuit coupled with the second capacitor and configured to generate the second readout voltage.

In some embodiments, the first readout circuit includes: a first MOSFET transistor including a first gate terminal coupled with a first control voltage source, a first channel terminal, and a second channel terminal coupled with the first readout terminal of the photodetector; a second MOSFET transistor including a second gate terminal coupled with a second control voltage source, a third channel terminal coupled with a supply voltage node, and a fourth channel terminal coupled with the first channel terminal; a first capacitor coupled with the first channel terminal of the first MOSFET transistor; and a first source follower circuit coupled with the first capacitor and configured to generate the first readout voltage. The second readout circuit includes: a third MOSFET transistor including a third gate terminal coupled with the first control voltage source, a fifth channel terminal, and a sixth channel terminal coupled with the second readout terminal of the photodetector; a fourth MOSFET transistor including a fourth gate terminal coupled with the second control voltage source, a seventh channel terminal coupled with the supply voltage node, and an eighth channel terminal coupled with the fifth channel terminal; a second capacitor coupled with the fifth channel terminal of the third MOSFET transistor; and a second source follower circuit coupled with the second capacitor and configured to generate the second readout voltage.

In some embodiments, the first voltage source includes a third source follower circuit.

Another innovative aspect of the subject matter described in this specification can be embodied in a method for characterizing performance of a time-of-flight detection apparatus including a photodetector having a first readout terminal coupled with a first readout circuit and configured to output a first readout voltage, and a second readout terminal coupled with a second readout circuit and configured to output a second readout voltage, the method including: measuring a dark current of the photodetector by measuring a common-mode output signal between the first and second readout voltages in absence of ambient light and a time-of-flight optical signal; determining that the dark current of the photodetector is greater than a first value; and based on the determination that the dark current of the photodetector is greater than the first value, determining that the time-of-flight detection apparatus does not meet a performance specification.

Embodiments of the method can include one or more of the following features. For example, measuring the dark current of the photodetector can include: performing, through a one-bit ADC or a multi-bit ADC, one or more measurements of the common-mode output signal between the first and second readout voltages in absence of ambient light and the time-of-flight optical signal; and determining the dark current based on the one or more measurements of the common-mode output signal.

In some embodiments, the one or more measurements are a plurality of measurements, and each of the plurality of measurements corresponds to different integration times or different replica voltages input to the one-bit ADC or the multi-bit ADC.

In some embodiments, the method further includes: measuring a demodulation contrast of the time-of-flight detection apparatus by measuring a differential-mode output signal between the first and second readout voltages in presence of a time-of-flight optical signal; determining that the demodulation contrast of the time-of-flight detection apparatus is lower than a second value; and based on the determination that the demodulation contrast of the time-of-flight detection apparatus is lower than the second value, determining that the time-of-flight detection apparatus does not meet the performance specification.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. For a photodetector having p- and n-doped regions fabricated at two different depths, the photo-carrier transit distance is limited by the depth, and not the width, of the absorption material. Consequently, if an efficient absorption material with a short absorption length is used, the distance between the p- and n-doped regions can also be made short so that even a small bias may create a strong field resulting into an increased operation speed. For such a photodetector, two groups of switches may be inserted and arranged laterally in an interdigitated arrangement, which may collect the photo-carriers at different optical phases for a time-of-flight system. An increased operation speed allows the use of a higher modulation frequency in a time-of-flight system, giving a greater depth resolution. In a time-of-flight system where the peak intensity of optical pulses is increased while the duty cycle of the optical pulses is decreased, the signal-to-noise ratio (and hence depth accuracy) can be improved while maintaining the same power consumption for the time-of-flight system. This is made possible when the operation speed is increased so that the duty cycle of the optical pulses can be decreased without distorting the pulse shape. In addition, by using germanium as the absorption material, optical pulses at a wavelength longer than 1 μm can be used. As longer NIR wavelengths (e.g. 1.31 μm, 1.4 μm, 1.55 μm) are generally accepted to be safer to the human eye, optical pulses can be output at a higher intensity at longer wavelengths to improve signal-to-noise-ratio (and hence a better depth accuracy) while satisfying eye-safety requirements.

The details of one or more implementations are set forth in the accompanying drawings and the description below. Other potential features and advantages will become apparent from the description, the drawings, and the claims.

BRIEF DESCRIPTION OF THE DRAWINGS

FIGS. 19A-19H show top and side views of example switched photodetectors.

FIGS. 20A-20L show top and side views of example switched photodetectors.

FIGS. 21A-21F show top and side views of example switched photodetectors.

FIGS. 25A-25H show top and side views of example switched photodetectors.

FIGS. 36A and 36B show schematic side views of an example testing apparatus.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
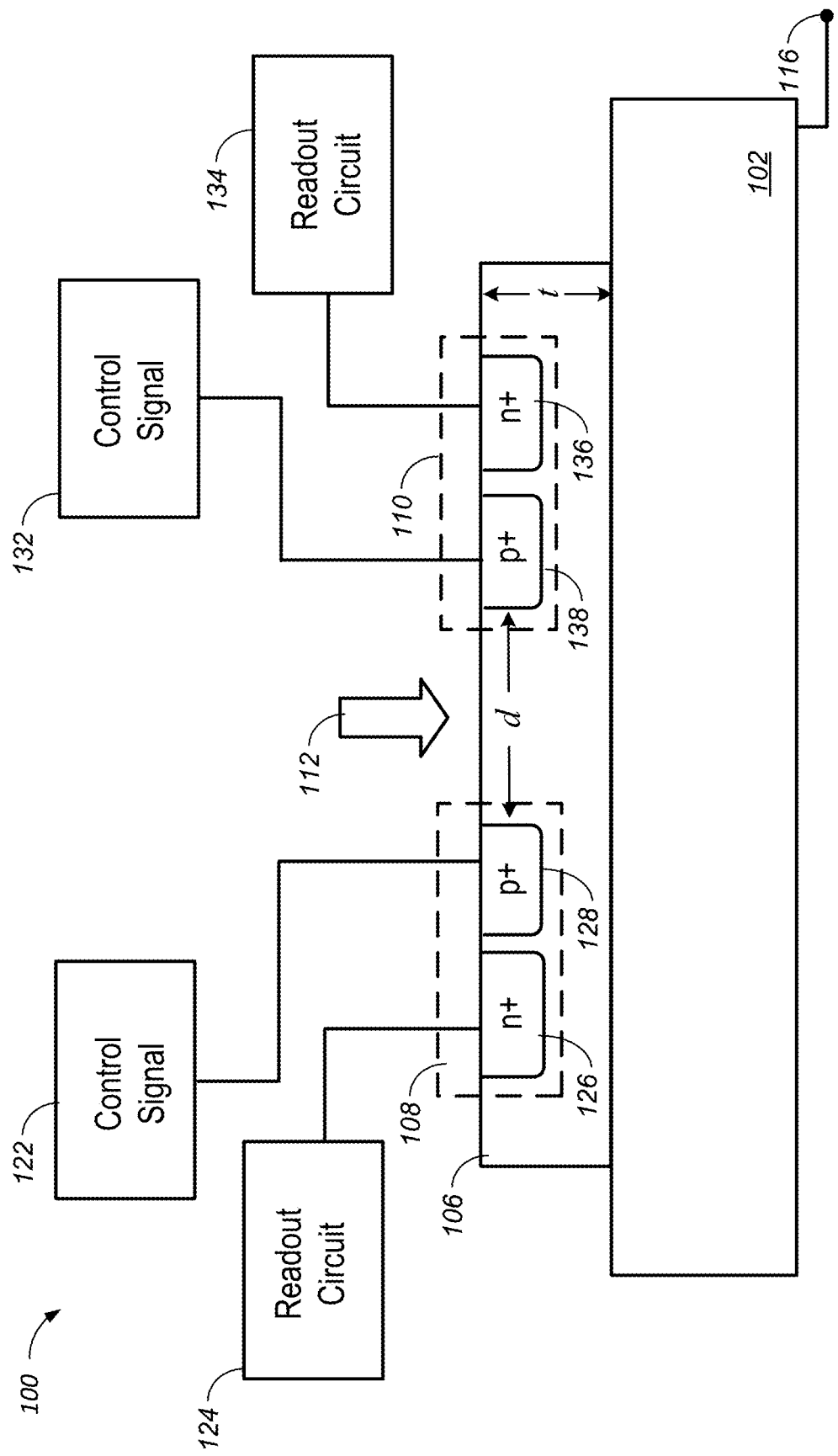
FIGS. 1A, 1B, 1C, and 1D are examples of a switched photodetector.

Photodetectors may be used to detect optical signals and convert the optical signals to electrical signals that may be further processed by another circuitry. In time-of-flight (TOF) applications, depth information of a three-dimensional object may be determined using a phase difference between a transmitted light pulse and a detected light pulse. For example, a two-dimensional array of pixels may be used to reconstruct a three-dimensional image of a three-dimensional object, where each pixel may include one or more photodetectors for deriving phase information of the three-dimensional object. In some implementations, time-of-flight applications use light sources having wavelengths in the near-infrared (NIR) range. For example, a light-emitting-diode (LED) may have a wavelength of 850 nm, 940 nm, 1050 nm, or 1.3 µm to 1.6 µm. Some photodetectors may use silicon as an absorption material, but silicon is an inefficient absorption material for NIR wavelengths. Specifically, photo-carriers may be generated deeply (e.g., greater than 10 µm in depth) in the silicon substrate, and those photo-carriers may drift and/or diffuse to the photodetector junction slowly, which results in a decrease in the operation speed. Moreover, a small voltage swing is typically used to control photodetector operations in order to minimize power consumption. For a large absorption area (e.g., 10 µm in diameter), the small voltage swing can only create a small lateral/vertical field across the large absorption area, which affects the drift velocity of the photo-carriers being swept across the absorption area. The operation speed is therefore further limited. For TOF applications using NIR wavelengths, a switched photodetector with innovative design structures and/or with the use of germanium-silicon (GeSi) as an absorption material addresses the technical issues discussed above. In this application, the term "photodetector" may be used interchangeably with the term "optical sensor". In this application, the term "germanium-silicon (GeSi)" refers to a GeSi alloy with alloy composition ranging from 1% germanium (Ge), i.e., 99% silicon (Si), to 99% Ge, i.e., 1% of Si. In this application, the GeSi material may be grown using a blanket epitaxy, a selective epitaxy, or other applicable techniques. Furthermore, an absorption layer comprising the GeSi material may be formed on a planar surface, a mesa top surface, or a trench bottom surface at least partially surrounded by an insulator (ex: oxide, nitrite), a semiconductor (ex: Si, Ge), or their combinations. Furthermore, a strained super lattice structure or a multiple quantum well structure including alternative layers such as GeSi layers with two or more different alloy compositions may be used for the absorption layer. Furthermore, a Si layer or a GeSi layer with a low Ge concentration (e.g., <10%) may be used to passivate the surface of a GeSi layer with a high Ge concentration (e.g., >50%), which may reduce a dark current or a leakage current at the surface of the GeSi layer with high Ge concentration.

FIG. 1A is an example switched photodetector 100 for converting an optical signal to an electrical signal. The switched photodetector 100 includes an absorption layer 106 fabricated on a substrate 102. The substrate 102 may be any suitable substrate where semiconductor devices can be fabricated on. For example, the substrate 102 may be a silicon substrate. The absorption layer 106 includes a first switch 108 and a second switch 110.

In general, the absorption layer 106 receives an optical signal 112 and converts the optical signal 112 into electrical signals. The absorption layer 106 may be intrinsic, p-type, or n-type. In some implementations, the absorption layer 106 may be formed from a p-type GeSi material. The absorption layer 106 is selected to have a high absorption coefficient at the desired wavelength range. For NIR wavelengths, the absorption layer 106 may be a GeSi mesa, where the GeSi absorbs photons in the optical signal 112 and generates electron-hole pairs. The material composition of germanium and silicon in the GeSi mesa may be selected for specific processes or applications. In some implementations, the absorption layer 106 is designed to have a thickness t. For example, for 850 nm or 940 nm wavelength, the thickness of the GeSi mesa may be approximately 1 µm to have a substantial quantum efficiency. In some implementations, the surface of the absorption layer 106 is designed to have a specific shape. For example, the GeSi mesa may be circular, square, or rectangular depending on the spatial profile of the optical signal 112 on the surface of the GeSi mesa. In some implementations, the absorption layer 106 is designed to have a lateral dimension d for receiving the optical signal 112. For example, the GeSi mesa may have a circular or a rectangular shape, where d can range from 1 µm to 50 µm.

A first switch 108 and a second switch 110 have been fabricated in the absorption layer 106. The first switch 108 is coupled to a first control signal 122 and a first readout circuit 124. The second switch 110 is coupled to a second control signal 132 and a second readout circuit 134. In general, the first control signal 122 and the second control signal 132 control whether the electrons or the holes generated by the absorbed photons are collected by the first readout circuit 124 or the second readout circuit 134.

In some implementations, the first switch 108 and the second switch 110 may be fabricated to collect electrons. In this case, the first switch 108 includes a p-doped region 128 and an n-doped region 126. For example, the p-doped region 128 may have a p+ doping, where the activated dopant concentration may be as high as a fabrication process may achieve, e.g., the peak concentration may be about $5 \times 10^{20}$ cm$^{-3}$ when the absorption layer 106 is germanium and doped with boron. In some implementation, the doping concentration of the p-doped region 128 may be lower than $5 \times 10^{20}$ cm$^{-3}$ to ease the fabrication complexity at the expense of an increased contact resistance. The n-doped region 126 may have an n+ doping, where the activated dopant concentration may be as high as a fabrication process may achieve, e.g., the peak concentration may be about $1 \times 10^{20}$ cm$^{-3}$ when the absorption layer 106 is germanium and doped with phosphorous. In some implementation, the doping concentration of the n-doped region 126 may be lower than $1 \times 10^{20}$ cm$^{-3}$ to ease the fabrication complexity at the expense of an increased contact resistance. The distance between the p-doped region 128 and the n-doped region 126 may be designed based on fabrication process design rules. In general, the closer the distance between the p-doped region 128 and the n-doped region 126, the higher the switching efficiency of the generated photo-carriers. However, reducing of the distance between the p-doped region 128 and the n-doped region 126 may increase a dark current associated with a PN junction formed between the p-doped region 128 and the n-doped region 126. As such, the distance may be set based on the performance requirements of the switched photodetector 100. The second switch 110 includes a p-doped region 138 and an n-doped region 136. The p-doped region 138 is similar to the p-doped region 128, and the n-doped region 136 is similar to the n-doped region 126.

In some implementations, the p-doped region 128 is coupled to the first control signal 122. For example, the p-doped region 128 may be coupled to a voltage source, where the first control signal 122 may be an AC voltage signal from the voltage source. In some implementations, the n-doped region 126 is coupled to the readout circuit 124. The readout circuit 124 may be in a three-transistor configuration consisting of a reset gate, a source-follower, and a selection gate, a circuit including four or more transistors, or any suitable circuitry for processing charges. In some implementations, the readout circuit 124 may be fabricated on the substrate 102. In some other implementations, the readout circuit 124 may be fabricated on another substrate and integrated/co-packaged with the switched photodetector 100 via die/wafer bonding or stacking.

The p-doped region 138 is coupled to the second control signal 132. For example, the p-doped region 138 may be coupled to a voltage source, where the second control signal 132 may be an AC voltage signal having an opposite phase from the first control signal 122. In some implementations, the n-doped region 136 is coupled to the readout circuit 134. The readout circuit 134 may be similar to the readout circuit 124.

The first control signal 122 and the second control signal 132 are used to control the collection of electrons generated by the absorbed photons. For example, when voltages are used, if the first control signal 122 is biased against the second control signal 132, an electric field is created between the p-doped region 128 and the p-doped region 138, and free electrons drift towards the p-doped region 128 or the p-doped region 138 depending on the direction of the electric field. In some implementations, the first control signal 122 may be fixed at a voltage value $V_i$, and the second control signal 132 may alternate between voltage values $V_i \pm \Delta V$. The direction of the bias value determines the drift direction of the electrons. Accordingly, when one switch (e.g., the first switch 108) is switched "on" (i.e., the electrons drift towards the p-doped region 128), the other switch (e.g., the second switch 110) is switched "off" (i.e. the electrons are blocked from the p-doped region 138). In some implementations, the first control signal 122 and the second control signal 132 may be voltages that are differential to each other.

In general, a difference (before equilibrium) between the Fermi level of a p-doped region and the Fermi level of an n-doped region creates an electric field between the two regions. In the first switch 108, an electric field is created between the p-doped region 128 and the n-doped region 126. Similarly, in the second switch 110, an electric field is created between the p-doped region 138 and the n-doped region 136. When the first switch 108 is switched "on" and the second switch 110 is switched "off", the electrons drift toward the p-doped region 128, and the electric field between the p-doped region 128 and the n-doped region 126 further carries the electrons to the n-doped region 126. The readout circuit 124 may then be enabled to process the charges collected by the n-doped region 126. On the other hand, when the second switch 110 is switched "on" and the first switch 108 is switched "off", the electrons drift toward the p-doped region 138, and the electric field between the p-doped region 138 and the n-doped region 136 further carries the electrons to the n-doped region 136. The readout circuit 134 may then be enabled to process the charges collected by the n-doped region 136.

In some implementations, a voltage may be applied between the p-doped and the n-doped regions of a switch to operate the switch in an avalanche regime to increase the sensitivity of the switched photodetector 100. For example, in the case of an absorption layer 106 including GeSi, when the distance between the p-doped region 128 and the n-doped region 126 is about 100 nm, it is possible to apply a voltage that is less than 7 V to create an avalanche gain between the p-doped region 128 and the n-doped region 126.

In some implementations, the substrate 102 may be coupled to an external control 116. For example, the substrate 102 may be coupled to an electrical ground, or a preset voltage less than the voltages at the n-doped regions 126 and 136. In some other implementations, the substrate 102 may be floated and not coupled to any external control.

Figure 1B:
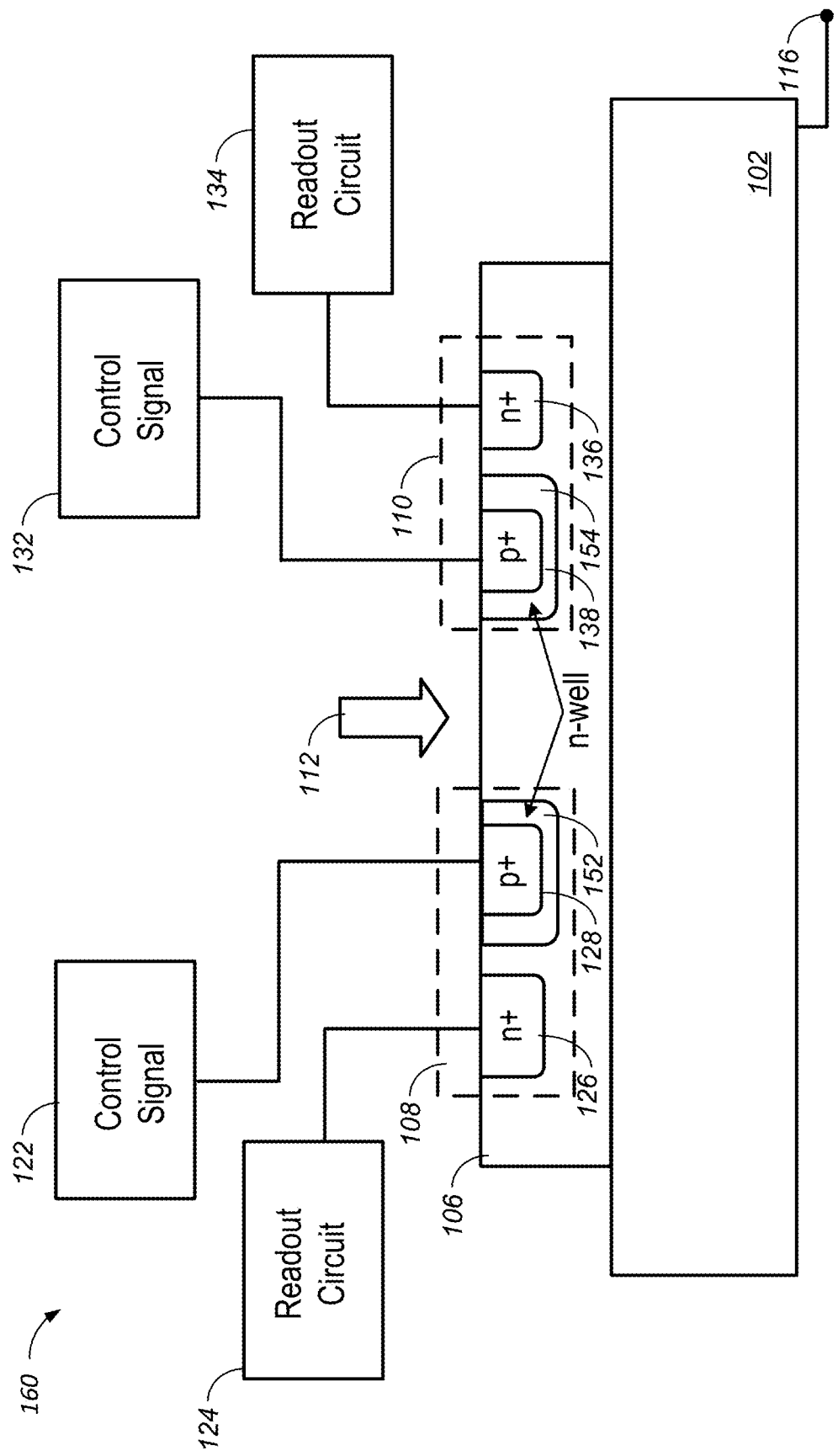

FIG. 1B is an example switched photodetector 160 for converting an optical signal to an electrical signal. The switched photodetector 160 is similar to the switched photodetector 100 in FIG. 1A, but that the first switch 108 and the second switch 110 further includes an n-well region 152 and an n-well region 154, respectively. In addition, the absorption layer 106 may be a p-doped region. In some implementations, the doping level of the n-well regions 152 and 154 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 152, the p-doped absorption layer 106, the n-well region 154, and the p-doped region 138 forms a PNPNP junction structure. In general, the PNPNP junction structure reduces a leakage current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124.

In some implementations, the p-doped region 128 is formed entirely within the n-well region 152. In some other implementations, the p-doped region 128 is partially formed in the n-well region 152. For example, a portion of the p-doped region 128 may be formed by implanting the p-dopants in the n-well region 152, while another portion of the p-doped region 128 may be formed by implanting the p-dopants in the absorption layer 106. Similarly, in some implementations, the p-doped region 138 is formed entirely within the n-well region 154. In some other implementations, the p-doped region 138 is partially formed in the n-well region 154. In some implementations, the depth of the n-well regions 152 and 154 is shallower than the p-doped regions 128 and 138.

Figure 1C:
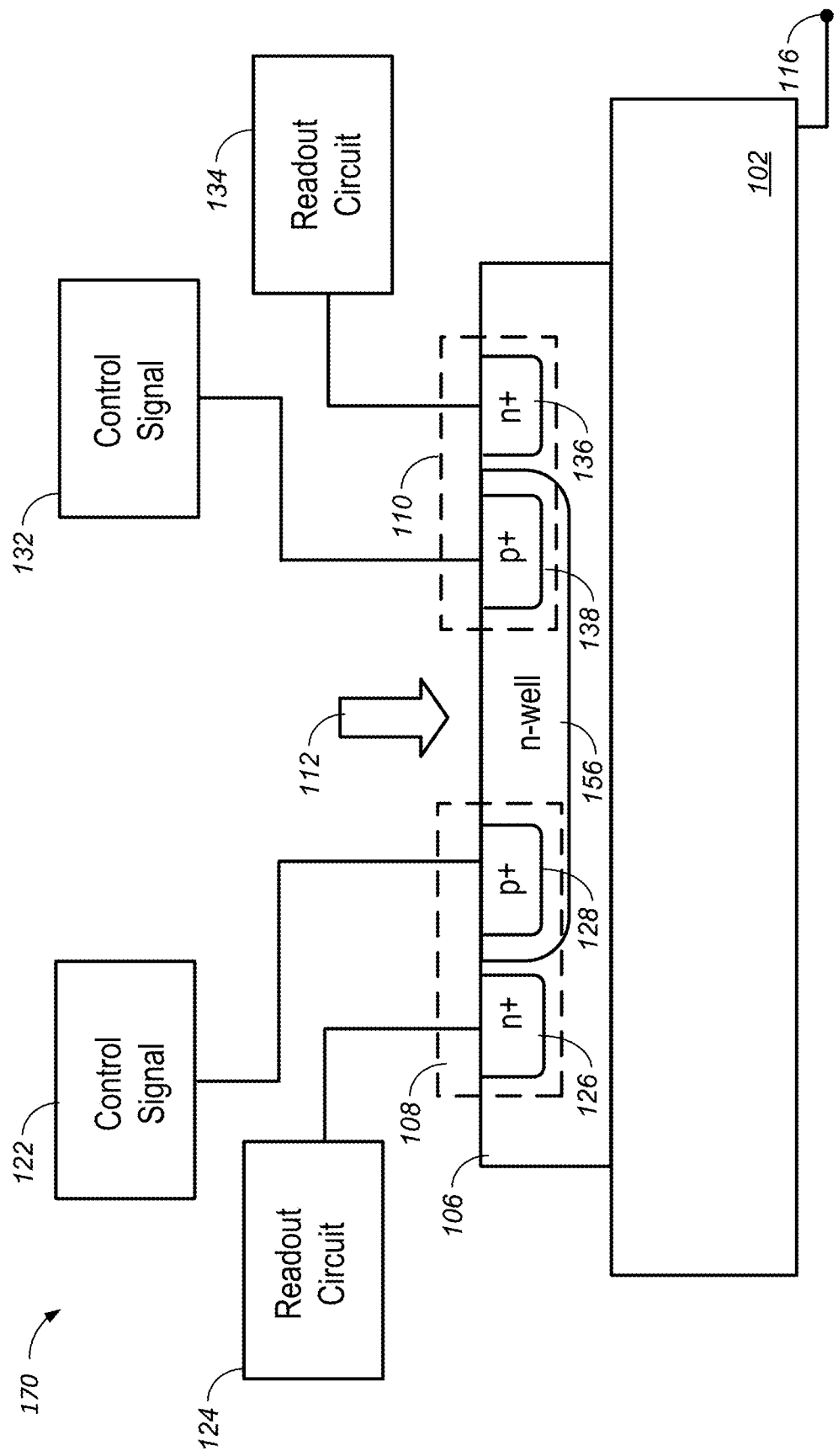

FIG. 1C is an example switched photodetector 170 for converting an optical signal to an electrical signal. The switched photodetector 170 is similar to the switched photodetector 100 in FIG. 1A, but that the absorption layer 106 further includes an n-well region 156. In addition, the absorption layer 106 may be a p-doped region. In some implementations, the doping level of the n-well region 156 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 156, and the p-doped region 138 forms a PNP junction structure. In general, the PNP junction structure reduces a leakage current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124. In some implementations, if the depth of the n-well region 156 is deep, the arrangement of the n-doped region 126, the p-doped absorption layer 106, the n-well region 156, the p-doped absorption layer 106, and the n-doped region 136 forms an NPNPN junction structure, which further reduces a charge coupling from the first readout circuit 124 to the second readout circuit 134, or alternatively from the second readout circuit 134 to the first readout circuit 124.

In some implementations, the p-doped regions 128 and 138 are formed entirely within the n-well region 156. In some other implementations, the p-doped regions 128 and 138 are partially formed in the n-well region 156. For example, a portion of the p-doped region 128 may be formed by implanting the p-dopants in the n-well region 156, while another portion of the p-doped region 128 may be formed by implanting the p-dopants in the absorption layer 106. In some implementations, the depth of the n-well region 156 is shallower than the p-doped regions 128 and 138.

Figure 1D:
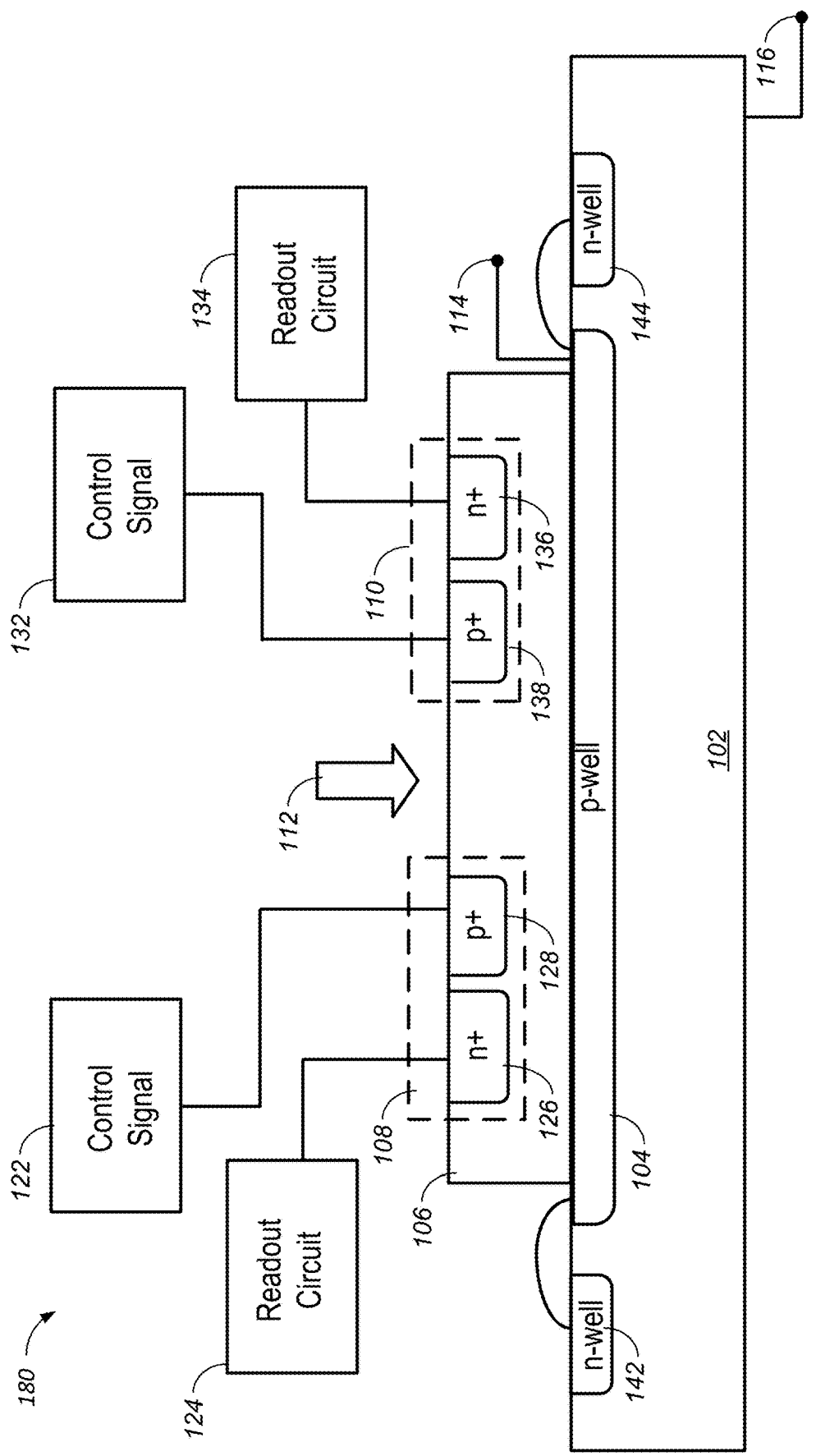

FIG. 1D is an example switched photodetector 180 for converting an optical signal to an electrical signal. The switched photodetector 180 is similar to the switched photodetector 100 in FIG. 1A, but that the switched photodetector 150 further includes a p-well region 104 and n-well regions 142 and 144. In some implementations, the doping level of the n-well regions 142 and 144 may range from $10^{16}$ cm$^{-3}$ to $10^{20}$ cm$^{-3}$. The doping level of the p-well region 104 may range from $10^{16}$ cm$^{-3}$ to $10^{20}$ cm$^{-3}$.

In some implementation, the absorption layer 106 may not completely absorb the incoming photons in the optical signal 112. For example, if the GeSi mesa does not completely absorb the incoming photons in the NIR optical signal 112, the NIR optical signal 112 may penetrate into the silicon substrate 102, where the silicon substrate 102 may absorb the penetrated photons and generate photo-carriers deeply in the substrate that are slow to recombine. These slow photo-carriers negatively affect the operation speed of the switched photodetector. Moreover, the photo-carries generated in the silicon substrate 102 may be collected by the neighboring pixels, which may cause unwanted signal cross-talks between the pixels. Furthermore, the photo-carriers generated in the silicon substrate 102 may cause charging of the substrate 102, which may cause reliability issues in the switched photodiode.

To further remove the slow photo-carriers, the switched photodetector 150 may include connections that short the n-well regions 142 and 144 with the p-well region 104. For example, the connections may be formed by a silicide process or a deposited metal pad that connects the n-well regions 142 and 144 with the p-well region 104. The shorting between the n-well regions 142 and 144 and the p-well region 104 allows the photo-carriers generated in the substrate 102 to be recombined at the shorted node, and therefore improves the operation speed and/or reliability of the switched photodetector. In some implementation, the p-well region 104 is used to passivate and/or minimize the electric field around the interfacial defects between the absorptive layer 106 and the substrate 102 in order to reduce the device dark current.

Although not shown in FIGS. 1A-1D, in some implementations, an optical signal may reach to the switched photodetector from the backside of the substrate 102. One or more optical components (e.g., microlens or lightguide) may be fabricated on the backside of the substrate 102 to focus, collimate, defocus, filter, or otherwise manipulate the optical signal.

Although not shown in FIGS. 1A-1D, in some other implementations, the first switch 108 and the second switch 110 may alternatively be fabricated to collect holes instead of electrons. In this case, the p-doped region 128 and the p-doped region 138 would be replaced by n-doped regions, and the n-doped region 126 and the n-doped region 136 would be replaced by p-doped regions. The n-well regions 142, 144, 152, 154, and 156 would be replaced by p-well regions. The p-well region 104 would be replaced by an n-well region.

Although not shown in FIGS. 1A-1D, in some implementations, the absorption layer 106 may be bonded to a substrate after the fabrication of the switched photodetector 100, 160, 170, and 180. The substrate may be any material that allows the transmission of the optical signal 112 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 112.

Although not shown in FIGS. 1A-1D, in some implementations, the switched photodetector 100, 160, 170, and 180 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 102. Adding such a mirror like metal layer may increase the absorption efficiency (quantum efficiency) of the absorption layer 106. For example, the absorption efficiency of photodetectors operating at a longer NIR wavelength between 1.0 µm and 1.6 µm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 108 and 110 can be added for interfacing control signals/readout circuits.

Although not shown in FIG. 1A-1D, in some implementations, the absorption layer 106 may be partially or fully embedded/recessed in the substrate 102 to relieve the surface topography and so ease the fabrication process. An example of the embedment technique is described in U.S. Patent Publication No. US20170040362 A1 titled "Germanium-Silicon Light Sensing Apparatus," which is fully incorporated by reference herein.

Figure 2A:
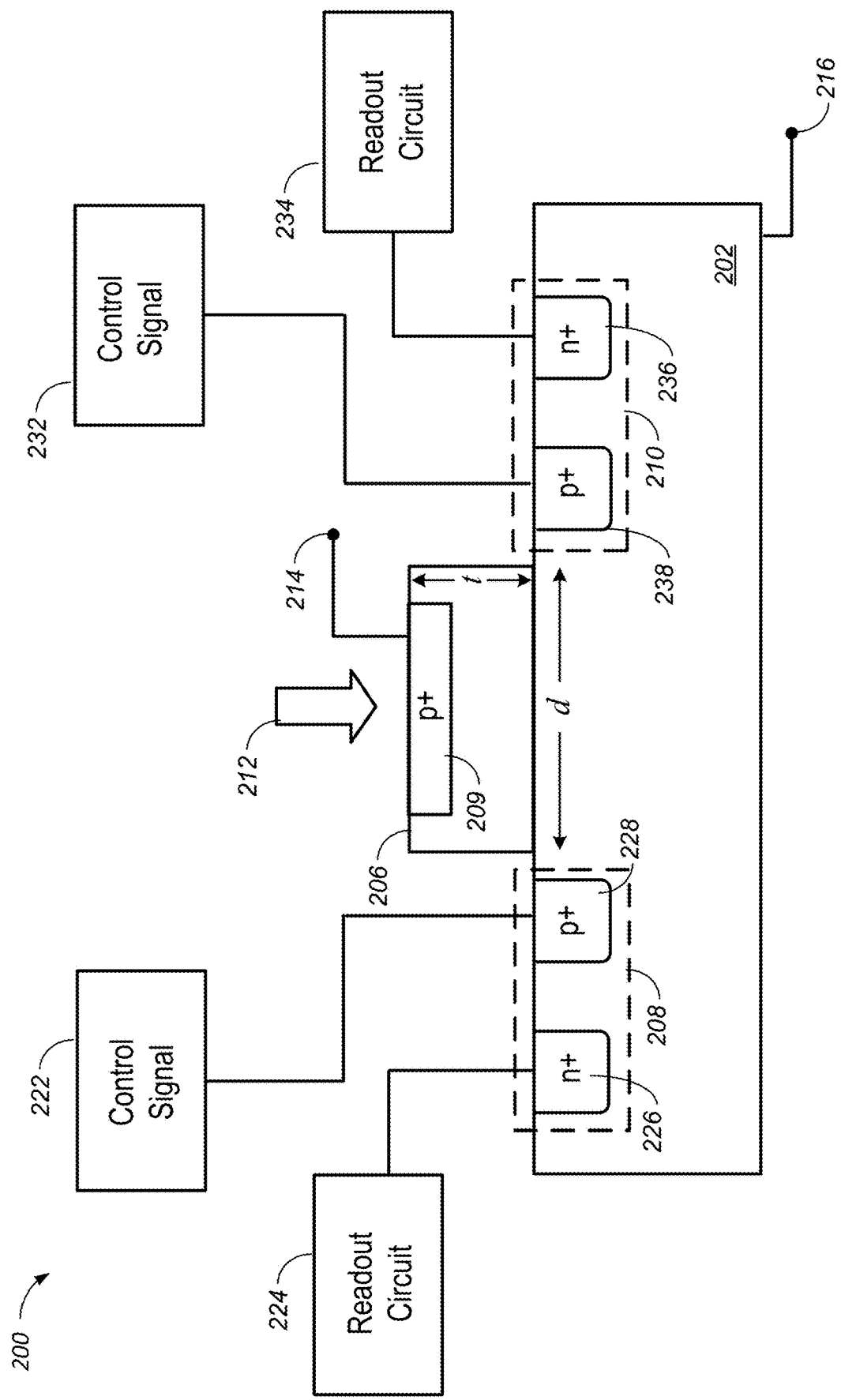
FIGS. 2A, 2B, 2C and 2D are examples of a switched photodetector.

FIG. 2A is an example switched photodetector 200 for converting an optical signal to an electrical signal, where the first switch 208 and the second switch 210 are fabricated on a substrate 202. The switched photodetector 200 includes an absorption layer 206 fabricated on a substrate 202. The substrate 202 may be any suitable substrate where semiconductor devices can be fabricated on. For example, the substrate 202 may be a silicon substrate.

In general, the absorption layer 206 receives an optical signal 212 and converts the optical signal 212 into electrical signals. The absorption layer 206 is similar to the absorption layer 106. The absorption layer 206 may be intrinsic, p-type, or n-type. In some implementations, the absorption layer 206 may be formed from a p-type GeSi material. In some implementations, the absorption layer 206 may include a p-doped region 209. The p-doped region 209 may repel the photo-electrons from the absorption layer 206 to the substrate 202 and thereby increase the operation speed. For example, the p-doped region 209 may have a p+ doping, where the dopant concentration is as high as a fabrication process may achieve, e.g., the peak concentration may be about 5×1020 cm−3 when the absorption layer 206 is germanium and doped with boron. In some implementation, the doping concentration of the p-doped region 209 may be lower than 5×1020 cm−3 to ease the fabrication complexity at the expense of an increased contact resistance. In some implementations, the p-doped region 209 may be a graded p-doped region.

A first switch 208 and a second switch 210 have been fabricated in the substrate 202. The first switch 208 is coupled to a first control signal 222 and a first readout circuit 224. The second switch 210 is coupled to a second control signal 232 and a second readout circuit 234. In general, the first control signal 222 and the second control signal 232 control whether the electrons or the holes generated by the absorbed photons are collected by the first readout circuit 224 or the second readout circuit 234. The first control signal 222 is similar to the first control signal 122. The second control signal 232 is similar to the second control signal 132. The first readout circuit 224 is similar to the first readout circuit 124. The second readout circuit 234 is similar to the second readout circuit 134.

In some implementations, the first switch 208 and the second switch 210 may be fabricated to collect electrons generated by the absorption layer 206. In this case, the first switch 208 includes a p-doped region 228 and an n-doped region 226. For example, the p-doped region 228 may have a p+ doping, where the activated dopant concentration may be as high as a fabrication process may achieve, e.g., the peak concentration may be about 2×1020 cm−3 when the substrate 202 is silicon and doped with boron. In some implementation, the doping concentration of the p-doped region 228 may be lower than 2×1020 cm−3 to ease the fabrication complexity at the expense of an increased contact resistance. The n-doped region 226 may have an n+ doping, where the activated dopant concentration may be as high as a fabrication process may achieve, e.g., the peak concentration may be about 5×1020 cm−3 when the substrate 202 is silicon and doped with phosphorous. In some implementation, the doping concentration of the n-doped region 226 may be lower than 5×1020 cm−3 to ease the fabrication complexity at the expense of an increased contact resistance. The distance between the p-doped region 228 and the n-doped region 226 may be designed based on fabrication process design rules. In general, the closer the distance between the p-doped region 228 and the n-doped region 226, the higher the switching efficiency of the generated photo-carriers. The second switch 210 includes a p-doped region 238 and an n-doped region 236. The p-doped region 238 is similar to the p-doped region 228, and the n-doped region 236 is similar to the n-doped region 226.

In some implementations, the p-doped region 228 is coupled to the first control signal 222. The n-doped region 226 is coupled to the readout circuit 224. The p-doped region 238 is coupled to the second control signal 232. The n-doped region 236 is coupled to the readout circuit 234. The first control signal 222 and the second control signal 232 are used to control the collection of electrons generated by the absorbed photons. For example, when the absorption layer 206 absorbs photons in the optical signal 212, electron-hole pairs are generated and drift or diffuse into the substrate 202. When voltages are used, if the first control signal 222 is biased against the second control signal 232, an electric field is created between the p-doped region 228 and the p-doped region 238, and free electrons from the absorption layer 206 drift towards the p-doped region 228 or the p-doped region 238 depending on the direction of the electric field. In some implementations, the first control signal 222 may be fixed at a voltage value Vi, and the second control signal 232 may alternate between voltage values Vi±ΔV. The direction of the bias value determines the drift direction of the electrons. Accordingly, when one switch (e.g., the first switch 208) is switched "on" (i.e., the electrons drift towards the p-doped region 228), the other switch (e.g., the second switch 210) is switched "off" (i.e., the electrons are blocked from the p-doped region 238). In some implementations, the first control signal 222 and the second control signal 232 may be voltages that are differential to each other.

In the first switch 208, an electric field is created between the p-doped region 228 and the n-doped region 226. Similarly, in the second switch 210, an electric field is created between the p-doped region 238 and the n-doped region 236. When the first switch 208 is switched "on" and the second switch 210 is switched "off", the electrons drift toward the p-doped region 228, and the electric field between the p-doped region 228 and the n-doped region 226 further carries the electrons to the n-doped region 226. The readout circuit 224 may then be enabled to process the charges collected by the n-doped doped region 226. On the other hand, when the second switch 210 is switched "on" and the first switch 208 is switched "off", the electrons drift toward the p-doped region 238, and the electric field between the p-doped region 238 and the n-doped region 236 further carries the electrons to the n-doped region 236. The readout circuit 234 may then be enabled to process the charges collected by the n-doped region 236.

In some implementations, a voltage may be applied between the p-doped and the n-doped regions of a switch to operate the switch in an avalanche regime to increase the sensitivity of the switched photodetector 200. For example, in the case of a substrate 202 including GeSi, when the distance between the p-doped region 228 and the n-doped region 226 is about 100 nm, it is possible to apply a voltage that is less than 7 V to create an avalanche gain between the p-doped region 228 and the n-doped region 226.

In some implementations, the p-doped region 209 may be coupled to an external control 214. For example, the p-doped region 209 may be coupled to ground. In some implementations, the p-doped region 209 may be floated and not coupled to any external control. In some implementations, the substrate 202 may be coupled to an external control 216. For example, the substrate 202 may be coupled to an electrical ground, or a preset voltage less than the voltages at the n-doped regions 226 and 236. In some other implementations, the substrate 202 may be floated and not coupled to any external control.

Figure 2B:
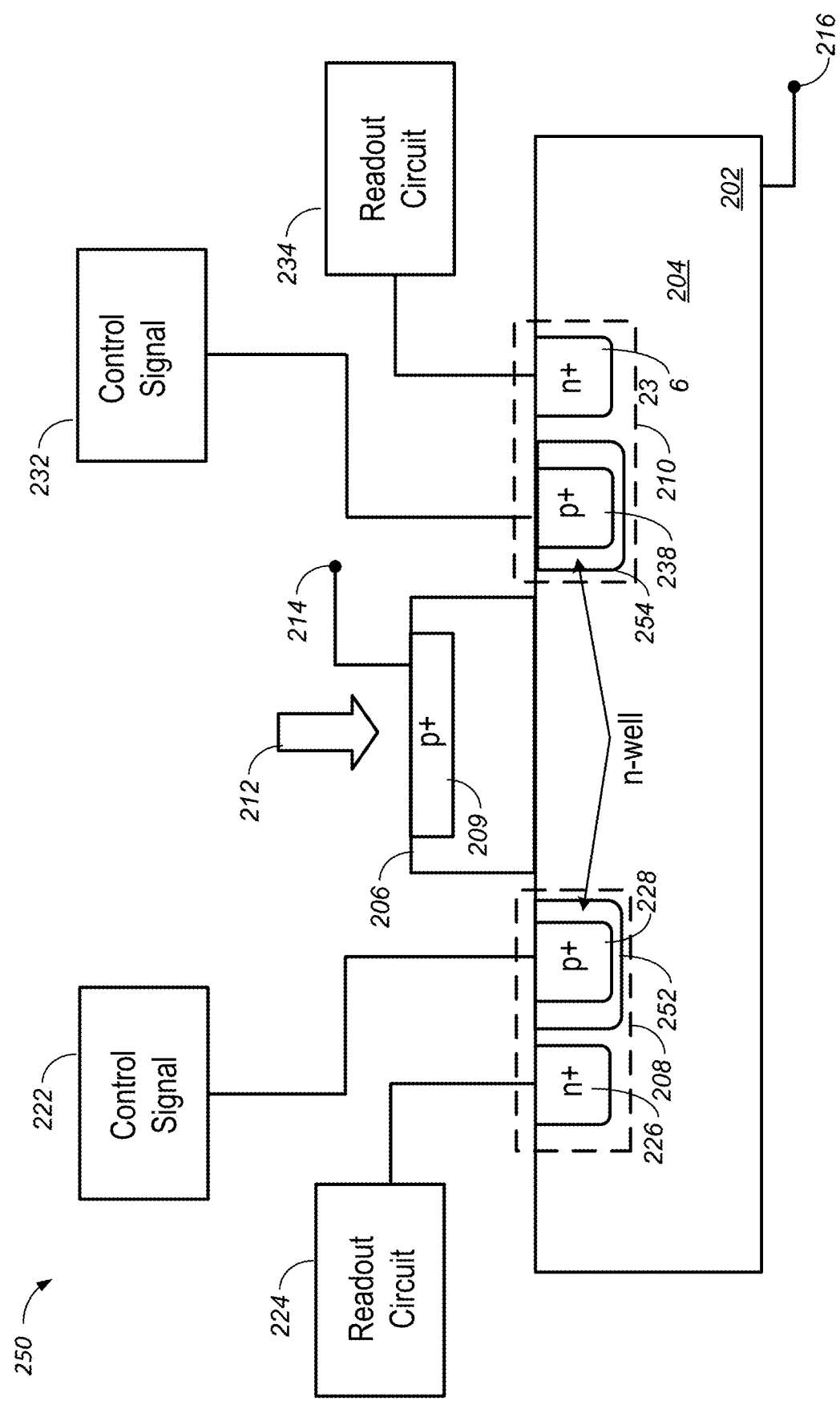

FIG. 2B is an example switched photodetector 250 for converting an optical signal to an electrical signal. The switched photodetector 250 is similar to the switched photodetector 200 in FIG. 2A, but that the first switch 208 and the second switch 210 further includes an n-well region 252 and an n-well region 254, respectively. In addition, the absorption layer 206 may be a p-doped region and the substrate 202 may be a p-doped substrate. In some implementations, the doping level of the n-well regions 252 and 254 may range from 1015 cm−3 to 1017 cm−3. The doping level of the absorption layer 206 and the substrate 202 may range from 1014 cm−3 to 1016 cm−3.

The arrangement of the p-doped region 228, the n-well region 252, the p-doped substrate 202, the n-well region 254, and the p-doped region 238 forms a PNPNP junction structure. In general, the PNPNP junction structure reduces a leakage current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224.

In some implementations, the p-doped region 228 is formed entirely within the n-well region 252. In some other implementations, the p-doped region 228 is partially formed in the n-well region 252. For example, a portion of the p-doped region 228 may be formed by implanting the p-dopants in the n-well region 252, while another portion of the p-doped region 228 may be formed by implanting the p-dopants in the substrate 202. Similarly, in some implementations, the p-doped region 238 is formed entirely within the n-well region 254. In some other implementations, the p-doped region 238 is partially formed in the n-well region 254. In some implementations, the depth of the n-well regions 252 and 254 is shallower than the p-doped regions 228 and 238.

Figure 2C:
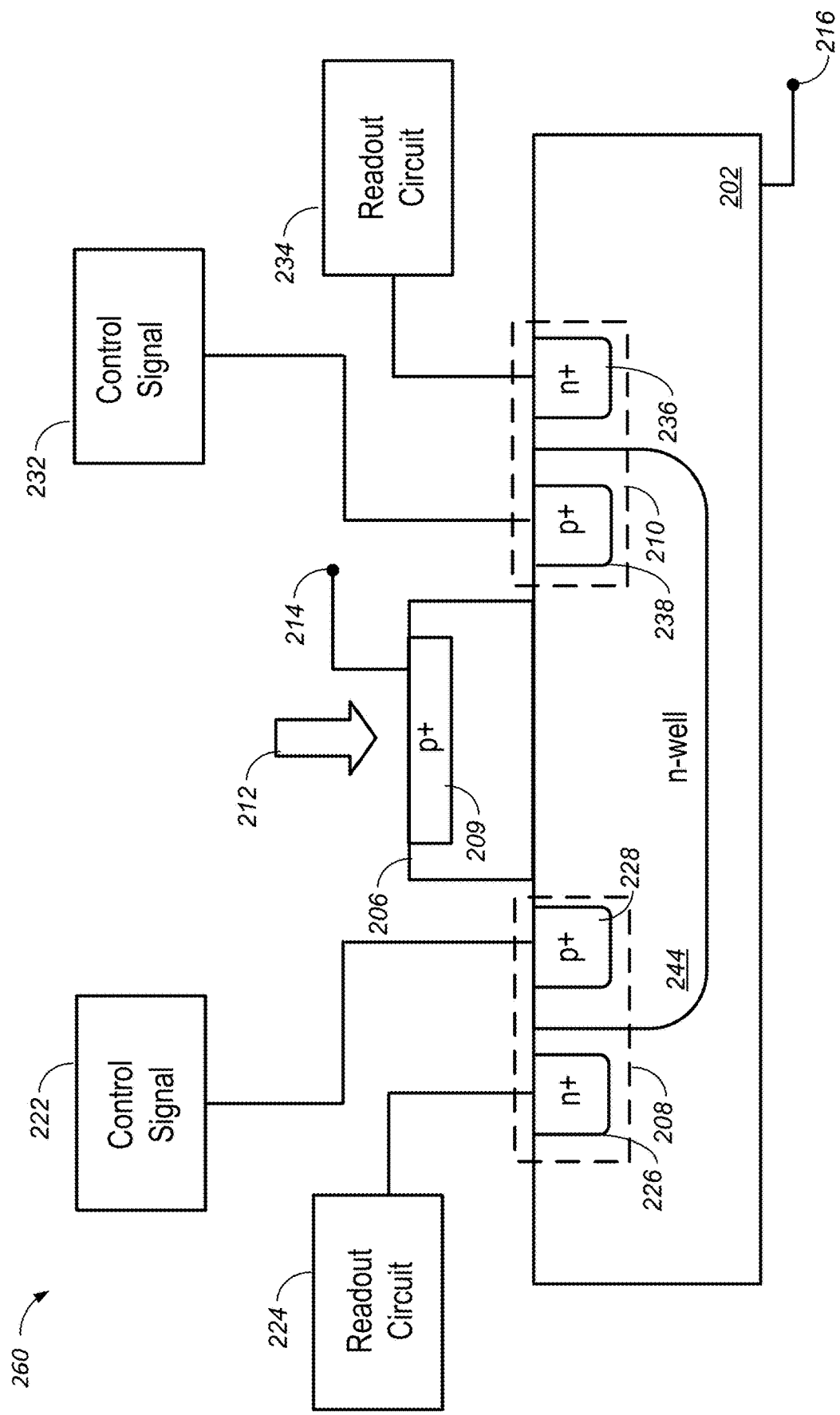

FIG. 2C is an example switched photodetector 260 for converting an optical signal to an electrical signal. The switched photodetector 260 is similar to the switched photodetector 200 in FIG. 2A, but that the substrate 202 further includes an n-well region 244. In addition, the absorption layer 206 may be a p-doped region and the substrate 202 may be a p-doped substrate. In some implementations, the doping level of the n-well region 244 may range from 1015 cm−3 to 1017 cm−3. The doping level of the absorption layer 206 and the substrate 202 may range from 1014 cm−3 to 1016 cm−3.

The arrangement of the p-doped region 228, the n-well region 244, and the p-doped region 238 forms a PNP junction structure. In general, the PNP junction structure reduces a leakage current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224. In some implementations, if the depth of the n-well 244 is deep, the arrangement of the n-doped region 226, the p-doped substrate 202, the n-well region 244, the p-doped substrate 202, and the n-doped region 236 forms an NPNPN junction structure, which further reduces a charge coupling from the first readout circuit 224 to the second readout circuit 234, or alternatively from the second readout circuit 234 to the first readout circuit 224. In some implementations, the n-well region 244 also effectively reduces the potential energy barrier perceived by the electrons flowing from the absorption layer 206 to the substrate 202.

In some implementations, the p-doped regions 228 and 238 are formed entirely within the n-well region 244. In some other implementations, the p-doped regions 228 and 238 are partially formed in the n-well region 244. For example, a portion of the p-doped region 228 may be formed by implanting the p-dopants in the n-well region 244, while another portion of the p-doped region 228 may be formed by implanting the p-dopants in the substrate 202. In some implementations, the depth of the n-well region 244 is shallower than the p-doped regions 228 and 238.

Figure 2D:
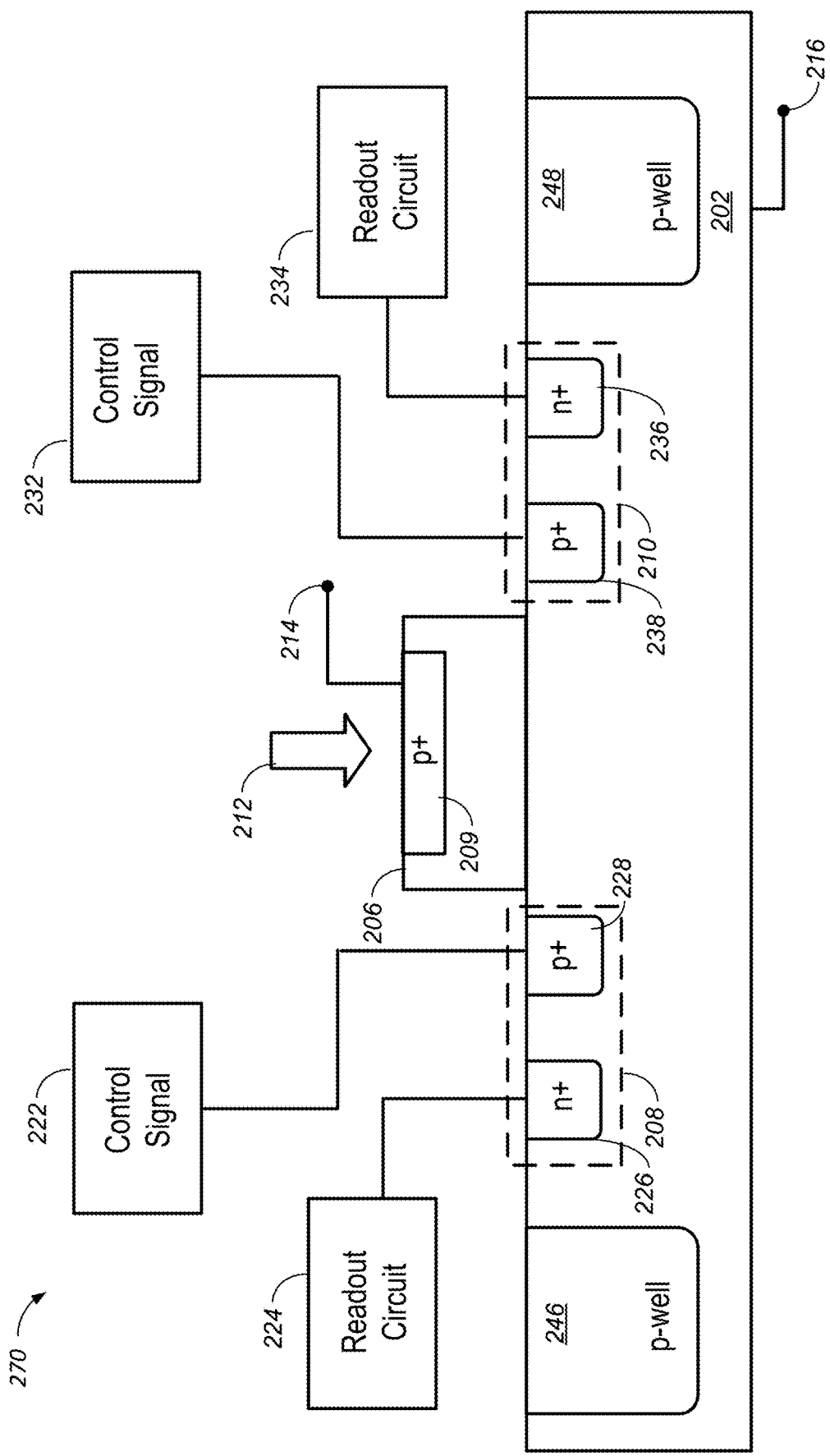

FIG. 2D is an example switched photodetector 270 for converting an optical signal to an electrical signal. The switched photodetector 270 is similar to the switched photodetector 200 in FIG. 2A, but that the switched photodetector 270 further includes one or more p-well regions 246 and one or more p-well regions 248. In some implementations, the one or more p-well regions 246 and the one or more p-well regions 248 may be part of a ring structure that surrounds the first switch 208 and the second switch 210. In some implementations, the doping level of the one or more p-well regions 246 and 248 may range from 1015 cm−3 to 1020 cm−3. The one or more p-well regions 246 and 248 may be used as an isolation of photo-electrons from the neighboring pixels.

Although not shown in FIG. 2A-2D, in some implementations, an optical signal may reach to the switched photodetector from the backside of the substrate 202. One or more optical components (e.g., microlens or lightguide) may be fabricated on the backside of the substrate 202 to focus, collimate, defocus, filter, or otherwise manipulate the optical signal.

Although not shown in FIG. 2A-2D, in some other implementations, the first switch 208 and the second switch 210 may alternatively be fabricated to collect holes instead of electrons. In this case, the p-doped region 228, the p-doped region 238, and the p-doped region 209 would be replaced by n-doped regions, and the n-doped region 226 and the n-doped region 236 would be replaced by p-doped regions. The n-well regions 252, 254, and 244 would be replaced by p-well regions. The p-well regions 246 and 248 would be replaced by n-well regions.

Although not shown in FIG. 2A-2D, in some implementations, the absorption layer 206 may be bonded to a substrate after the fabrication of the switched photodetector 200, 250, 260, and 270. The carrier substrate may be any material that allows the transmission of the optical signal 212 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 212.

Although not shown in FIGS. 2A-2D, in some implementations, the switched photodetector 200, 250, 260, and 270 may be bonded (e.g., metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 202. Adding such a mirror like metal layer may increase the absorption efficiency (quantum efficiency) of the absorption layer 206. For example, the absorption efficiency of photodetectors operating at a longer NIR wavelength between 1.0 µm and 1.6 µm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 208 and 210 can be added for interfacing control signals/readout circuits.

Although not shown in FIG. 2A-2D, in some implementations, the absorption layer 206 may be partially or fully embedded/recessed in the substrate 202 to relieve the surface topography and so ease the fabrication process. An example of the embedment technique is described in U.S. Patent Publication No. US20170040362 A1.

Figure 3A:
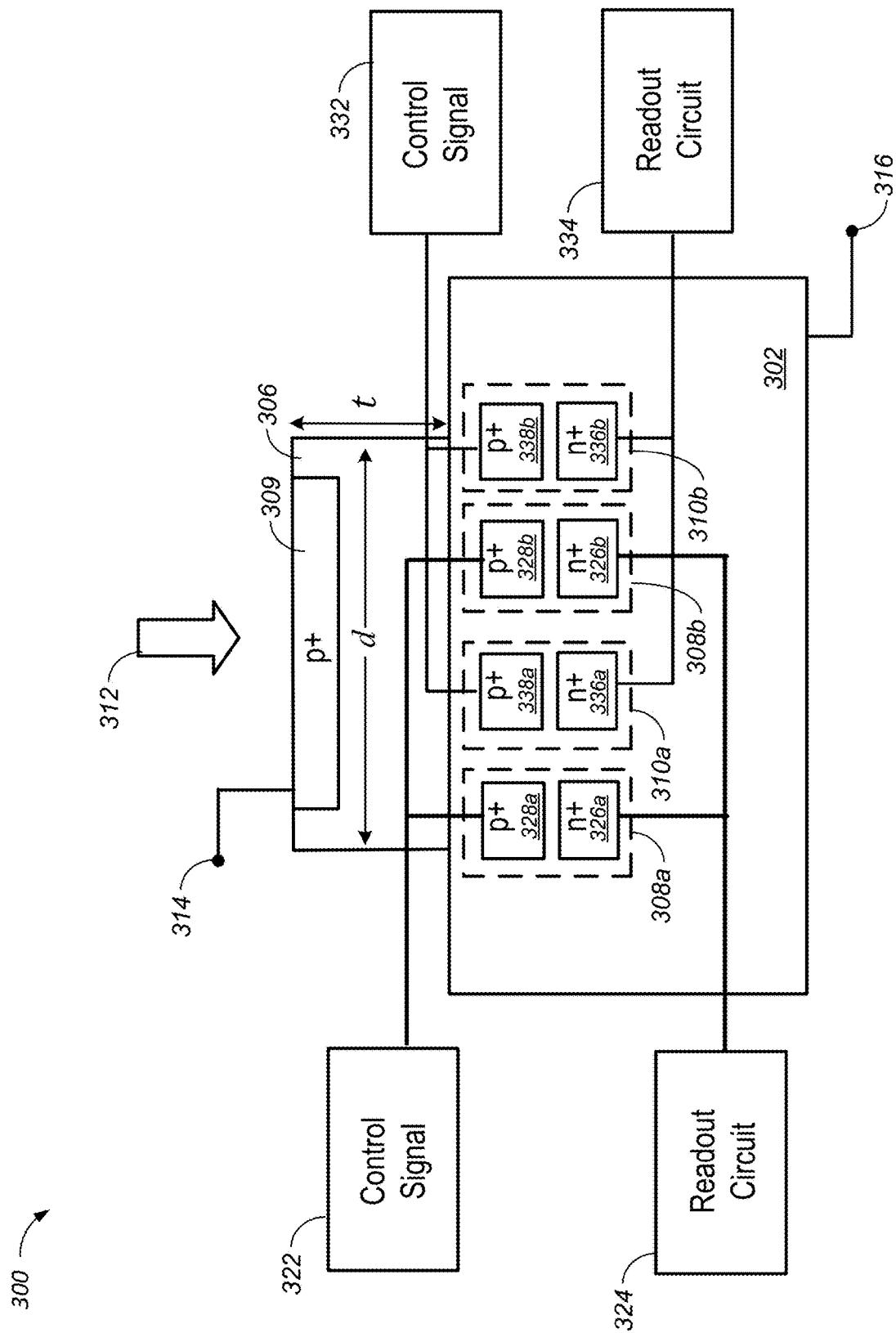
FIGS. 3A, 3B, 3C, and 3D are examples of a switched photodetector.

FIG. 3A is an example switched photodetector 300 for converting an optical signal to an electrical signal, where first switches 308a and 308b, and second switch 310a and 310b are fabricated in a vertical arrangement on a substrate 302. One characteristic with the switched photodetector 100 or the switched photodetector 200 is that the larger the optical window size d, the longer the photo-electron transit time required for an electron drifts or diffuses from one switch to the other switch. The operation speed of the photodetector may therefore be affected. The switched photodetector 300 may further improve the operation speed by arranging the p-doped regions and the n-doped regions of the switches in a vertical arrangement. Using this vertical arrangement, the photo-electron transit distance is limited mostly by the thickness t (e.g., ~1 µm) of the absorption layer instead of the window size d (e.g., ~10 µm) of the absorption layer. The switched photodetector 300 includes an absorption layer 306 fabricated on a substrate 302. The substrate 302 may be any suitable substrate where semiconductor devices can be fabricated on. For example, the substrate 302 may be a silicon substrate.

In general, the absorption layer 306 receives an optical signal 312 and converts the optical signal 312 into electrical signals. The absorption layer 306 is similar to the absorption layer 206. The absorption layer 306 may be intrinsic, p-type, or n-type. In some implementations, the absorption layer 306 may be formed from a p-type GeSi material. In some implementations, the absorption layer 306 may include a p-doped region 309. The p-doped region 309 is similar to the p-doped region 209.

First switches 308a and 308b, and second switches 310a and 310b have been fabricated in the substrate 302. Notably, although FIG. 3A only shows two first switches 308a and 308b and two second switches 310a and 310b, the number of first switches and second switches may be more or less. The first switches 308a and 308b are coupled to a first control signal 322 and a first readout circuit 324. The second switches 310a and 310b are coupled to a second control signal 332 and a second readout circuit 334.

In general, the first control signal 322 and the second control signal 332 control whether the electrons or the holes generated by the absorbed photons are collected by the first readout circuit 324 or the second readout circuit 334. The first control signal 322 is similar to the first control signal 122. The second control signal 332 is similar to the second control signal 132. The first readout circuit 324 is similar to the first readout circuit 124. The second readout circuit 334 is similar to the second readout circuit 134. In some implementations, the first switches 308a and 308b, and the second switches 310a and 310b may be fabricated to collect electrons generated by the absorption layer 306. In this case, the first switches 308a and 308b include p-doped regions 328a and 328b, and n-doped regions 326a and 326b, respectively. For example, the p-doped regions 328a and 328b may have a p+ doping, where the activated dopant concentration may be as high as a fabrication process may achieve, e.g., the peak concentration may be about 2×1020 cm−3 when the substrate 302 is silicon and doped with boron. In some implementation, the doping concentration of the p-doped regions 328a and 328b may be lower than 2×1020 cm−3 to ease the fabrication complexity at the expense of an increased contact resistance. The n-doped regions 326a and 326b may have an n+ doping, where the activated dopant concentration may be as high as a fabrication process may achieve, e.g., the peak concentration may be about 5×1020 cm−3 when the substrate 302 is silicon and doped with phosphorous. In some implementation, the doping concentration of the n-doped regions 326a and 326b may be lower than 5×1020 cm−3 to ease the fabrication complexity at the expense of an increased contact resistance. The distance between the p-doped region 328a and the n-doped region 326a may be designed based on fabrication process design rules. For example, the distance between the p-doped region 328a and the n-doped region 326a may be controlled by the energies associated with the dopant implants. In general, the closer the distance between the p-doped regions 328a/328b and the n-doped regions 326a/326b, the higher the switching efficiency of the generated photo-carriers. The second switches 310a and 310b includes p-doped regions 338a and 338b, and n-doped regions 336a and 336b, respectively. The p-doped regions 338a/338b are similar to the p-doped regions 328a/328b, and the n-doped regions 336a/336b are similar to the n-doped region 326a/326b.

In some implementations, the p-doped regions 328a and 328b are coupled to the first control signal 322. The n-doped regions 326a and 326b are coupled to the readout circuit 324. The p-doped regions 338a and 338b are coupled to the second control signal 332. The n-doped regions 336a and 336b are coupled to the readout circuit 334. The first control signal 322 and the second control signal 332 are used to control the collection of electrons generated by the absorbed photons. For example, when the absorption layer 306 absorbs photons in the optical signal 312, electron-hole pairs are generated and drift or diffuse into the substrate 302. When voltages are used, if the first control signal 322 is biased against the second control signal 332, electric fields are created between the p-doped region 309 and the p-doped regions 328a/328b or the p-doped regions 338a/338b, and free electrons from the absorption layer 306 drift towards the p-doped regions 328a/328b or the p-doped regions 338a/338b depending on the directions of the electric fields. In some implementations, the first control signal 322 may be fixed at a voltage value Vi, and the second control signal 332 may alternate between voltage values Vi±ΔV. The direction of the bias value determines the drift direction of the electrons. Accordingly, when one group of switches (e.g., first switches 308a and 308b) are switched "on" (i.e., the electrons drift towards the p-doped regions 328a and 328b), the other group of switches (e.g., the second switches 310a and 310b) are switched "off" (i.e., the electrons are blocked from the p-doped regions 338a and 338b). In some implementations, the first control signal 322 and the second control signal 332 may be voltages that are differential to each other.

In each of the first switches 308a/308b, an electric field is created between the p-doped region 328a/328b and the n-doped region 326a/326b. Similarly, in each of the second switches 310a/310b, an electric field is created between the p-doped region 338a/338b and the n-doped region 336a/336b. When the first switches 308a and 308b are switched "on" and the second switches 310a and 310b are switched "off", the electrons drift toward the p-doped regions 328a and 328b, and the electric field between the p-doped region 328a and the n-doped region 326a further carries the electrons to the n-doped region 326a. Similarly, the electric field between the p-doped region 328b and the n-doped region 326b further carries the electrons to the n-doped region 326b. The readout circuit 324 may then be enabled to process the charges collected by the n-doped regions 326a and 326b. On the other hand, when the second switches 310a and 310b are switched "on" and the first switches 308a and 308b are switched "off", the electrons drift toward the p-doped regions 338a and 338b, and the electric field between the p-doped region 338a and the n-doped region 336a further carries the electrons to the n-doped region 336a. Similarly, the electric field between the p-doped region 338b and the n-doped region 336b further carries the electrons to the n-doped region 336b. The readout circuit 334 may then be enabled to process the amount of charges collected by the n-doped regions 336a and 336b.

In some implementations, a voltage may be applied between the p-doped and the n-doped regions of a switch to operate the switch in an avalanche regime to increase the sensitivity of the switched photodetector 300. For example, in the case of a substrate 302 including GeSi, when the distance between the p-doped region 328a and the n-doped region 326a is about 100 nm, it is possible to apply a voltage that is less than 7 V to create an avalanche gain between the p-doped region 328a and the n-doped region 326a.

In some implementations, the p-doped region 309 may be coupled to an external control 314. For example, the p-doped region 309 may be coupled to ground. In some implementations, the p-doped region 309 may be floated and not coupled to any external control. In some implementations, the substrate 302 may be coupled to an external control 316. For example, the substrate 302 may be coupled to an electric ground, or a preset voltage less than the voltages at the n-doped regions 326 and 336. In some other implementations, the substrate 302 may be floated and not coupled to any external control.

Figure 3B:
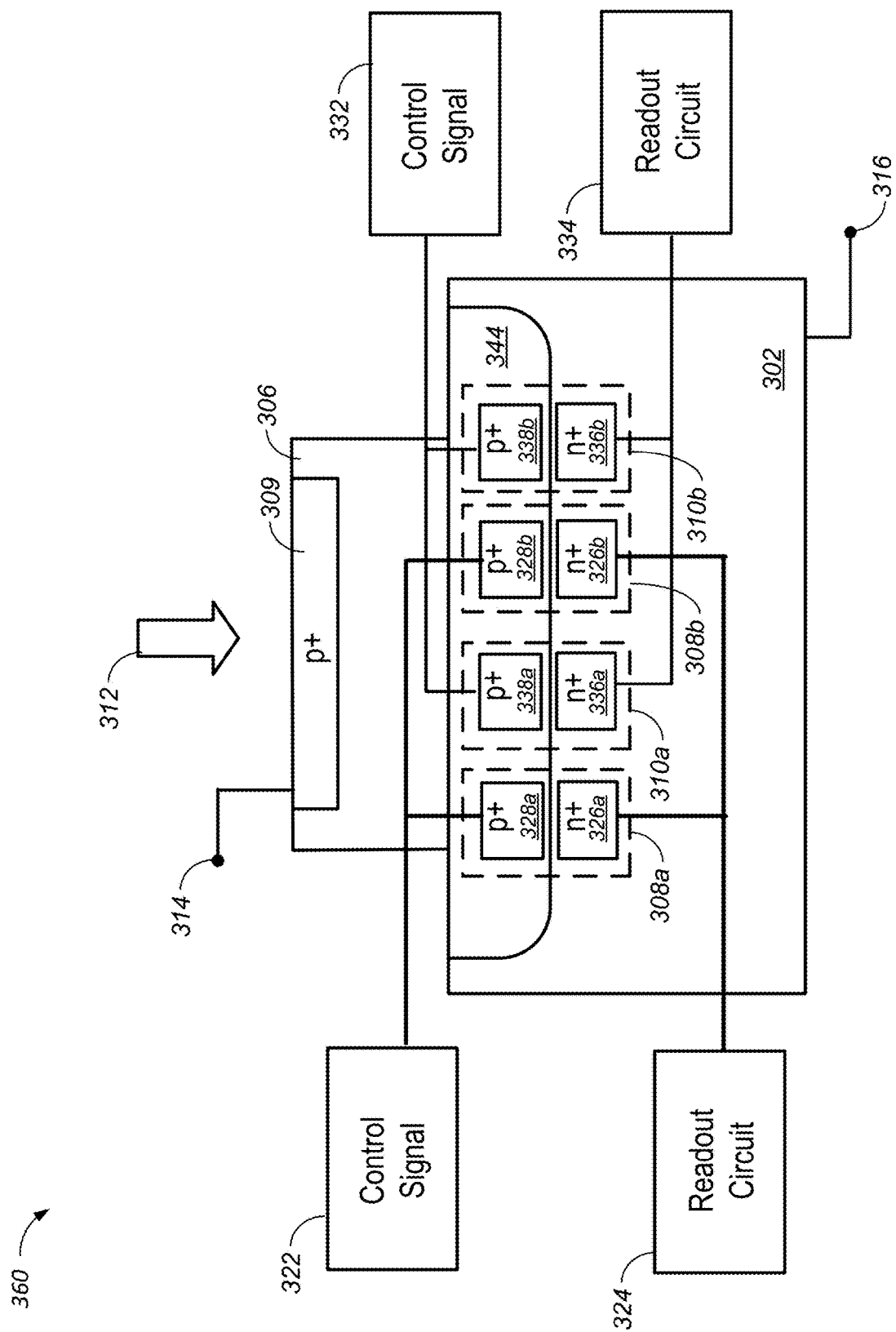

FIG. 3B is an example switched photodetector 360 for converting an optical signal to an electrical signal. The switched photodetector 360 is similar to the switched photodetector 300 in FIG. 3A, but that the switched photodetector 360 further includes an n-well region 344. In addition, the absorption layer 360 may be a p-doped region and the substrate 302 may be a p-doped substrate. In some implementations, the doping level of the n-well region 344 may range from 1015 cm−3 to 1017 cm−3. The doping level of the absorption layer 360 and the substrate 302 may range from 1014 cm−3 to 1016 cm−3.

The arrangement of the p-doped region 328a, the n-well region 344, and the p-doped region 338a forms a PNP junction structure. Similarly, the arrangement of the p-doped region 328b, the n-well region 344, and the p-doped region 338b forms another PNP junction structure. In general, the PNP junction structure reduces a leakage current from the first control signal 322 to the second control signal 332, or alternatively from the second control signal 332 to the first control signal 322. The arrangement of the n-doped region 326a, the p-doped substrate 302, and the n-doped region 336a forms an NPN junction structure. Similarly, the arrangement of the n-doped region 326b, the p-doped substrate 302, and the n-doped region 336b forms an NPN junction structure. In general, the NPN junction structure reduces a charge coupling from the first readout circuit 324 to the second readout circuit 334, or alternatively from the second readout circuit 334 to the first readout circuit 324. In some implementations, the n-well region 344 also effectively reduces the potential energy barrier perceived by the electrons flowing from the absorption layer 306 to the substrate 302.

In some implementations, the p-doped regions 328a, 338a, 328b, and 338b are formed entirely within the n-well region 344. In some other implementations, the p-doped regions 328a, 338a, 328b, and 338b are partially formed in the n-well region 344. For example, a portion of the p-doped region 328a may be formed by implanting the p-dopants in the n-well region 344, while another portion of the p-doped region 328a may be formed by implanting the p-dopants in the substrate 302. In some implementations, the depth of the n-well region 344 is shallower than the p-doped regions 328a, 338a, 328b, and 338b.

Figure 3C:
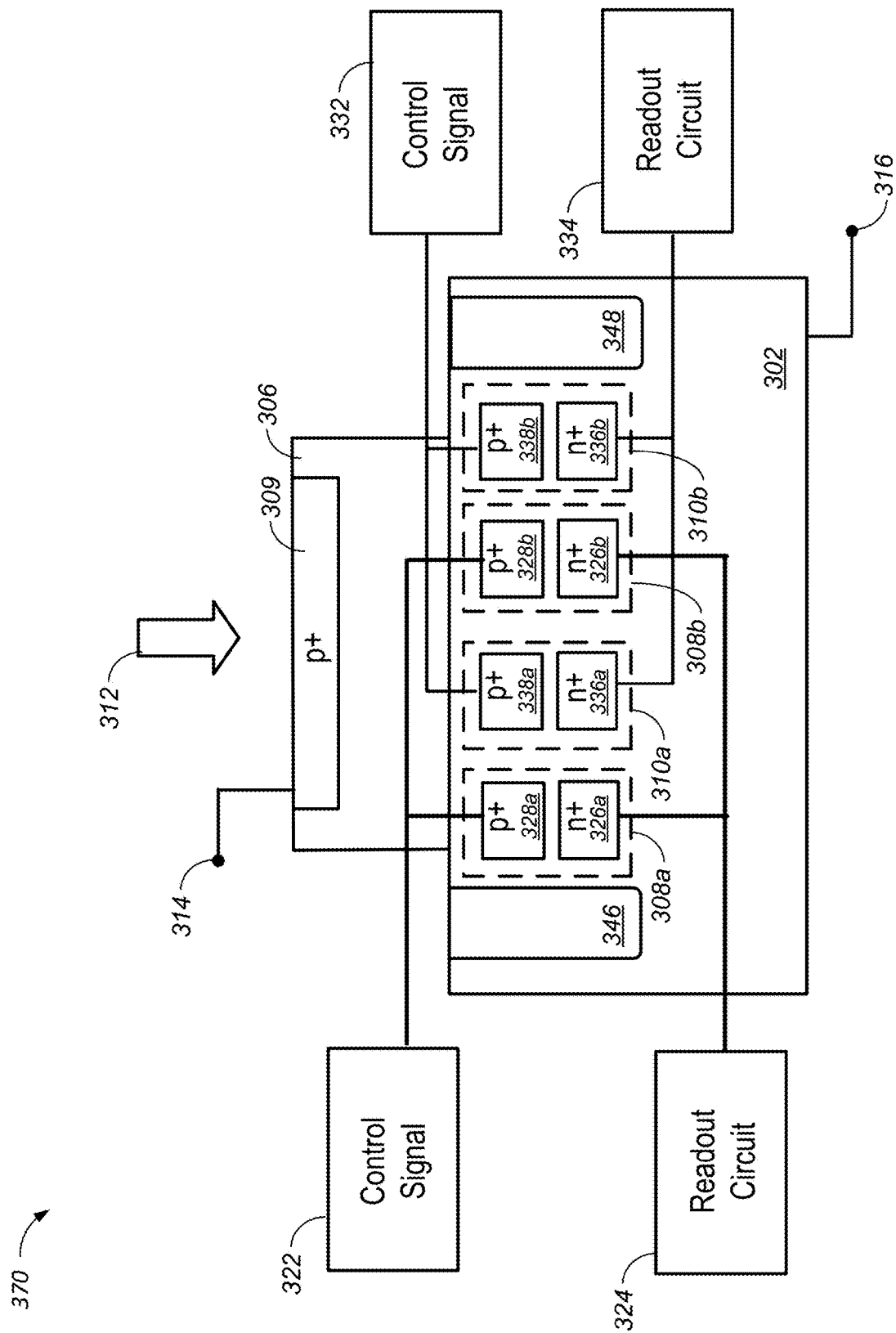

FIG. 3C is an example switched photodetector 370 for converting an optical signal to an electrical signal. The switched photodetector 370 is similar to the switched photodetector 300 in FIG. 3A, but that the switched photodetector 370 further includes one or more p-well regions 346 and one or more p-well regions 348. In some implementations, the one or more p well regions 346 and the one or more p-well regions 348 may be part of a ring structure that surrounds the first switches 308a and 308b, and the second switches 310a and 310b. In some implementations, the doping level of the one or more p-well regions may range from 1015 cm−3 to 1020 cm−3. The one or more p-well regions 346 and 348 may be used as an isolation of photo-electrons from the neighboring pixels.

Figure 3D:
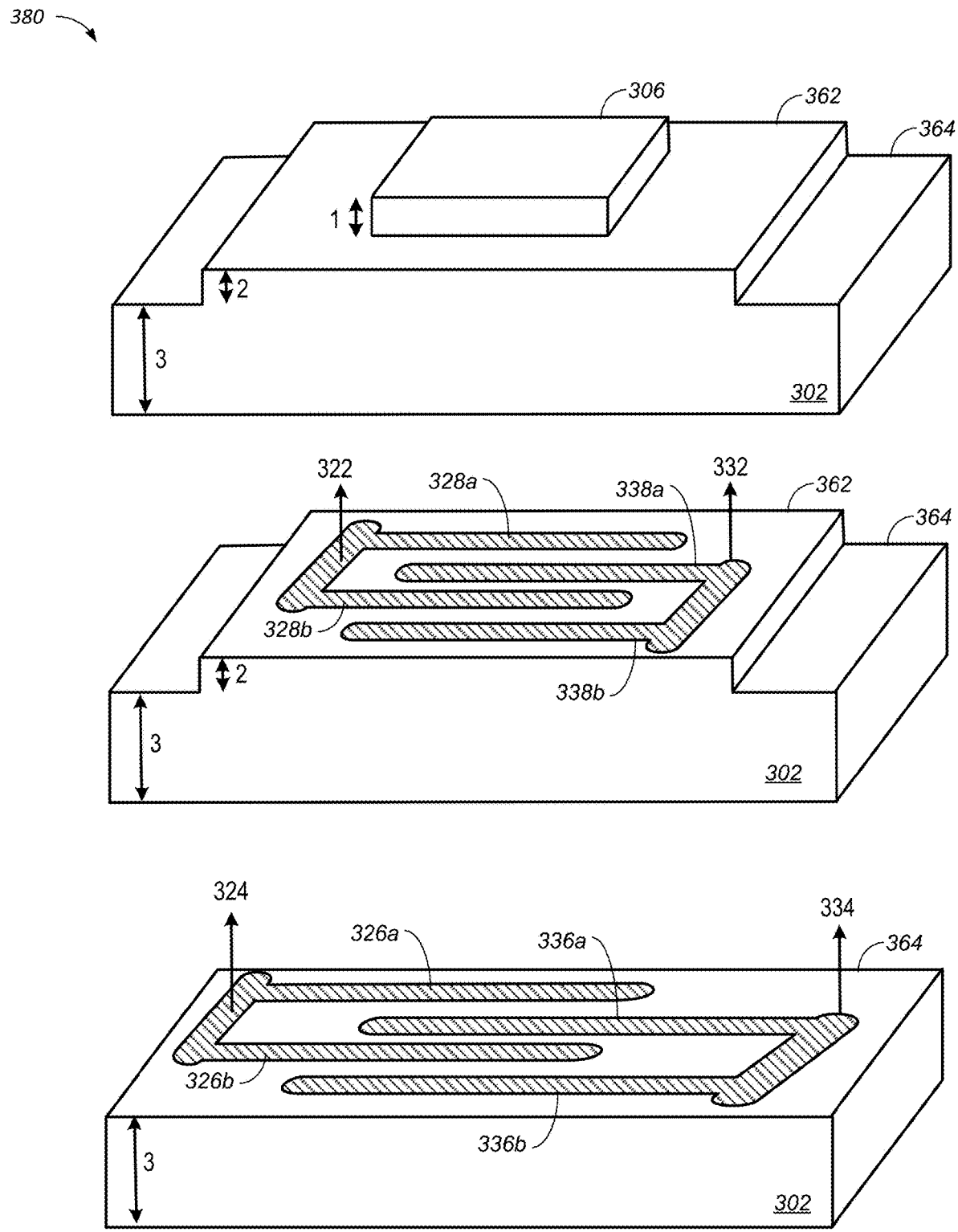

FIG. 3D shows cross-sectional views of the example switched photodetector 380. FIG. 3D shows that the p-doped regions 328a and 328b of the first switches 308a and 308b, and the p-doped regions 338a and 338b of the second switches 310a and 310b may be arranged on a first plane 362 of the substrate 302 in an interdigitated arrangement. FIG. 3D further shows that the n-doped regions 326a and 326b of the first switches 308a and 308b, and the n-doped regions 336a and 336b of the second switches 310a and 310b may be arranged on a second plane 364 of the substrate 302 in an interdigitated arrangement.

Although not shown in FIG. 3A-3D, in some implementations, an optical signal may reach to the switched photodetector from the backside of the substrate 302. One or more optical components (e.g., microlens or lightguide) may be fabricated on the backside of the substrate 302 to focus, collimate, defocus, filter, or otherwise manipulate the optical signal.

Although not shown in FIG. 3A-3D, in some other implementations, the first switches 308a and 308b, and the second switches 310a and 310b may alternatively be fabricated to collect holes instead of electrons. In this case, the p-doped regions 328a and 328b, the p-doped regions 338a and 338b, and the p-doped region 309 would be replaced by n-doped regions, and the n-doped regions 326a and 326b, and the n-doped regions 336a and 336b would be replaced by p-doped regions. The n-well region 344 would be replaced by a p-well region. The p-well regions 346 and 348 would be replaced by n-well regions.

Although not shown in FIG. 3A-3D, in some implementations, the absorption layer 306 may be bonded to a substrate after the fabrication of the switched photodetector 300, 360, 370, and 380. The substrate may be any material that allows the transmission of the optical signal 312 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 312.

Although not shown in FIGS. 3A-3D, in some implementations, the switched photodetector 300, 360, 370, and 380 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 302. Adding such a mirror like metal layer may increase the absorption efficiency (quantum efficiency) of the absorption layer 306. For example, the absorption efficiency of photodetectors operating at a longer NIR wavelength between 1.0 µm and 1.6 µm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 308a (or 308b) and 310a (or 310b) can be added for interfacing control signals/readout circuits.

Although not shown in FIG. 3A-3D, in some implementations, the absorption layer 306 may be partially or fully embedded/recessed in the substrate 302 to relieve the surface topography and so ease the fabrication process. An example of the embedment technique is described in U.S. Patent Publication No. US20170040362 A1.

Figure 4A:
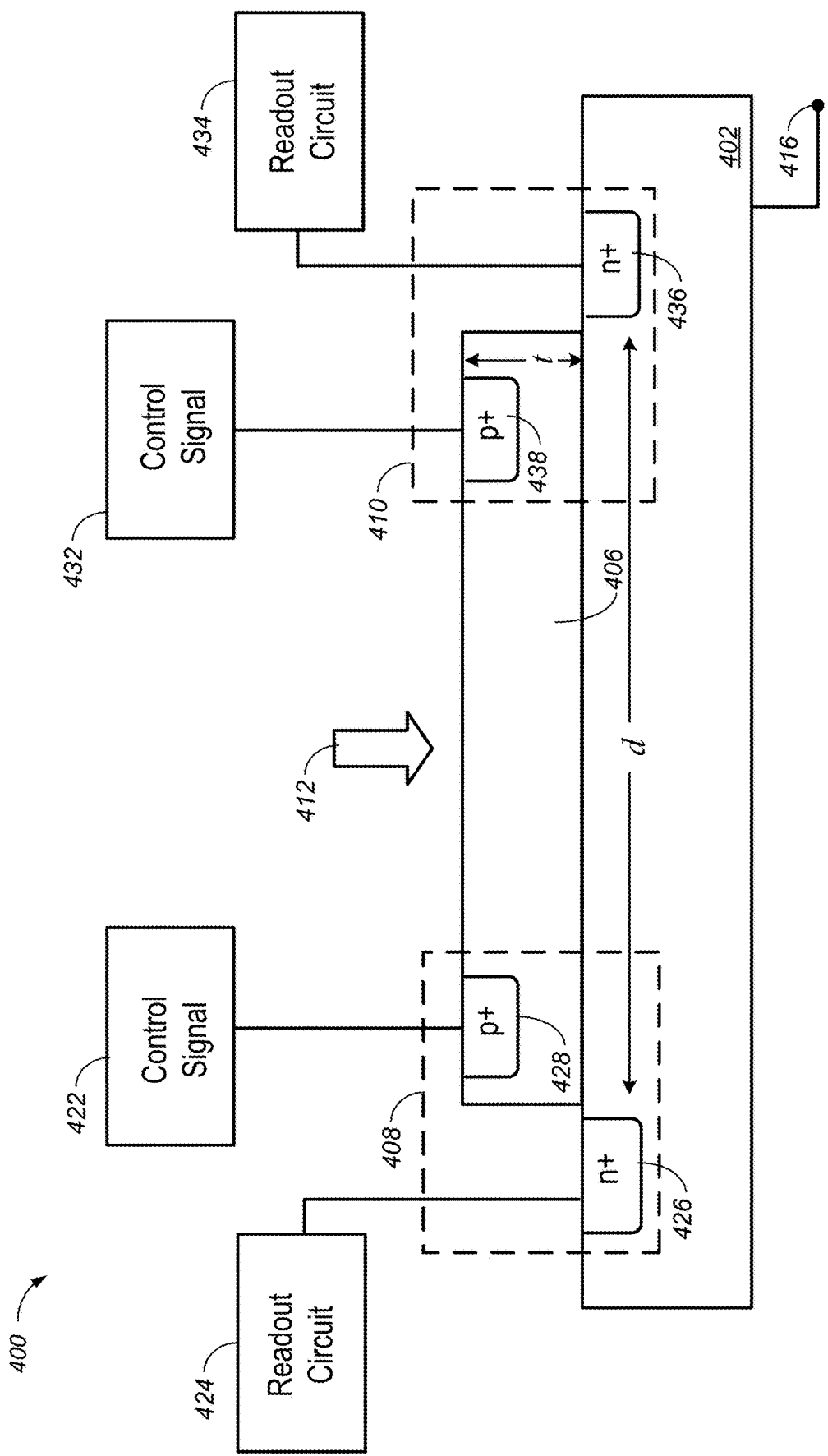
FIGS. 4A, 4B, 4C, 4D, and 4E are examples of a switched photodetector.

FIG. 4A is an example switched photodetector 400 for converting an optical signal to an electrical signal. The switched photodetector 400 includes an absorption layer 406 fabricated on a substrate 402. The substrate 402 may be any suitable substrate where semiconductor devices can be fabricated on. For example, the substrate 402 may be a silicon substrate. The absorption layer 406 includes a first switch 408 and a second switch 410.

In general, the absorption layer 406 receives an optical signal 412 and converts the optical signal 412 into electrical signals. The absorption layer 406 may be intrinsic, p-type, or n-type. In some implementations, the absorption layer 406 may be formed from a p-type GeSi material. The absorption layer 406 is selected to have a high absorption coefficient at the desired wavelength range. For NIR wavelengths, the absorption layer 406 may be a GeSi mesa, where the GeSi absorbs photons in the optical signal 412 and generates electron-hole pairs. The material composition of germanium and silicon in the GeSi mesa may be selected for specific processes or applications. In some implementations, the absorption layer 406 is designed to have a thickness t. For example, for 850 nm or 940 nm wavelength, the thickness of the GeSi mesa may be approximately 1 µm to have a substantial quantum efficiency. In some implementations, the surface of the absorption layer 406 is designed to have a specific shape. For example, the GeSi mesa may be circular, square, or rectangular depending on the spatial profile of the optical signal 412 on the surface of the GeSi mesa. In some implementations, the absorption layer 406 is designed to have a lateral dimension d for receiving the optical signal 412. For example, the GeSi mesa may have a circular or a rectangular shape, where d can range from 1 µm to 50 µm.

A first switch 408 and a second switch 410 have been fabricated in the absorption layer 406 and the substrate 402. The first switch 408 is coupled to a first control signal 422 and a first readout circuit 424. The second switch 410 is coupled to a second control signal 432 and a second readout circuit 434. In general, the first control signal 422 and the second control signal 432 control whether the electrons or the holes generated by the absorbed photons are collected by the first readout circuit 424 or the second readout circuit 434.

In some implementations, the first switch 408 and the second switch 410 may be fabricated to collect electrons. In this case, the first switch 408 includes a p-doped region 428 implanted in the absorption layer 406 and an n-doped region 426 implanted in the substrate 402. For example, the p-doped region 428 may have a p+ doping, where the activated dopant concentration may be as high as a fabrication process may achieve, e.g., the peak concentration may be about 5×1020 cm−3 when the absorption layer 106 is germanium and doped with boron. In some implementation, the doping concentration of the p-doped region 428 may be lower than 5×1020 cm−3 to ease the fabrication complexity at the expense of an increased contact resistance. The n-doped region 426 may have an n+ doping, where the activated dopant concentration may be as high as a fabrication process may achieve, e.g., e.g., the peak concentration may be about 5×1020 cm−3 when the substrate 402 is silicon and doped with phosphorous. In some implementation, the doping concentration of the n-doped region 426 may be lower than 5×1020 cm−3 to ease the fabrication complexity at the expense of an increased contact resistance. The distance between the p-doped region 428 and the n-doped region 426 may be designed based on fabrication process design rules. In general, the closer the distance between the p-doped region 428 and the n-doped region 426, the higher the switching efficiency of the generated photo-carriers. The second switch 410 includes a p-doped region 438 and an n-doped region 436. The p-doped region 438 is similar to the p-doped region 428, and the n-doped region 436 is similar to the n-doped region 426.

In some implementations, the p-doped region 428 is coupled to the first control signal 422. For example, the p-doped region 428 may be coupled to a voltage source, where the first control signal 422 may be an AC voltage signal from the voltage source. In some implementations, the n-doped region 426 is coupled to the readout circuit 424. The readout circuit 424 may be in a three-transistor configuration consisting of a reset gate, a source-follower, and a selection gate, a circuit including four or more transistors, or any suitable circuitry for processing charges. In some implementations, the readout circuit 424 may be fabricated on the substrate 402. In some other implementations, the readout circuit 424 may be fabricated on another substrate and integrated/co-packaged with the switched photodetector 400 via die/wafer bonding or stacking.

The p-doped region 438 is coupled to the second control signal 432. For example, the p-doped region 438 may be coupled to a voltage source, where the second control signal 432 may be an AC voltage signal having an opposite phase from the first control signal 422. In some implementations, the n-doped region 436 is coupled to the readout circuit 434. The readout circuit 434 may be similar to the readout circuit 424.

The first control signal 422 and the second control signal 432 are used to control the collection of electrons generated by the absorbed photons. For example, when voltages are used, if the first control signal 422 is biased against the second control signal 432, an electric field is created between the p-doped region 428 and the p-doped region 438, and free electrons drift towards the p-doped region 428 or the p-doped region 438 depending on the direction of the electric field. In some implementations, the first control signal 422 may be fixed at a voltage value Vi, and the second control signal 432 may alternate between voltage values Vi±ΔV. The direction of the bias value determines the drift direction of the electrons. Accordingly, when one switch (e.g., the first switch 408) is switched "on" (i.e., the electrons drift towards the p-doped region 428), the other switch (e.g., the second switch 410) is switched "off" (i.e. the electrons are blocked from the p-doped region 438). In some implementations, the first control signal 422 and the second control signal 432 may be voltages that are differential to each other.

In general, a difference (before equilibrium) between the Fermi level of a p-doped region and the Fermi level of an n-doped region creates an electric field between the two regions. In the first switch 408, an electric field is created between the p-doped region 428 and the n-doped region 426. Similarly, in the second switch 410, an electric field is created between the p-doped region 438 and the n-doped region 436. When the first switch 408 is switched "on" and the second switch 410 is switched "off", the electrons drift toward the p-doped region 428, and the electric field between the p-doped region 428 and the n-doped region 426 further carries the electrons to the n-doped region 426. The readout circuit 424 may then be enabled to process the charges collected by the n-doped region 426. On the other hand, when the second switch 410 is switched "on" and the first switch 408 is switched "off", the electrons drift toward the p-doped region 438, and the electric field between the p-doped region 438 and the n-doped region 436 further carries the electrons to the n-doped region 436. The readout circuit 434 may then be enabled to process the charges collected by the n-doped region 436.

In some implementations, the substrate 402 may be coupled to an external control 416. For example, the substrate 402 may be coupled to an electrical ground, or a preset voltage less than the voltages at the n-doped regions 426 and 436. In some other implementations, the substrate 402 may be floated and not coupled to any external control.

Figure 4B:
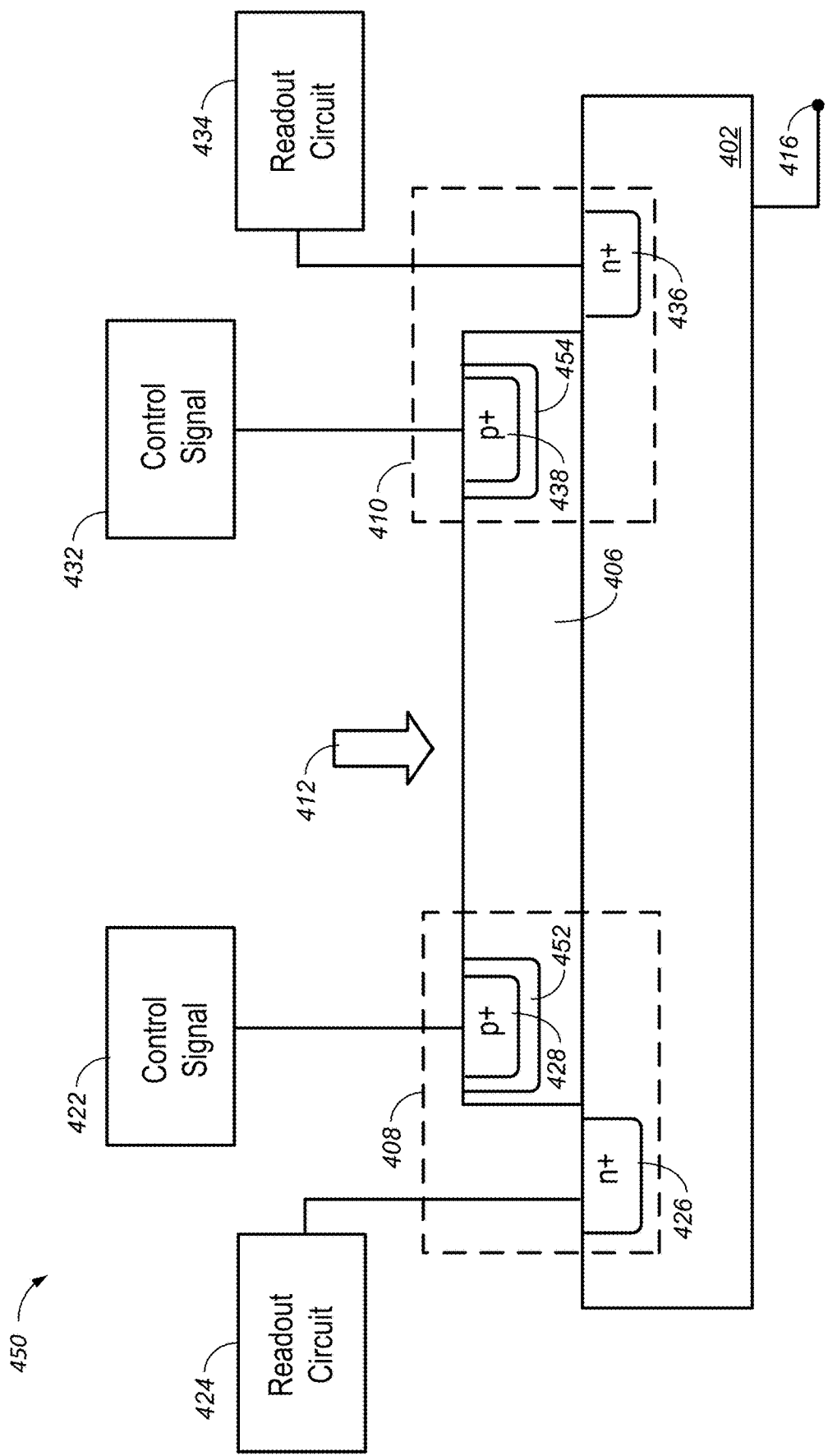

FIG. 4B is an example switched photodetector 450 for converting an optical signal to an electrical signal. The switched photodetector 450 is similar to the switched photodetector 400 in FIG. 4A, but that the first switch 408 and the second switch 410 further includes an n-well region 452 and an n-well region 454, respectively. In addition, the absorption layer 406 may be a p-doped layer and the substrate 402 may be a p-doped substrate. In some implementations, the doping level of the n-well regions 452 and 454 may range from 1015 cm−3 to 1017 cm−3. The doping level of the absorption layer 406 and the substrate 402 may range from 1014 cm−3 to 1016 cm−3.

The arrangement of the p-doped region 428, the n-well region 452, the absorption layer 406, the n-well region 454, and the p-doped region 438 forms a PNPNP junction structure. In general, the PNPNP junction structure reduces a leakage current from the first control signal 422 to the second control signal 432, or alternatively from the second control signal 432 to the first control signal 422.

The arrangement of the n-doped region 426, the p-doped substrate 402, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped region 428 is formed entirely within the n-well region 452. In some other implementations, the p-doped region 428 is partially formed in the n-well region 452. For example, a portion of the p-doped region 428 may be formed by implanting the p-dopants in the n-well region 452, while another portion of the p-doped region 428 may be formed by implanting the p-dopants in the absorption layer 406. Similarly, in some implementations, the p-doped region 438 is formed entirely within the n-well region 454. In some other implementations, the p-doped region 438 is partially formed in the n-well region 454. In some implementations, the depth of the n-well regions 452 and 454 is shallower than the p-doped regions 428 and 438.

Figure 4C:
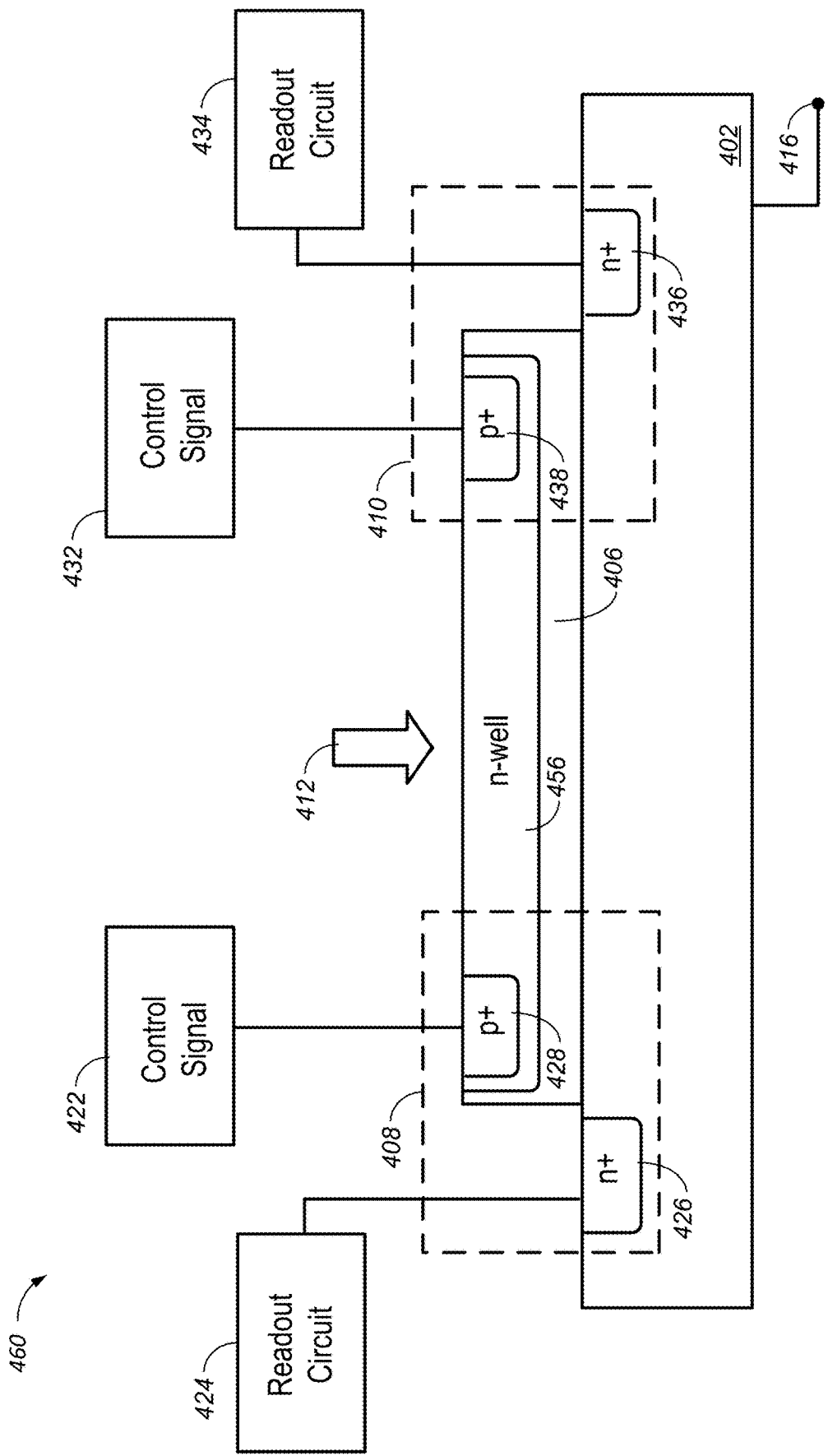

FIG. 4C is an example switched photodetector 460 for converting an optical signal to an electrical signal. The switched photodetector 460 is similar to the switched photodetector 400 in FIG. 4A, but that the absorption layer 406 further includes an n-well region 456. In addition, the absorption layer 406 may be a p-doped region and the substrate 402 may be a p-doped substrate. In some implementations, the doping level of the n-well region 456 may range from 1015 cm−3 to 1017 cm−3. The doping level of the absorption layer 406 and the substrate 402 may range from 1014 cm−3 to 1016 cm−3.

The arrangement of the p-doped region 428, the n-well region 456, and the p-doped region 438 forms a PNP junction structure. In general, the PNP junction structure reduces a leakage current from the first control signal 422 to the second control signal 432, or alternatively from the second control signal 432 to the first control signal 422.

The arrangement of the n-doped region 426, the p-doped absorption layer 406, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped regions 428 and 438 are formed entirely within the n-well region 456. In some other implementations, the p-doped regions 428 and 438 are partially formed in the n-well region 456. For example, a portion of the p-doped region 428 may be formed by implanting the p-dopants in the n-well region 456, while another portion of the p-doped region 428 may be formed by implanting the p-dopants in the absorption layer 406. In some implementations, the depth of the n-well region 456 is shallower than the p-doped regions 428 and 438.

Figure 4D:
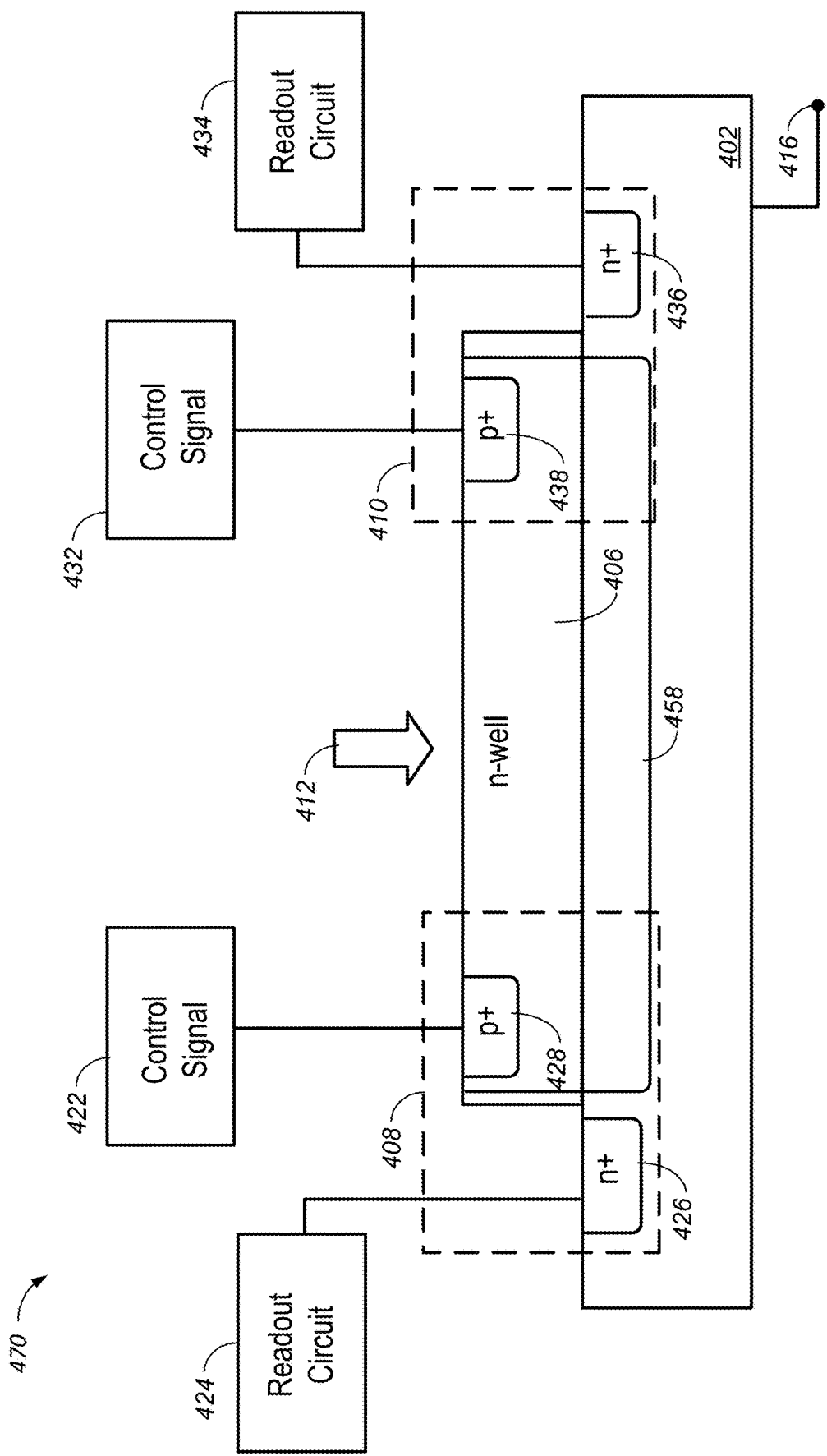

FIG. 4D is an example switched photodetector 470 for converting an optical signal to an electrical signal. The switched photodetector 470 is similar to the switched photodetector 460 in FIG. 4C, but that the n-well region 458 is formed to extend from the absorption layer 406 into the substrate 202. In addition, the absorption layer 406 may be a p-doped region and the substrate 402 may be a p-doped substrate. In some implementations, the doping level of the n-well region 456 may range from 1015 cm−3 to 1017 cm−3. The doping level of the absorption layer 406 and the substrate 402 may range from 1014 cm−3 to 1016 cm−3.

The arrangement of the p-doped region 428, the n-well region 458, and the p-doped region 438 forms a PNP junction structure, which further reduces a leakage current from the first control signal 422 to the second control signal 432, or alternatively from the second control signal 432 to the first control signal 422. The arrangement of the n-doped region 426, the p-doped substrate 402, the n-well region 458, the p-doped substrate 402, and the n-doped region 436 forms an NPNPN junction structure, which further reduces a charge coupling from the first readout circuit 424 to the second readout circuit 434, or alternatively from the second readout circuit 434 to the first readout circuit 424. In some implementations, the n-well region 458 also effectively reduces the potential energy barrier perceived by the electrons flowing from the absorption layer 406 to the substrate 402.

Figure 4E:
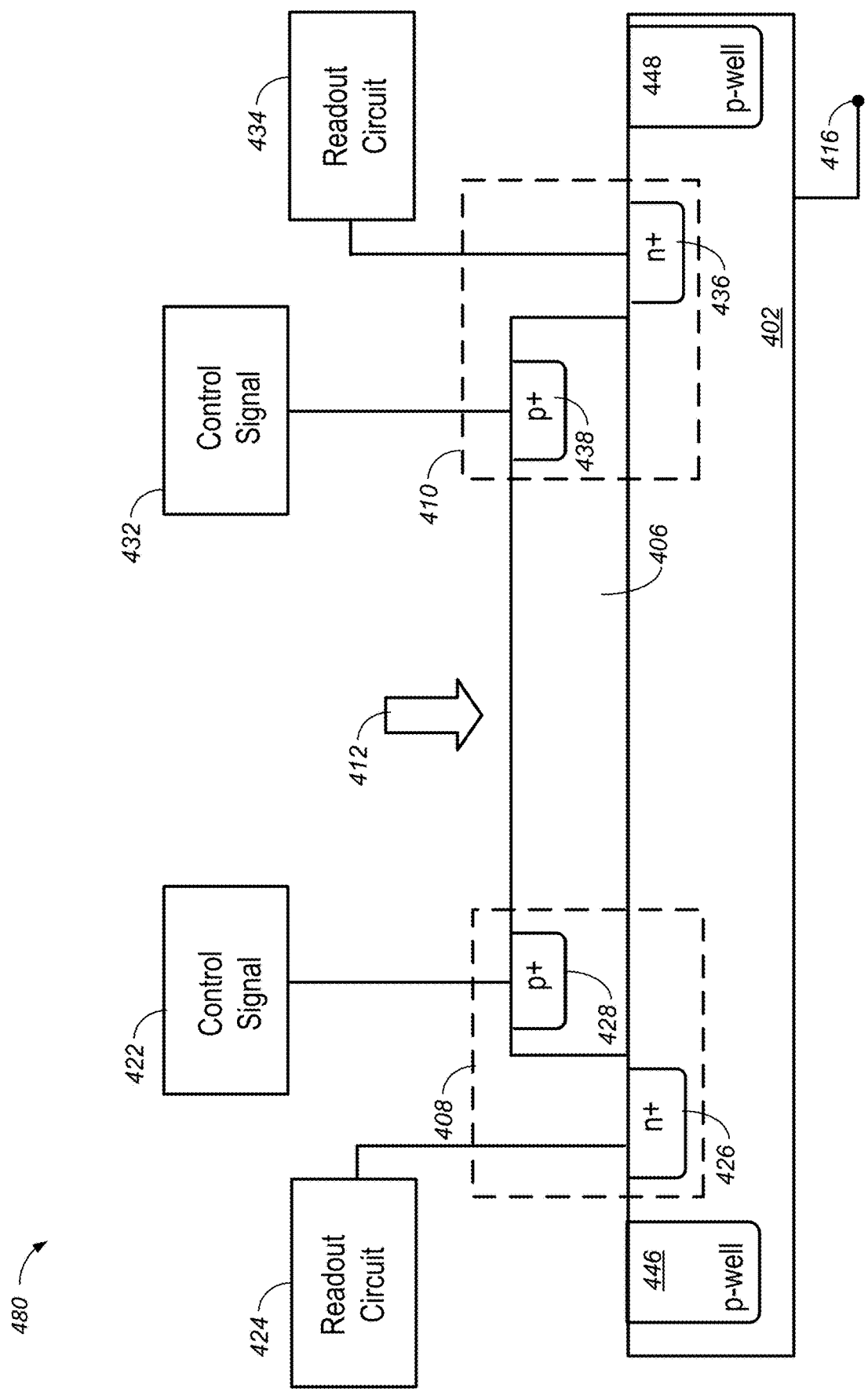

FIG. 4E is an example switched photodetector 480 for converting an optical signal to an electrical signal. The switched photodetector 480 is similar to the switched photodetector 400 in FIG. 4A, but that the switched photodetector 480 further includes one or more p-well regions 446 and one or more p-well regions 448. In some implementations, the one or more p-well regions 446 and the one or more p-well regions 448 may be part of a ring structure that surrounds the first switch 408 and the second switch 410. In some implementations, the doping level of the one or more p-well regions 446 and 448 may range from 1015 cm−3 to 1020 cm−3. The one or more p-well regions 446 and 448 may be used as an isolation of photo-electrons from the neighboring pixels.

Although not shown in FIG. 4A-4E, in some implementations, an optical signal may reach to the switched photodetector from the backside of the substrate 402. One or more optical components (e.g., microlens or lightguide) may be fabricated on the backside of the substrate 402 to focus, collimate, defocus, filter, or otherwise manipulate the optical signal.

Although not shown in FIG. 4A-4E, in some other implementations, the first switch 408 and the second switch 410 may alternatively be fabricated to collect holes instead of electrons. In this case, the p-doped region 428 and the p-doped region 438 would be replaced by n-doped regions, and the n-doped region 426 and the n-doped region 436 would be replaced by p-doped regions. The n-well regions 452, 454, 456, and 458 would be replaced by p-well regions. The p-well regions 446 and 448 would be replaced by n-well regions.

Although not shown in FIG. 4A-4E, in some implementations, the absorption layer 406 may be bonded to a substrate after the fabrication of the switched photodetector 400, 450, 460, 470, and 480. The substrate may be any material that allows the transmission of the optical signal 412 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 412.

Although not shown in FIGS. 4A-4E, in some implementations, the switched photodetector 400, 450, 460, 470, and 480 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 402. Adding such a mirror like metal layer may increase the absorption efficiency (quantum efficiency) of the absorption layer 406. For example, the absorption efficiency of photodetectors operating at a longer NIR wavelength between 1.0 µm and 1.6 µm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 408 and 410 can be added for interfacing control signals/readout circuits.

Although not shown in FIG. 4A-4E, in some implementations, the absorption layer 406 may be partially or fully embedded/recessed in the substrate 402 to relieve the surface topography and so ease the fabrication process. An example of the embedment technique is described in U.S. Patent Publication No. US20170040362 A1.

Figure 4F:
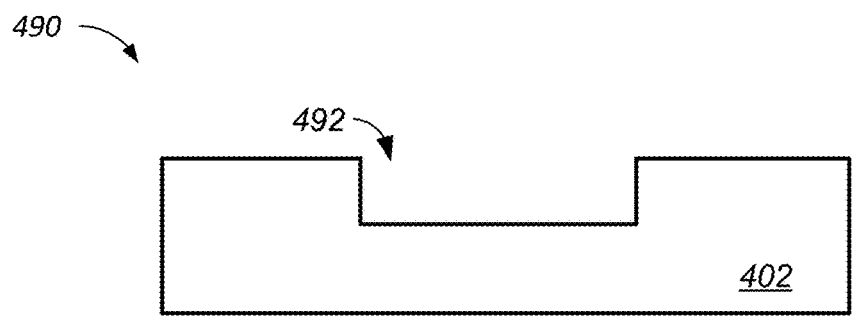
FIGS. 4F-4I illustrate an example design for selectively forming an absorption layer on a substrate.

FIGS. 4F-4I illustrate an example design 490 for selectively forming an absorption layer on a substrate. The design 490 may be used to fabricate the switched photodetectors described in FIGS. 1A-4E, for example. Referring to FIG. 4F, a recess 492 is formed on the substrate 402. The recess 492 may define the photodetector area for an NIR pixel. The recess may be formed using lithography followed by a dry etching of the substrate 402. The shape of the recess may correspond to the shape of the pixel, such as a square, a circle, or other suitable shapes.

Figure 4G:
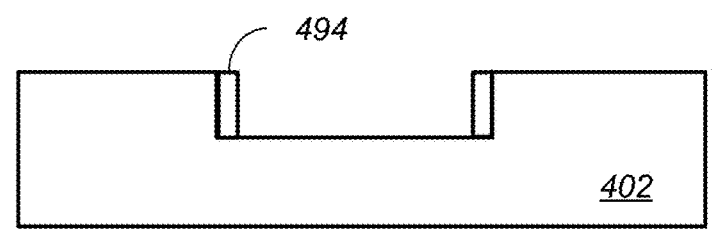

Referring to FIG. 4G, a dielectric layer may be deposited over the substrate, and a directional etch may be performed to form a sidewall spacer 494. The directional etch may be an anisotropic dry etch. The spacers 494 may be a dielectric material such as various oxides and nitrides that separates the sidewalls of an absorption layer that will be formed from the substrate 402. In some implementations, the spacers 494 may be omitted, and an embedded portion of the absorption layer to be formed may be in direct contact with a surface of the recess 492 formed in the substrate 402, such as a sidewall of a silicon substrate.

Figure 4H:
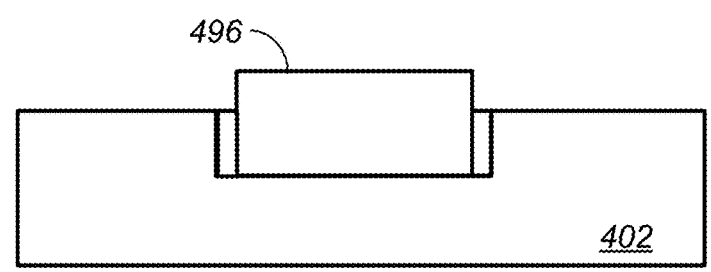

Referring to FIG. 4H, a germanium or germanium-silicon absorption layer 496 is selectively grown from the substrate 402. For example, the absorption layer 496 may be formed using epitaxial growth through chemical vapor deposition (CVD) system. The resulting absorption layer 496 is partially embedded in the recess 492 formed on the substrate 402. The absorption layer 496 may be the absorption layers of the switched photodetectors described in FIGS. 1A-4E, for example.

Figure 4I:
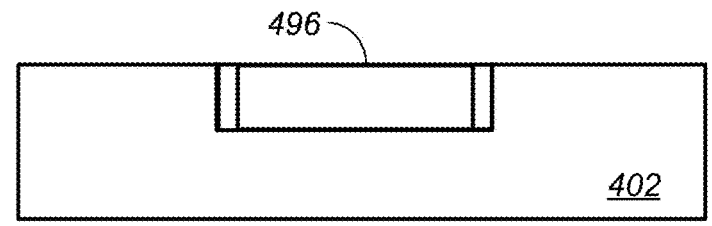

Referring to FIG. 4I, the germanium or germanium-silicon absorption layer 496 is planarized with the substrate 402, resulting in a fully-embedded absorption layer 496. The germanium or germanium-silicon absorption layer 496 may be planarized using chemical mechanical polishing (CMP) or any other suitable techniques. In some implementations, the planarization of the germanium or germanium-silicon absorption layer 496 with respect to the surface of the substrate 402 may be omitted if the surface topography is acceptable for subsequent fabrication process steps.

Figure 5A:
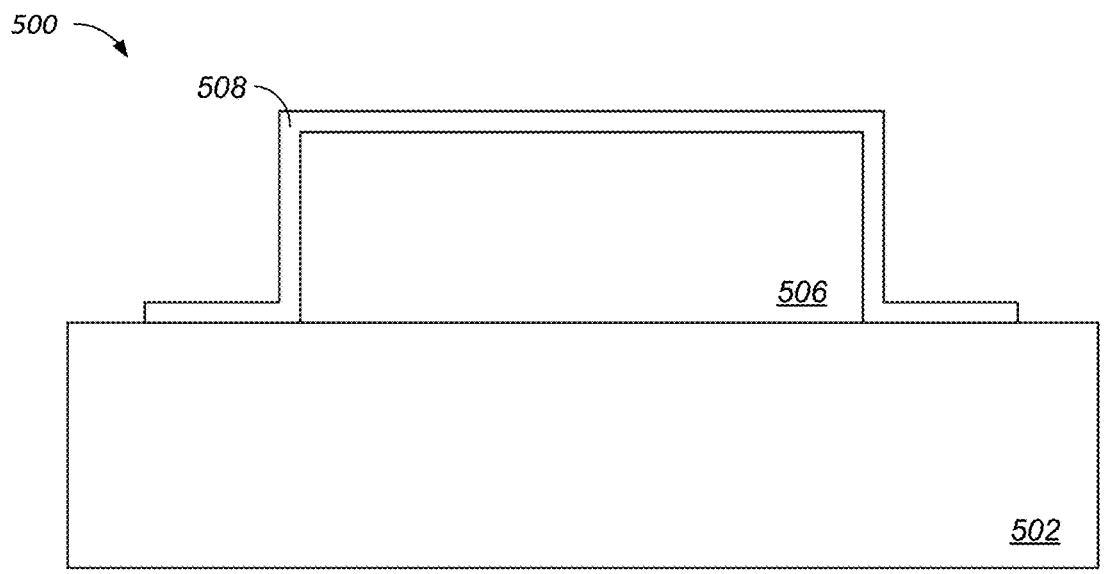
FIGS. 5A-5C are examples of a photodetector.

FIG. 5A shows an example photodetector 500 for converting an optical signal to an electrical signal. The photodetector 500 includes an absorption layer 506 fabricated on a substrate 502, and a first layer 508 formed on top of the absorption layer 506 and the substrate 502. The substrates 502 may be similar to the substrate 102 described previously, and the absorption layers 506 may be similar to the absorption layer 106 described previously, and may be formed, for example, from Ge or GeSi with Ge concentration ranging from 1-99%. The background doping polarity and doping level of the Ge or GeSi absorption layer 506 may be p-type and range from 1014 cm−3 to 1016 cm−3. The background doping level may be due to, for example, explicit incorporation of doping, or due to material defects introduced during formation of the absorption layer 506. The absorption layer 506 of the photodetector 500 has a mesa structure and is supported by the substrate 502, and while a vertical sidewall has been shown, the shape and sidewall profile of the mesa structure may depend on the specifics of the growth and fabrication process for the absorption layer 506.

The first layer 508 covers an upper surface and side surfaces of the absorption layer 506, and covers a portion of an upper surface of the substrate 502 on which the absorption layer 506 is formed. The first layer 508 may be formed from a Complementary Metal-Oxide-Semiconductor (CMOS) process compatible material (CPCM), such as amorphous silicon, polysilicon, epitaxial silicon, aluminum oxide family (e.g., Al2O3), silicon oxide family (e.g., SiO2), Ge oxide family (e.g., GeO2), germanium-silicon family (e.g., Ge0.4Si0.6), silicon nitride family (e.g., Si3N4), high-k materials (e.g. HfOx, ZnOx, LaOx, LaSiOx), and any combination thereof. The presence of the first layer 508 over the surfaces of the absorption layer 506 may have various effects. For example, the first layer 508 may act as a surface passivation layer to the absorption layer 506, which may reduce dark current or leakage current generated by defects present at the surface of the absorption layer 506. In the case of a germanium (Ge) or a germanium-silicon (GeSi) absorption layer 506, the surface defects may be a significant source of dark current or leakage current, which contributes to an increased noise level of the photocurrent generated by the photodetector 500. By forming the first layer 508 over the surfaces of the absorption layer 506, the dark current or leakage current may be reduced, thereby reducing the noise level of the photodetector 500. As another example, the first layer 508 may modulate a Schottky barrier level between a contact formed on the photodetector 500 and the absorption layer 506 and/or the substrate 502. This barrier modulation effect will be described at a later paragraph.

Figure 5B:
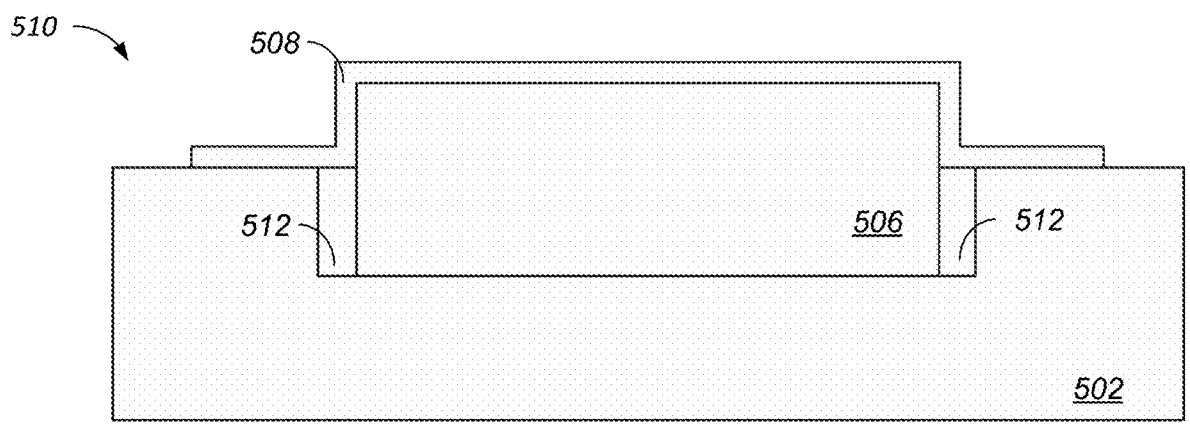

FIG. 5B shows an example photodetector 510 for converting an optical signal to an electrical signal. The photodetector 510 is similar to the photodetector 500 in FIG. 5A, but differs in that the absorption layer 506 is partially embedded in a recess formed on the substrate 502, and the photodetector 510 further includes spacers 512. The spacers 512 may be a dielectric material such as various oxides and nitrides that separates the sidewalls of the absorption layer 506 from the substrate 502. In some implementations, the spaces 512 may be omitted, and the embedded portion of the absorption layer 506 may be in direct contact with a surface of the recess formed in the substrate 502, such as a [110] sidewall of a silicon substrate. An example of the embedment technique is described in U.S. Patent Publication No. US20170040362 A1.

Figure 5C:
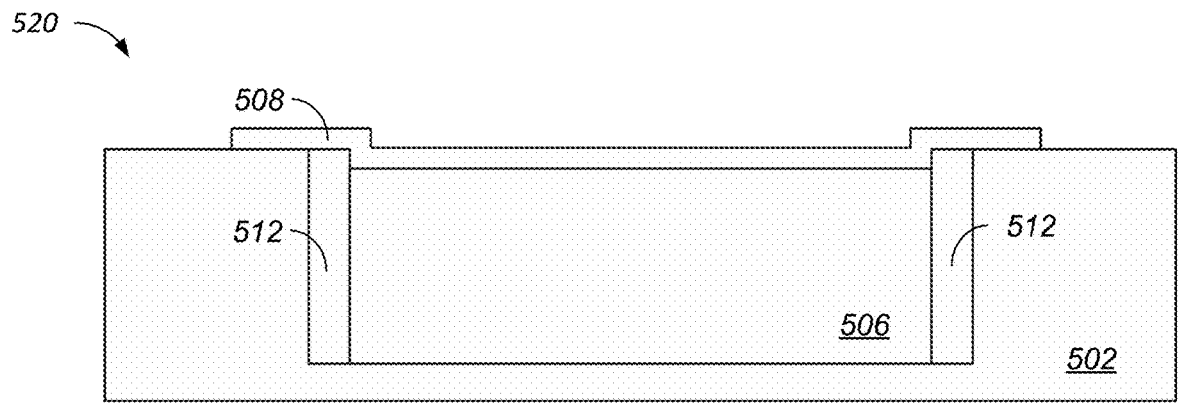

FIG. 5C shows an example photodetector 520 for converting an optical signal to an electrical signal. The photodetector 520 is similar to the photodetector 510 in FIG. 5B, but differs in that the absorption layer 506 is fully embedded in the recess formed on the substrate 502. An example of the embedment technique is described in U.S. Patent Publication No. US20170040362 A1.

Figure 5D:
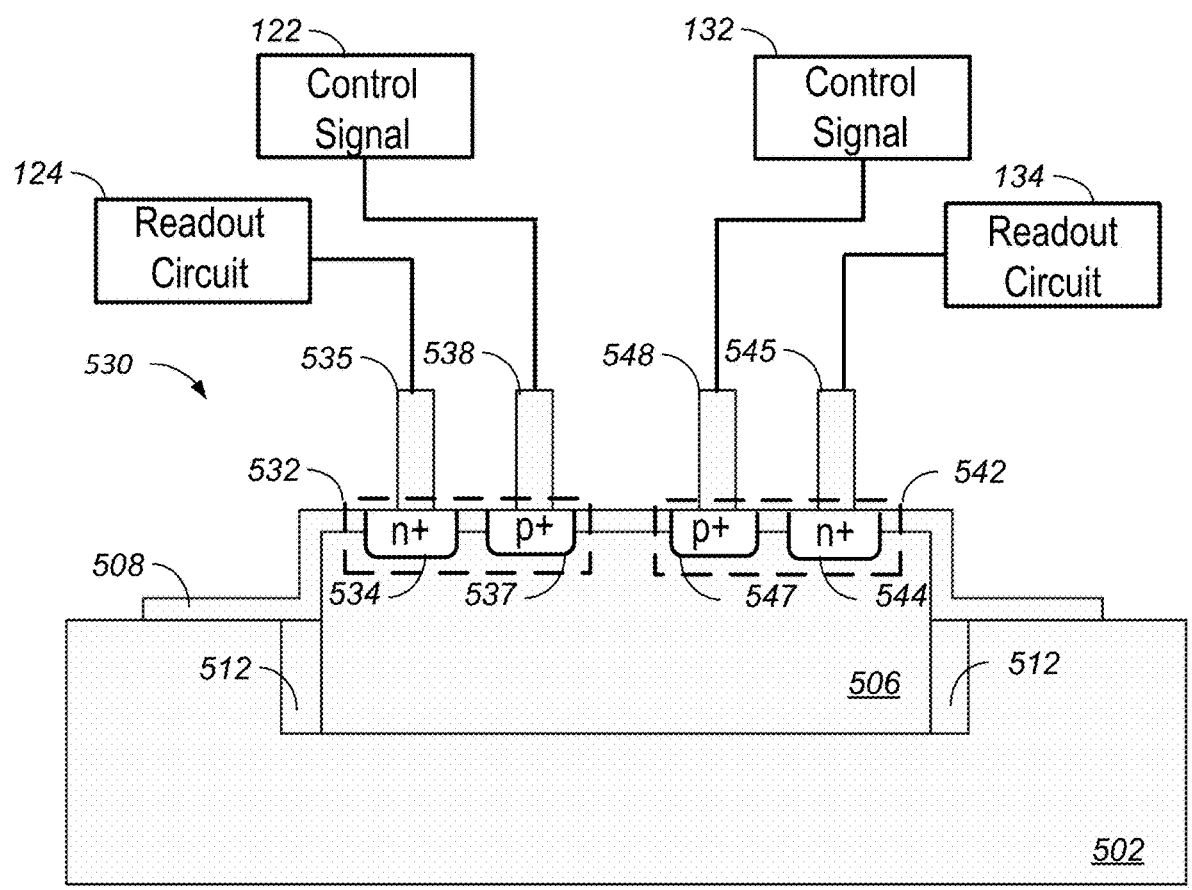
FIGS. 5D-5K are examples of a switched photodetector.

FIG. 5D shows an example switched photodetector 530 for converting an optical signal to an electrical signal. The switched photodetector 530 is similar to the photodetector 510 in FIG. 5B, but differs in that a first switch 532 and a second switch 542 have been fabricated in the absorption layer 506 and the first layer 508. The first switch 532 may be similar to the first switch 108 in FIG. 1A, but further includes a first readout contact 535 coupled to a first n-doped region 534 and a first control contact 538 coupled to a first p-doped region 537. Similarly, the second switch 542 may be similar to the second switch 110 in FIG. 1A, but further includes a second readout contact 545 coupled to a second n-doped region 544 and a second control contact 548 coupled to a second p-doped region 547. The first and second p-doped regions 537 and 547 may be control regions, and the first and second n-doped regions 534 and 544 may be readout regions. The first and second readout contacts 535 and 545 are connected to respective readout circuits similar to readout circuits 124 and 134 shown in FIG. 1A. The first and second control contacts 538 and 548 are connected to respective control signals, such as the control signals 122 and 132 shown in FIG. 1A.

The contacts 535, 538, 545, and 548 provide electrical contacts to the respective doped regions, and may be formed from various electrically conducting materials. Examples of contact materials include various silicides, Ta—TaN—Cu stack, Ti—TiN—W stack, aluminum, and various combinations of such materials. In some implementations, the readout contacts 535 and 545 may be formed from different materials than the control contacts 538 and 548. The contacts 535, 538, 545, and 548 may have various physical configurations. The dimensions of the contacts may range from being as small as 10's of nanometers in diameter or width. While a single contact 535, 538, 545, or 548 are shown to be coupled to each of the doped regions, two or more contacts may be coupled to the doped regions to, for example, reduce contact resistance or improve reliability, as is customary in semiconductor device manufacturing process.

Figure 5E:
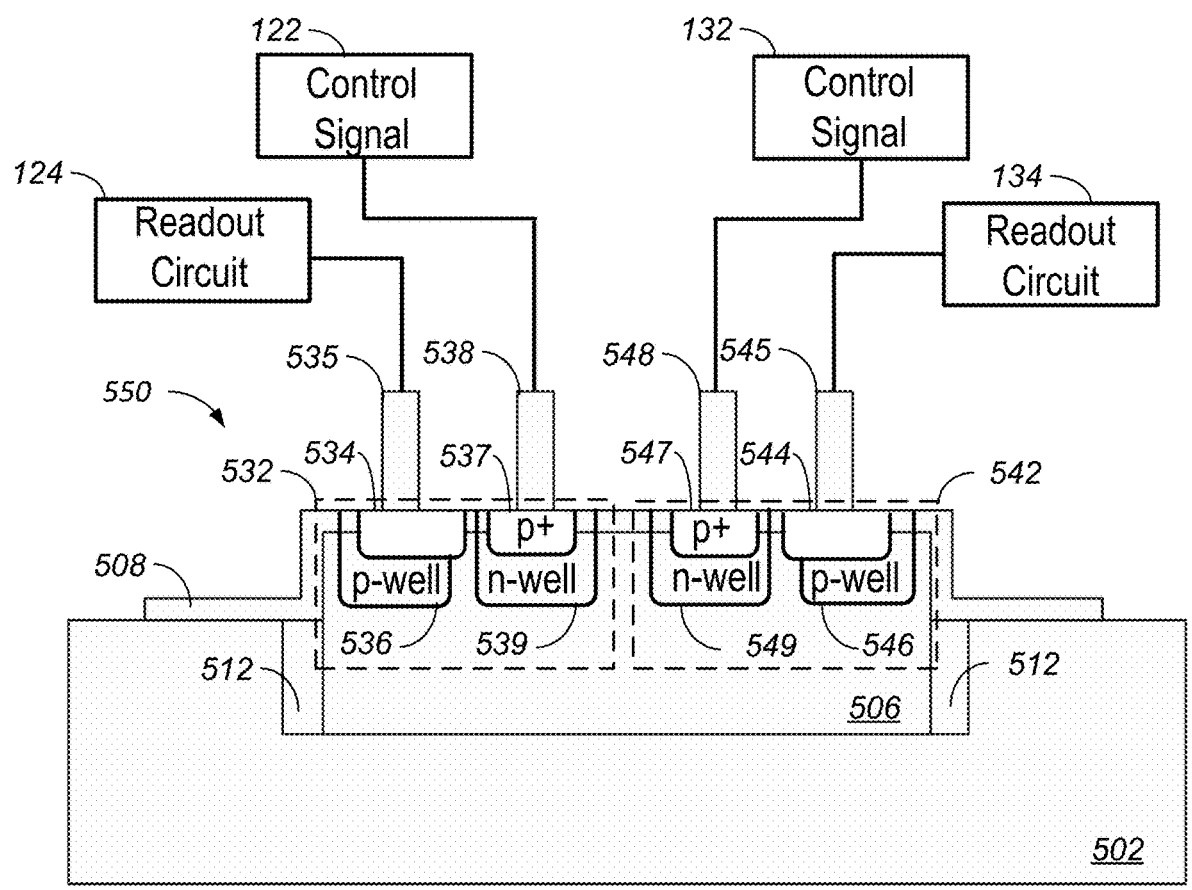

FIG. 5E shows an example switched photodetector 550 for converting an optical signal to an electrical signal. The switched photodetector 550 is similar to the switched photodetector 530 in FIG. 5D, but differs in that the first switch 532 and the second switch 542 further include n-well regions 539 and 549, respectively, and p-well regions 536 and 546, respectively. Additions of the n-well regions and the p-well regions may modify the electrical and/or optical properties of the photodetector 550. In some implementations, the doping level of the n-well regions 539 and 549 and p-well regions 536 and 546 may range from 1015 cm−3 to 1017 cm−3.

The arrangement of the p-doped region 537, the n-well region 539, a p-type absorption layer 506, the n-well region 549, and the p-doped region 547 forms a PNPNP junction structure. In general, the PNPNP junction structure reduces a flow of leakage current from the first control signal 122 to the second control signal 132, or alternatively from the second control signal 132 to the first control signal 122. The arrangement of the n-doped region 534, the p-well region 536, the p-type absorption layer 506, the p-well region 546, and the n-doped region 544 forms an NPN junction structure. In general, the NPN junction structure reduces a charge coupling from the first readout circuit 124 to the second readout circuit 134, or alternatively from the second readout circuit 134 to the first readout circuit 124.

In some implementations, the p-doped region 537 is formed entirely within the n-well region 539. In some other implementations, the p-doped region 537 is partially formed in the n-well region 539. For example, a portion of the p-doped region 537 may be formed by implanting the p-dopants in the n-well region 539, while another portion of the p-doped region 537 may be formed by implanting the p-dopants in the absorption layer 506. Similarly, in some implementations, the p-doped region 547 is formed entirely within the n-well region 549. In some other implementations, the p-doped region 547 is partially formed in the n-well region 549. In some implementations, the n-well regions 539 and 549 form a continuous n-well region that includes at least a portion of both the p-doped regions 537 and 547.

In some implementations, the n-doped region 534 is formed entirely outside the p-well region 536. In some other implementations, the n-doped region 534 is partially formed in the p-well region 536. For example, a portion of the n-doped region 534 may be formed by implanting the n-dopants in the p-well region 536, while another portion of the n-doped region 534 may be formed by implanting the n-dopants in the absorption layer 506. Similarly, in some implementations, the n-doped region 544 is formed entirely outside the p-well region 546. In some other implementations, the n-doped region 544 is partially formed in the p-well region 546.

While FIGS. 5D and 5E show switched photodetectors with a partially embedded absorption region 506, the same construction can be applied to photodetector 500 having non-embedded absorption layer 506, and to photodetector 520 having a fully-embedded absorption layer 506 to achieve analogous effects.

While n-well regions 539 and 549, and p-well regions 536 and 546 have been illustrated in combination for the purpose of illustration, the wells may be individually implemented, or implemented in any combination.

Figure 5F:
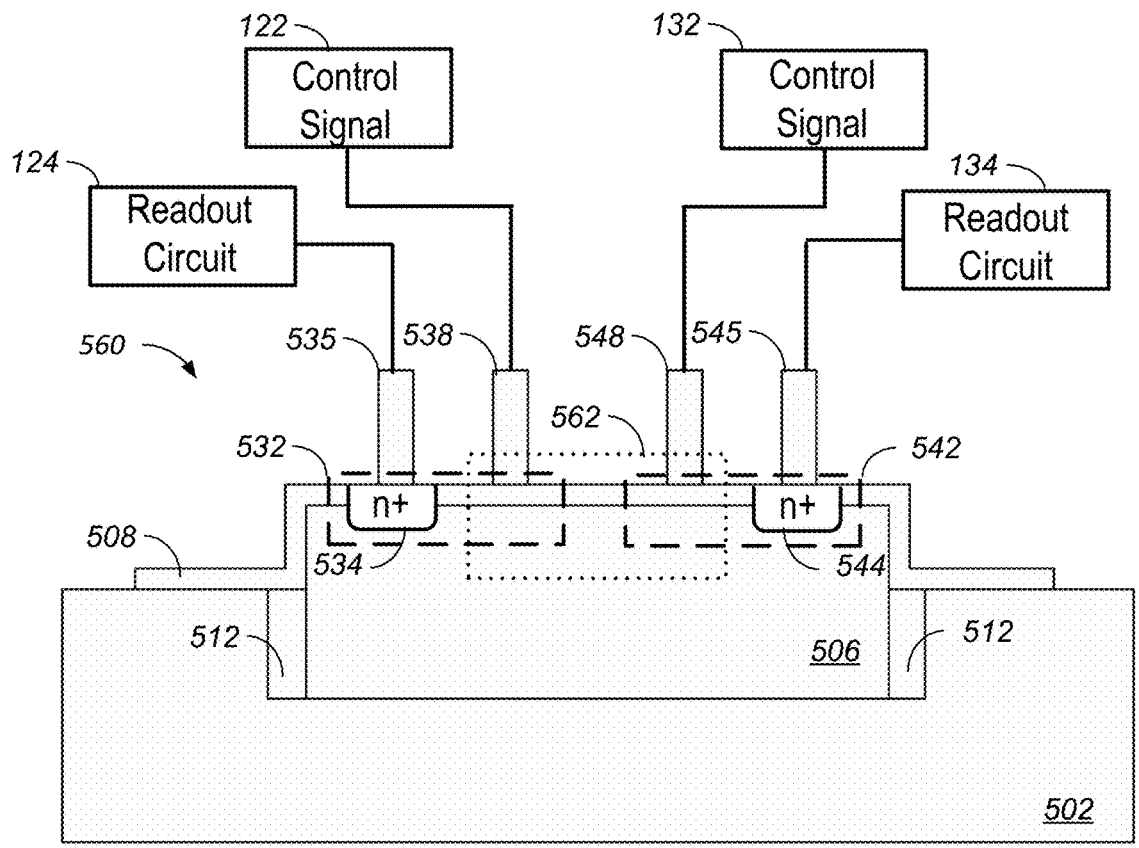

FIG. 5F shows an example switched photodetector 560 for converting an optical signal to an electrical signal. The switched photodetector 560 is similar to the switched photodetector 530 in FIG. 5D, but differs in that the respective p-doped regions 537 and 547 of switches 532 and 542 have been omitted. As a result, the first and second control contacts 538 and 548 form Schottky junctions to the first layer 508. Schottky junction is an electrical junction formed between a metal and a semiconductor, when the semiconductor is not intentionally doped or doped to a moderate dopant concentration, such as below approximately 1×1015 cm−3. A region 562 marks a leakage path between the first control contact 538 and the second control contact 548 through the first layer 508 and the absorption layer 506, which will be described in more detail in relation to FIG. 5G.

Figure 5G:
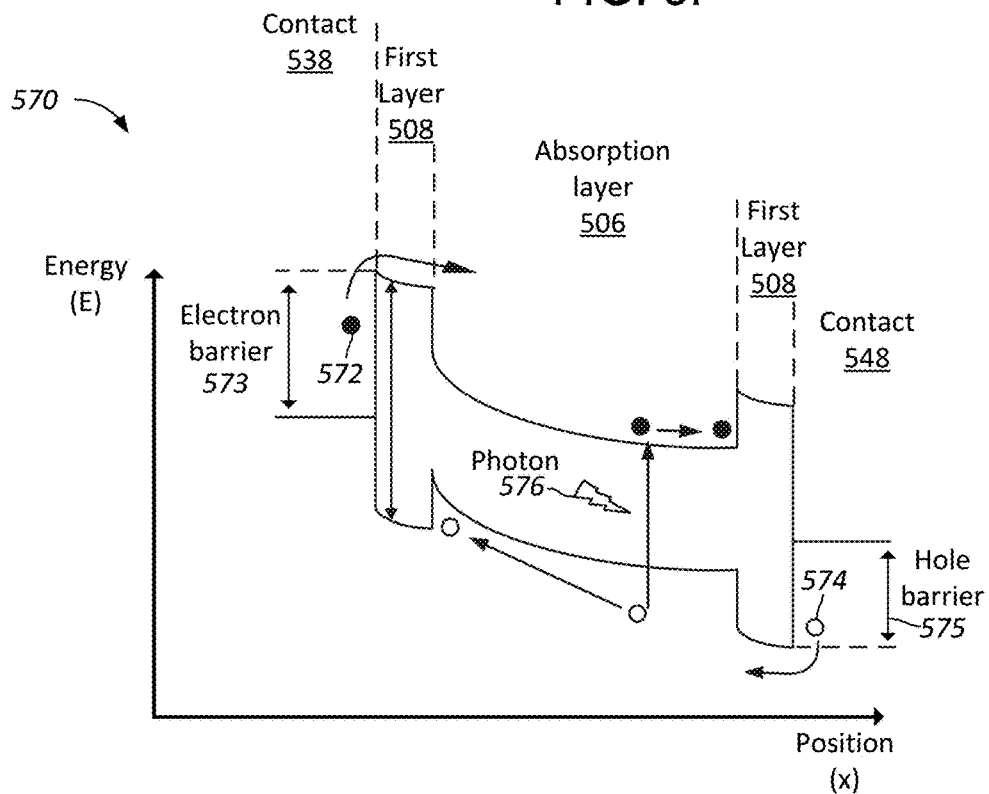

FIG. 5G shows an example band diagram 570 of the leakage path formed between the control contacts 538 and 548. The band diagram 570 illustrates various energy levels that charge carriers such as an electron 572 and a hole 574 experiences at various locations along a leakage path. The vertical axis corresponds to an energy level E, and the horizontal axis corresponds to a position x along the leakage path formed between the control contacts 538 and 548. An example scenario where the electrical potential energy of the first control contact 538 is higher than that of the second control contact 548 (e.g., first control signal 122 has a lower voltage than the second control signal 132) is shown. The potential difference manifests as a downward slope of the overall band diagram from the first control contact 538 to the second control contact 548. The energy levels and positions as shown are for illustration purposes, and may not represent actual values.

An electron barrier 573 and a hole barrier 575 are examples of a Schottky barrier. A Schottky junction is characterized by presence of a Schottky barrier, which is a potential energy barrier that needs to be overcome by the electron 572 and hole 574 in order for those carriers to flow across the Schottky junction. The value of the barriers 573 and 575 can vary depending on a work function of the material of contacts 538 and 548, and the material of the first layer 508. As such, by selecting an appropriate combination of contact material and first layer material, a desired level of electron barrier 573 and hole barrier 575 may be set.

The electron 572 must overcome the electron barrier 573 between the first control contact 538 and the first layer 508. By providing a sufficiently high electron barrier 573, the voltage potential of the control signal 122 applied to the first control contact may be unable to overcome the barrier 573. As such, the electron barrier 573 may block the electron 572 from flowing into the absorption layer 506. In cases where the electron 572 does overcome the electron barrier 573, which may be due to statistical fluctuation of a thermal energy of the electron 572 ("thermionic emission") or quantum tunneling, the electron 572 may flow across the absorption layer 506 to the first layer 508 adjacent to the second control contact 548. Another electron barrier is presented by a junction formed between the absorption layer 506 and the first layer 508, which may further block electron 572 from flowing into the second control contact 548, thereby reducing a leakage current of electrons from the first control contact 538 to the second control contact 548.

Similarly, the hole 574 must overcome the hole barrier 575 between the second control contact 548 and the first layer 508. By providing a sufficiently high hole barrier 575, the voltage potential of the control signal 132 applied to the second control contact may be unable to overcome the barrier 575. As such, the hole barrier 575 may block the hole 574 from flowing into the absorption layer 506. In cases where the hole 574 does overcome the hole barrier 575, which may be due to statistical fluctuation of a thermal energy of the hole 574 ("thermionic emission") or quantum tunneling, the hole 574 may flow across the absorption layer 506 to the first layer 508 adjacent to the first control contact 538. Another hole barrier is presented by a junction formed between the absorption layer 506 and the first layer 508, which may further block hole 574 from flowing into the first control contact 538, thereby reducing a leakage current of holes from the second control contact 548 to the first control contact 538.

When light is being illuminated to the absorption layer 506, the photon 576 of the light may be absorbed by an electron in a valence band of the absorption layer 506 and, resulting in creation of an electron-hole as indicated by the vertical arrow adjacent to the photon 576. The electron of this electron-hole pair forms a photocurrent that is to be captured by the readout circuits 124 and/or 134 through the respective readout contacts 535 and/or 545, and should not flow into the control contacts 538 and 548. In this case, the barriers formed by the interface between the first layer 508 and the absorption layer 506 may prevent such a flow, thereby improving photocurrent collection efficiency of the readout circuits.

When the first layer 508, such as amorphous silicon or polysilicon or crystalline silicon or germanium-silicon, is inserted between the control contacts 538 and 548 and the absorption layer 506, such as a GeSi mesa, the Schottky barrier of the Metal-Semiconductor (MS) junction is modified, resulting in partial blocking of the electrons or holes injected into the first layer 508 by the contacts 538 and 548 as explained above. The power consumption of a ToF pixel such as the switched photodetectors described herein is partially determined by a leakage current flowing between the two control contacts 538 and 548 connected to the two control circuits. As such, by partially blocking the electrons or holes injected by the contacts 538 and 548, the power consumption of the ToF pixel can be significantly reduced.

Figure 5H:
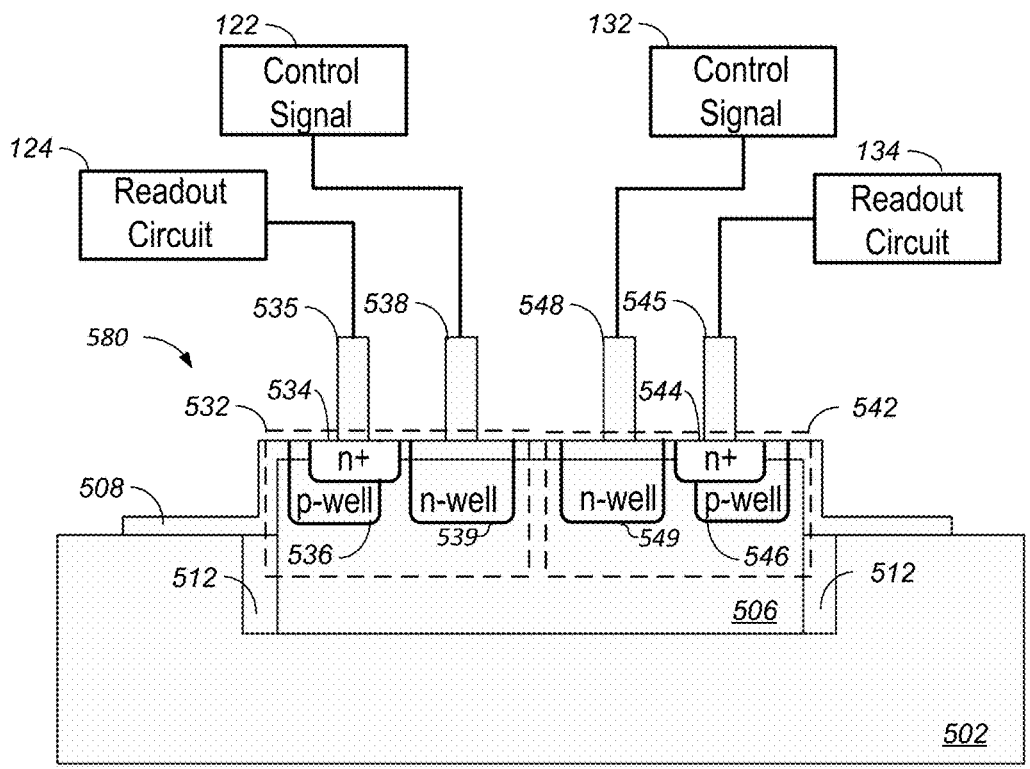

FIG. 5H shows an example switched photodetector 580 for converting an optical signal to an electrical signal. The switched photodetector 580 is similar to the switched photodetector 560 in FIG. 5F, but differs in that the photodetector 580 further includes the n-well regions 539 and 549, and the p-well regions 536 and 546. The structures and effects of the n-well regions 539 and 549, and the p-well regions 536 and 546 have been described in relation to FIG. 5E. In addition, the n-well regions 539 and 549 overlap with at least a portion of the first layer 508 beneath the control contacts 538 and 548, which can contribute to an enhancement in the voltage drop inside the absorption layer 506. Enhancement in the voltage drop inside the absorption layer 506 increases the magnitude of electric field established within the absorption layer 506, which may improve capturing efficiency of the photo-generated electrons by the readout circuits 124 and/or 134 through the respective readout contacts 535 and/or 545.

Figure 5I:
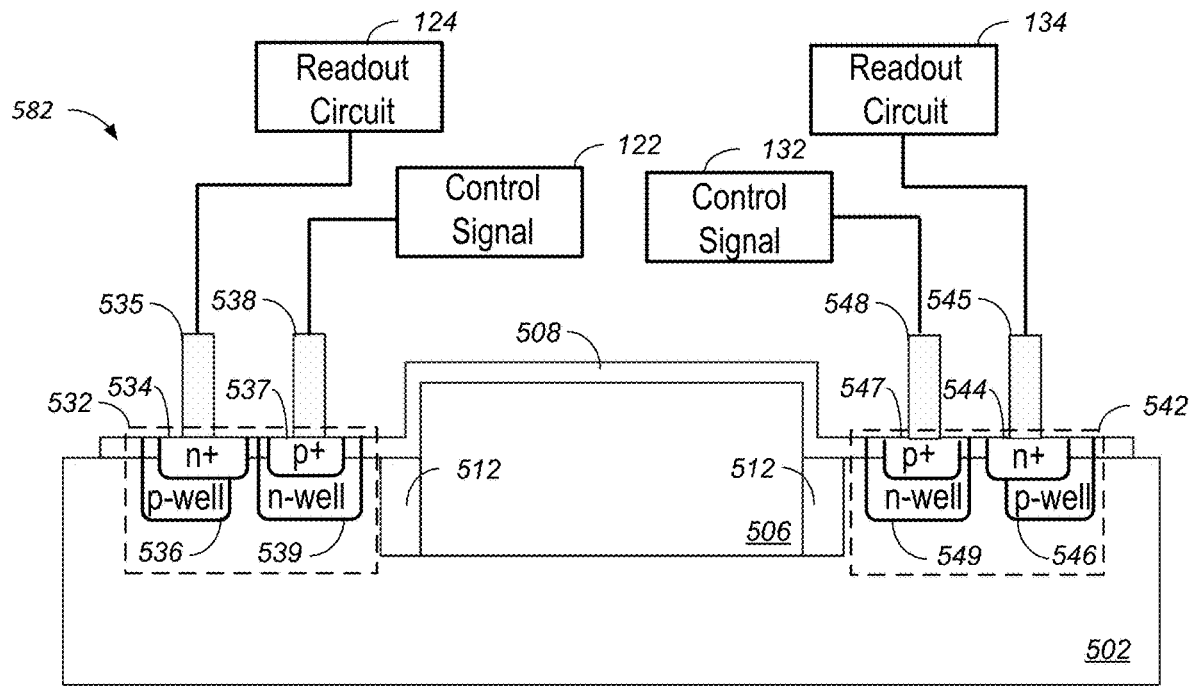

FIG. 5I shows an example switched photodetector 582 for converting an optical signal to an electrical signal. The switched photodetector 582 is similar to the switched photodetector 550 in FIG. 5E, but differs in that the first switch 532 is now located on the substrate 502 and adjacent to the absorption region 506 on the left side, and the second switch 542 are now located on the substrate 502 and adjacent to the absorption region 506 on the right side. The operations of the switched photodetector 582 is analogous to that of previously described switched photodetectors. However, as electrical contacts formed between contacts such as readout contacts 535 and 545 or control contacts 538 and 548 and silicon substrate 502 generally have a lower dark current or leakage current than electrical contacts formed between contacts and Ge or GeSi absorption layer 506 (e.g., due to the substrate 502 having less material defects compared to the absorption layer 506), the overall dark current or leakage current may be lowered in comparison to the configuration of photodetector 550 shown in FIG. 5E. Further, as a result of the switches being placed on the substrate 502, the photo-generated carriers from the light absorbed by the absorption region 506 now flows from the absorption region 506 to the substrate 502 before reaching the readout circuits 124 and 134. Depending on the specific geometry of the absorption region 506 and the spacer 512 and their material, the photo-carriers may conduct through the spacer 512, flow around the spacer 512, or combination thereof.

In some implementations, the p-doped regions 537 and 547 may be omitted in a configuration analogous to the configuration shown in FIG. 5F. While n-well regions 539 and 549, and p-well regions 536 and 546 have been illustrated in combination for the purpose of illustration, the wells may be omitted, be individually implemented, or implemented in any combination.

Figure 5J:
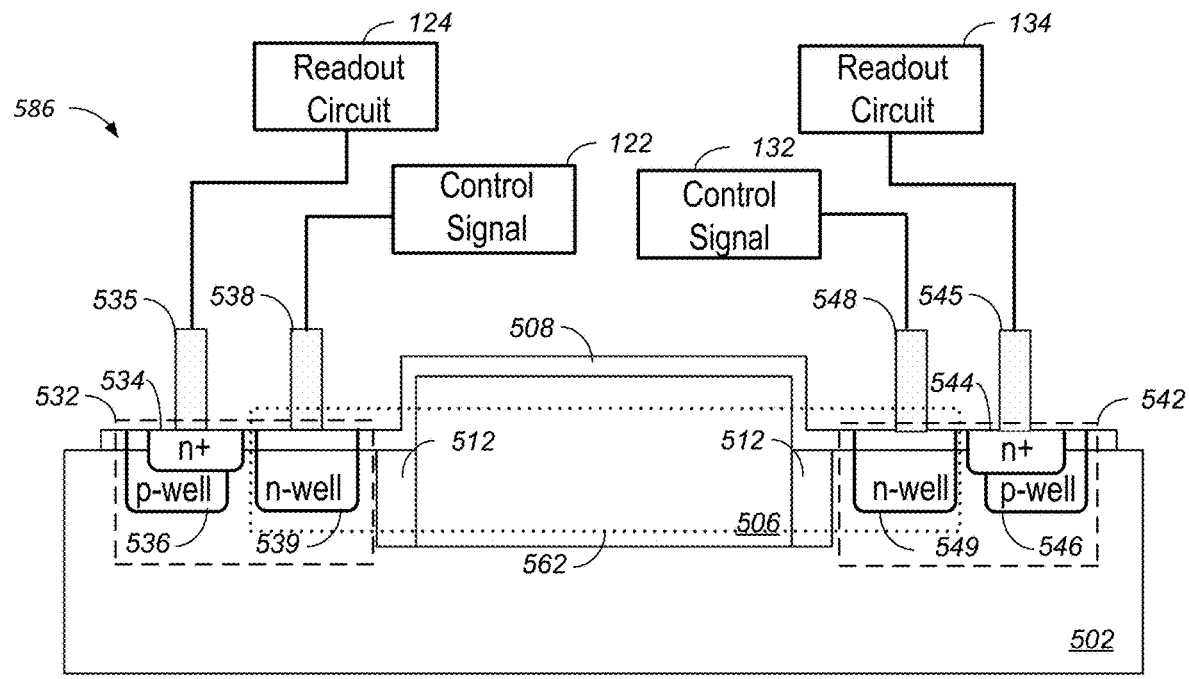

FIG. 5J shows an example switched photodetector 586 for converting an optical signal to an electrical signal. The switched photodetector 586 is similar to the switched photodetector 582 in FIG. 5I, but differs in that the respective p-doped regions 537 and 547 of switches 532 and 542 have been omitted. As a result, the first and second control contacts 538 and 548 form Schottky junctions to the first layer 508. The effects of the Schottky junctions have been described in relation to FIGS. 5F-H. The band diagram 570 of FIG. 5G remain applicable to the region 562 of the photodetector 586, with the barriers formed by to the first layer 508 now corresponding to barriers formed by the first layer 508, the substrate 502, and the spacer 512 due to the modified geometry of photodetector 586 relative to photodetector 506.

While the n-well regions 539 and 549, and the p-well regions 536 and 546 have been illustrated in combination for the purpose of illustration, the wells may be omitted, be individually implemented, or implemented in any combination.

Figure 5K:
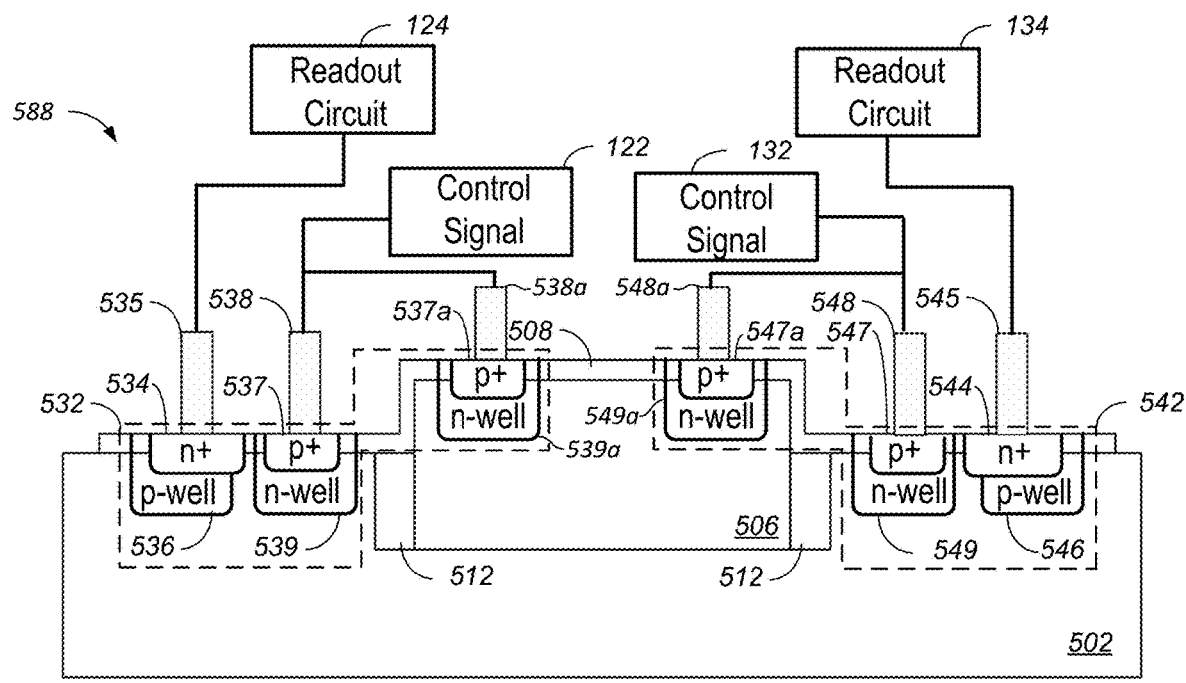

FIG. 5K shows an example switched photodetector 588 for converting an optical signal to an electrical signal. The switched photodetector 588 is similar to the switched photodetector 582 in FIG. 5I, but differs in that the first switch 532 further includes a second p-doped region 537a, a third control contact 538a coupled to the second p-doped region 537a, and a second n-well region 539a in contact with the second p-doped region 537a, and the second switch 542 further includes a second p-doped region 547a, a fourth control contact 548a coupled to the second p-doped region 547a, and a second n-well region 549a in contact with the second p-doped region 547a. The second p-doped regions 537a and 537b are similar to second p-doped regions 537 and 547, respectively. The second n-well regions 539a and 549a are similar to second n-well regions 539 and 549, respectively. The third control contact 538a is similar to the first control contact 538, and the fourth control contact 548a is similar to the second control contact 548. The third control contact 538a is connected to the first control signal 122, and the fourth control contact 548a is connected to the second control signal 132.

As the first control contact 538 and the associated doped regions are not in direct contact with the absorption region 506, the electric field generated within the absorption region 506 by application of the first control signal 122 to the first control contact 538 may be relatively weak in comparison to a configuration where the first control contact 538 is in direct contact with the absorption layer 506, such as in the configuration of the photodetector 550 in FIG. 5E. By adding the third and fourth control contacts 538a and 548a and associated doped regions, the carrier collection control efficiency of the photodetector 586 may be improved over that of the photodetector 582 of FIG. 5I to be comparable to the carrier collection control efficiency of the photodetector 550 in FIG. 5E, while at least partially retaining the benefit of reduced dark current or leakage current by moving the contacts to the substrate 502. Furthermore, as larger electric field within the absorption region can lead to increased photodetector bandwidth, faster switching between the first switch 532 and the second switch 542, the additional control contacts 538a and 548a may also contribute to an improvement in operational speed of the photodetector 584.

While the third control contact 538a and the fourth control contact 548a are shown to share the respective control signal 122 and 132 for the first control contact 538 and the second control contact 548, in some implementations, the contacts 538a and 548a may have independent control signals that may be different from first and second control signals 122 and 132. For example, the control signal for the third control contact 538a may be smaller than the first control signal 122 for the first control contact 538, as the control signal applied to the third control contact 538a may be have a greater effect on the photo-generated carriers than the first control signal 122 applied to the first control contact 538 due to the proximity of the second p-doped region 537a to the carriers being generated in the absorption region 506, and the same applies to the control signal for the fourth control contact 548a.

In some implementations, the second p-doped regions 537a and 547a may be omitted to form Schottky junctions, the effects of which have been previously described in relation to FIGS. 5F-5H. While the n-well regions 539 and 549, and the p-well regions 536 and 546 have been illustrated in combination for the purpose of illustration, the wells may be omitted, be individually implemented, or implemented in any combination.

While various configurations of the switched photodetectors having a partially embedded absorption layer 506 have been described in FIGS. 5D-5K, the described configurations can be applied to switched photodetectors having a fully protruding absorption layer 506 such as the configuration shown in FIG. 5A, and to switched photodetectors having a fully embedded absorption layer 506 such as the configuration shown in FIG. 5C and achieve analogous effects.

The photodetectors described in FIGS. 5A-5K may be incorporated into a front-side illumination (FSI) image sensor, or a back-side illumination image sensor (BSI). In the FSI configuration, the light enters the photodetectors from the top through the first layer 508. In the BSI configuration, the light enters the photodetectors from the bottom through the substrate 502.

The control regions (e.g., p-doped regions 537 and 547) and the readout regions (e.g., n-doped regions 534 and 544) may be at different heights. For example, in the case of photodetectors 530, 550, 560, and 580, and any configurations in which the control regions and the readout regions are both located on the absorption region 506, a portion of the absorption region 506 corresponding to the readout region or the control region may be etched, and the readout region or the control region may be formed on the etched portion, resulting in a vertical offset between the control region and the readout region. Similarly, in the case of photodetectors 582, 586, and 588, and any configurations in which the control regions and the readout regions are both located on the substrate 502, a portion of the substrate 502 corresponding to the readout region or the control region may be etched, and the readout region or the control region may be formed on the etched portion, resulting in a vertical offset between the control region and the readout region.

In some implementations, lens may be placed on an optical path of light incident on the photodetectors. The lens may be, for example, a micro ball lens or a Fresnel Zone Plate (FZP) lens. As another example, for a silicon substrate 502, the lens may be formed directly on the substrate 502 by etching of the substrate 502. Details regarding configurations of the lens will be provided in relation to FIGS. 7A-7C.

In some implementations, the interface between the absorption layer 506 and the spacers 512 may be doped with n- or p-type dopants to improve electrical isolation for holes and electrons, respectively. In some implementations, the interface between the absorption layer 506 and the substrate 502 (e.g., the bottom interface) may be doped with n- or p-type dopants to improve electrical isolation for holes and electrons, respectively.

Figure 6A:
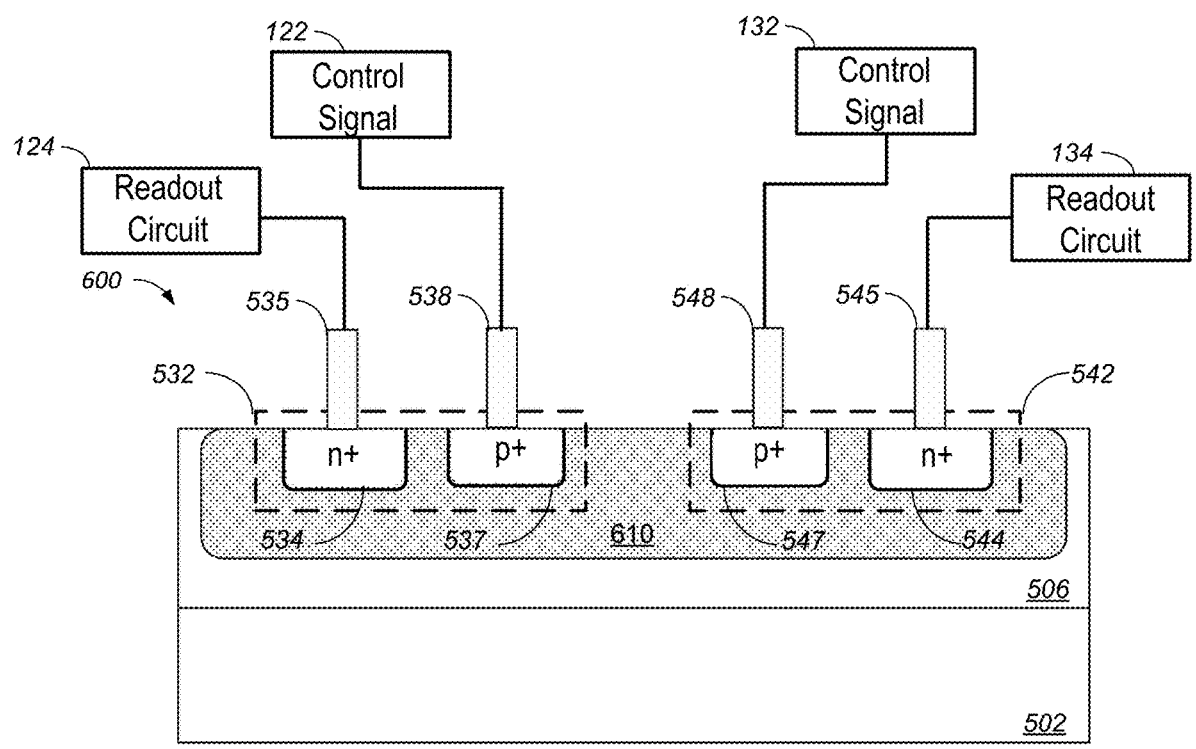
FIGS. 6A-6B are examples of a switched photodetector.

FIG. 6A shows an example switched photodetector 600 for converting an optical signal to an electrical signal. The switched photodetector 600 includes the substrate 502, the absorption region 506, the first switch 532, the second switch 542, and a counter-doped region 610. The counter-doped region 610 is arranged within the absorption region 506. The first and second switches 532 and 542 are arranged on the absorption layer 506. The substrate 502, the absorption region 506, and first and second switches 532 and 542 have been previously described in relation to FIG. 5D.

The counter-doped region 610 is a portion of the absorption region 506 that has been doped with a dopant specie to reduce a net carrier concentration of the absorption region 506. An undoped semiconductor material has a certain concentration of charge carriers that may contribute to current conduction even in absence of dopants, which is referred to as the intrinsic carrier concentration of the semiconductor. The absorption region 506 is typically formed from semiconductor materials, such as Silicon, Germanium, or an alloy of the two, and has an associated intrinsic carrier concentration. This intrinsic carrier concentration may vary depending on various factors, such as the material preparation method and defect level (defect concentration). Examples of the material preparation method include epitaxial growth, chemical vapor deposition (CVD), metal organic CVD (MOCVD), and physical vapor deposition (PVD), and materials prepared using different methods may be different material defect levels. Typically, higher number of material defects correlates to higher level of intrinsic carrier concentration level. For example, bulk crystalline Germanium may have an intrinsic p-type like carrier concentration of approximately $2*10^{13}$ cm$-3$ at room temperature, while an epitaxially grown Germanium may have an intrinsic p-type like carrier concentration that is an order of magnitude higher at approximately $5*10^{14}$ cm$-3$. Depending on the material type and the nature of the defects, the semiconductor material may be p-type or n-type like.

Reducing a leakage current of switched photodetectors, such as the photodetector 600, is important for reducing a power consumption of a Time-Of-Flight pixel. One of the contributors to the leakage current of switched photodetectors is a leakage current flowing between the control regions, e.g. the current flow between the p-doped regions 537 and 547. One approach to reducing such current flow is by reducing a net carrier concentration of the absorption region 506 between the two p-doped regions 537 and 547. The net carrier concentration is the concentration of carriers available for conducting the current, and may be determined by combining the contributions of the intrinsic carrier concentration with extrinsic carrier concentration contributed by the dopants. By appropriately selecting the electrical type, species, and concentration of the dopants, the intrinsic carrier concentration may be compensated, or "counter-doped," by the dopants, resulting in a lower net carrier concentration for the semiconductor material. Typically, the leakage current between the control regions is proportional to the net carrier concentration when the intrinsic and net carriers have the same polarity, i.e., both are p-type like or n-type like.

The type of dopants to be used for the counter-doped region 610 may be selected based on various factors, such as the material forming the absorption region 506 and the nature of defects present in the absorption region 506. For example, epitaxially grown Ge on Si substrate 502 is typically a p-type material. In such a case, an n-type dopant specie such a P, As, Sb, or F may be used to dope the counter-doped region 610. The doping may be performed in various ways, including implantation, diffusion, and in-situ doping during growth of the material. In some cases, dopants such as fluorine may passivate the defects. The passivated defects may stop acting as sources of charge carriers and therefore the net carrier concentration of the Fluorine-doped absorption region 506 may be reduced and become more intrinsic.

The concentration of dopants to be used for the counter-doped region 610 may be selected based on the intrinsic carrier concentration of the absorption region 506. For example, an epitaxially grown Germanium having an intrinsic carrier concentration of approximately $5*10^{14}$ cm−3 may be doped with a counter-dopant concentration of approximately $5*10^{14}$ cm−3 to reduce the intrinsic carrier concentration toward that of the bulk crystalline Ge of approximately $2*10^{13}$ cm−3. In general, the counter-doping concentration may range from $1*10^{13}$ cm−3 to $1*10^{16}$ cm−3. In some implementations, the counter-doped region 610 may have variable dopant concentrations across the region. For example, regions that are closer to material interfaces, such as the bottom of the absorber 506, may have a higher intrinsic carrier concentration due to increased defect level, which may be better compensated by a correspondingly high counter-doping level. In some implementations, the counter-dopant concentration may be greater than the intrinsic carrier concentration of the absorption region 506. In such cases, the polarity of the absorption region 506 may be changed from p-type to n-type or vice versa.

While the counter-doped region 610 is shown to completely cover the n-doped regions 534 and 544, and the p-doped regions 537 and 547, in general, the counter-doped region 610 may cover just the p-doped regions 537 and 547 or the n-doped regions 534 and 544. Additionally, while the counter-doped region 610 is shown to be a continuous region, in general, it may be two or more separate regions. Furthermore, while the counter-doped region 610 is shown to be only a portion of the absorption region 506, in general, the counter-doped region 610 may be formed across the entire absorption region 506.

In some implementations, the counter-doped region 610 may function as a dopant diffusion suppressor, which may contribute to formation of an abrupt junction profile. Formation of an abrupt junction profile between the counter-doped region 610 and the p-doped regions 537 and 547 may lead to a lower leakage current and thereby reduce the power consumption of ToF pixels. For example, in the case of a Ge absorption region 506, Fluorine doping may suppress diffusion of Phosphorous dopants in the n-doped region 534.

In general, the counter-doped region 610 may be implemented in various implementations of the switched photodetectors to reduce the leakage current between control regions.

In some implementations, the p-doped regions 537 and 547 may be omitted, resulting in formation of Schottky junctions, the effects of which have been described in relation to FIGS. 5F-5H.

Figure 6B:
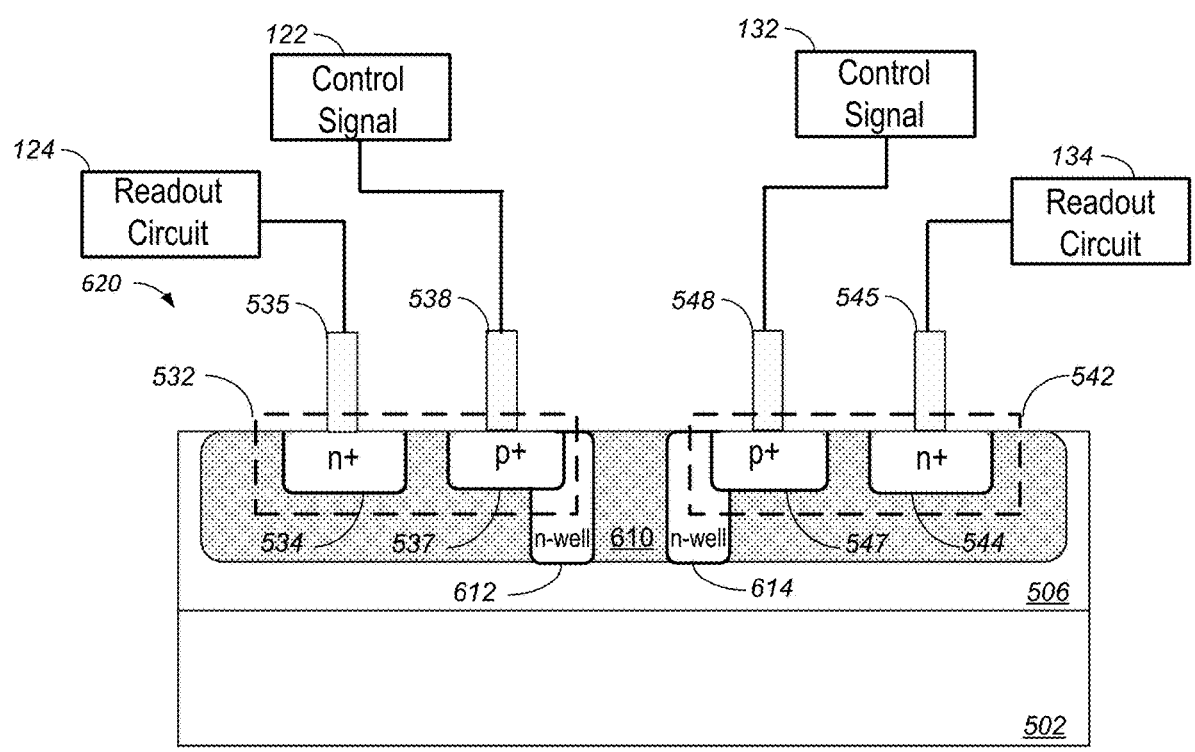

FIG. 6B shows an example switched photodetector 620 for converting an optical signal to an electrical signal. The switched photodetector 620 is similar to the photodetector 600 in FIG. 6A but differs in that the first switch 532 and the second switch 542 further include n-well regions 612 and 614, respectively. Additions of the n-well regions may modify the electrical and/or optical properties of the photodetector 620. In some implementations, the doping level of the n-well regions 612 and 614 may range from $10^{15}$ cm−3 to $10^{17}$ cm−3. In some implementations, the n-well regions 612 and 614 may extend from the upper surface of the absorption region 506 to the lower surface of the counter-doped region 610 or to the interface between the absorption layer 506 and the substrate 502.

The arrangement of the p-doped region 537, the n-well region 612, the counter-doped region 610, the n-well region 614, and the p-doped region 547 forms a PNINP junction structure. In general, the PNINP junction structure reduces a flow of leakage current from the first control signal 122 to the second control signal 132, or alternatively from the second control signal 132 to the first control signal 122.

In some implementations, the p-doped region 537 is formed entirely within the n-well region 612. In some other implementations, the p-doped region 537 is partially formed in the n-well region 612. For example, a portion of the p-doped region 537 may be formed by implanting the p-dopants in the n-well region 612, while another portion of the p-doped region 537 may be formed by implanting the p-dopants in the counter-doped region 610. Similarly, in some implementations, the p-doped region 547 is formed entirely within the n-well region 614. In some other implementations, the p-doped region 547 is partially formed in the n-well region 614. In some implementations, the n-well regions 612 and 614 form a continuous n-well region that includes at least a portion of both the p-doped regions 537 and 547.

Operation speed or bandwidth of a photodetector can be an important performance parameter for applications that benefit from high speed detection of light, such as ToF detection. Among characteristics that can affect bandwidth of a photodetector is the physical size of the photodetector, such as the area of the photodetector through which light is received. Reducing the area of the photodetector, for example, can lead to a reduction in device capacitance, carrier transit time, or a combination of both, which typically results in an increase in photodetector bandwidth. However, a reduction in the detection area of a photodetector can lead to a reduction in the amount of light (i.e., number of photons) detected by the photodetector. For example, for a given intensity of light per unit area, the reduction in the area of the detector leads to a reduction in detected light.

For applications that benefit from both high bandwidth and high detection efficiency, such as ToF detection, addition of a microlens before the photodetector may be beneficial. The microlens can focus the incident light onto the photodetector, allowing a small-area photodetector to detect light incident over an area larger than itself. For example, a properly designed combination of a microlens and a spacer layer (SL) that separates the microlens from the photodetector by an effective focal length of the microlens can allow focusing of the incident light to a diffraction-limited spot that is on the order of the square of the optical wavelength of the incident light. Such a scheme can allow reduction of photodetector area while mitigating the potential downsides of the photodetector area reduction.

Figure 7A:
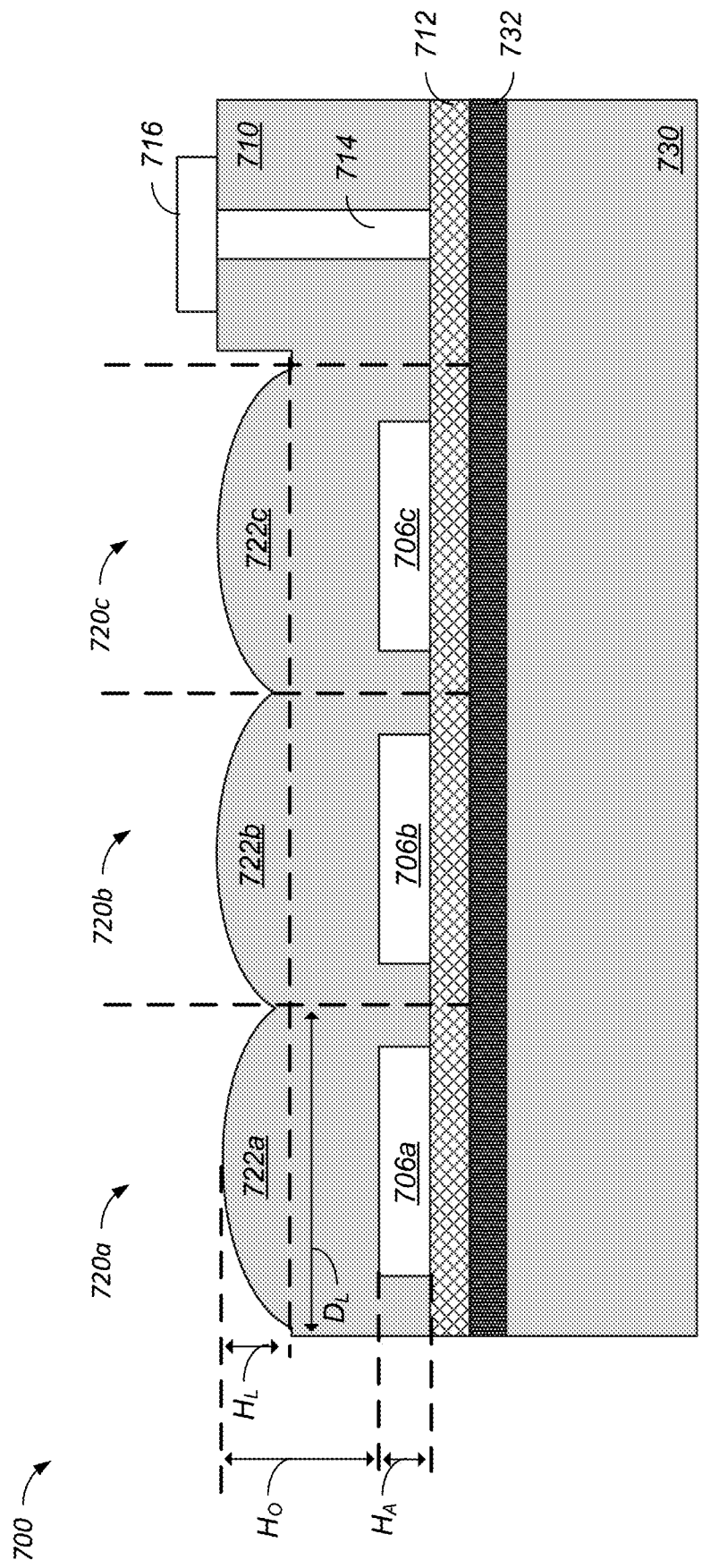
FIGS. 7A-7B are cross-sectional views of example configurations of microlenses integrated with photodetectors.

FIG. 7A shows a cross-sectional view of an example configuration 700 of silicon lenses integrated with photodetectors. The configuration 700 includes a donor wafer 710 and a carrier wafer 730. The donor wafer 710 includes multiple pixels 720a through 720c (collectively referred to as pixels 720), via 714, metal pad 716, and a first bonding layer 712. The carrier wafer 730 includes a second bonding layer 732. The donor wafer 710 and the carrier wafer 730 are bonded to each other through the first bonding layer 712 and the second bonding layer 732. The substrate 710 may be similar to substrate 502 of FIG. 5A. The absorption region 706 may be similar to the absorption region 506 of FIGS. 5A-5L.

The pixels 720a through 730c include absorption regions 706a through 706c, respectively, and microlenses 722a through 722c (collected referred to as microlenses 722), respectively. The microlenses 722 are convex lenses that are integrated into or on the donor wafer 710. In applications that benefit from high light collection efficiency, such as ToF detection, addition of microlenses 722 may be beneficial. The convex configuration of the microlens 722 can cause light incident on the microlens 722 to be focused toward the absorption region 706, which may improve light collection efficiency of the pixels 720, leading to improved pixel performance. The arrangement of the pixel 720 with the microlens 722 on a backside of the donor wafer 710 may be referred to as backside illumination.

The microlens 722 has various characteristics that affect its performance, including geometrical parameters and material from which it is formed. The microlens 722 is typically implemented in a plano-convex configuration, with one surface facing the incident light and being convex with a radius of curvature, and the other surface being a planar surface interfacing with the donor wafer 710 in or on which the microlens 722 is formed. The plano-convex configuration of the microlens 722 may lend itself to fabrication through standard semiconductor processing techniques. The microlens 722 may have a height HL and a diameter DL, and may be separated from a lens-facing surface of the absorption region 706 by a height HO. In some implementations, HL may range from 1 to 4 µm, HO may range from 8 to 12 µm, HA may range from 1 to 1.5 µm, and DL may range from 5 to 15 µm. In some implementations, for a spherical-type microlens 722, its radius of curvature may be set such that the focal length of the microlens 722 is approximately equal to HO to achieve optimal focusing of light onto the absorption region 706. The determination of the focal length and the radius of curvature may be performed using various simulation techniques such as beam propagation method (BPM) and finite difference time domain (FDTD) technique. In some implementations, the microlens 722 is an aspheric lens.

The microlens 722 can be formed from various materials and fabricated in various ways. In general, various materials that are transparent for the wavelengths to be detected by the pixels 720 may be used. For example, the microlens 722 may be fabricated from materials having moderate to high index of refraction (e.g., >1.5), such as crystalline silicon, polysilicon, amorphous silicon, silicon nitride, polymer, or combination thereof. For visible wavelengths, polymer materials may be used. For NIR wavelengths, silicon may be used as silicon is relatively transparent in the NIR, and has a relatively high index of refraction (approximately 3.5 at 1000 nm), making it well suited as a lens material in the NIR. Furthermore, as silicon is strongly absorbing in the visible wavelengths (e.g., <800 nm), a silicon microlens may block a substantial portion of visible light from reaching the absorption region 706, which may be beneficial for applications where selective detection of NIR wavelengths is desired (e.g., ToF detection). A crystalline silicon microlens 722 may be fabricated by patterning and etching a surface of the donor wafer 710, which is typically a crystalline silicon wafer. As another example, polysilicon or amorphous silicon may be deposited on the surface of the donor wafer 710, which may then be patterned and etched in similar fashion. The formation of microlens 722 through etching of the crystalline silicon donor wafer 710 or by etching of the polysilicon or amorphous silicon deposited on the donor wafer 710 is an example method of integrally forming the microlens 722 on the donor wafer 710.

The patterning of the microlens 722 may be performed using, for example, grayscale lithography techniques. In grayscale lithography, a feature to be patterned, such as the microlens, is exposed using a local gradation in the exposure dose, which translates into a gradation in the thickness of the resulting photoresist mask that has been developed. For example, the photoresist mask can be patterned to have a similar shape as the microlens 722. The photoresist mask is then transferred onto the material underneath, such as the crystalline silicon donor wafer 710, by semiconductor etching techniques such as plasma-based directional etching techniques, completing the fabrication of the microlens 722. In some implementations, the local gradation in the exposure dose may be achieved, for example, by varying a fill-factor of sub-wavelength features on a photomask.

The absorption regions 706 may be similar to absorption region 506 described in relation to FIG. 5A. The carrier wafer 730 may include various electronic circuits that are coupled to the pixels 720. For example, the electronic circuits may be coupled through structures such as the via 714. The via 714 may be coupled to a metal pad 716 to interface with external electronics through, for example, a wire bond.

The carrier wafer 730 and the donor wafer 710 may be bonded or mechanically attached to one another through various techniques. For example, the first and second bonding layers 712 and 732 may be oxides (e.g., silicon dioxide), and the bonding may be an oxide-to-oxide bonding. As another example, the first and second bonding layers 712 and 732 may be metals (e.g., copper), and the bonding may be a metal-to-metal bonding. As yet another example, the first and second bonding layers 712 and 732 may be a combination of oxide and metals (e.g., silicon dioxide and copper), and the bonding may be a hybrid bonding.

Figure 7B:
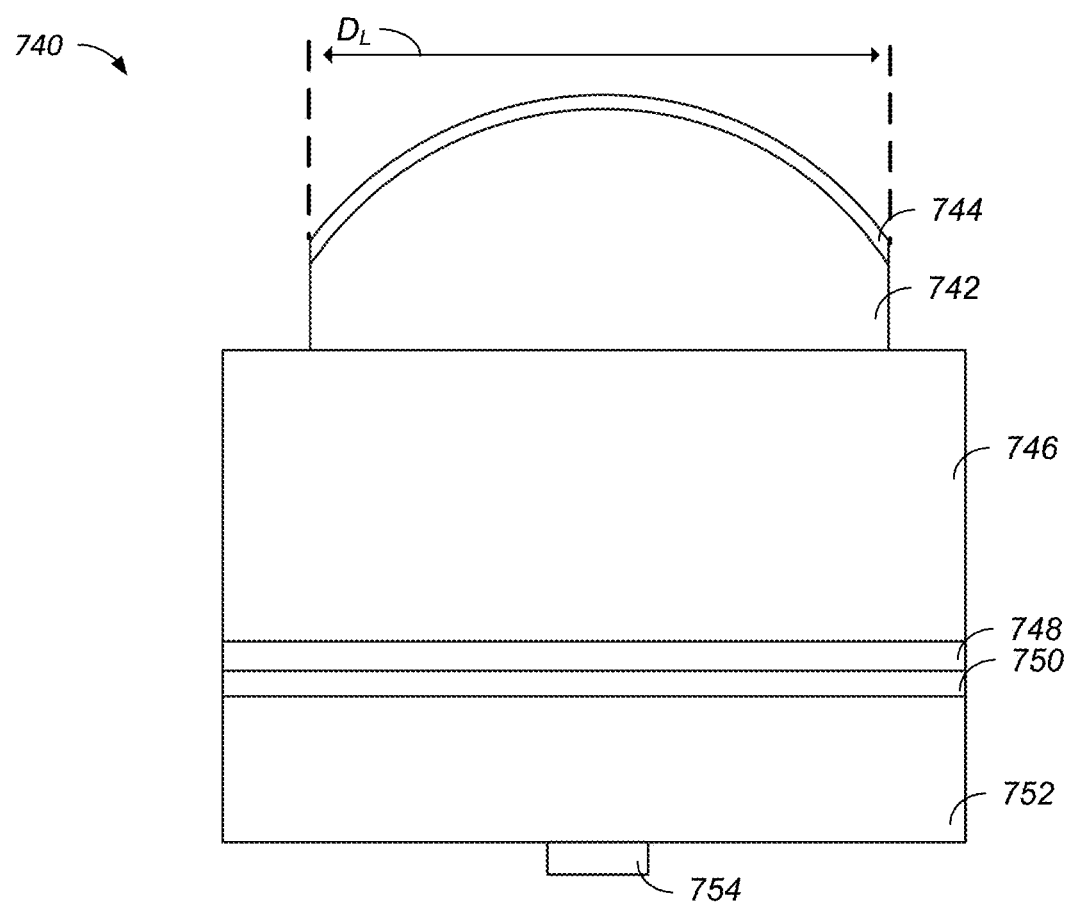

FIG. 7B shows a cross-sectional view of an example configuration 740 of a microlens integrated with a photodetector. The configuration 740 includes a microlens 742, an anti-reflection coating (ARC) layer 744, a spacer layer 746, a first layer 748, a second layer 750, a silicon layer 752 and a photodetector 754. The ARC layer 744 is supported by the microlens 742. The microlens 742 is supported by the spacer layer 746. The photodetector 754 may be supported by the silicon layer 752 or be formed within the silicon layer 752. The first layer 748 and the second layer 750 may be intermediate layers between the silicon layer 752 and the spacer layer 746.

The ARC layer 744 is provided to reduce a reflection of light incident on the microlens 742. The ARC layer 744, for example, may be designed to have a refractive index that is the square root of the index of the microlens 742, and have a thickness corresponding to a quarter of the incident wavelength. In some implementation, the ARC layer 744 may be formed from silicon dioxide. In some implementations, the ARC layer 744 may include multiple layers to form a multi-layer ARC.

The configuration 740 may correspond to an integration of microlens 742 in a back-side illuminated (BSI) image sensor configuration. For example, the silicon layer 752 can be a silicon substrate, such as the substrate 710 of FIG. 7A or substrate 502 of FIG. 5D, and the photodetector 754 may be, for example, the switched photodetector 530 of FIG. 5D. The interface between the silicon layer 752 and the second layer 750 may correspond to the bottom surface of the substrate 502 opposite to the absorption region 506 of FIG. 5D. In such a BSI configuration, the second layer 750 formed on the silicon layer 752, e.g., the backside of the substrate 502, can include various structures and layers typical in fabrication of a BSI illuminated sensor wafer. Examples of such structures and layers include an ARC layer for reducing light reflection at the interface of the silicon layer 752, and a metal grid, such as a tungsten grid, for blocking light into the silicon layer 752 other than regions for receiving light, such as the regions underneath the microlens 742. The first layer 748 may be a thin layer of material that promotes adhesion of the spacer layer 746 to the second layer 750 for improving, among others, manufacturability and reliability of the configuration 740. The material for the first layer 748 may be, for example, various dielectric materials (e.g., SiO2, SiON, and SiN) or polymers. In some implementation, the first layer 748 can be omitted depending on the interaction between the second layer 750 and the spacer layer 746 (e.g., in the case where the spacer layer 746 has good adhesion with the second layer 750).

The configuration 740 may be fabricated by providing a sensor wafer including the silicon layer 752, the photodetector 754, and the second layer 750, and depositing the first layer 748, the spacer layer 746, the microlens 742, and the ARC layer 744 in the order given, and then patterning and etching to expose metal pads similar to the metal pad 716 shown in FIG. 7A. The microlens 742 may be patterned and etched using techniques described in relation to fabrication of the microlens 722 of FIG. 7A. While the ARC layer 744 is shown to be limited to the surface of the microlens 742, in general, the ARC layer 744 may extend to other surfaces, such as the side surface of the microlens 742 and the upper surface of the spacer layer 746.

Various characteristics of the components of a particular implementation of the configuration 740 configured for operational wavelength of 940 nm are given as an example. The microlens 742 has a refractive index of 1.5316, a radius of curvature of 6 µm, a height of 4 µm, and a diameter DL of 10 µm. The ARC layer 744 is formed from SiO2, which has a refractive index of 1.46 at 940 nm and a thickness of 160.96 nm. The spacer layer 746 has a refractive index of 1.5604, and a thickness of 10 µm. The first layer 748 has a refractive index 1.5507 and a thickness of 60 nm. The second layer 750 includes an ARC layer for the silicon layer 752 and a tungsten grid. While specific characteristics have been provided, the characteristics may be modified to adapt the configuration 740, for example, for different operational wavelengths, materials, and size of the photodetector 754.

In some implementations, the second layer 750, which may be referred to as the "top layer" formed on top of the backside of a silicon substrate of a BSI image sensor, may be modified to improve the overall optical performance of configuration 740. The second layer 750, as previously described, typically includes metal grid embedded in a dielectric layer, such as tungsten grid embedded in a layer of SiO2. This layer of SiO2 may serve as an ARC layer if the light was entering the silicon layer 752 directly from air. However, due to the addition of the microlens 742, the spacer layer 746 and the first layer 748 which all have refractive indices that are significantly higher than that of air (approximately 1.0), the SiO2 layer may not function effectively in reducing the optical reflection at the interface between the silicon layer 752 and the stacking of the first layer 748 and/or spacer layer 746.

Table 1 shows simulation parameters and calculated transmission of an implementation of configuration 740. The layers and the thicknesses have been adapted and/or approximated for the purpose of performing a simulation that approximate the expected transmission of different implementations of the configuration 740.

TABLE 1

| LAYERS | REFRACTIVE INDEX | THICKNESS (µm) | |
|---|---|---|---|
| | | Case 1 | Case 2 |
| ARC layer 744 | 1.249 | 0.188 | |
| Spacer layer 746 | 1.560 | 10 | |
| First layer 748 | 1.551 | 0.06 | |
| Second  SiO2 layer    Si3N4 750 | 1.451 1.949 | 0.8 0 | 0.120 |
| Silicon layer 752 | 3.599 + 0.00135i | 1 | |
| Transmission (%) | | 78.95 | 97.62 |

Referring to Table 1, case 1 corresponds to a second layer 750 that includes a standard single layer of SiO2, which results in a simulated transmission of approximately 79%. For applications where it is important to detect as much of the incident light as possible, such 21% loss of the incident light may not be acceptable. Such a drop in transmission can be mitigated by including a Si3N4 layer in the second layer 750 under the SiO2 layer as an intermediate layer between the SiO2 layer and the silicon layer 752. By including approximately 121 nm of Si3N4, the transmission can be improved to approximately 97.6%. As such, the intermediate layer may be referred to as an anti-reflection layer. In general, various optically transparent material with a refractive index greater than SiO2 may be used in place of Si3N4. Example materials include SiON, SiN, Al2O3, HfO2, ZrO2, and La2O3, and high-k materials (e.g., materials with high dielectric constant) that are compatible with CMOS manufacturing processes. Suitable material may have a refractive index greater than, for example, 1.6, 1.7, 1.8, 1.9, or 2.0. Thickness of the material should be adapted to be an odd multiple of a quarter of the wavelength of light within the material.

The addition of Si3N4 or high-k material layer directly on top of the silicon layer 752 may result in an increase of a dark current of the photodetector 754 due to, for example, increased surface defect at the Silicon-Si3N4 interface relative to Silicon-SiO2 interface. To mitigate such increase in dark current, in some implementations, a second layer of SiO2 can be inserted between the Si3N4 layer and the silicon layer 752. Inserting the second layer of SiO2 of thickness ranging from 10 nm to 50 nm results in a transmission ranging from approximately 97.1% to 85%, respectively. As such, inserting a thin layer of SiO2, such as 10 nm, may be beneficial for mitigating the increase in dark current while maintaining high optical transmission.

Low leakage current flowing across control regions of a switched photodetector, as previously described, is an important performance parameter, as it contributes to lowering power consumption of apparatuses including the photodetector. Another important aspect performance parameter is dark current flowing between a readout region and the control region of a switched photodetector, as the dark current contributes to the noise of a signal detected by the switched photodetector, degrading the signal-to-noise ratio (SNR) of a measure ToF signal.

Figure 8A:
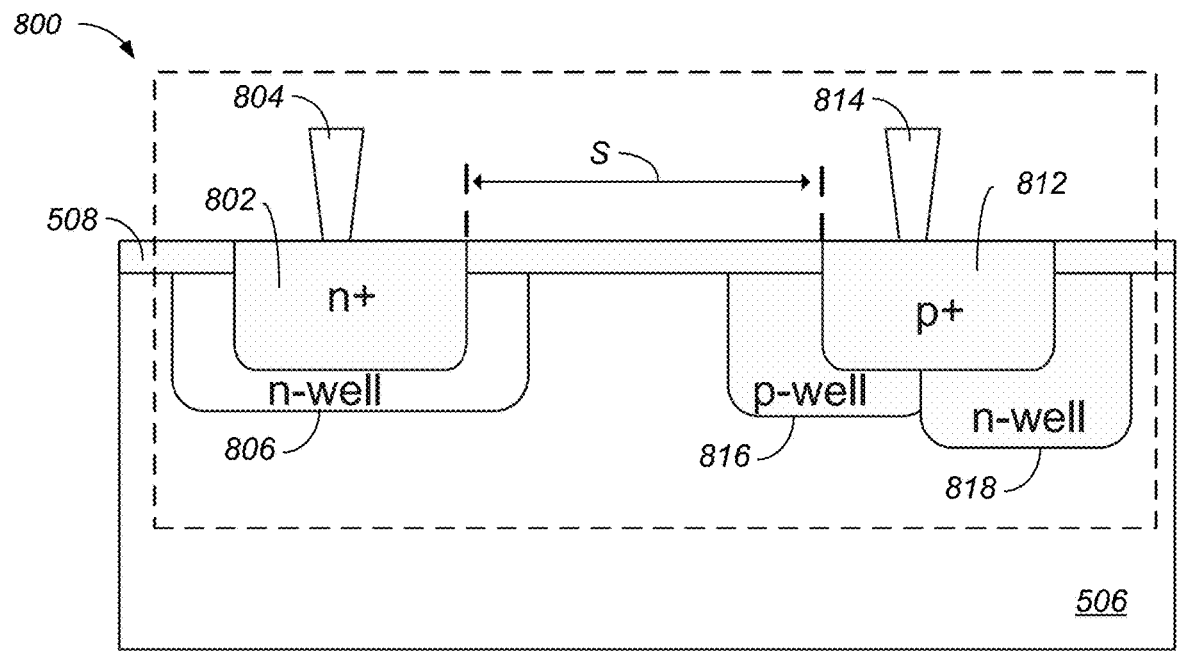
FIGS. 8A-8C are examples of a switch for a switched photodetector.

FIG. 8A shows an example switch 800 for a switched photodetector. The switch 800 may be used as a first or second switch in various switched photodetectors described in the present specification. The switch 800 is formed in the absorption region 506 having the first layer 508, which has been described previously described in relation to FIG. 5A. The switch 800 includes an n-doped region 802, a readout contact 804 coupled to the n-doped region 802, a lightly doped n-well region 806, a p-doped region 812, a control contact 814 coupled to the p-doped region 812, a lightly doped p-well region 816, and an n-well region 818. The edges of the n-doped region 802 and the p-doped region 812 are separated by a distance S. The n-doped region 802 and the p-doped region 812 may be similar to the first n-doped region 534 and the first p-doped region 537 of FIG. 5E. The n-well region 818 may be similar to the n-well region 539 in FIG. 5E. The readout contact 804 and the control contact 814 may be similar to the first readout contact 535 and the first control contact 538 in FIG. 5E. The p-doped region 812 may be a control region, and the n-doped regions 802 may be a readout region.

Origins of the dark current in a lateral PIN diode formed by the control region (p-doped region 812), the absorption region 506 (undoped/intrinsic), and a readout region (n-doped region 802) include Shockley-Read-Hall (SRH) generation and band-to-band tunneling. SRH generation may be influenced by presence of surface defects at the surface of the absorption region 506. The addition of the first layer 508 partially reduces the surface defect, which can reduce the dark current due to SRH generation. Increasing the distance S between the n-doped region 802 and the p-doped region 812 can also reduce the dark current due to, for example, lowering of the electrical field between the n-doped region 802 and the p-doped region 812, which in turn decreases the SRH generation rate between the said regions. For example, the distance S should be kept at above 400 nm. However, increasing the distance S can lead to a reduction in bandwidth of the photodetector due to, for example, an increase in carrier transit time. Addition of the lightly doped n-well region 806, the lightly doped p-well region 816, or combinations thereof may help overcome such tradeoff.

The respective lightly doped regions 806 and 816 have dopant concentrations that are lower than the respective n-doped region 802 and the p-doped region 812. For example, the lightly doped regions 806 and 816 can have dopant concentrations on the order of $1*10^{17}$ cm$^{-3}$, which are lower than that of the n-doped region 802 and the p-doped region 812 which can have dopant concentrations on the order of $1*10^{19}$ cm$^{-3}$. The presence of the lightly doped regions reduces discontinuity in the dopant concentrations between the doped regions 802 and 812 and the absorption region 506, which may have dopant concentrations on the order of $1*10^{15}$ cm$^{-3}$ or lower, by providing a region of intermediate dopant concentration, which results in a reduction in the electric field values at the edges of the doped regions 802 and 812. By reducing the electric field values, band-to-band tunneling may also be reduced, which leads to lowering of the dark current between the two doped regions 802 and 812. In addition, contributions from SRH generation may be reduced. In general, the doping concentration of the lightly doped regions 806 and 816 may be set based on various factors such a geometry of the switch, doping concentration of the doped regions 802 and 812, and doping concentration of the absorption region 506.

Figure 8B:
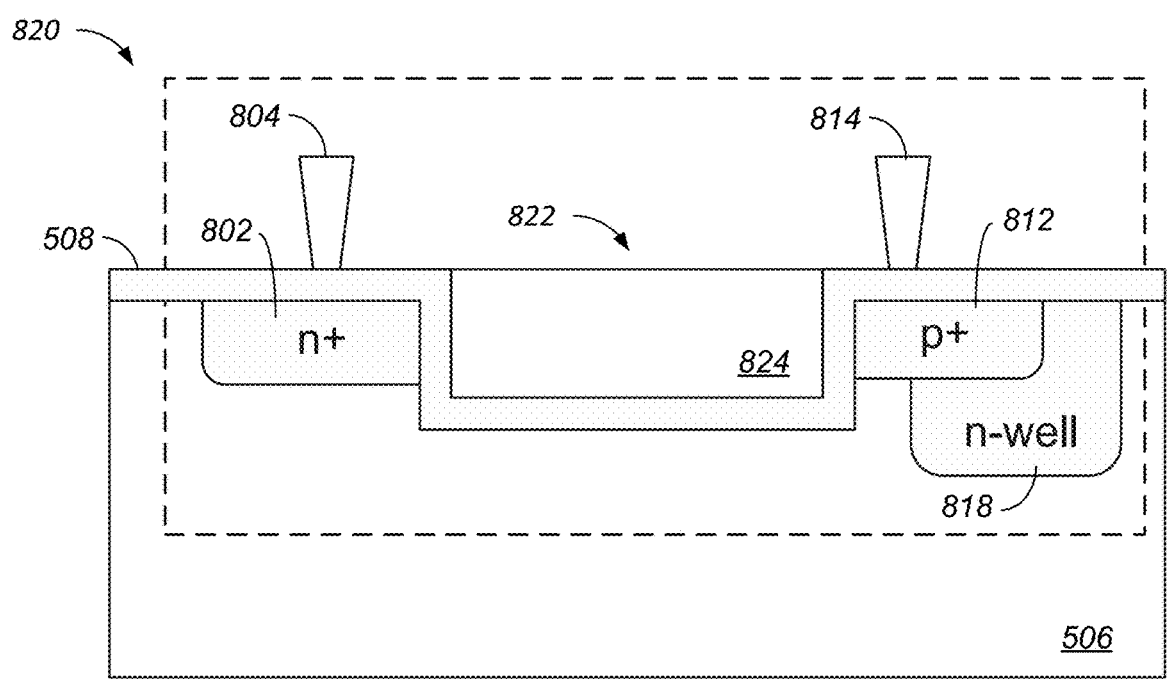

FIG. 8B shows an example switch 820 for a switched photodetector. Switch 820 is similar to the switch 800 in FIG. 8A, but differs in that instead of the lightly doped regions 806 and 816, a trench 822 is formed in the absorption region 506, which is filled by a dielectric fill 824. The trench 822 filled with the dielectric fill 824 can contribute to a reduction in the dark current.

The dielectric fill 824 is typically an electrically insulating material with a dielectric constant lower than that of the surrounding absorption region 506. Electric field is able to penetrate further into a region of low dielectric constant compared to region of high dielectric constant. By placing the dielectric-filled trench 822 in proximity to the doped regions 802 and 812, some of the high electric field regions formed around the doped regions 802 and 812 and in depletion regions ("space charge region") surrounding the doped regions 802 and 812 are pulled into the dielectric fill 824. Accordingly, SRH generation and/or band-to-band tunneling in the absorption region 506 is reduced. Furthermore, unlike the germanium absorption region 506, the dielectric fill 824 such as SiO2 is an insulator and does not contribute to SRH generation and/or band-to-band tunneling. Therefore, dark current generation through SRH generation and/or band-to-band tunneling that is caused by high electric field regions at the edges of the doped regions 802 and 812 may be reduced.

The trench 822 may be formed by etching the absorption region through dry (e.g., plasma etching) or wet (e.g., liquid chemical bath) etching techniques. The trench 822 may be etched to a depth similar to the depth of the doped regions 802 and 812 (e.g., 10-200 nm). The trench 822 should overlap with at least a portion of high electric field regions surrounding at least one of the n-doped region 802 or the p-doped region 812. In some implementations, the trench 822 cuts into the doped regions 802 and 812, removing a portion of the n-doped region 802 and the p-doped region 812. Once the trench 822 is formed, the first layer 508 may be deposited over the trench 822 to passivate the defects present on the surface of the trench 822. In the case of a germanium absorption region 806, the first layer 508 may be, for example, amorphous silicon, polysilicon, germanium-silicon, or a combination thereof. Then, the trench 822 is filled with the dielectric fill 824, which may be, for example, SiO2. The dielectric fill 824 should be clean without significant concentration of impurities to avoid generation of dark current.

In some implementations, the depth of the trench may be deeper than the depth of the doped regions 802 and 812. For example, for doped regions 802 and 812 that are approximately 100 nm deep, a trench depth of 200 nm may further reduce SRH generation and/or band-to-band tunneling. In some implementations, greater than 50% reduction in SRH generation and/or band-to-band tunneling around the doped regions 802 and 812 may be observed.

Figure 8C:
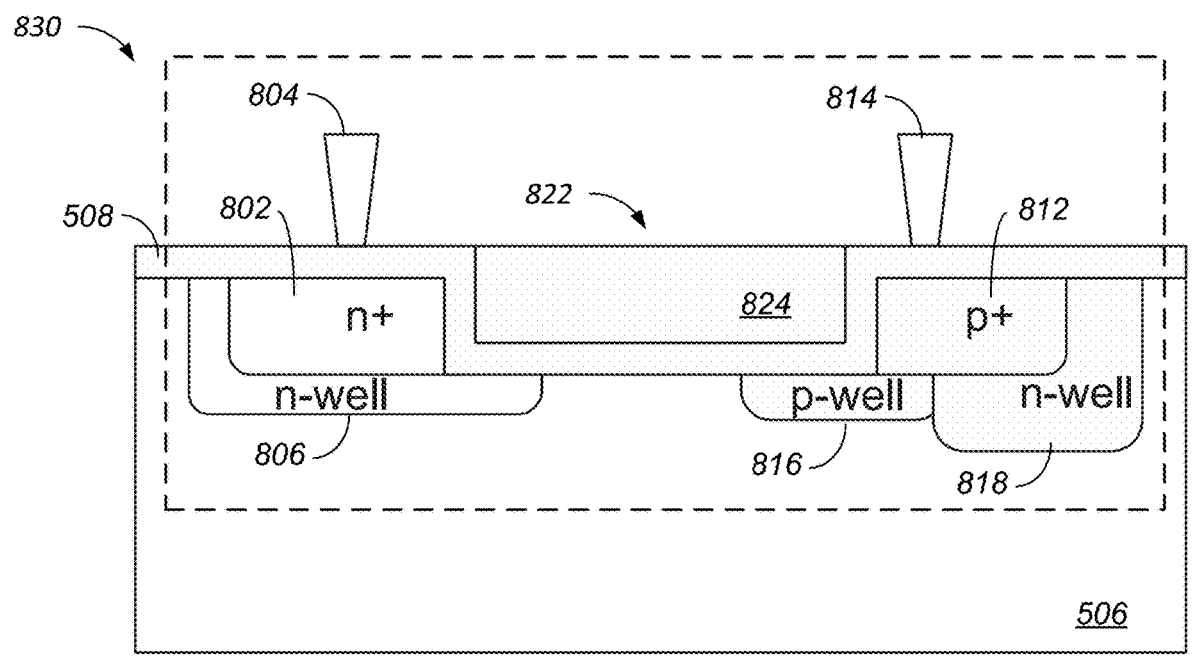

FIG. 8C shows an example switch 830 for a switched photodetector. The switch 830 is similar to the switch 800 of FIG. 8A, but further includes the trench 822 and dielectric fill 824 of FIG. 8B. By simultaneously implementing the lightly-doped regions 806 and 816 and the trench 822, the band-to-band tunneling, the SRH recombination, or combination thereof may be further reduced over individually implementing either the lightly-doped regions 806 and 816 or the trench 822 in isolation.

In general, the reduction in dark current through the use of lightly doped regions 806 and 816 or the trenches 822 depends on the specific design of the switch and the overall design of the switched photodetector that includes the switch. As such, while the implementation shown in FIG. 8C includes both the lightly doped regions 806 and 816 and the trenches 822, a decision to implement the lightly doped regions, the trench, or combination of the two may be based on the specific design of the switched photodetector in which the switch is to be included. Furthermore, while a single trench 822 is shown, in general, the trench 822 may be split into two or more trenches.

While the first layer 508 and the n-well 818 is included in the implementations shown in FIGS. 8A-8D, the first layer 508, the n-well 818, or both may be omitted in some implementations.

So far, various implementations of switched photodetectors and switches for the switched photodetectors have been described. Now, details of the various structures and components of switched photodetectors will be described.

A switched photodetector is typically fabricated on a substrate, such as substrate 102, 202, 302, 402, and 502. The substrate is a carrier material on which the switched photodetector is fabricated. A semiconductor wafer is an example of a substrate. The substrate may be part of the switched photodetector, but in general, the substrate may simply provide a mechanical platform on which the switched photodetector is fabricated. The substrate may be formed from different materials, such as Silicon, Germanium, compound semiconductors (e.g., III-V, II-VI), Silicon Carbide, glass, and sapphire. The substrate may include various layers within. For example, a Silicon-on-Insulator (SOI) substrate includes a base layer of silicon, an insulator layer (e.g., SiO2) on the base layer of silicon, and a device layer of silicon on the layer of insulator. The SOI may include additional device layer-insulator layer pairs. For example, a dual-SOI (DSOI) wafer includes two device layer-insulator layer pairs.

A switched photodetector includes an absorption region configured to absorb incident light and convert the absorbed light into charge carriers. Absorption layers 106, 206, 306, and 406, and absorption regions 506 and 706 are examples of the absorption region. The absorption region may be formed from various absorber materials that absorb the light at the operational wavelengths of the switched photodetector. Example materials for the absorption region include Silicon, Germanium, IV-IV semiconductor alloy (e.g., GeSn, GeSi), III-V compound semiconductors (e.g., GaAs, InGaAs, InP, InAlAs, InGaAlAs), and other materials in the group III, IV, and V of the periodic table. In some implementations, absorption region may be a region within the substrate. For example, a region of a silicon substrate may be used as an absorption region for visible light.

In some implementations, the absorption region may be defined within a light-absorbing material by a change in material composition (e.g., different GeSi composition), by doping a region within the absorbing material (e.g., counter doped region), or by forming an optical window to pass through light (e.g., tungsten grid openings in a BSI image sensor).

The absorber material may be deposited on the substrate. For example, absorber material may be blanket-deposited on the substrate. In some implementations, the absorber material may be deposited on an intermediate layer formed on the substrate. In general, the intermediate layer may be selected based on the absorber material, the substrate, or both. Such intermediate layer may improve device manufacturability and/or improve device performance. Example materials for the intermediate layer include silicon, graded germanium-silicon compound material, graded III-V material, germanium, GaN, and SiC. Graded material refers to a material that has a varying material composition along at least one direction. For example, a graded GeSi material may have a composition that varies from 1% Germanium on one end of the material to 99% Germanium of the other end of the material. In general, the starting and ending composition may be set, for example, based on the substrate composition and the absorber material composition.

In some implementations, the absorber material can be epitaxially grown on the intermediate layer in two or more steps. For example, the absorber material (e.g., Ge, GeSi) may be deposited on a dielectric layer with openings to underlying substrate (e.g., crystalline Silicon substrate). Such multi-step growth procedure may improve material quality (e.g., reduced number of material defects) when the absorber material is deposited on a substrate having mismatched lattice constants. Examples of such multi-step growth procedure is described in U.S. Pat. No. 9,786,715 titled "High Efficiency Wide Spectrum Sensor," which is fully incorporated by reference herein.

Figure 9A:
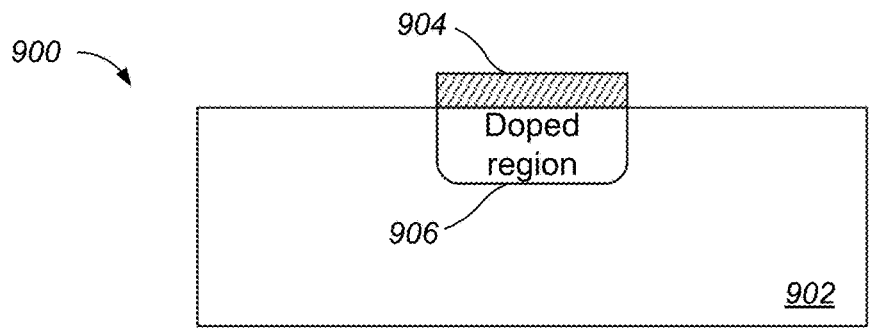
FIGS. 9A-9E are examples of an electrical terminal for a switched photodetector.

FIGS. 9A-9D show example electrical terminals for use in switched photodetectors. Referring to FIG. 9A, an electrical terminal 900 include a region 902, and a contact metal 904, and a doped region 906. The region 902 is a material on which the electrical terminal 900 is formed, and may correspond to an absorption region, such as the absorption region 506, or a substrate, such as the substrate 502. The doped region 906 may be a p-type (acceptor) doped region or an n-type (donor) doped region depending on the type of dopant. The doped region 906 is typically doped to a high doping concentration (e.g., between $1*10^{19}$ to $5*10^{20}$ cm$^{-3}$) to allow an Ohmic contact to be formed between the contact metal 904 and the region 902. Such level of doping concentration may be referred to as "degenerate doping."

The contact metal 904 is a metallic material that is in contact with the region 902 through the doped region 906. The contact metal may be selected from various metals and alloys based on the material of the region 902 and dopants of the doped region 906. Examples include Al, Cu, W, Ti, Ta—TaN—Cu stack, Ti—TiN—W stack, and various silicides.

Figure 9B:
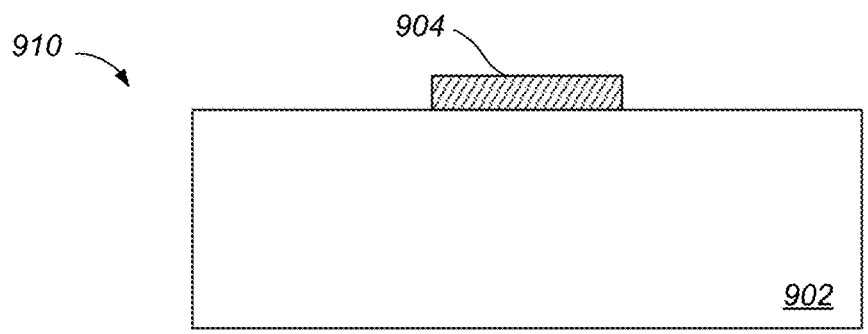

Referring to FIG. 9B, an electrical terminal 910 is similar to the electrical terminal 900 of FIG. 9A, but differs in that the doped region 906 is omitted. The direct placement of the contact metal 904 on the region 902 without the doped region 906 may lead to formation of a Schottky contact, an Ohmic contact, or a combination thereof having an intermediate characteristic between the two, depending on various factors including the material of the region 902, the contact metal 904, and the impurity or defect level of the region 902.

Figure 9C:
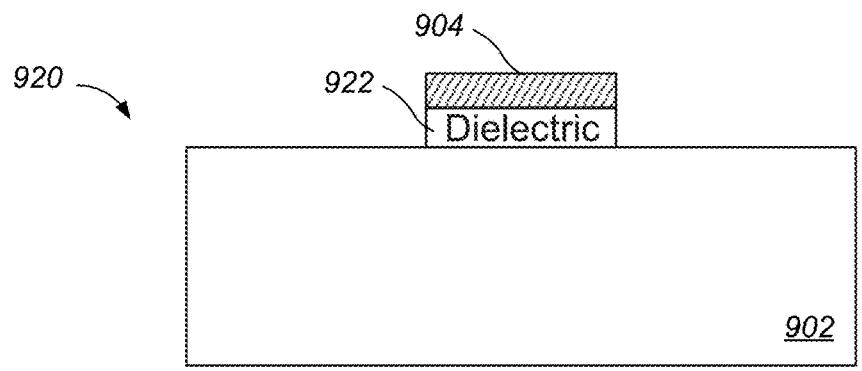

Referring to FIG. 9C, an electrical terminal 920 is similar to the electrical terminal 910 of FIG. 9B, but differs in that a dielectric layer 922 is inserted between the contact metal 904 and the region 902. For example, for a (crystalline) germanium region 902, the dielectric layer 922 may be amorphous silicon, polysilicon, or germanium-silicon. As another example, for a (crystalline) silicon region 902, the dielectric layer 922 may be amorphous silicon, polysilicon, or germanium-silicon. The insertion of the dielectric layer 922 may lead to formation of a Schottky contact, an Ohmic contact, or a combination thereof having an intermediate characteristic between the two.

Figure 9D:
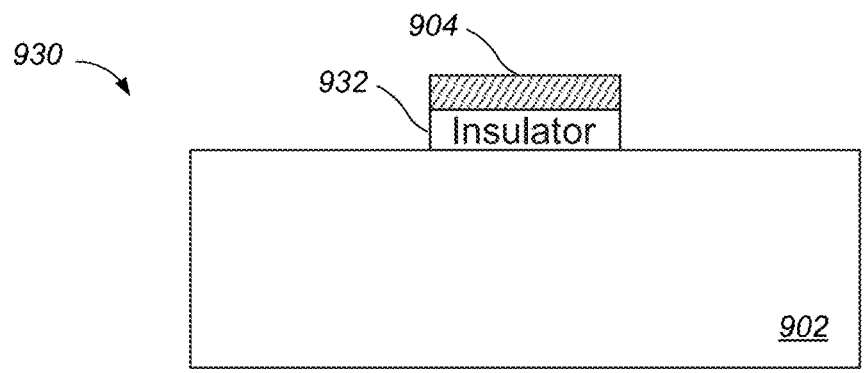

Referring to FIG. 9D, an electrical terminal 930 is similar to the electrical terminal 910 of FIG. 9B, but differs in that an insulating layer 932 is inserted between the contact metal 904 and the region 902. The insulating layer 932 prevents direct current conduction from the contact metal 904 to the region 902, but allows an electric field to be established within the region 902 in response to an application of a voltage to the contact metal 904. The established electric field may attract or repel charge carriers within the region 902. The insulating layer 932 may be SiO2, Si3N4, or high-k material.

A switch, such as the switch first switch 532 of FIG. 5D, of a switched photodetector includes a carrier control terminal and a carrier collection (readout) terminal. A carrier control terminal is a terminal configured to direct photo-generated carriers within the region 902 in a certain direction (e.g., toward the carrier collection terminal) by application of a control voltage through, for example, an external bias circuitry. The operation of the carrier control terminal has been described in relation to the control signals 122 and 132 of FIG. 1A. Different types of electrical terminals may be used to implement the carrier control terminal. For example, the electrical terminals 900, 910, 920, and 930 may be used to implement the carrier control terminal.

A carrier collection terminal is a terminal configured to collect the photo-generated carriers in the region 902. The carrier collection terminal may be configured to collect electrons (e.g., n-type doped region 906) or holes (e.g., p-type doped region 906). The operation of the carrier collection terminal has been described in relation to the readout circuits 124 and 134 of FIG. 1A. Different types of electrical terminals may be used to implement the carrier collection terminal. For example, the electrical terminals 900, 910, and 920 may be used to implement the carrier collection terminal.

The number of carrier control and carrier collection terminals may be varied based on a variety of considerations, such as target device performance. As examples, a switched photodetector may have the following exemplary configurations: 2 carrier control terminals and 2 carrier collection terminals; 2 carrier control terminals and 1 carrier collection terminal; 4 carrier control terminals and 2 carrier collection terminals; and 4 carrier control terminals and 4 carrier collection terminals. In general, a switched photodetector can have any number of carrier control terminals and carrier collection terminals greater than 1.

When more two or more control terminals are implemented within a switched photodetector, various combinations of the previously described electrical terminals may be used. For example, a combination of Ohmic and Schottky/Ohmic terminals (e.g., terminals 900 and 920), Ohmic and insulating (e.g., terminals 900 and 930), insulating and Schottky/Ohmic (e.g., terminals 930 and 920), and Ohmic and Schottky/Ohmic, and insulating (e.g., terminals 900, 920, and 930) may be used.

When more two or more carrier collection terminals are implemented within a switched photodetector, a combination of Ohmic and Schottky/Ohmic terminals (e.g., terminals 900 and 920) may be used.

Figure 9E:
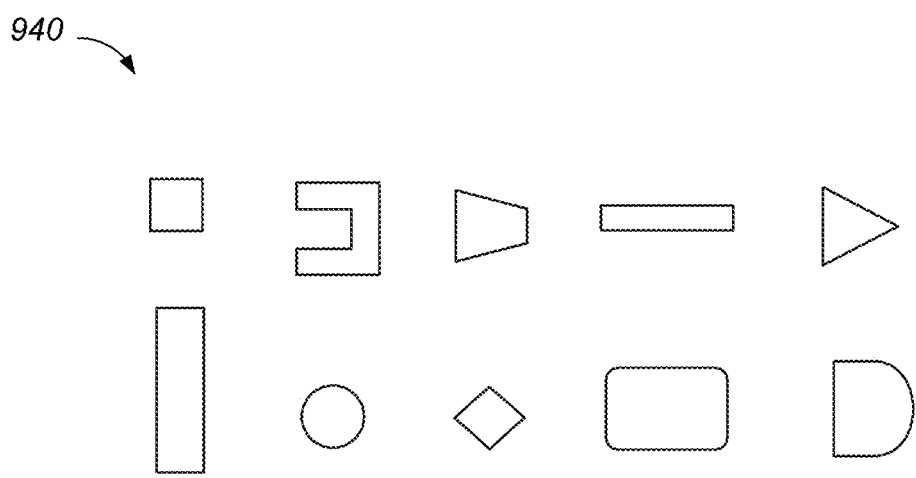

The electrical terminals can have various shapes based on a variety of considerations, such as manufacturability and device performance. FIG. 9E shows an example top view of various shapes of an electrical terminal. The terminals 940 may have rectangular, triangular, circular, polygonal, or may be a combination of such shapes. The corners of the terminals may be sharp, or may be rounded. The shapes can be defined using doping region, metal silicide, contact metal or any combination thereof.

The absorption region and the substrate may be arranged in various configurations, and the absorption region may take on various shapes based on various considerations, such as manufacturability and device performance. Referring to FIGS. 10A-10I, example configurations of an absorption region and a substrate are shown. Specifically, referring to FIG. 10A, a configuration 1000 includes a substrate 1002 and an absorption region 1004 protruding from an upper surface of the substrate 1002. The substrate 1002 may be similar to substrate 502 described in relation to FIG. 5D, and the absorption region 1004 may be similar to absorption region 506 described in relation to FIG. 5D. The configuration 1000 may be fabricated by depositing the absorption region 1004 on the substrate 1002, and etching the absorption region 1004 into the protruding structure.

Figure 10A:
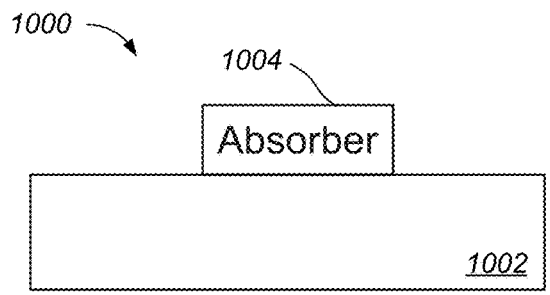
FIGS. 10A-10I are example configurations of a photodetector with an absorption region and a substrate.
Figure 10B:
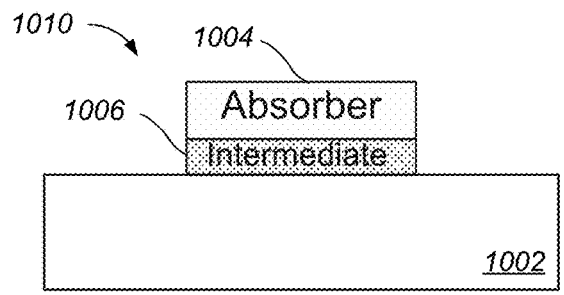

Referring to FIG. 10B, a configuration 1010 is similar to the configuration 1000 in FIG. 10A, but now includes an intermediate layer 1006 between the absorption region 1004 and the substrate 1002. The intermediate layer may be a buffer layer that facilitates the growth of the absorption region 1004 over the substrate 1002. The configuration 1010 may be fabricated by depositing an intermediate layer 1006 on the substrate 1002, depositing the absorption region 1004 on the intermediate layer 1006, and etching the absorption region 1004 and the intermediate layer 1006 into the protruding structure.

Figure 10C:
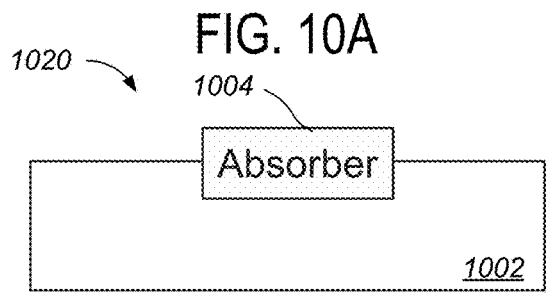

Referring to FIG. 10C, a configuration 1020 is similar to the configuration 1000 in FIG. 10A, but now the absorption region 1004 is partially embedded in the substrate 1002. The configuration 1020 may be fabricated by forming a recess on the substrate 1002, and selectively depositing the absorption region 1004 in the formed recess. Alternatively, the configuration 1020 may be fabricated by depositing a sacrificial layer over the substrate 1002, etching through the deposited sacrificial layer to form the recess on the substrate 1002, selectively depositing the absorbing material, removing the absorbing material deposited outside of the recess by performing a planarizing step such as a chemical-mechanical polishing (CMP) step, and removing the sacrificial layer through a selective etch, such as a wet chemical etch.

Figure 10D:
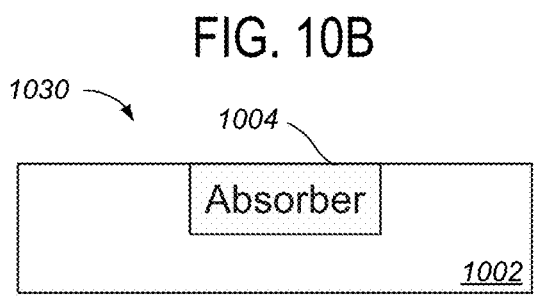

Referring to FIG. 10D, a configuration 1030 is similar to the configuration 1020 in FIG. 10C, but now the absorption region 1004 is fully embedded in the substrate 1002. The configuration 1030 may be fabricated by forming a recess on the substrate 1002, depositing a selective layer of absorbing material over the substrate 1002, and removing the absorbing material deposited outside of the recess by performing a planarizing step, such as a chemical-mechanical polishing (CMP) step.

Figure 10E:
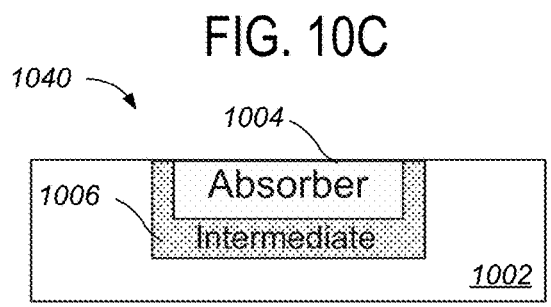

Referring to FIG. 10E, a configuration 1040 is similar to the configuration 1030 in FIG. 10D, but now the intermediate layer 1006 is inserted between, in the recess, the absorption region 1004 and the substrate 1002. The configuration 1040 may be fabricated by forming a recess on the substrate 1002, depositing a conformal layer of the intermediate layer 1006, depositing a blanket layer of absorbing material over the intermediate layer 1006, and removing the absorbing material and the intermediate layer deposited outside of the recess by performing a planarizing step, such as a chemical-mechanical polishing (CMP) step.

Figure 10F:
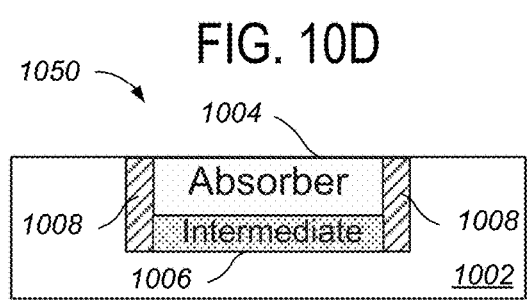

Referring to FIG. 10F, a configuration 1050 is similar to the configuration 1040 in FIG. 10E, but now a second intermediate layer 1008 replaces the first intermediate layer 1006 at the interface between a sidewall of the absorption region 1004 and the sidewall of the recess of the substrate 1002. The configuration 1050 may be fabricated by forming a recess on the substrate 1002, depositing a conformal layer of the second intermediate layer 1008, performing an anisotropic blanket etching to remove the second intermediate layer 1008 along vertical surfaces, depositing a conformal layer of the first intermediate layer 1006, performing an anisotropic blanket etching to remove the first intermediate layer 1006 along non-vertical surfaces, depositing a selective layer of absorbing material, and removing the absorbing material and the first intermediate layer deposited outside of the recess by performing a planarizing step, such as a chemical-mechanical polishing (CMP) step. In an exemplary implementation, the first intermediate layer 1006 may be formed from SiO2, and the second intermediate layer 1008 may be formed from GeSi.

Figure 10G:
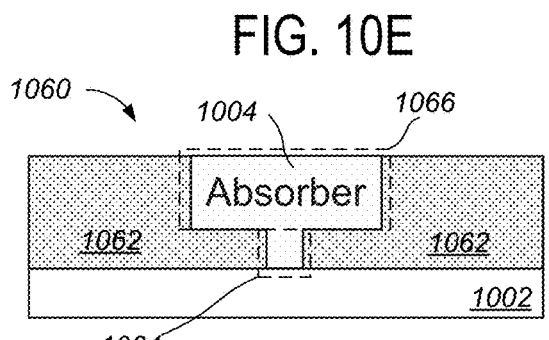

Referring to FIG. 10G, a configuration 1060 is similar to the configuration 1000 in FIG. 10A, but now includes a tiered intermediate layer 1062 in which the absorption region 1004 is embedded. The tiered intermediate layer 1062 includes an opening 1064 to the substrate 1002, and a recess 1066 in which the absorption region 1004 is embedded. The absorption region 1004 contacts the substrate 1002 through the opening 1064. The configuration 1060 may be fabricated by depositing an intermediate layer on the substrate 1002, etching the opening 1064 throughout the entire thickness of the deposited intermediate layer, etching the recess 1066 in the deposited intermediate layer, depositing the absorption region 1004 on the tiered intermediate layer 1062, and removing the absorbing material deposited outside of the recess 1066 by performing a planarizing step, such as a chemical-mechanical polishing (CMP) step.

Figure 10H:
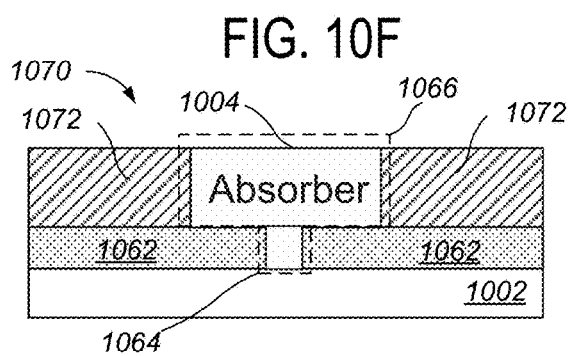

Referring to FIG. 10H, a configuration 1070 is similar to the configuration 1060 in FIG. 10G, but now includes a second intermediate layer 1072 in which the recess 1066 is formed. The configuration 1070 may be fabricated by depositing the first intermediate layer 1062 on the substrate 1002, depositing the second intermediate layer 1072, etching the opening 1064 through the first intermediate layer 1062 and the second intermediate layer 1072, etching the recess 1066 in the second intermediate layer 1072, depositing the absorption region 1004, and removing the absorbing material deposited outside of the recess 1066 by performing a planarizing step, such as a chemical-mechanical polishing (CMP) step.

Figure 10I:
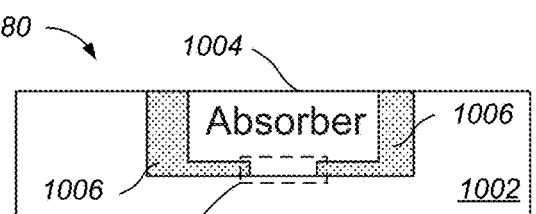

Referring to FIG. 10I, a configuration 1080 is similar to the configuration 1040 in FIG. 10E, but now includes an opening 1084 formed on the intermediate layer 1006. The absorption region 1004 contacts the substrate 1002 through the opening 1084. The configuration 1080 may be fabricated by forming a recess on the substrate 1002, depositing a conformal layer of the intermediate layer 1006, etching the opening 1084, depositing a blanket layer of absorbing material over the intermediate layer 1006, and removing the absorbing material and the intermediate layer deposited outside of the recess by performing a planarizing step, such as a chemical-mechanical polishing (CMP) step.

Figure 11A:
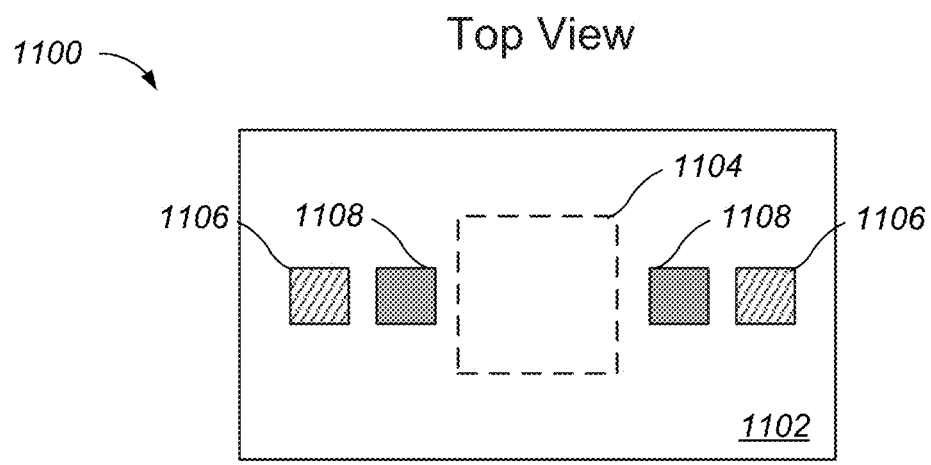
FIGS. 11A-11F are top and side views of examples of switched photodetectors.
Figure 11B:
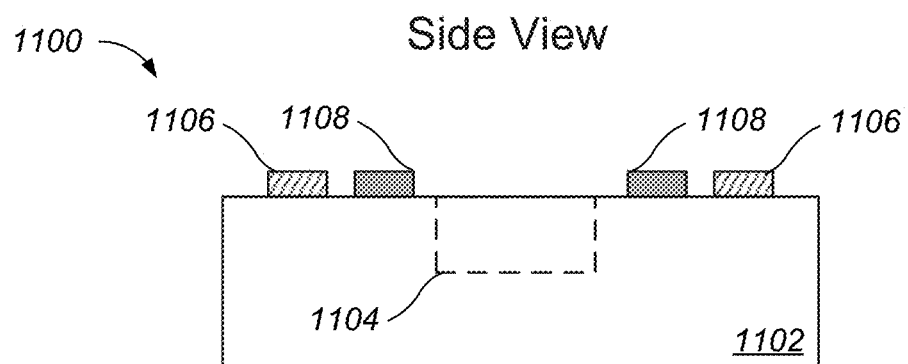

The absorption region, the carrier control terminals, and the carrier collection terminals may be arranged in various configurations based on a variety of considerations, such as manufacturability and device performance. FIGS. 11A-11B show a top view and a side view of an example switched photodetector 1100 in which the carrier control terminals and the carrier collection terminals are placed on the substrate, and a portion of the substrate is the absorption region. In this example, the switched photodetector 1100 includes a substrate 1102, an absorption region 1104, carrier collection terminals 1106, and carrier control terminals 1108. The absorption region 1104 is a region within the substrate 1102. For example, for a silicon substrate 1102, the absorption region 1104 is formed in silicon, and the absorption region 1104 may absorb visible light. The absorption region 1104 may have various shapes, e.g., a square shape in a top view of the photodetector 1100. The absorption region 1104 may extend from an upper surface of the substrate 1102 and into a desired depth below the upper surface. For example, the absorption region 1104 may extend 1 µm, 2 µm, 3 µm, 5 µm, or 10 µm below the upper surface of the substrate 1102. Adjacent pairs of the carrier collection terminal 1106 and the carrier control terminal 1108 forms a switch. The absorption region 1104 is arranged between the adjacent pairs of carrier collection terminal 1106 and the carrier control terminal 1108. In some implementations, the adjacent pairs of carrier collection terminal and carrier control terminal are arranged symmetrically about the absorption region 1104 (e.g., on opposite sides or on the four sides of the absorption region 1104). Such symmetric placement may improve matching of carrier control and collection performance of the two switches formed by the pairs.

Figure 11C:
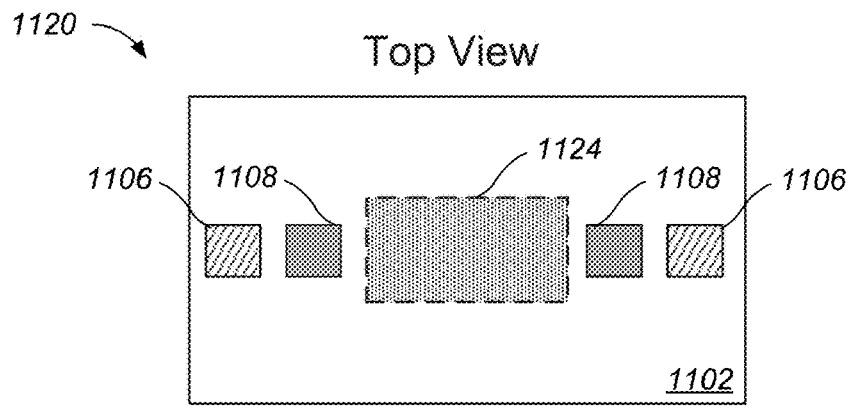
Figure 11D:
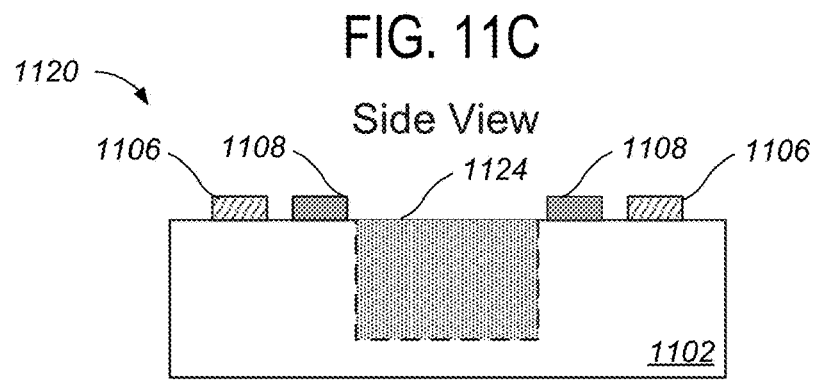

FIGS. 11C-11F show a top view and side views of example switched photodetectors in which the absorption regions are formed from a material different than the substrate. Referring to FIGS. 11C-11D, the switched photodetector 1120 includes the substrate 1102, an absorption region 1124, the carrier collection terminals 1106, and the carrier control terminals 1108. FIG. 11C shows a top view of the switched photodetector 1120, and FIG. 11D shows a side view of the switched photodetector 1120. The switched photodetector 1120 is similar to the switched photodetector 1100 of FIGS. 11A-11B, but differs in that the absorption region 1124 of the switched photodetector 1120 is formed from a material different than the substrate 1102. For example, the absorption region 1124 may be formed from germanium, and the substrate 1102 may be a silicon substrate. The absorption region 1124 is fully embedded in a recess formed in the substrate 1102. While specifics of the embedded structure are not shown, the embedded absorption region 1124 may be implemented, for example, as described in relation to FIGS. 10D-10F and FIG. 5C.

Figure 11E:
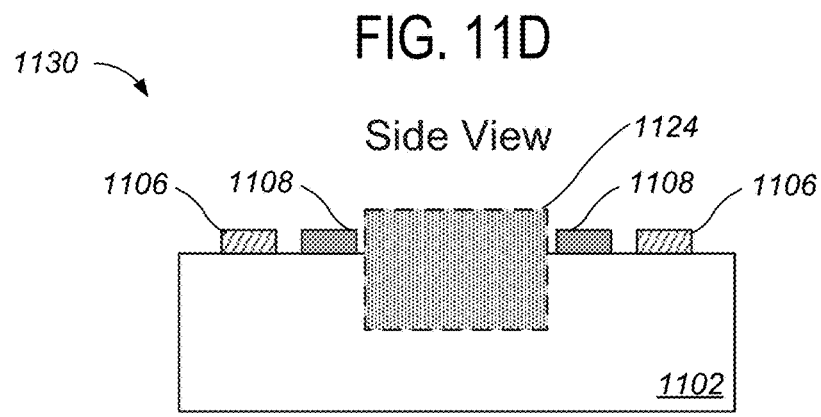

Referring to FIG. 11E, a switched photodetector 1130 is similar to the switched photodetector 1120 of FIGS. 11C-11D, but differs in that the absorption region 1124 is now partially embedded in the substrate 1102. While specifics of the partially embedded structure are not shown, the partially embedded absorption region 1124 may be implemented, for example, as described in relation to FIG. 10C and FIG. 5B.

Figure 11F:
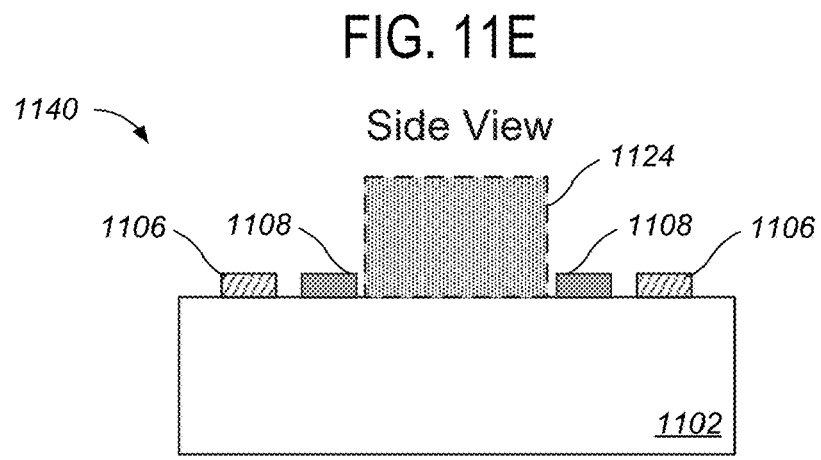

Referring to FIG. 11F, a switched photodetector 1140 is similar to the switched photodetector 1120 of FIGS. 11C-11D, but differs in that the absorption region 1124 is now fully protruding on the substrate 1102. While specifics of the fully protruding structure are not shown, the full protruding absorption region 1124 may be implemented, for example, as described in relation to FIGS. 10A-10B and FIG. 5A.

Figure 12A:
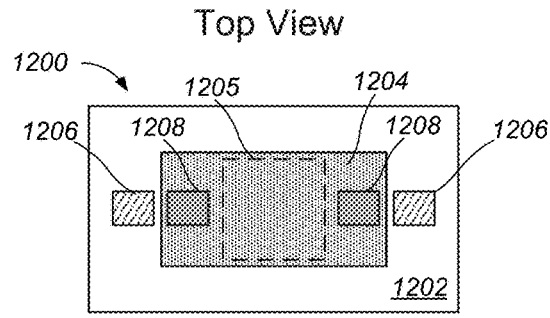
FIGS. 12A-12H are top and side views of examples of switched photodetectors.

In some configurations of the switched photodetectors, the carrier collection terminals, the carrier control terminals, or both may be placed on an absorption region. Descriptions of the implementation details of the substrate, the absorption region, the carrier control terminals, and the carrier collection terminals will be omitted for brevity. FIGS. 12A-12B show a top view and a side view of an example switched photodetector 1200 in which the carrier collection terminals are placed on the substrate, and the carrier control terminals are placed on an absorption region. The switched photodetector 1200 includes a substrate 1202, an absorption region 1204, a light receiving region 1205, carrier collection terminals 1206, and carrier control terminals 1208. The light receiving region 1205 may indicate a portion of the absorption region 1204 on which input light is incident, and may be physically indistinguishable from the remaining portion of the absorption region 1204. For example, a combination of a light shield (e.g., tungsten grid) and a microlens may block and focus the incident light onto the light receiving region 1205. The carrier collection terminals 1206 are placed on the substrate 1202, and the carrier control terminals 1208 are placed on the absorption region 1204 on a location that does not overlap with the light receiving region 1205. For the switched photodetector 1200, the absorption region 1204 is fully protruding. The absorption region 1204 may be partially embedded as shown in FIG. 12C for a switched photodetector 1220, or fully embedded as shown in FIG. 12D for a switched photodetector 1230.

Figure 12E:
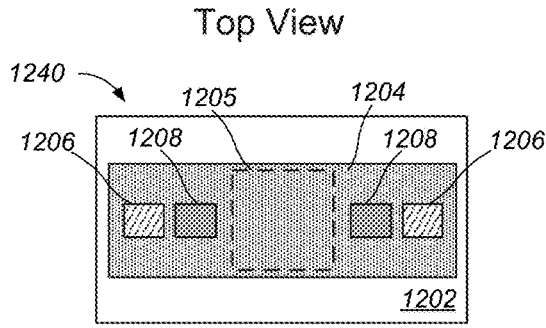
Figure 12B:
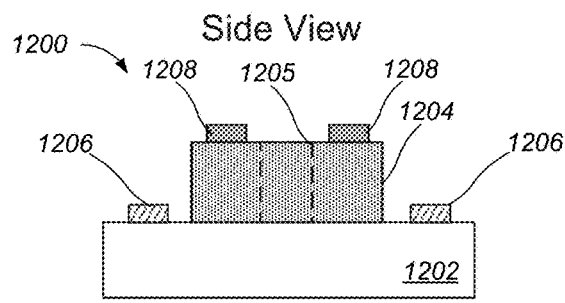
Figure 12F:
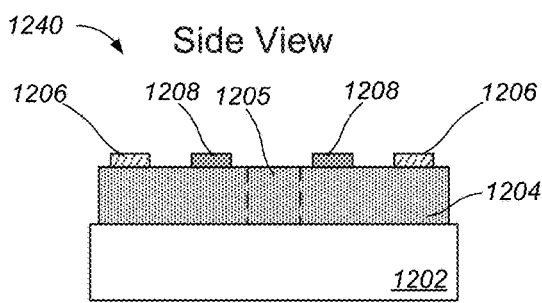
Figure 12C:
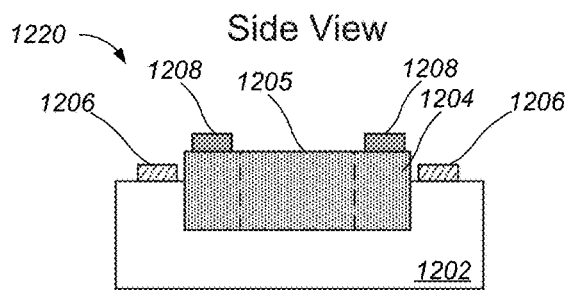
Figure 12G:
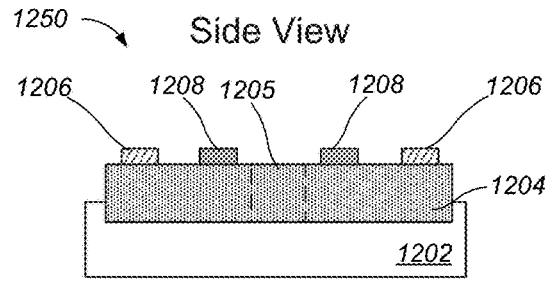
Figure 12D:
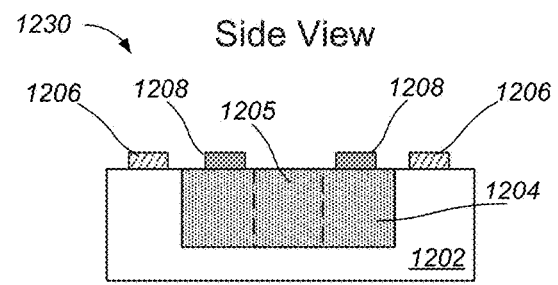
Figure 12H:
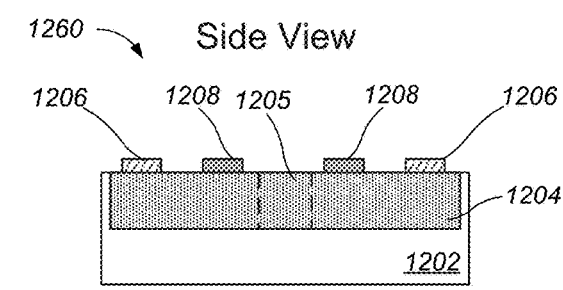

FIGS. 12E-12F show a top view and a side view of an example switched photodetector 1240 in which both the carrier collection terminals and the carrier control terminals are placed on the absorption region. The switched photodetector 1240 is similar to the switched photodetector 1200 of FIGS. 12A-12B, but differs in that the carrier collection terminals 1206 are now placed on the absorption region 1204 on a location that does not overlap with the light receiving region 1205. For the switched photodetector 1240, the absorption region 1204 is fully protruding. The absorption region 1204 may be partially embedded as shown in FIG. 12G for a switched photodetector 1250, or fully embedded as shown in FIG. 12H for a switched photodetector 1260.

While light receiving regions 1205 in FIGS. 12A-12H are shown to not overlap with the carrier collection terminals or the carrier control terminals, in general, the light receiving regions 1205 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

Figure 13A:
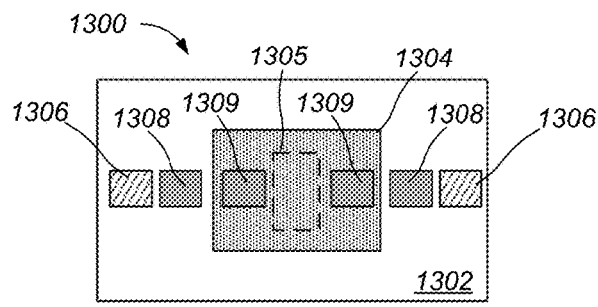
FIGS. 13A-13G are top and side views of examples of switched photodetectors.

In some configurations of the switched photodetectors, each switch may include more than one carrier collection terminals, more than one carrier control terminals, or more than one of both. Descriptions of the implementation details of the substrate, the absorption region, the light receiving region, the carrier control terminals, and the carrier collection terminals will be omitted for brevity. FIGS. 13A-13G show top views of example switched photodetectors having switches that include multiple carrier control terminals or multiple carrier collection terminals. Referring to FIG. 13A, the switched photodetector 1300 includes a substrate 1302, an absorption region 1304, a light receiving region 1305, substrate carrier collection terminals 1306, substrate carrier control terminals 1308, and absorber carrier control terminals 1309. The substrate carrier collection terminals 1306 are carrier collection terminals placed on a substrate, such as the substrate 1302. The substrate carrier control terminals 1308 are carrier control terminals placed on a substrate, such as the substrate 1302. The absorber carrier control terminals 1309 are carrier control terminals placed on an absorption region, such as the absorption region 1304. The effects and implementation details of the absorber carrier control terminals 1309 in combination with the substrate carrier control terminal 1308 have been described in relation to FIG. 5K. In some implementations, the illustrated arrangement of the substrate carrier collection terminals 1306, the substrate carrier control terminals 1308, and the absorber carrier control terminals 1309 may be repeated in a second row as shown in FIG. 13B.

Referring to FIG. 13B, the switched photodetector 1310 is similar to the switched photodetector 1300 of FIG. 13A, but differs in that the substrate carrier control terminals 1308 has been omitted, and a second row of pairs of terminals 1306 and 1309 has been added. The second pairs of control and collection terminals may function independent of, or function in combination with the first pairs of control and collection terminals that are adjacent to the second pairs of terminals.

Figure 13D:
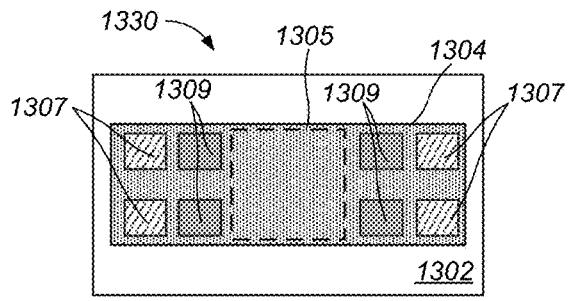
Figure 13B:
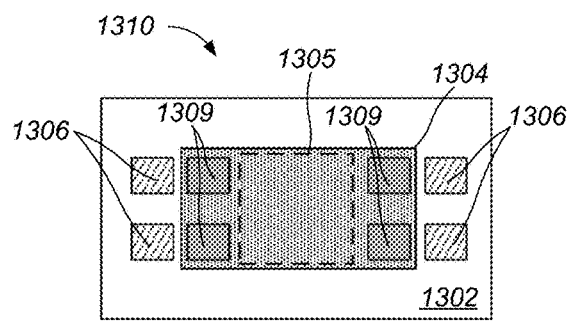
Figure 13E:
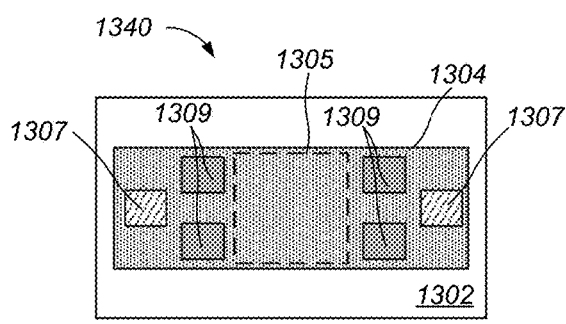
Figure 13C:
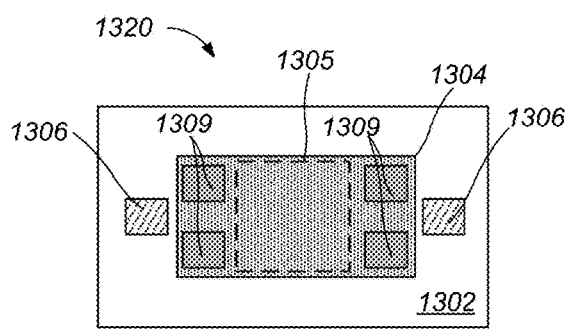

Referring to FIG. 13C, the switched photodetector 1320 is similar to the switched photodetector 1310 of FIG. 13B, but differs in that one of the substrate carrier collection terminals 1306 has been removed from each side of the light receiving region 1305. The pairs of absorber carrier control terminals 1309 on each side of the light receiving region 1305 in combination with respective substrate carrier collection terminals 1306 may function as a switch.

Referring to FIG. 13D, the switched photodetector 1330 is similar to the switched photodetector 1310 of FIG. 13B, but differs in that the substrate carrier collection terminals 1306 have been moved onto the absorption region 1304 as absorber carrier collection terminals 1307.

Referring to FIG. 13E, the switched photodetector 1340 is similar to the switched photodetector 1330 of FIG. 13D, but differs in that one of the absorber carrier collection terminals 1307 has been removed from each side of the light receiving region 1305. The pairs of absorber carrier control terminals 1309 on each side of the light receiving region 1305 in combination with respective absorber carrier collection terminals 1307 may function as a switch.

Figure 13F:
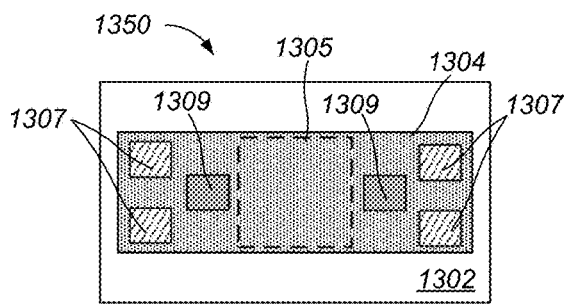

Referring to FIG. 13F, the switched photodetector 1350 is similar to the switched photodetector 1330 of FIG. 13D, but differs in that one of the absorber carrier control terminals 1309 has been removed from each side of the light receiving region 1305. The pairs of absorber carrier collection terminals 1307 on each side of the light receiving region 1305 in combination with respective absorber carrier control terminals 1309 may function as a switch.

Figure 13G:
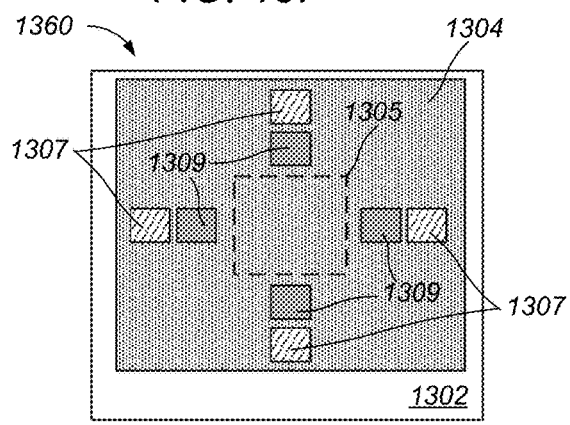

Referring to FIG. 13G, the switched photodetector 1360 is similar to the switched photodetector 1330 of FIG. 13D, but differs in that four pairs of absorber carrier collection and control terminals 1307 and 1309 are now symmetrically arranged about the light receiving region 1305. Each pair of terminals 1307 and 1309 may function as a switch. Each switch may function independently, or function in tandem with another switch. For example, east and west switches may be controlled as a first switch and north and south switches may be controlled as a second switch. As another example, the east and south switches may be controlled as a first switch and west and north switches may be controlled as a second switch.

While light receiving regions 1305 in FIGS. 13A-13G are shown to not overlap with the carrier collection terminals or the carrier control terminals, in general, the light receiving regions 1305 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

Figure 14A:
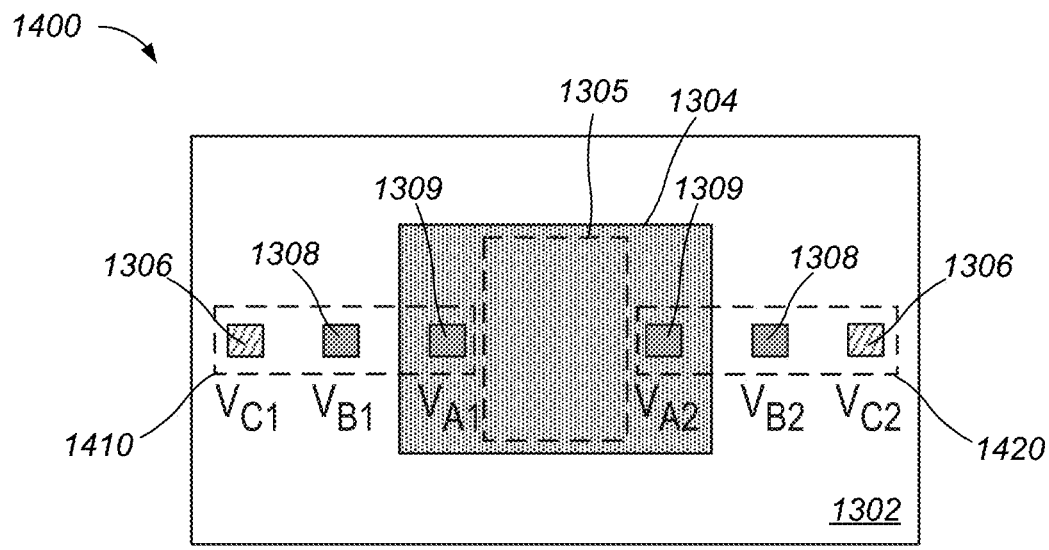
FIGS. 14A-14B are top views of examples of switched photodetectors.
Figure 14B:
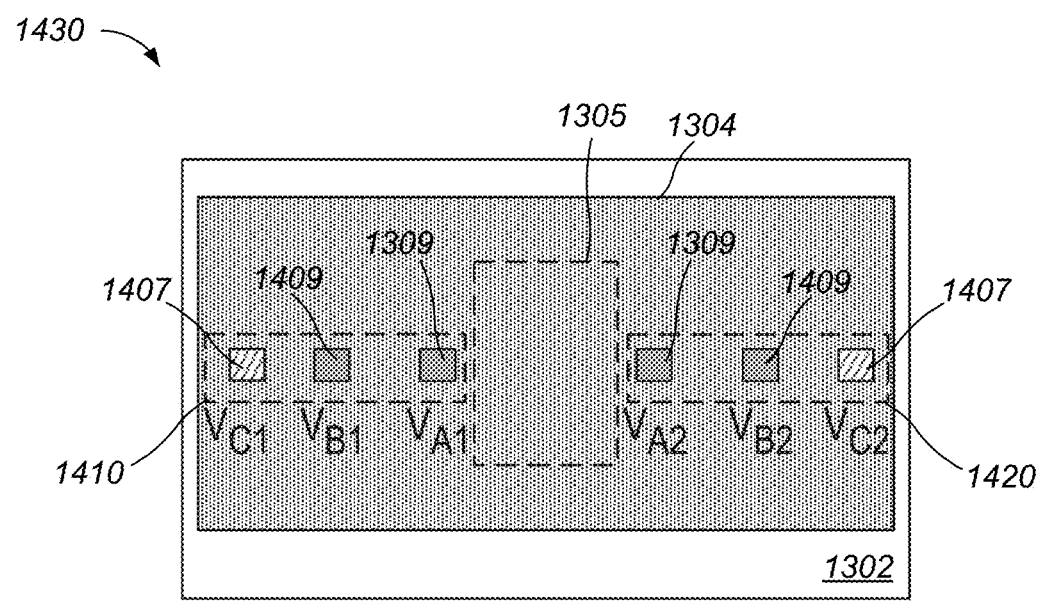

For switches having two or more carrier control terminals, the carrier control terminals may be biased independently with independently controlled bias voltages, or the carrier control terminals may be shorted together and biased with a single bias voltage. FIGS. 14A-14B show top views of example switched photodetectors having switches that include multiple carrier control terminals. Referring to FIG. 14A, the switched photodetector 1400 is similar to the switched photodetector 1300 of FIG. 13A. The substrate carrier collection terminal 1306, the substrate carrier control terminal 1308, and the absorber carrier control terminal 1309 on the left side of the light receiving region 1305 forms a first switch 1410. The substrate carrier collection terminal 1306, the substrate carrier control terminal 1308, and the absorber carrier control terminal 1309 on the right side of the light receiving region 1305 forms a second switch 1420.

Within the switches 1410 and 1420, the substrate carrier control terminal 1308 and the absorber carrier control terminal 1309 may be shorted together and biased with a single bias voltage, or biased with independently controlled bias voltages. For example, the substrate carrier control terminal 1308 of the first switch 1410 is biased with voltage VB1 and the absorber carrier control terminal 1309 is biased with voltage VA1. Similarly, the substrate carrier control terminal 1308 of the second switch 1420 is biased with voltage VB2 and the absorber carrier control terminal 1309 is biased with voltage VA2. In some implementations, the control terminals closer to the light receiving region 1305, such as the absorber carrier control terminals 1309, may be biased to respective control voltages VA1 and VA2 to direct the photo-generated carriers in the light receiving region 1305 toward the substrate carrier collection terminals 1306 that are biased to voltages Vc1 and Vc2 as shown. Simultaneously, the substrate control terminals 1308 may be biased to voltages Vb1 and Vb2 to establish a high electric field between the substrate control terminals 1308 and the substrate carrier collection terminals 1306. With sufficiently high electric field between the terminals 1308 and 1306, a region of avalanche multiplication may be established between the terminals 1308 and 1306, providing an avalanche gain to the photo-generated carriers that have been directed toward the substrate carrier collection terminal 1306 by the absorber carrier control terminal 1309. As a result, the photo-generated carrier may be multiplied by an avalanche gain, which may increase the photocurrent signal generated by the switched photodetector 1400.

Referring to FIG. 14B, the switched photodetector 1430 is similar to the switched photodetector 1400 of FIG. 14A, but differs in that the substrate carrier collection terminals 1306 have been relocated onto the absorption region 1304 as absorber carrier collection terminals 1407, and the substrate carrier control terminals 1308 have been relocated onto the absorption region 1304 as absorber carrier control terminals 1409. The effects of the different biases to the terminals are analogous to the effects described in relation to FIG. 14A.

While light receiving regions 1305 in FIGS. 14A-14B are shown to not overlap with the carrier collection terminals or the carrier control terminals, in general, the light receiving regions 1305 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

In typical implementations of an image sensor, multiple sensor pixels (e.g., photodetectors) are arranged in an array to allow the image sensor to capture images having multiple image pixels. To allow high integration density, multiple sensor pixels are typically arranged in close proximity to each other on a common substrate. For a semiconducting substrate, such as p-doped silicon substrates, the proximity of the sensor pixels to each other may cause electrical and/or optical crosstalk between the sensor pixels, which may, for example, decrease a signal to noise ratio of the sensor pixels. As such, various isolation structures may be implemented to improve electrical isolation between the sensor pixels.

Figure 15A:
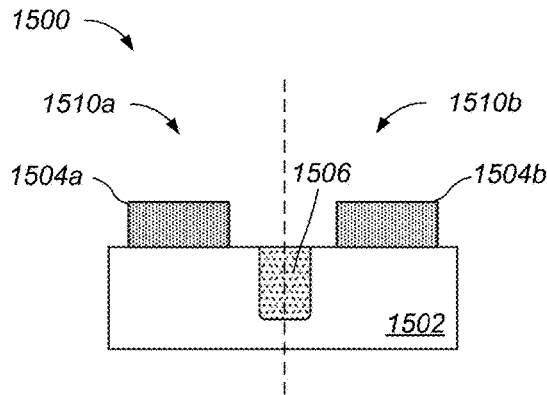
FIGS. 15A-15G are cross-sectional views of example configurations of sensor pixel isolation.

FIGS. 15A-15G show cross-sectional views of example configurations of sensor pixel isolation. Referring to FIG. 15A, an example configuration 1500 includes a substrate 1502, sensor pixels 1510a and 1510b (collectively referred to as sensor pixels 1510), and an isolation structure 1506. The sensor pixels 1510a and 1510b include respective absorption regions 1504a and 1504b. Each sensor pixels 1510 may be a switched photodetector, such as the switched photodetectors of FIGS. 5A-5L. Details of the sensor pixels 1510 has been omitted for clarity.

The isolation structure 1506 may increase the electrical isolation between the sensor pixels 1510a and 1510b. In configuration 1500, the isolation structure extends from an upper surface of the substrate 1502 and extends into a predetermined depth from the upper surface. In some implementations, the isolation structure 1506 is a doped region that has been doped with p-type dopants or n-type dopants. The doping of the isolation structure 1506 may create a bandgap offset-induced potential energy barrier that impedes a flow of current across the isolation structure 1506 and improving electrical isolation between the pixels 1510a and 1510b. In some implementations, the isolation structure 1506 is a trench filled with a semiconductor material that is different from the substrate 1502. An interface between two different semiconductors formed between the substrate 1502 and the isolation structure 1506 may create a bandgap offset-induced energy barrier that impedes a flow of current across the isolation structure 1506 and improving electrical isolation between the pixels 1510a and 1510b.

In some implementations, the isolation structure 1506 is a trench filled with a dielectric or an insulator. The isolation structure 1506 filled with a low conductivity dielectric or insulator may provide a region of high electrical resistance between the sensors pixels 1510a and 1510b, impeding a flow of current across the isolation structure 1506 and improving electrical isolation between the pixels 1510a and 1510b.

While a single isolation structure 1506 has been shown, in general, there may be multiple isolation structures 1506 arranged between each neighboring pairs of sensor pixels 1510. For example, in a 2D array of sensor pixels 1510, a single sensor pixel 1510 may be surrounded by four nearest-neighbor sensor pixels 1510. In such a case, the isolation structure 1506 may be placed along the four nearest-neighbor interfaces. In some implementations, the isolation structure 1506 may be a continuous structure that surround the sensor pixel 1510. The isolation structure 1506 may be shared at the interfaces between the pixels 1510.

Figure 15B:
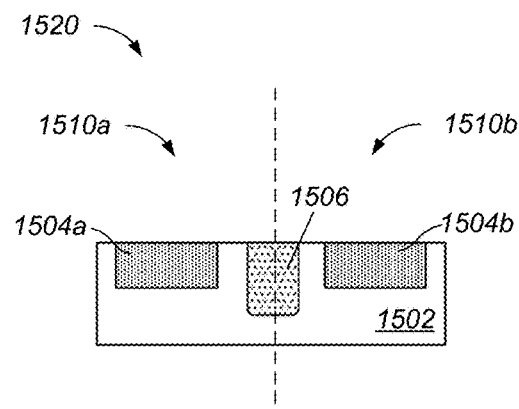

Referring to FIG. 15B, an example configuration 1520 is similar to the configuration 1500 of FIG. 15A, but differs in that the absorption regions 1504a and 1504b are fully embedded in the substrate 1502.

Figure 15C:
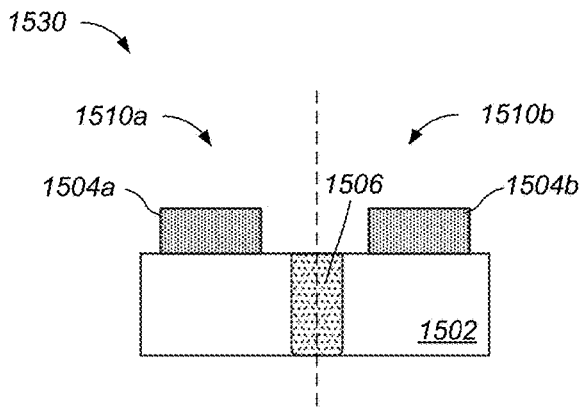

Referring to FIG. 15C, an example configuration 1530 is similar to the configuration 1500 of FIG. 15A, but differs in that the isolation structure 1506 extends from the upper surface of the substrate 1502 to the lower surface of the substrate 1502 through the entire depth of the substrate 1502. Configuration 1530 may remove alternative conduction paths between the sensor pixels 1510 that diverts the isolation structure 1506, and may improve electrical isolation between the sensor pixels 1510.

Figure 15D:
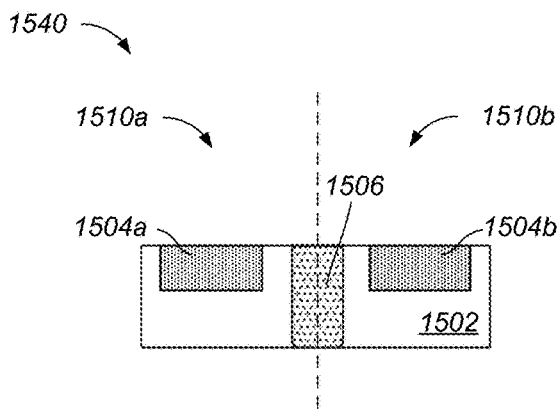

Referring to FIG. 15D, an example configuration 1540 is similar to the configuration 1530 of FIG. 15C, but differs in that the absorption regions 1504a and 1504b are fully embedded in the substrate 1502.

Figure 15E:
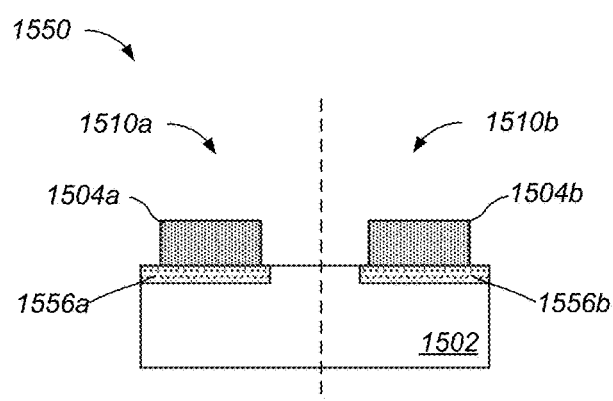

Referring to FIG. 15E, an example configuration 1550 includes the substrate 1502, the sensor pixels 1510a and 1510b (collectively referred to as sensor pixels 1510), and isolation structures 1556a and 1556b (collectively referred to as isolation structures 1556). The isolation structures 1556a and 1556b is similar to the isolation structure 1506 described in relation to FIG. 15A, but differs in that the isolation structures 1556 are arranged on a portion of the substrate 1502 immediately below the respective absorption regions 1504. Such arrangement of the isolation structures 1556 between the absorption region 1504 and the substrate 1502 may help confine the photo-generated carriers to the absorption region 1504 and help reduce the leakage of the photo-generated carriers into the substrate 1502. For example, the sensor pixels 1510a and 1510b may be implemented as the switched photodetector 530 of FIG. 5D, which has all the electrical terminals placed on the absorption region 1504. In such a case, the electrical isolation provided by the isolation structure 1556 (e.g., a thin p-doped layer) may improve photocurrent collection efficiency and/or bandwidth of the sensor pixels 1510.

Figure 15F:
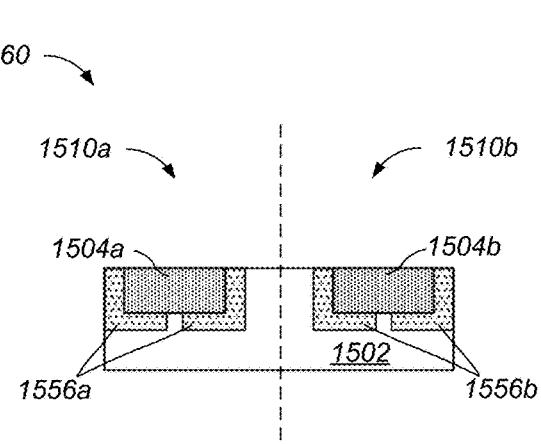

Referring to FIG. 15F, an example configuration 1560 is similar to the configuration 1550 of FIG. 15E, but differs in that the absorption regions 1504a and 1504b are fully embedded in the substrate 1502, and the isolation structures 1556 partially or fully surrounds the absorption regions 1504. For isolation structures 1556 that are formed from insulator or dielectric, the isolation structures 1556 may include an opening below the absorber and partially surround the embedded absorption regions 1504. For isolation structures 1556 that are doped regions, the isolation structures 1556 may be a continuous structure that fully surrounds the embedded absorption regions 1504 without the opening.

Figure 15G:
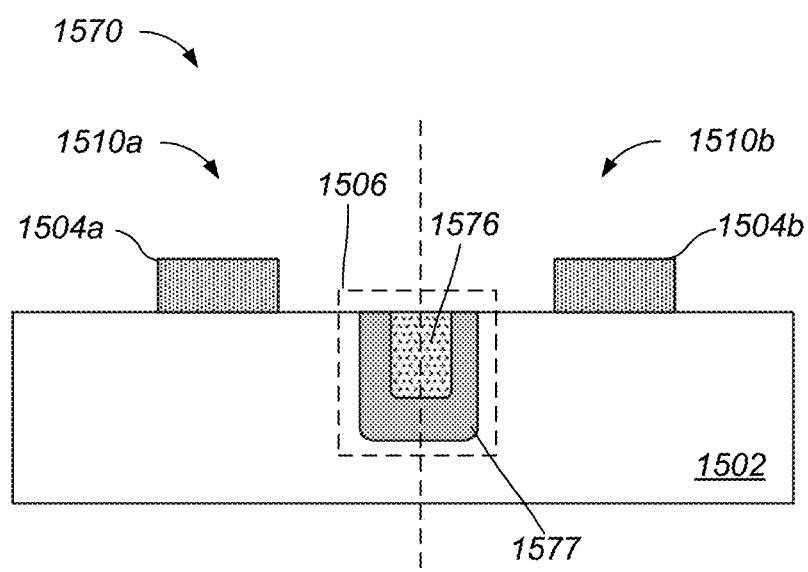

While isolation structures that are doped regions, dielectric material, or insulator have been described, in general, the isolation structure may be a combination of such implementations. Referring to FIG. 15G, an example configuration 1570 is similar to the configuration 1500 of FIG. 15A, but differ in that the isolation structure 1506 includes a first isolation structure 1576 and a second isolation structure 1577. The first isolation structure 1576 may be a trench filled with a semiconductor material that is different from the substrate 1502 or a trench filled with a dielectric or an insulator. The second isolation structure 1577 may be a doped region that has been doped with p-type dopants or n-type dopants. The isolation structure 1504 that implements both different materials and doped regions may further improve electrical isolation between the sensor pixels 1510 over isolation structures that implement one in isolation. In some implementations, a doping isolation may be used to form the second isolation structure 1577 while a material isolation through trench fill may be used to form the first isolation structure 1576 in which the doping isolation is shallower than the material isolation.

Figure 16A:
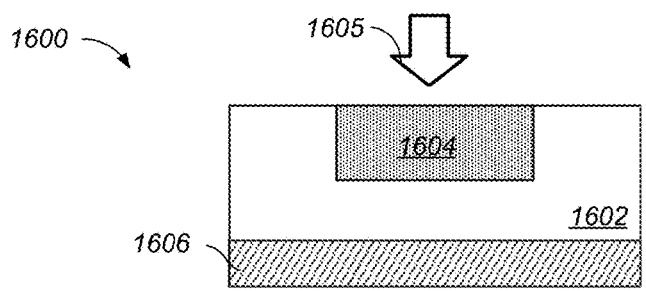
FIGS. 16A-16J are cross-sectional views of example configurations of photodetectors.

Light detection efficiency of a photodetector, such as a switched photodetector, may be enhanced by addition of various structures that modify optical characteristics of the photodetector. For example, mirrors, dielectric layers, and anti-reflection coating (ARC) layers can be added alone or in combination to achieve various effects including increased absorption of light by an absorption region, creation of an optical resonance cavity, and/or alteration of the spectral response of the photodetector. FIGS. 16A-16J show cross-sectional views of example configurations for improving detection efficiency of a photodetector. Referring to FIG. 16A, an example configuration 1600 includes a substrate 1602, an absorption region 1604, and a metal mirror 1606. The absorption region 1604 forms a photodetector. The metal mirror 1606 reflects incident light.

An optical signal 1605 is incident on the absorption region 1604 from the top as shown, which may be referred to as a front-side illumination (FSI) configuration. In such configurations, in some cases, the optical signal 1605 may not be fully absorbed by the absorption region 1604, and a portion of the optical signal 1605 may pass through the absorption region 1604. Such light that passes through the absorption region 1604 without being absorbed may reduce detection efficiency of the photodetector. By placing the metal mirror 1606 on a lower surface of the substrate 1602 to reflect the passed-through portion of the optical signal 1605, the passed-through portion may be reflected back toward the absorption region 1604 for a second pass through the absorption region 1604, improving detection efficiency.

The portion of the optical signal 1605 that gets absorbed by the absorption region 1604 may be a function of optical absorption coefficient of the absorption region 1604, the thickness of the absorption region 1604 along the direction of light incidence (e.g., along the vertical direction), and the wavelength of the optical signal 1605.

The metal mirror 1606 may be formed from various optically reflective metals, such as copper, aluminum, gold, and platinum. The metal mirror 1606 may have reflectivity greater than 50%, 60%, 70%, 80%, 90%, or 95% at the operation wavelength of the photodetector of the configuration 1600. The thickness of the metal mirror 1606 may be greater than a skin-depth of the metal. For example, the metal mirror 1606 may have a thickness ranging from 50 nm to 500 nm.

Figure 16E:
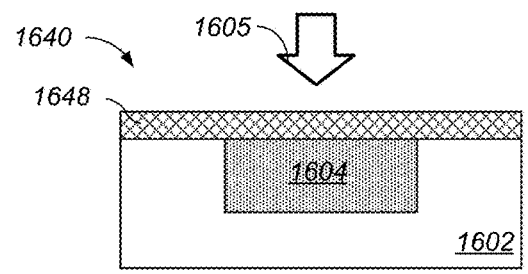
Figure 16B:
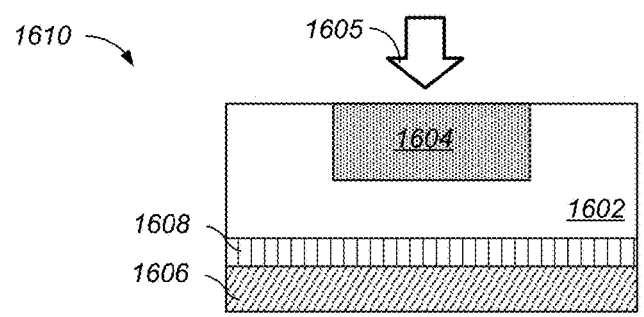

Referring to FIG. 16B, an example configuration 1610 is similar to the configuration 1600 of FIG. 16A, but differs in that the example configuration 1610 further includes a dielectric layer 1608 arranged between the substrate 1602 and the metal mirror 1606. The dielectric layer 1608 may alter an optical reflection spectrum of the metal mirror 1608. For example, by thin film interference caused by the dielectric layer 1608 (e.g., a SiO2 layer), the reflection of the light incident on the metal mirror 1606 (e.g., an Al layer) may be enhanced (e.g., a reflectivity enhanced from <90% to >97%) at certain wavelengths and decreased at some other wavelengths.

Figure 16C:
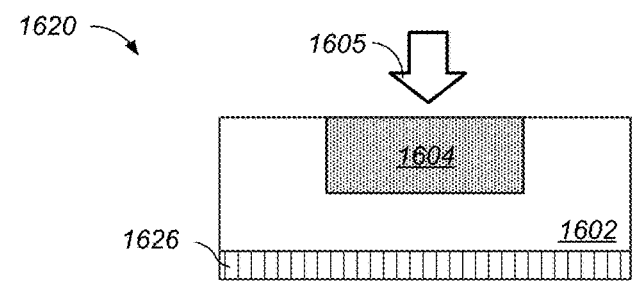

Referring to FIG. 16C, an example configuration 1620 is similar to the configuration 1600 of FIG. 16A, but differs in that the metal mirror 1606 of configuration 1600 has been replaced with a dielectric mirror 1626. The dielectric mirror may be a single layer of dielectric film or a stack of various dielectric films. The dielectric mirror 1626 may be formed from various dielectric materials, such as SiO2, Si3N4, SiON, and Si. The dielectric mirror 1626 may have reflectivity greater than 50%, 60%, 70%, 80%, 90%, or 95% at the operation wavelength of the photodetector of the configuration 1620. The thickness of the dielectric mirror 1626 may have a thickness ranging from 50 nm to 4000 nm.

Figure 16D:
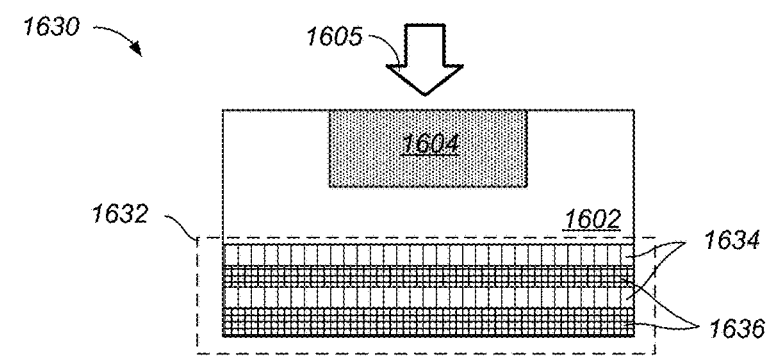

Referring to FIG. 16D, an example configuration 1630 is similar to the configuration 1620 of FIG. 16C, but differs in that the dielectric mirror 1626 of configuration 1620 has been replaced with a Distributed Bragg Reflector (DBR) mirror 1632. The DBR mirror includes multiple first dielectric layers 1634 and multiple second dielectric layers 1636 that are stacked on top of each other in an alternating fashion. The second dielectric layers 1636 have an index of refraction that is different from that of the first dielectric layers 1634. The first layers 1634 and the second layers 1636 may have a thickness that corresponds to a quarter of the operation wavelength in the respective dielectric materials. The reflectivity and the reflection bandwidth may depend on the thicknesses, the refractive indices of the first layers 1634 and the second layers 1636, and the number of first-second layer pairs.

Referring to FIG. 16E, an example configuration 1640 includes the substrate 1602, the absorption region 1604, and an anti-reflection coating (ARC) layer 1648. The ARC layer 1648 may reduce a reflection of the optical signal 1605 incident on the absorption region 1604. The ARC layer 1648 may be similar to ARC layer 744 of FIG. 7B.

Figure 16F:
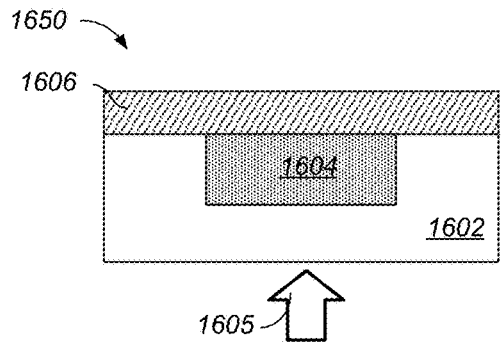

Referring to FIG. 16F, an example configuration 1650 is similar to the configuration 1600 of FIG. 16A, but differs in that the metal mirror 1606 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the metal mirror 1606 is analogous to the descriptions in relation to FIG. 16A.

Figure 16I:
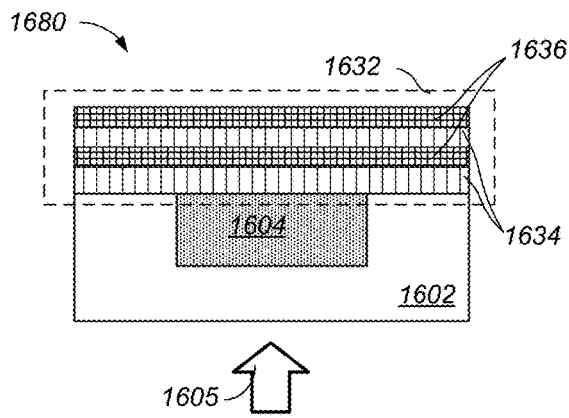
Figure 16G:
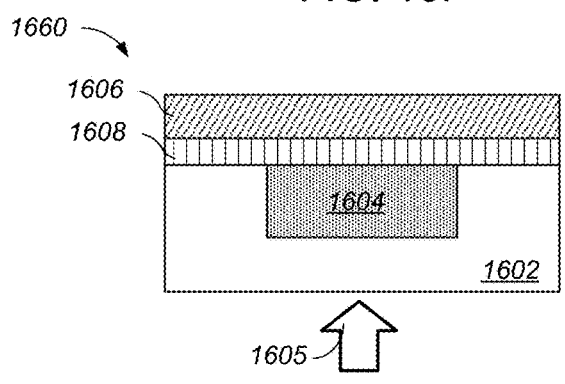

Referring to FIG. 16G, an example configuration 1660 is similar to the configuration 1610 of FIG. 16B, but differs in that the dielectric layer 1608 and the metal mirror 1606 are now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the dielectric layer 1608 and the metal mirror 1606 is analogous to the descriptions in relation to FIG. 16B.

Figure 16J:
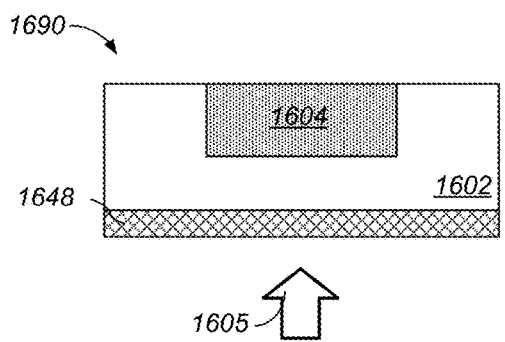
Figure 16H:
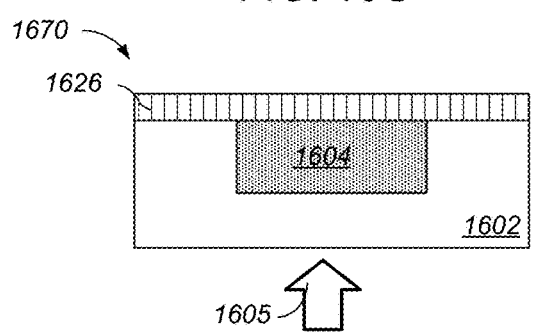

Referring to FIG. 16H, an example configuration 1670 is similar to the configuration 1620 of FIG. 16C, but differs in that the dielectric mirror 1626 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the dielectric mirror 1626 is analogous to the descriptions in relation to FIG. 16C.

Referring to FIG. 16I, an example configuration 1680 is similar to the configuration 1630 of FIG. 16D, but differs in that the DBR mirror 1632 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the DBR mirror 1632 is analogous to the descriptions in relation to FIG. 16D.

Referring to FIG. 16J, an example configuration 1690 is similar to the configuration 1640 of FIG. 16E, but differs in that the ARC layer 1648 is now placed on the lower surface of the substrate 1602, on the side of the substrate 1602 opposite to the absorption region 1604. The optical signal 1605 is now incident on the absorption region 1604 through the lower surface of the substrate 1602, which may be referred to as a back-side illumination (BSI) configuration. The effect of the ARC layer 1648 is analogous to the descriptions in relation to FIG. 16E.

In general, the mirror structures, such as metal mirror 1606, the dielectric layer 1608, the dielectric mirror 1626, and the DBR mirror 1632 may be fabricated in various ways. For example, the mirror structures may be deposited directly onto the substrate 1602. Alternatively, or additionally, the mirror structures may be fabricated on a separate substrate and bonded to the substrate 1602 through wafer bonding techniques.

While individual implementations having metal mirror 1606, the dielectric layer 1608, the dielectric mirror 1626, and the DBR mirror 1632 on the lower surface or the upper surface of the substrate 1602 are shown, in general, the described structures may be implemented on both sides of the substrate 1602. For example, the DBR mirror 1632 may be implemented on both sides of the substrate 1602, which may create an optical resonance cavity around the absorption region 1604, modifying the spectral response of the photodetector. As another example, the ARC layer 1648 may be implemented on the upper surface of the substrate 1602 in combination with a mirror structure on the lower surface of the substrate 1602 (e.g., configurations 1600, 1610, 1620, and 1630) to further enhance detection efficiency of the photodetector. In general, mirrors such as the metal mirror 1606, the dielectric layer 1608, the dielectric mirror 1626, and the DBR mirror 1632 may be partially reflecting and partially transmitting.

Surface of the absorption regions may be modified in various ways to modify various performance characteristics of a photodetector. Examples of modification of the surface of the absorption regions include: addition of doping regions; introduction of foreign elements; variation of material composition; introduction of topographies onto the surface of the absorption region; and deposition of dielectric or semiconductor materials. Examples of performance characteristics include: light absorption efficiency; optical absorption spectrum; carrier collection efficiency; dark current or leakage current; photodetector operation power; and photodetector bandwidth.

Figure 17A:
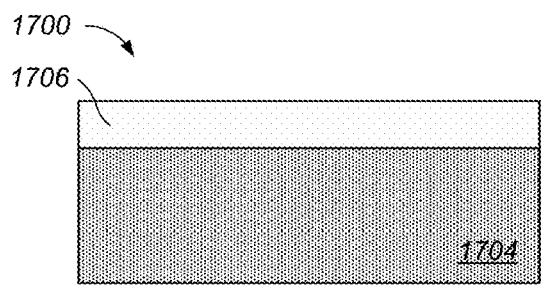
FIGS. 17A-17E are cross-sectional views of example configurations of absorption region surface modification.

FIGS. 17A-17E show cross-sectional views of example configurations of absorption region surface modification. Referring to FIG. 17A, a surface-modified absorption region 1700 includes a germanium-silicon based absorption region 1704 and a surface modification layer 1706. The germanium-silicon based absorption region 1704 may be an absorption region of a switched photodetector such as the switched photodetector 530 of FIG. 5D.

The GeSi-based absorption region 1704 may be a $Si_xGe_{1-x}$ compound with varying composition (X). For example, the composition (X) may vary from 0.01, at which point the GeSi-based absorption region 1704 may have a characteristic closer to Ge, to 0.99, at which point the GeSi-based absorption region 1704 may be have a characteristic closer to Si. The composition of the GeSi-based absorption region may affect the optical absorption efficiency for a given wavelength, and also affect the overall optical absorption spectrum. For example, a composition with a lower (X), corresponding to higher Ge concentration, may absorb more strongly in the near infrared wavelengths (e.g., >1 µm) compared to a composition with a higher (X), corresponding to a higher Si composition.

The surface modification layer 1706 may modify the optical and/or electrical properties of the GeSi-based absorption region 1704 and the photodetector including the absorption region 1704. The surface modification layer may be formed from various materials, such as amorphous silicon, polysilicon, epitaxial silicon, $Si_YGe_{1-Y}$ compound with varying composition (Y), $Ge_ZSn_{1-Z}$ compound with varying composition (Z), and any combination thereof.

In some implementations, for a GeSi-based absorption region 1704 having a $Si_xGe_{1-x}$ composition, the surface modification layer 1706 may be a $Si_YGe_{1-Y}$ layer where the compositions (X) and (Y) are different. For example, by having a composition (X) that is larger than composition (Y), the surface modification layer 1706 may have a higher absorption coefficient at a longer wavelength than the GeSi-based absorption region 1704. As such, incident light at a longer wavelength may be strongly absorbed by the surface modification layer 1706 without penetrating deep into the GeSi-based absorption region 1704. By absorbing the incident light closer to the surface of the GeSi-based absorption region 1704, bandwidth of the photodetector including the absorption region 1704 may improve due to reduced diffusion of the photo-generated carriers within the absorption region 1704. In some implementations, for a pure germanium absorption region 1704 (i.e., X=0), the surface modification layer 1706 may be a SiYGe1-Y layer. In some implementations, the composition of the surface modification layer 1706 and the GeSi-based absorption region 1704 may vary along a direction, such as the vertical direction, forming a graded GeSi absorption region 1704. The grading of the GeSi composition may further improve bandwidth of the photodetector. In some implementations, the surface modification layer 1706 may be multi-layered. For example, a GeSi layer may be deposited on top of a GeSi-based absorption region 1704 for passivation, and another Si layer may be deposited on top of the GeSi layer for further passivation.

In some implementations, the surface modification layer 1706 may be a Germanium-Tin alloy GeZSn1-Z with varying composition (Z). The addition of Tin to the surface modification layer 1706 may improve optical absorption efficiency at longer wavelengths, such as beyond the bandgap of germanium (approximately 1.55 μm), beyond which point the absorption efficiency of pure germanium decreases significantly.

Figure 17B:
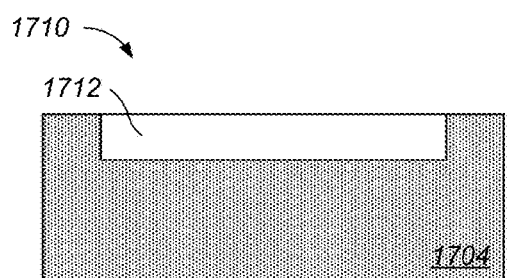

Referring to FIG. 17B, a surface-modified absorption region 1710 includes the germanium-silicon based absorption region 1704 and first doped region 1712. In some implementations, the first doped region 1712 may be doped with p-type or n-type dopants. P-type or n-type dopants may modify the electrical properties of the absorption region 1704. For example, the photo-generated electrons (or holes) may be repelled away from the surface due to the first doped region 1712, thereby avoiding surface recombination, which results into a higher collection efficiency when first doped region 1712 is doped with p-type (or n-type) dopants. In some implementations, the first doped region 1712 may be doped with impurities that modifies the optical property of the absorption region 1704, such as silicon and tin.

Figure 17C:
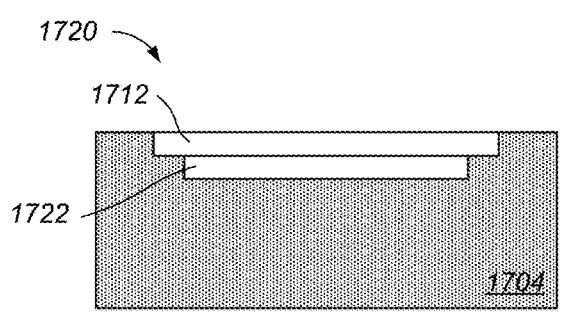

Referring to FIG. 17C, a surface-modified absorption region 1720 is similar to the surface-modified absorption region 1710, but differs in that it further includes a second doped region 1722. The second doped region 1722 may be similar to the first doped region 1712 or may have a different polarity, depth, and width such that the photo-generated carriers are attracted by the second doped region 1722 and repelled by the first doped region 1712.

Figure 17D:
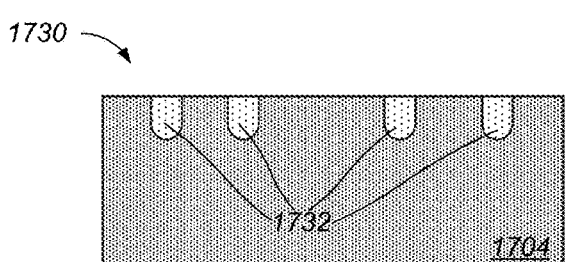

Referring to FIG. 17D, a surface-modified absorption region 1730 includes the germanium-silicon based absorption region 1704 and dielectric wells 1732. The dielectric wells 1732 may be filled with various dielectric materials, such as SiO2, Si3N4, and high-k material. The dielectric well may contribute to reduction of dark current or leakage current, reduction of photodetector operation power, and/or improvement of photodetector bandwidth, when it is placed, for example, inside a PN junction or in-between surface electrical terminals.

Figure 17E:
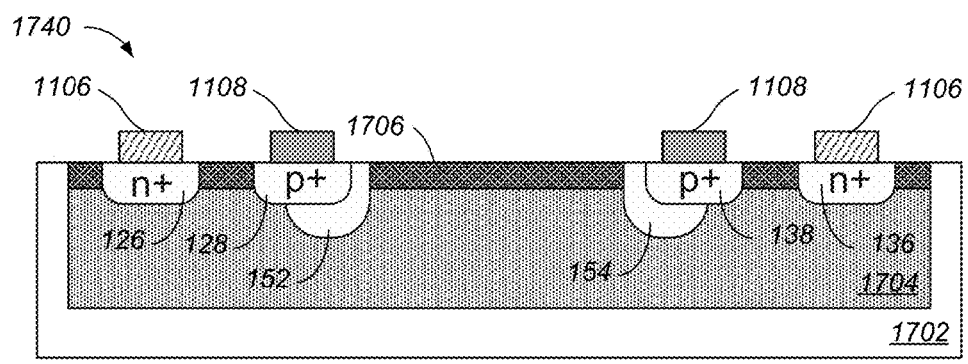

Referring to FIG. 17E, a switched photodetector 1740 includes a surface modified Ge-absorption region 1710 of FIG. 17B. The switched photodetector 1740 is similar to the switched photodetector 160 of FIG. 1B, but differs in that it further includes the surface modification layer 1706, and the carrier collection terminals 1106 and carrier control terminals 1108 of FIG. 11A. The addition of the surface modification layer 1706 may contribute to improvements in various performance characteristics of the switched photodetector 1740, such as: light absorption efficiency; optical absorption spectrum; carrier collection efficiency; dark current or leakage current; photodetector operation power; and photodetector bandwidth.

While individual implementations of surface modification of the absorption region are shown, in general, the described surface modification can be implemented in various combinations to achieve desired effects. For example, the surface modification layer 1706 may be implemented in combination with the first doped region 1712 and/or the second doped region 1722. As another example, the surface modification layer 1706 may be implemented in combination with the dielectric wells 1732. As yet another example, the surface modification layer 1706 may be implemented in combination with the first doped region 1712 and/or the second doped region 1722, and the dielectric wells 1732.

Various doped regions and wells, such as p-doped regions and wells, and n-doped regions and wells, may be arranged in various locations of the absorption region, the substrate, or intermediate layers to modify device performance characteristics. Examples of performance characteristics include: light absorption efficiency; optical absorption spectrum; carrier collection efficiency; dark current or leakage current; photodetector operation power; and photodetector bandwidth.

The depth of the doping regions and wells may be determined based on a variety of considerations, such as manufacturability and device performance. One or more doping wells and regions may be connected to a voltage or current sources. One or more doping wells and regions may not be connected to a voltage or current sources (i.e., floating), and/or be connected to each other (i.e., shorted).

Figure 18A:
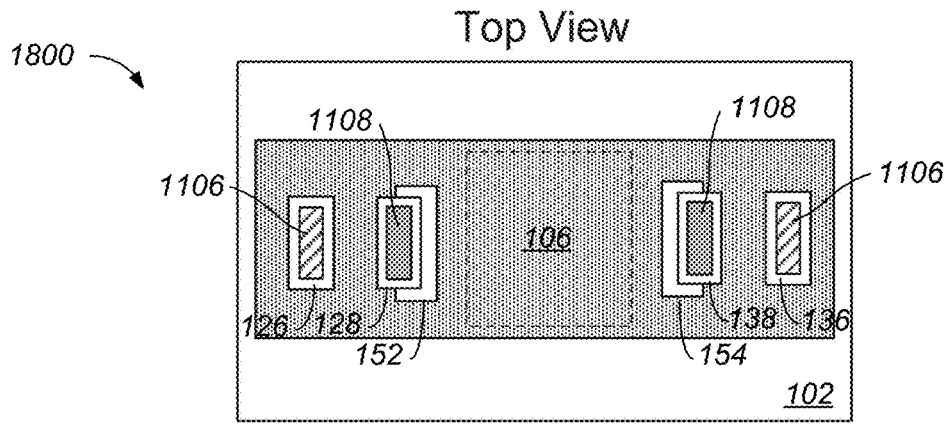
FIGS. 18A-18G show top and side views of example switched photodetectors.
Figure 18B:
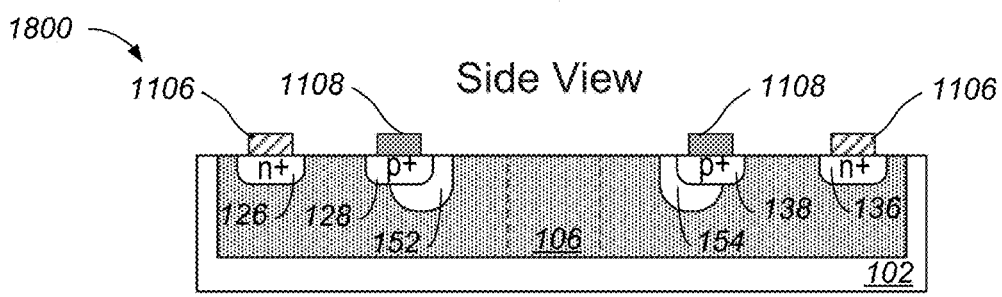

FIGS. 18A-18B show top and side views of an example switched photodetector 1800. The switched photodetector 1800 is similar to the switched photodetector 160 of FIG. 1B, and further includes the carrier collection terminals 1106 and carrier control terminals 1108 of FIG. 11A. As previous described in relation to FIG. 1B, the n-well regions 152 and 154 may reduce a leakage current from the first control signal 122 to the second control signal 132, and may reduce a charge coupling between the n-doped regions 126 and 136. Reduction of the leakage current contributes to reduction of operation power of the switched photodetector 1800.

Figure 18C:
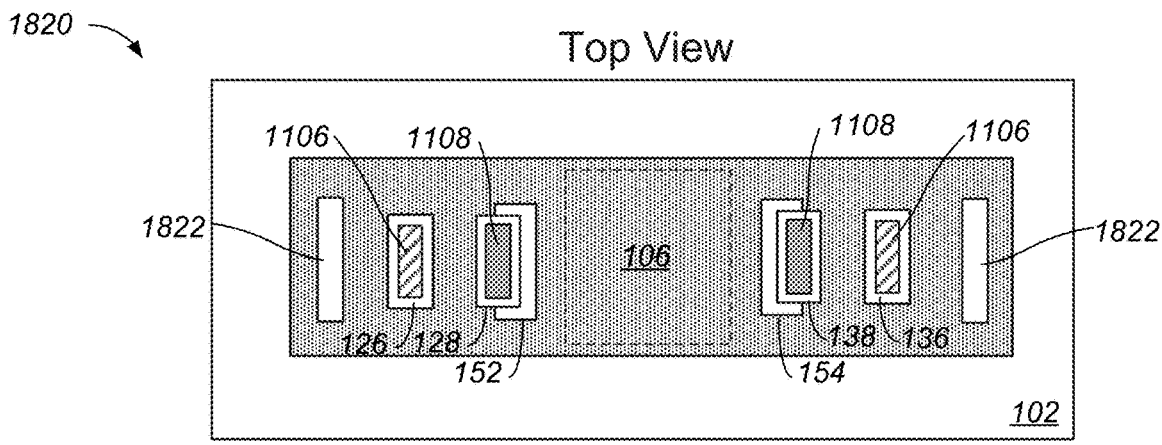
Figure 18D:
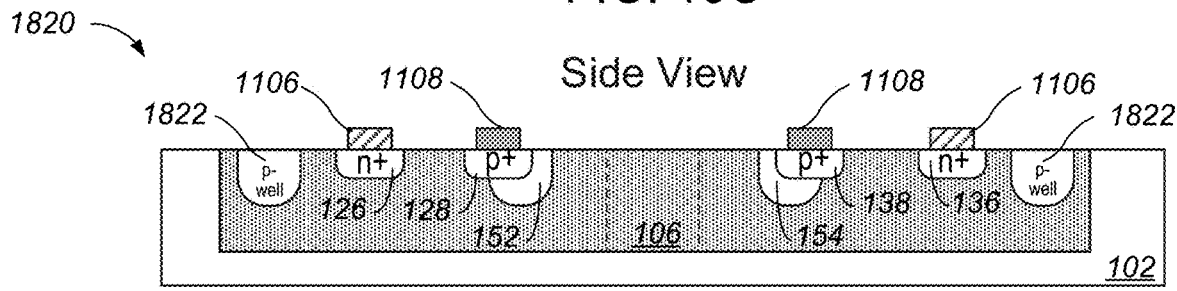

FIGS. 18C-18D show top and side views of an example switched photodetector 1820. The switched photodetector 1800 is similar to the switched photodetector 1800 of FIGS. 18A-18B, and further includes p-well regions 1822. The p-well regions 1822 may be similar to the p-well regions 246 and 248 of FIG. 2D. The p-well regions 1822 may increase the collection efficiency of photo-generated electrons of the switched photodetector 1820 relative to the switched photodetector 1800.

In some cases, the photo-generated carriers in the absorption region 106 may not be completely collected by the n-doped regions 126 and 136. In such cases, the photo-generated carriers may reach the material interface between the substrate 102 and the absorption region 106, where material defects may be present. The material defects may capture the photo-generated carriers and release the carriers after some period of time, which may be collected by n-doped regions 126 and 136. Such capture and release of the carriers by the material defects at the interface and subsequent collection by the n-doped regions 126 and 136 may reduce the bandwidth of the switched photodetector 1800 due to the time delay caused by the capturing and releasing of the carriers. As such, such bandwidth-reduction may be mitigated by adding the p-well regions 1822, which may block photo-generated carriers not collected by the n-doped regions 126 and 136 from reaching the interface between the absorption region 106 and the substrate 102.

Figure 18E:
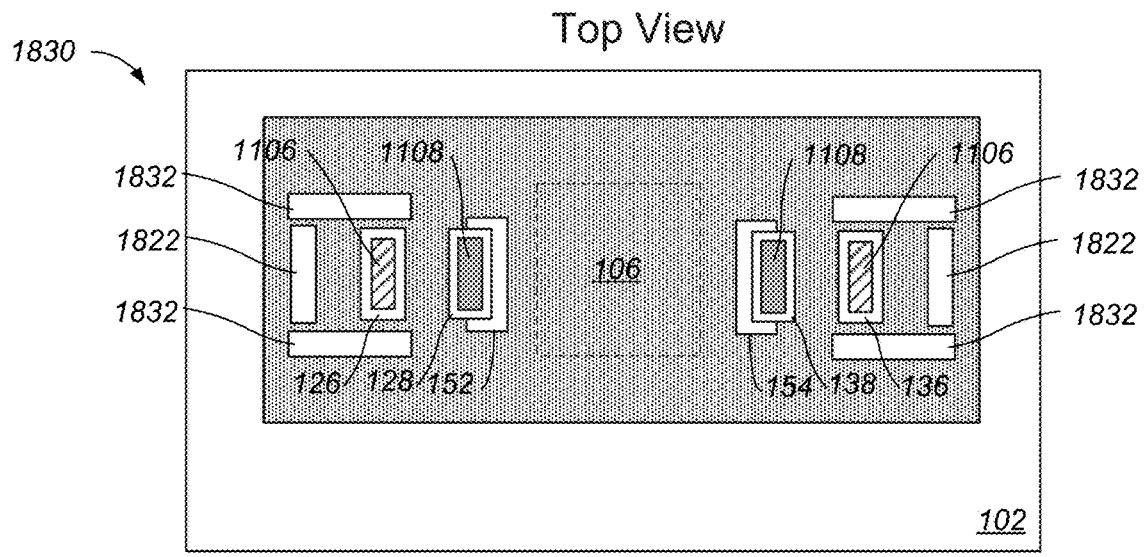

FIG. 18E shows a top view of an example switched photodetector 1830. The switched photodetector 1830 is similar to the switched photodetector 1820 of FIGS. 18C-18D, and further includes p-well regions 1832. The p-well regions 1832 are similar to the p-well regions 1822. The combination of p-well regions 1822 and 1832 surrounds the respective n-doped regions 126 and 136, which may further block photo-generated carriers not collected by the n-doped regions 126 and 136 from reaching the interface between the absorption region 106 and the substrate 102. While shown as separate p-well regions 1822 and 1832, the p-well regions 1822 and 1832 may be joined into respective "C" shaped region that surrounds the respective n-doped regions 126 and 136.

Figure 18F:
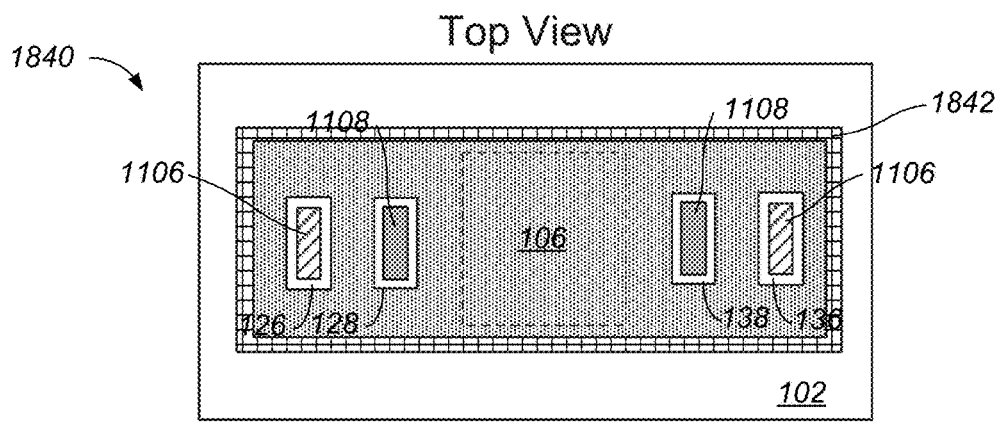
Figure 18G:
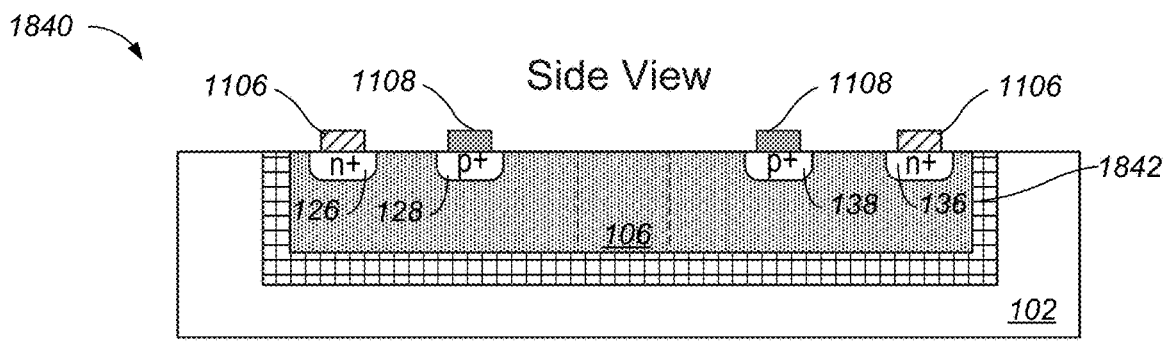

FIGS. 18F-18G show top and side views of an example switched photodetector 1840. The switched photodetector 1840 is similar to the switched photodetector 1800 of FIGS. 18A-18B, but differs in that it omits the n-well regions 152 and 154, and includes p-well region 1842. The p-well region 1842 may be similar to the p-well regions 246 and 248 of FIG. 2D. The p-well region 1842 surrounds the absorption region 106 embedded within the substrate 102. The p-well region 1842 may block photo-generated electrons in the absorption region 106 from reaching the substrate 102. Such blocking may increase the collection efficiency of photo-generated carriers of the switched photodetector 1840 relative to the switched photodetector 1800. The p-well region 1842 may be formed in the absorption region 106, the substrate 102, an intermediate layer between the absorption region 106 and the substrate 102, or combination thereof.

While individual implementations of n-well regions 152 and 154 and p-well regions 1822, 1832, and 1842 have been shown, in general, the described n-well and p-well regions can be implemented in various combinations to achieve desired effects.

So far, various implementations of the elements of the switched photodetectors, and various arrangements of the elements have been described. Now, various exemplary combinations of the previously described elements and their arrangements will be described. The described combinations are not intended to be a complete list of all combination.

FIGS. 19A-B show top and side views of an example switched photodetector 1900. The switched photodetector 1900 is similar to the switched photodetector 100 of FIG. 1A, but differs in that the absorption region 106 of the photodetector 1900 is fully embedded in the substrate 102, and further includes the carrier collection terminals 1106 and carrier control terminals 1108 of FIG. 11A. The light receiving region 1205 is described in relation to FIGS. 12A-12B. The presence of the p-doped regions 128 and 138 results in formation of an Ohmic contact at the interfaces between the carrier control terminal 1108 and the absorption region 106.

FIGS. 19C-D show top and side views of an example switched photodetector 1910. The switched photodetector 1910 is similar to the switched photodetector 1900 of FIG. 19A-B, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 19E-F show top and side views of an example switched photodetector 1920. The switched photodetector 1910 is similar to the switched photodetector 1900 of FIG. 19A-B, but differs in that additional p-doped regions 128 and 138, and carrier control terminals 1108 have been added on each sides of the light receiving region 1205.

FIGS. 19G-H show top and side views of an example switched photodetector 1930. The switched photodetector 1930 is similar to the switched photodetector 1920 of FIG. 19E-F, but differs in that the p-doped regions 128 and 138 have been omitted. The omission of the p-doped regions 128 and 138 results in formation of a Schottky junction at the interfaces between the carrier control terminal 1108 and the absorption region 106.

Figure 20A:
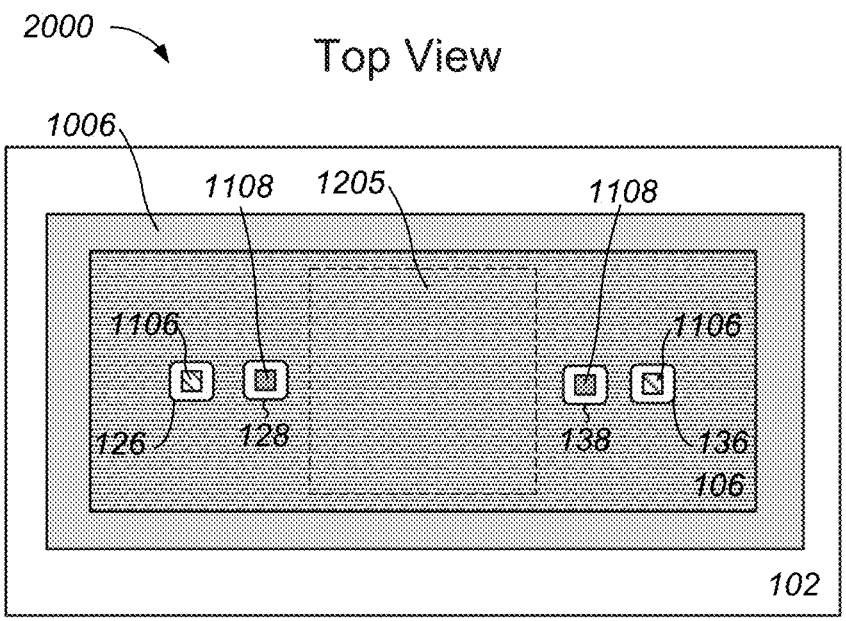
Figure 20B:
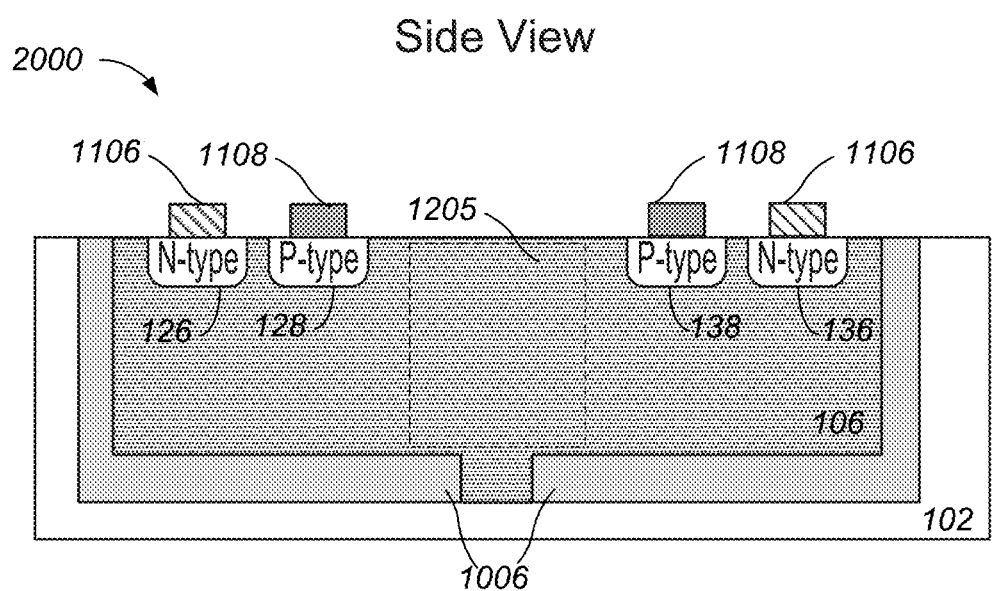

FIGS. 20A-B show top and side views of an example switched photodetector 2000. The switched photodetector 2000 is similar to the switched photodetector 1900 of FIG. 19A-B, but differs in that the intermediate layer 1006 of FIG. 10I has been added. As previously described in relation to FIG. 10I, the intermediate layer 1006 has an opening to the substrate 102, and the absorption region 106 fills the opening to the substrate 102 and the opening formed by the intermediate layer 1006. In some implementations, the intermediate layer 1006 may be SiO2, SiNx, AlOx, or any oxide or nitride-based insulators.

FIGS. 20C-D show top and side views of an example switched photodetector 2010. The switched photodetector 2010 is similar to the switched photodetector 2000 of FIG. 19A-B, but differs in that the intermediate layer 1006 of FIGS. 20A-B has been replaced with an intermediate layer 2012. The intermediate layer 2012 is similar to the intermediate layer 1006 in its material, but differs in that intermediate layer 2012 is a uniform layer that extends across the upper surface of the substrate 102, with openings to the substrate 102. The absorption region 106 is embedded in the opening of the intermediate layer 2012. In some implementations, the intermediate layer 2012 may be SiO2, SiNx, AlOx, or any oxide or nitride-based insulators.

FIGS. 20E-F show top and side views of an example switched photodetector 2020. The switched photodetector 2020 is similar to the switched photodetector 2010 of FIGS. 20C-D, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 20G-H show top and side views of an example switched photodetector 2030. The switched photodetector 2030 is similar to the switched photodetector 2010 of FIGS. 20C-D, but differs in that the intermediate layer 2012 of FIGS. 20C-D has been replaced with an intermediate layer 2032. The intermediate layer 2032 is similar to the intermediate layer 2012 of FIGS. 20C-D, but differs in that the intermediate layer 2032 has a first opening 2034 to the substrate 102, and a second opening 2036 that is larger than the first opening 2034 that opens up toward the upper surface of the intermediate layer 2032.

FIGS. 20I-J show top and side views of an example switched photodetector 2040. The switched photodetector 2040 is similar to the switched photodetector 2030 of FIGS. 20G-H, but differs in that the p-doped regions 128 and 138 have been omitted. The omission of the p-doped regions 128 and 138 results in formation of a Schottky junction at the interfaces between the carrier control terminal 1108 and the absorption region 106.

Figure 20K:
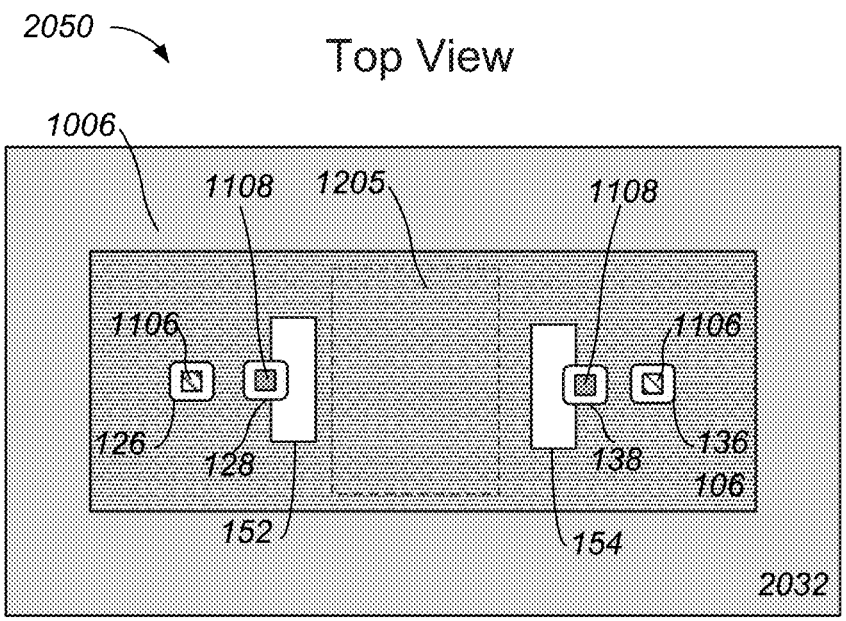
Figure 20L:
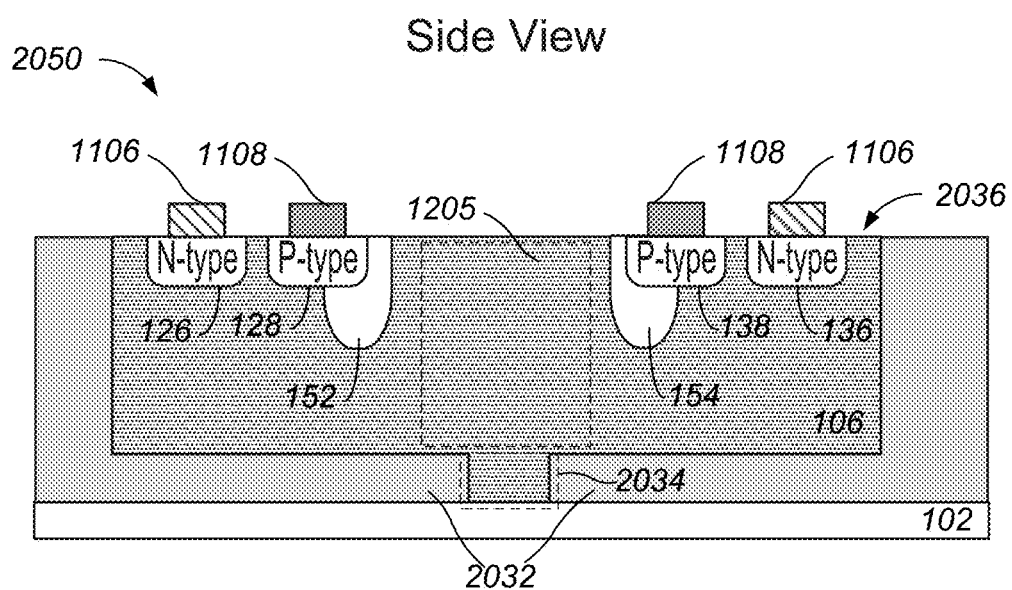

FIGS. 20K-L show top and side views of an example switched photodetector 2050. The switched photodetector 2050 is similar to the switched photodetector 2030 of FIGS. 20G-H, but differs in that the n-well regions 152 and 154 have been added. The n-well regions 152 and 154 have been described in relation to FIG. 1B.

FIGS. 21A-B show top and side views of an example switched photodetector 2100. The switched photodetector 2100 is similar to the switched photodetector 1900 of FIGS. 19A-B, but differs in that the n-doped regions 126 and 136, the p-doped regions 128 and 138, the carrier collection terminals 1106, and the carrier control terminals 1108 have been moved from the absorption region 106 to the substrate 102. Such terminals 1106 and 1108 may be referred to as substrate carrier collection terminals and substrate carrier control terminals.

FIGS. 21C-D show top and side views of an example switched photodetector 2110. The switched photodetector 2110 is similar to the switched photodetector 2100 of FIGS. 21A-B, but differs in that absorber p-doped regions 2128 and 2138, and absorber carrier control terminals 2108 have been placed on the absorption region 106. The substrate carrier collection terminals 1106, the substrate carrier control terminals 1108, and the absorber carrier control terminals 2108 may be similar to the substrate carrier collection terminal 1306, the substrate carrier control terminal 1308, and the absorber carrier control terminal 1309 described in relation to FIG. 14A, and have similar effects.

FIGS. 21E-F show top and side views of an example switched photodetector 2120. The switched photodetector 2120 is similar to the switched photodetector 2110 of FIGS. 21C-D, but differs in that the absorber p-doped regions 2128 and 2138 have been omitted. The omission of the absorber p-doped regions 2128 and 2138 results in formation of a Schottky junction at the interfaces between the absorber carrier control terminal 2108 and the absorption region 106.

Figure 22A:
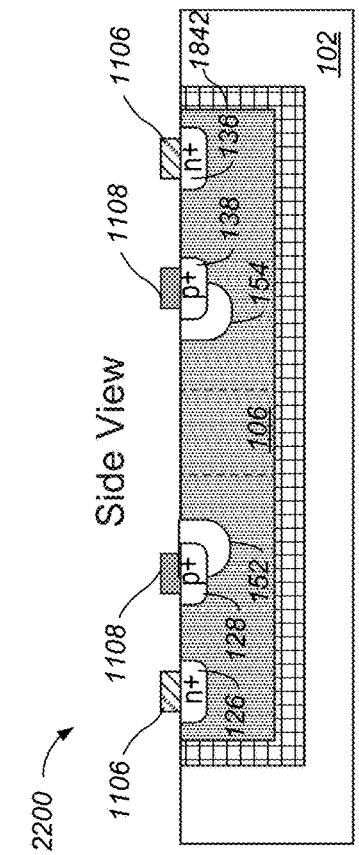
FIGS. 22A-22D show top and side views of example switched photodetectors.
Figure 22B:
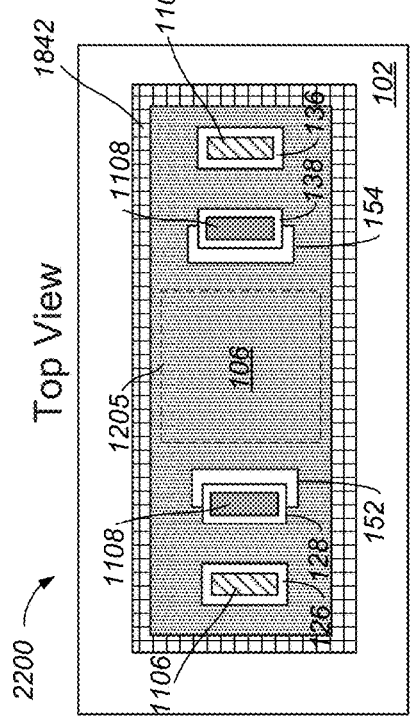

FIGS. 22A-B show top and side views of an example switched photodetector 2200. The switched photodetector 2200 is similar to the switched photodetector 1840 of FIGS. 18F-G, but differs in that the n-well regions 152 and 154 of FIGS. 18A-B have been added.

Figure 22C:
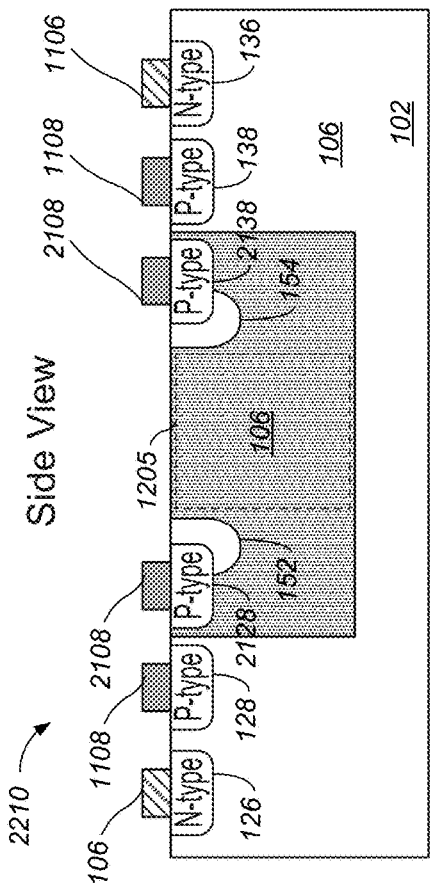
Figure 22D:
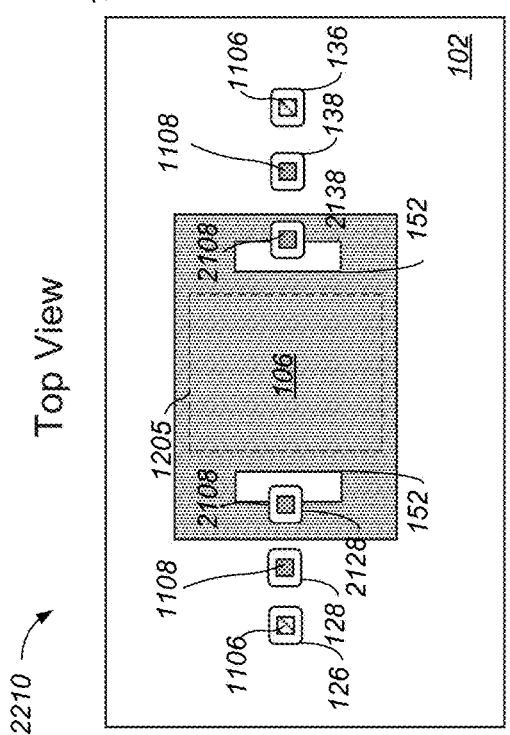

FIGS. 22C-D show top and side views of an example switched photodetector 2210. The switched photodetector 2210 is similar to the switched photodetector 2110 of FIGS. 21C-D, but differs in that the n-well regions 152 and 154 of FIGS.18A-B have been added.

Figure 23A:
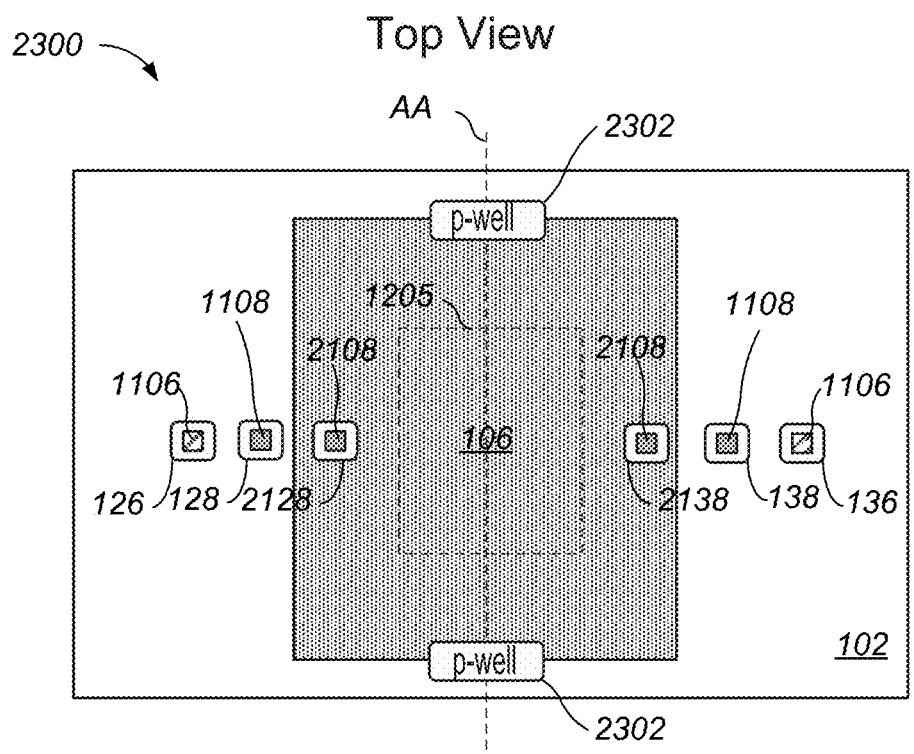
FIGS. 23A-23B show top and side views of an example switched photodetector.
Figure 23B:
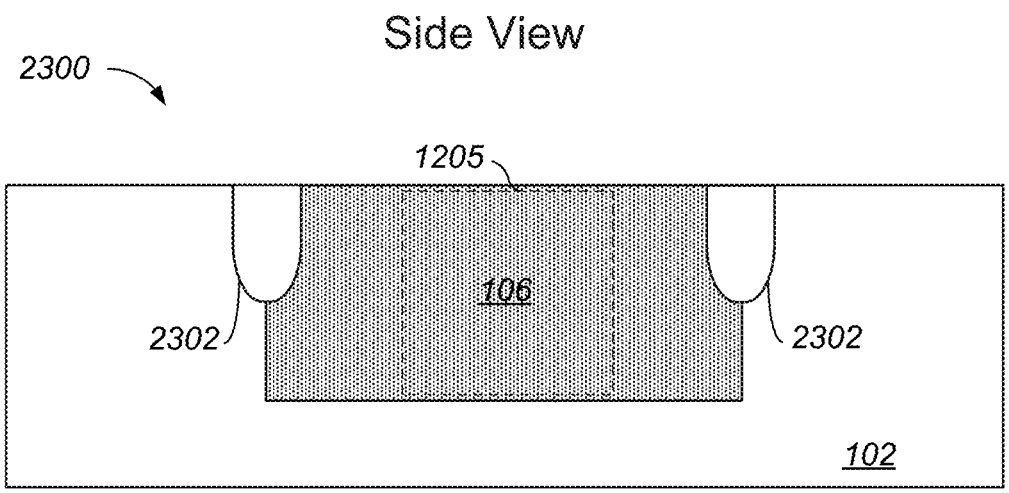

FIG. 23A show a top view of an example switched photodetector 2300, and FIG. 23B shows a side view of the example switched photodetector 2300 along a line AA. The switched photodetector 2300 is similar to the switched photodetector 2110 of FIGS. 21C-D, but differs in that the p-well regions 2302 have been added at the interface between the absorption region 106 and the substrate 102. The p-well regions 2302 may help mitigate carrier trapping and releasing at the interface between the absorption region 106 and the substrate 102, which has been described in relation to FIG. 18C-D.

Figure 24A:
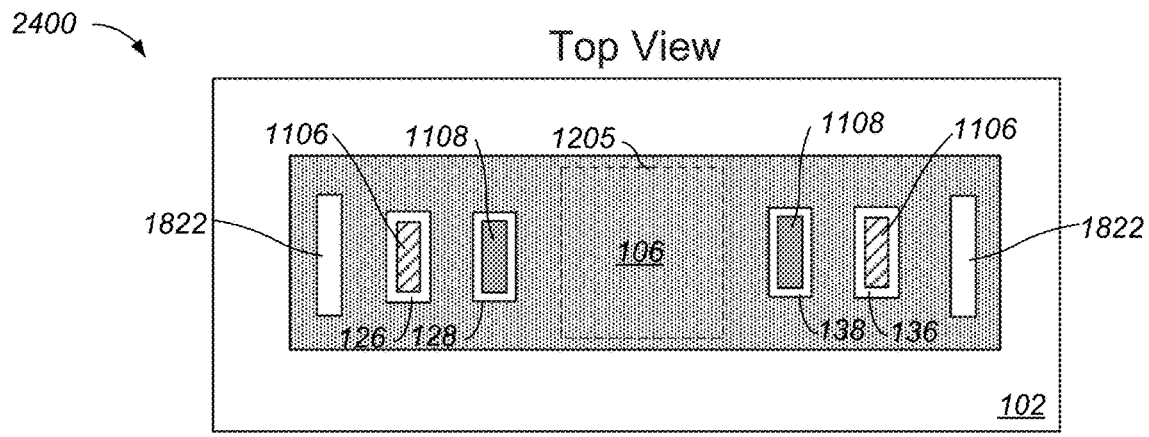
FIGS. 24A-24G show top and side views of example switched photodetectors.
Figure 24B:
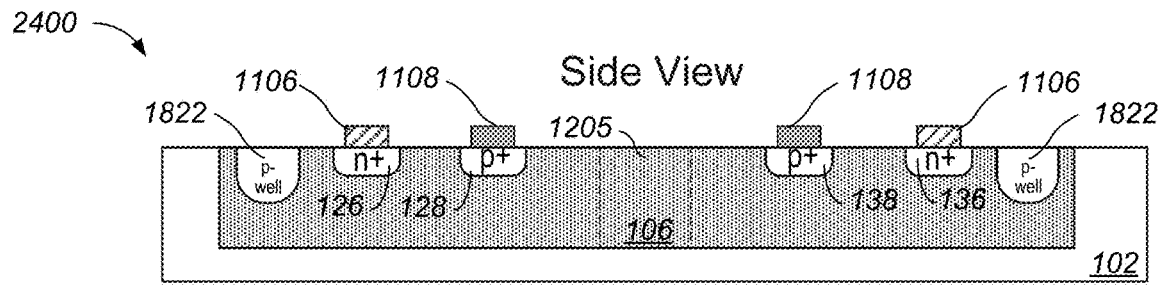

FIGS. 24A-B show top and side views of an example switched photodetector 2400. The switched photodetector 2400 is similar to the switched photodetector 1820 of FIGS. 18C-D, but differs in that the n-well regions 152 and 154 of have been omitted.

Figure 24C:
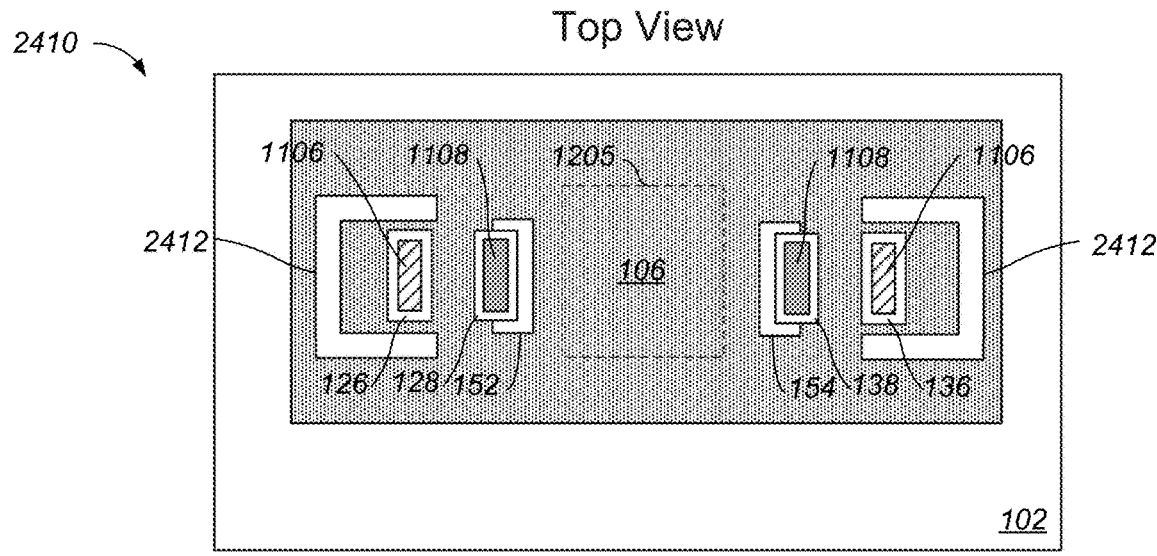

FIG. 24C shows a top view of an example switched photodetector 2410. The switched photodetector 2410 is similar to the switched photodetector 1830 of FIG. 18E, but differs in that the p-well regions 1822 and 1832 of FIG. 18E have been merged into continuous p-well regions 2412.

Figure 24D:
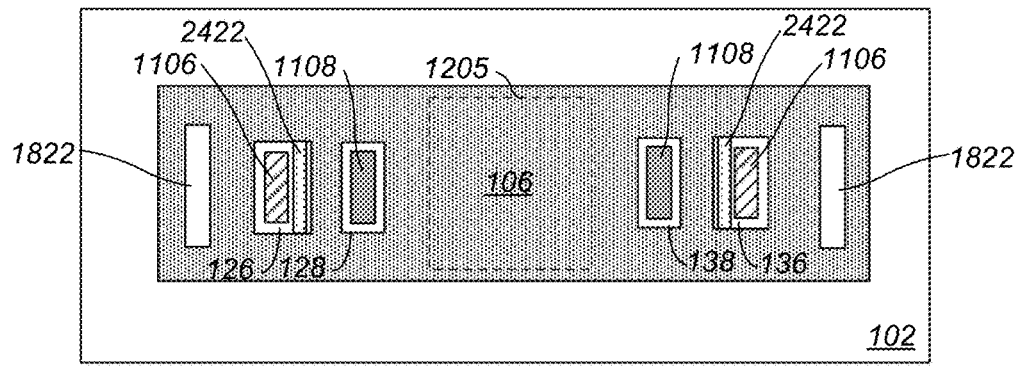
Figure 24E:
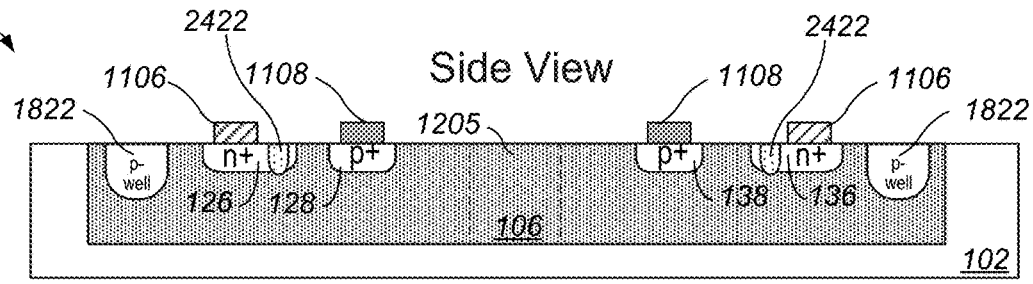

FIGS. 24D-E show top and side views of an example switched photodetector 2420. The switched photodetector 2420 is similar to the switched photodetector 2400 of FIGS. 24A-B, but differs in that dielectric wells 2422 have been added in the n-doped regions 126 and 136. The dielectric wells 2422 is similar to the dielectric wells 1732 of FIG. 17D. The dielectric well 2422 are arranged in a portion of the n-doped region 126 between carrier collection terminal 1106 and the carrier control terminal 1108. The dielectric well 2422 may reduce a dark current between the carrier collection terminal 1106 and the carrier control terminal 1108. The depth of the dielectric well 2422 may be less than, equal to, or greater than the depth of the n-doped region 126.

Figure 24F:
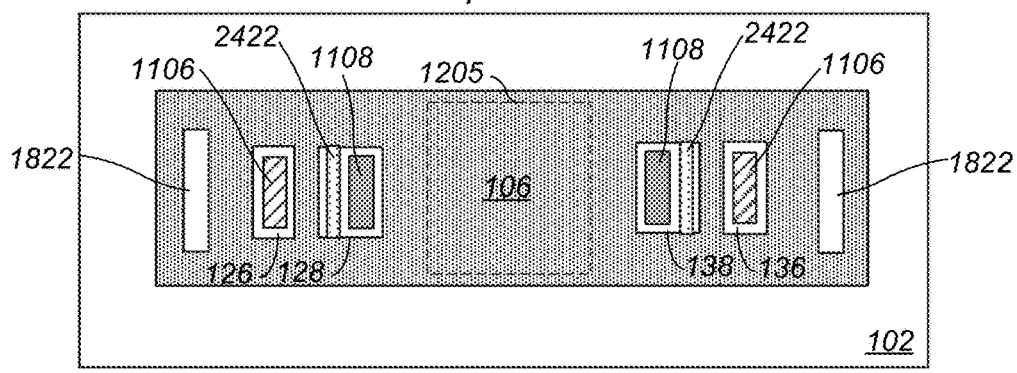
Figure 24G:
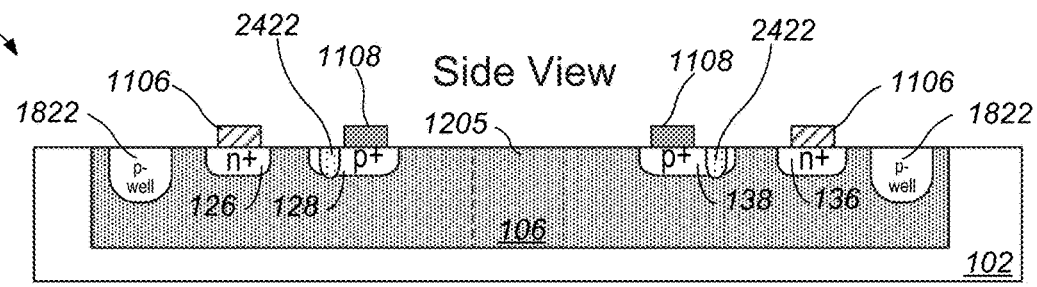

FIGS. 24F-G show top and side views of an example switched photodetector 2430. The switched photodetector 2430 is similar to the switched photodetector 2420 of FIGS. 24D-E, but differs in that dielectric wells 2422 have been moved from the n-doped regions 126 and 136 to the p-doped regions 128 and 138. The depth of the dielectric well 2422 may be less than, equal to, or greater than the depth of the p-doped region 128. In general, the dielectric well 2422 may be placed anywhere in between the n-doped region 126 and the p-doped region 128, and between the n-doped region 136 and the p-doped region 138.

FIGS. 25A-B show top and side views of an example switched photodetector 2500. The switched photodetector 2500 is similar to the switched photodetector 1900 of FIGS. 19A-B, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

FIGS. 25C-D show top and side views of an example switched photodetector 2510. The switched photodetector 2510 is similar to the switched photodetector 2500 of FIGS. 25A-B, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 25E-F show top and side views of an example switched photodetector 2520. The switched photodetector 2520 is similar to the switched photodetector 2050 of FIGS. 20K-L, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

FIGS. 25G-H show top and side views of an example switched photodetector 2530. The switched photodetector 2530 is similar to the switched photodetector 1840 of FIGS. 18F-G, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

In typical implementations of an image sensor, multiple sensor pixels (e.g., switched photodetectors) are arranged in an array to allow the image sensor to capture images having multiple image pixels. Square-shaped sensor pixels having equal dimensions on the two sides when seen from the top allows for simple 2D array. However, for certain applications such as ToF, some sensor pixels may have non-square shapes, such as a rectangular shape. For example, referring back to FIG. 1B, the switched photodetector 160 has two carrier control terminals (e.g., p-doped regions 128 and 138) and two carrier collection terminals (e.g., n-doped regions 126 and 136). These four terminals are typically arranged along a line, which leads to a rectangular sensor pixel shape that is longer along the line on which the terminals line up (e.g., switched photodetector 1800 of FIG. 18A).

Figure 26:
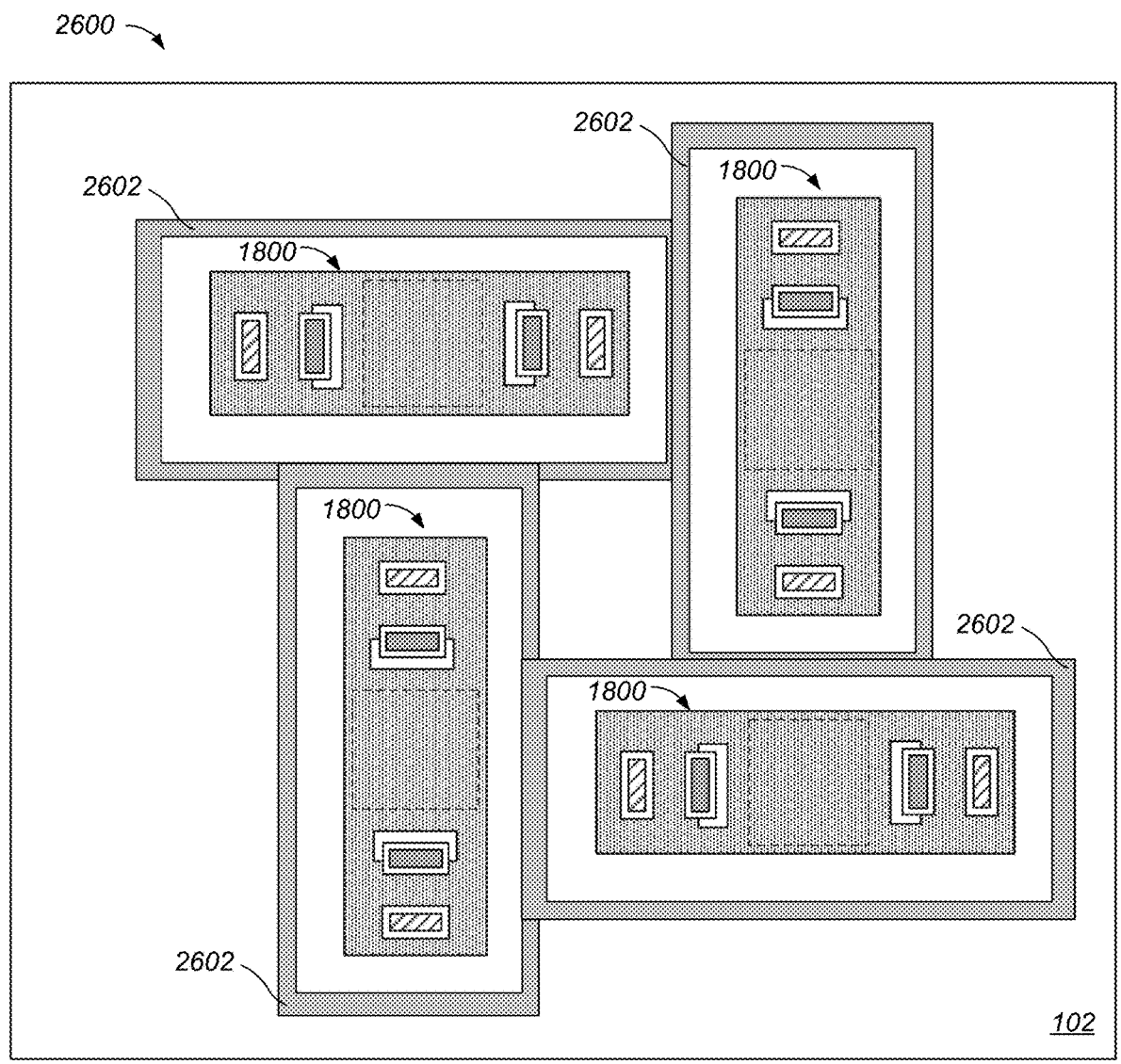
FIG. 26 is an example unit cell of rectangular photodetectors.

Such rectangular sensor pixels may present challenges in efficient arraying of the pixels due to, for example, design rules associated with semiconductor fabrication in a foundry. Design rules may impose various minimum separations of features such as doped regions, doped wells, dielectric wells, and germanium absorption regions. One approach to improving compactness and symmetry is by creating a unit cell of photodetectors that include four rectangular photodetectors. FIG. 26 show an example unit cell of rectangular photodetectors. A unit cell 2600 includes four switched photodetectors 1800 of FIG. 18A and four isolation structures 2602 that surround each of the switched photodetectors 1800. The isolation structures 2602 have been described in relation to FIGS. 15A-D. The unit cell 2600 may improve sensor pixel compactness and symmetry over the rectangular unit cell.

Figure 27:
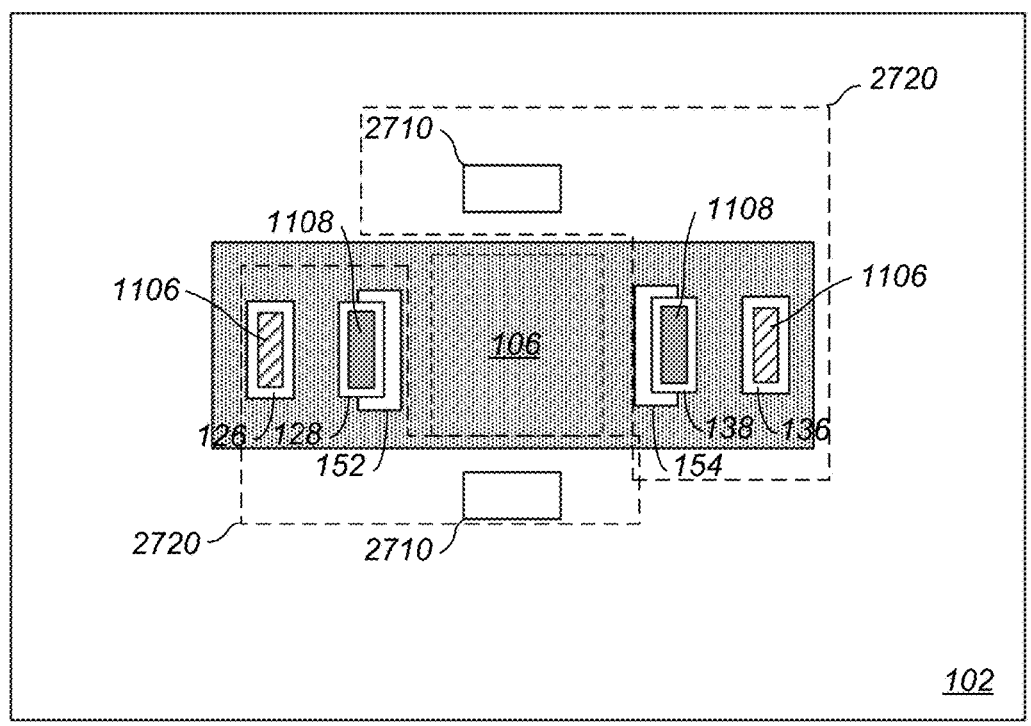
FIG. 27 is an example rectangular switched photodetector with photo-transistor gain.

FIG. 27 shows a top view of an example rectangular switched photodetector 2700 with photo-transistor gain. The switched photodetector 2700 is similar to the switched photodetector 1800 of FIG. 18A, but differs in that electron emitters 2710 have been added on to the substrate 102. The electron emitter 2710 may be similar to the n-doped regions 126 and 136. The rectangular shape of the switched photodetector 1800 allows coupling of a photocurrent integration capacitor (e.g., a floating diffusion capacitor) to a bipolar junction transistor (BJT) 2720 formed by the n-doped regions 126 and 136, the p-doped regions 128 and 138, and the electron emitter 2710, resulting in an NPN BJT. The BJT 2720, when biased appropriately, may provide a photo-transistor gain in response to incident optical signal, which may improve a light to photocurrent conversion efficiency of the photodetector 2700. For example, the BJT 2720 may be biased as follows: bias the n-doped regions 126 and 136 between 1V and 3V, bias the p-doped regions 128 and 138 between 0V and 1V, and bias the electron emitter 2710 to be lower than the bias of the respective n-doped regions 126 and 136.

In general, the electron emitter 2710 and/or the n-doped regions 126 and 136 should be biased to an external voltage or be shorted with a p-doped region through a metal connection to allow electrons to be emitted by the electron emitter 2710.

While various implementations of switched photodetectors with a particular combination and arrangement of n-type and p-type regions and wells have been described, in general, the polarity of the doped regions and wells may be reversed and achieve analogous operation and functionality. For example, all instances of a p-well and p-doped regions may be converted to n-well and n-doped regions, respectively, and all instance of n-well and n-doped regions may be converted to p-well and p-doped regions, receptively.

Figure 28A:
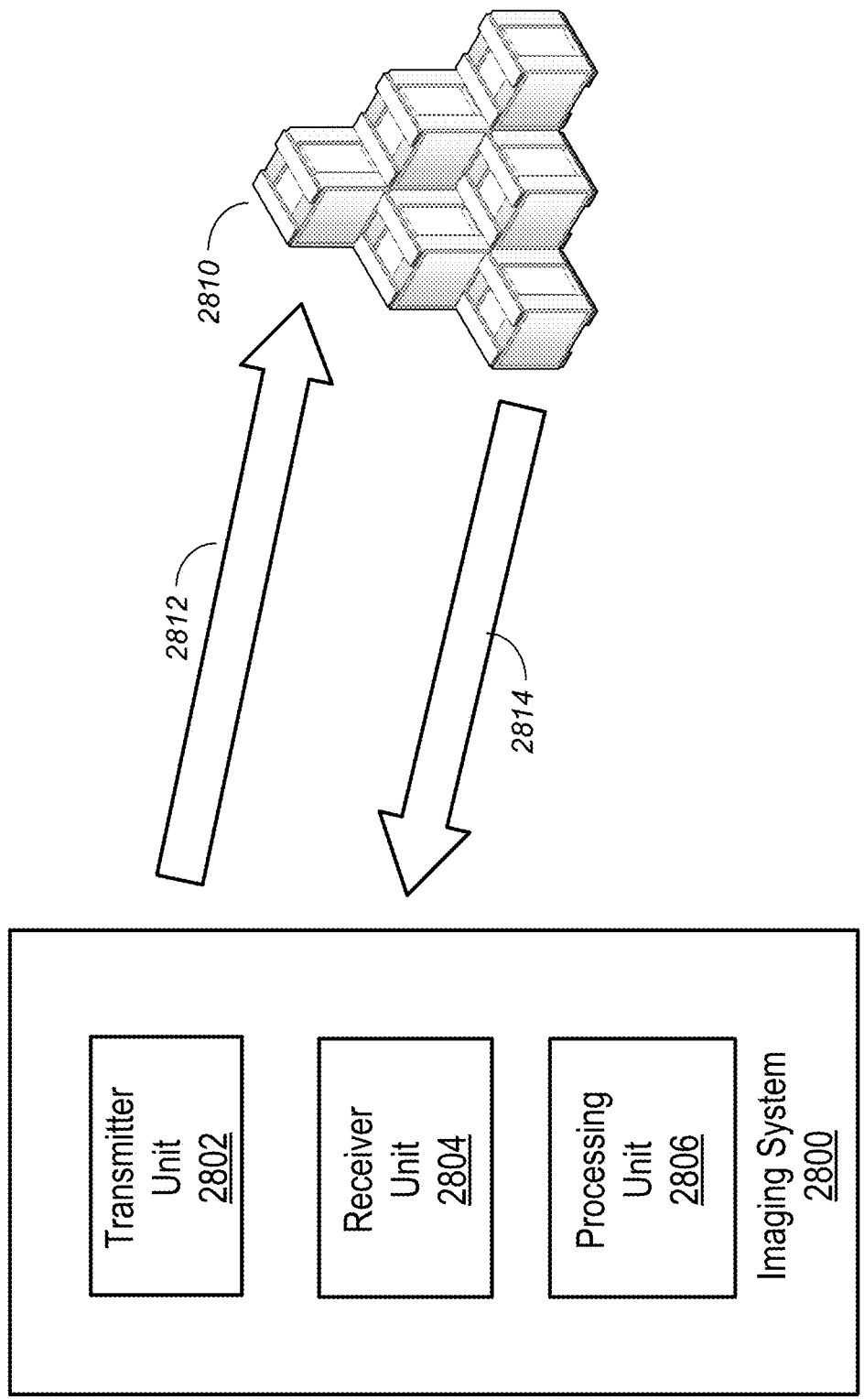
FIG. 28A is a block diagram of an example of an imaging system.

FIG. 28A shows an example imaging system 2800 for determining characteristics of a target object 2810. The target object 2810 may be a three-dimensional object. The imaging system 2800 may include a transmitter unit 2802, a receiver unit 2804, and a processing unit 2806. In general, the transmitter unit 2802 emits light 2812 towards the target object 2810. The transmitter unit 2802 may include one or more light sources, control circuitry, and/or optical elements. For example, the transmitter unit 2802 may include one or more NIR LEDs or lasers, where the emitted light 2812 may be collimated by a collimating lens to propagate in free space.

In general, the receiver unit 2804 receives the reflected light 2814 that is reflected from the target object 2810. The receiver unit 2804 may include one or more photodetectors, control circuitry, and/or optical elements. For example, the receiver unit 2804 may include an image sensor, where the image sensor includes multiple pixels fabricated on a semiconductor substrate. Each pixel may include one or more switched photodetectors for detecting the reflected light 2814, where the reflected light 2814 may be focused to the switched photodetectors. Each switched photodetector may be a switched photodetector disclosed in this application.

In general, the processing unit 2806 processes the photo-carriers generated by the receiver unit 2804 and determines characteristics of the target object 2810. The processing unit 2806 may include control circuitry, one or more processors, and/or computer storage medium that may store instructions for determining the characteristics of the target object 2810. For example, the processing unit 2806 may include readout circuits and processors that can process information associated with the collected photo-carriers to determine the characteristics of the target object 2810. In some implementations, the characteristics of the target object 2810 may be depth information of the target object 2810. In some implementations, the characteristics of the target object 2810 may be material compositions of the target object 2810.

Figure 28B:
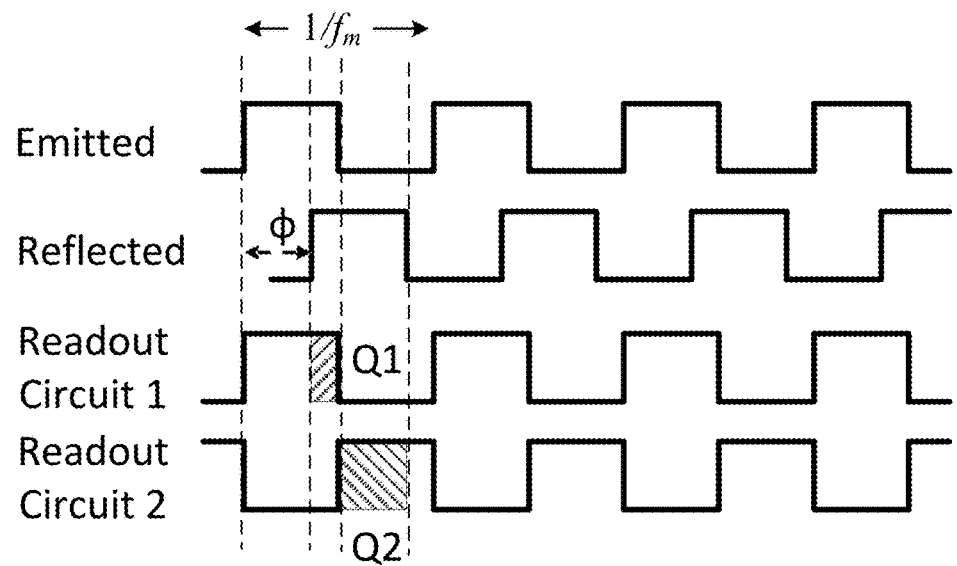
FIGS. 28B-28C show examples of techniques for determining characteristics of an object using an imaging system.

FIG. 28B shows one example technique for determining characteristics of the target object 2810. The transmitter unit 2802 may emit light pulses 2812 modulated at a frequency fm with a duty cycle of 50%. The receiver unit 2804 may receive reflected light pulses 2814 having a phase shift of Φ. The switched photodetectors are controlled such that the readout circuit 1 reads the collected charges Q1 in a phase synchronized with the emitted light pulses, and the readout circuit 2 reads the collected charges Q2 in an opposite phase with the emitted light pulses. In some implementations, the distance, D, between the imaging system 2800 and the target object 2810 may be derived using the equation $$D = \frac{c}{4f_m} \frac{Q_2}{Q_1 + Q_2}, \quad (1)$$

where c is the speed of light.

Figure 28C:
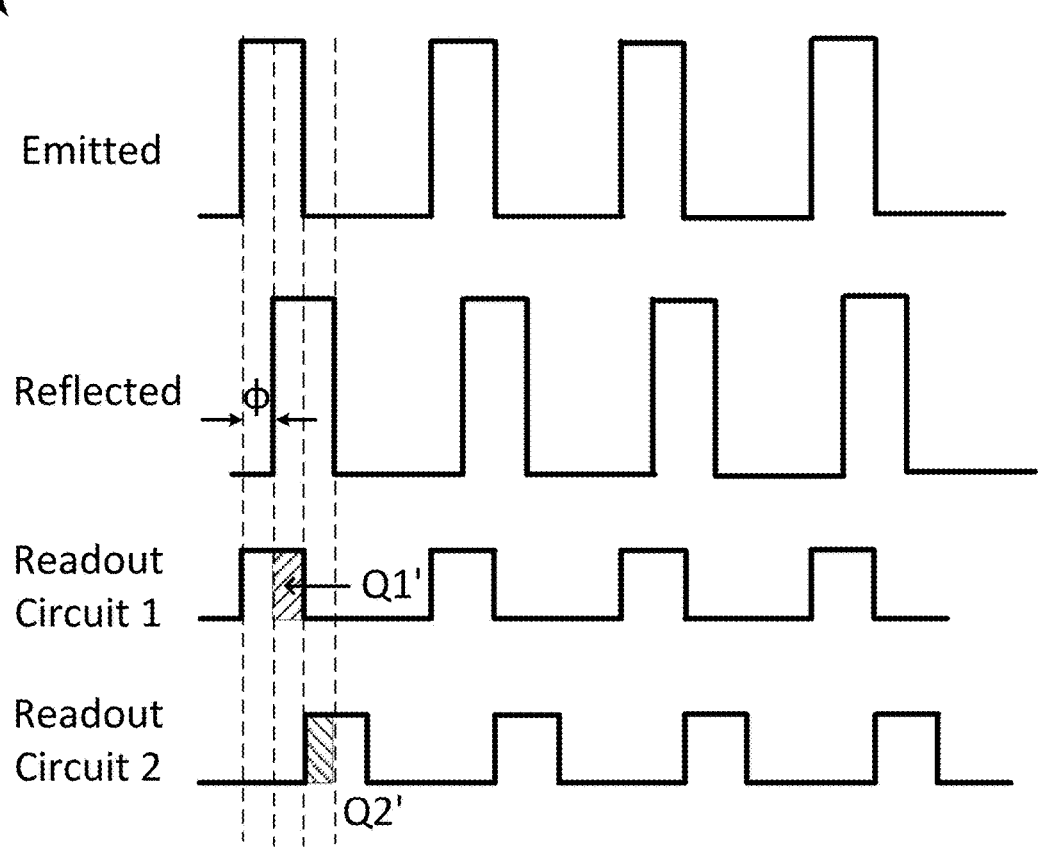

FIG. 28C shows another example technique for determining characteristics of the target object 2810. The transmitter unit 2802 may emit light pulses 2812 modulated at a frequency fm with a duty cycle of less than 50%. By reducing the duty cycle of the optical pulses by a factor of N, but increasing the intensity of the optical pulses by a factor of N at the same time, the signal-to-noise ratio of the received reflected light pulses 2814 may be improved while maintaining substantially the same power consumption for the imaging system 2800. This is made possible when the device bandwidth is increased so that the duty cycle of the optical pulses can be decreased without distorting the pulse shape. The receiver unit 2804 may receive reflected light pulses 2814 having a phase shift of Φ. The multi-gate photodetectors are controlled such that a readout circuit 1 reads the collected charges Q1' in a phase synchronized with the emitted light pulses, and a readout circuit 2 reads the collected charges Q2' in a delayed phase with the emitted light pulses. In some implementations, the distance, D, between the imaging system 2800 and the target object 2810 may be derived using the equation $$D = \frac{c}{4Nf_m} \frac{Q'_2}{Q'_1 + Q'_2}. \quad (2)$$

Figure 29:
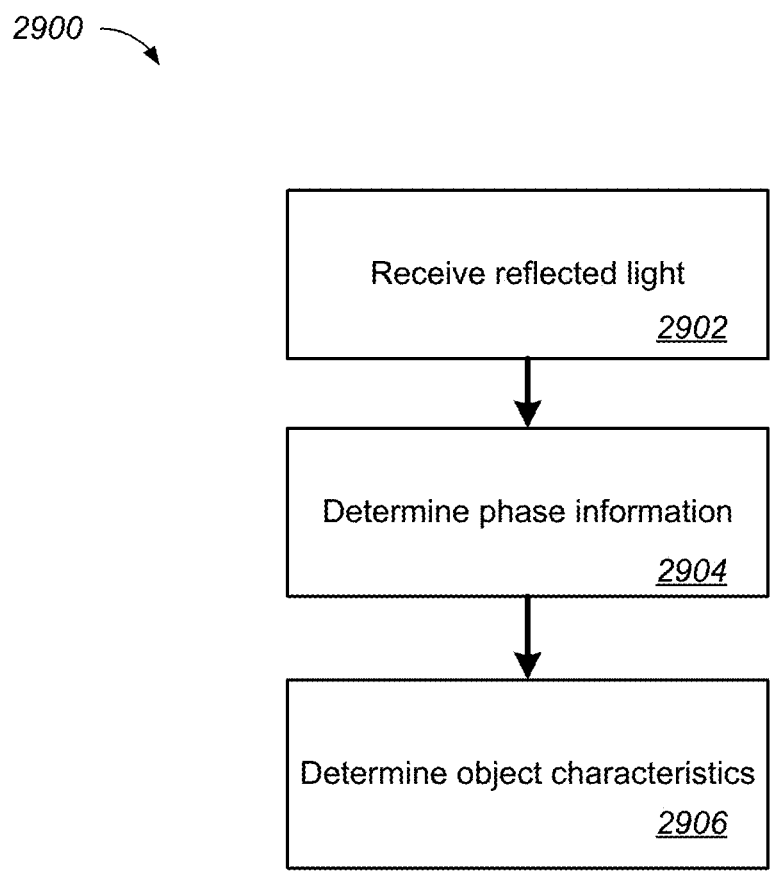
FIG. 29 shows an example of a flow diagram for determining characteristics of an object using an imaging system.

FIG. 29 shows an example of a flow diagram 2900 for determining characteristics of an object using an imaging system. The process 2900 may be performed by a system such as the imaging system 2800.

The system receives reflected light (2902). For example, the transmitter unit 2802 may emit NIR light pulses 2812 towards the target object 2810. The receiver unit 2804 may receive the reflected NIR light pulses 2814 that is reflected from the target object 2810.

The system determines phase information (2904). For example, the receiver unit 2804 may include an image sensor, where the image sensor includes multiple pixels fabricated on a semiconductor substrate. Each pixel may include one or more switched photodetectors for detecting the reflected light pulses 2814. The type of switched photodetectors may be a switched photodetector disclosed in this application, where the phase information may be determined using techniques described in reference to FIG. 28B or FIG. 28C.

The system determines object characteristics (2906). For example, the processing unit 2806 may determine depth information of the object 2810 based on the phase information using techniques described in reference to FIG. 28B or FIG. 28C.

In some implementations, an image sensor includes multiple pixels are fabricated on a semiconductor substrate, where each pixel may include one or more switched photodetectors 100, 160, 170, 180, 200, 250, 260, 270, 300, 360, 370, 380, 400, 450, 460, 470, and 480 for detecting the reflected light as illustrated in FIGS. 28A and 28B. The isolation between these pixels may be implemented based on an insulator isolation such as using an oxide or nitride layer, or based on an implant isolation such as using p-type or n-type region to block signal electrons or holes, or based on an intrinsic built-in energy barrier such as a using the germanium-silicon heterojunction interface.

Figure 30:
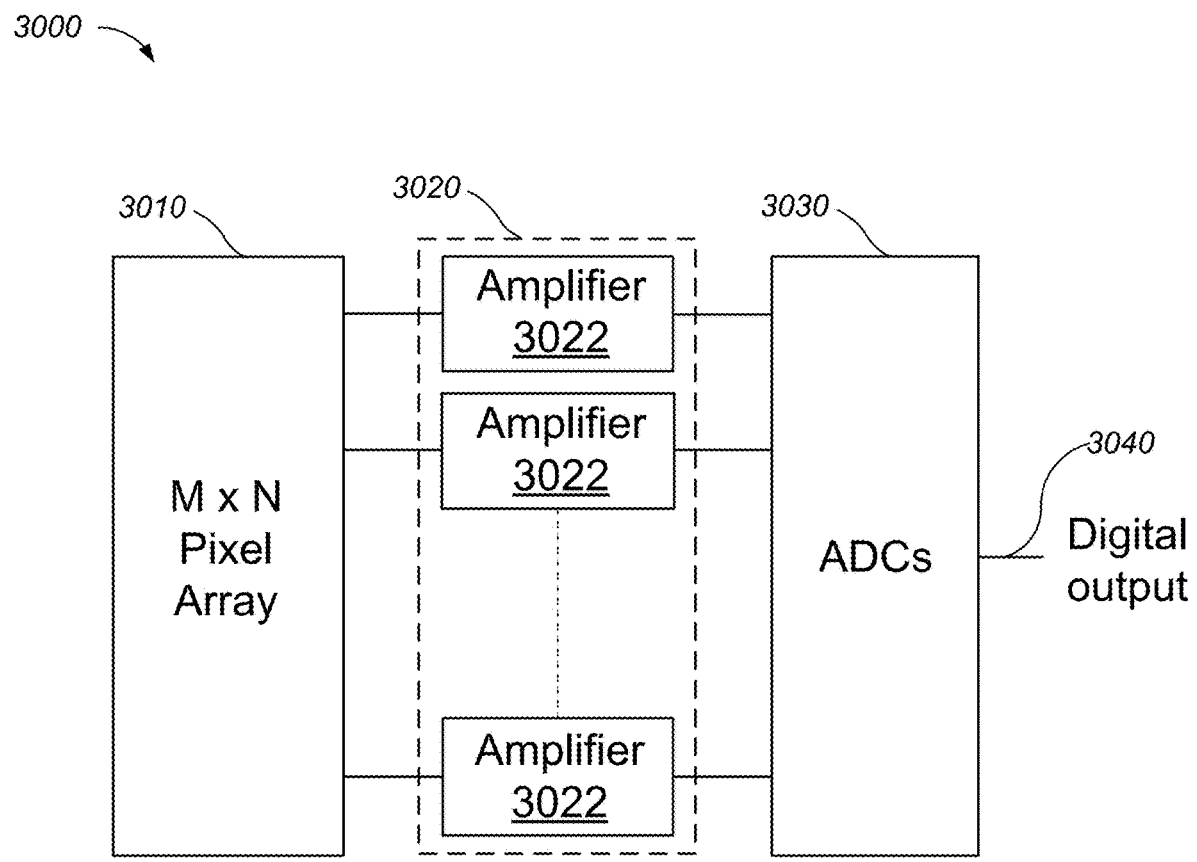
FIG. 30 shows a block diagram of an example receiver unit for time-of-flight (ToF) detection.

Up to this point, various implementations of switched photodetectors, and how switched photodetectors can be used in a time-of-flight (ToF) detection system such as the imaging system 2800 of FIG. 28A have been described. The receiver unit 2804 of the imaging system 2800 will now be described in more detail. FIG. 30 shows a block diagram of an example receiver unit 3000 for ToF detection. The receiver unit 3000 includes a pixel array 3010, amplifier array 3020, and analog-to-digital converter (ADC) array 3030. The pixel array 3010 is electrically coupled with the amplifier array 3020, which is electrically coupled with the ADC array 3030.

The pixel array 3010 include multiple photodetectors, such as the previously described switched photodetectors, and capacitors for storing the photo-generated carriers from the switched photodetectors. The pixel array 3010 is a two-dimensional array of photodetectors and capacitors, including M rows and N columns (i.e., an M×N array). The capacitors may be integrated with the photodetectors or be implemented separately. Examples of the capacitors include floating-diffusion capacitors, metal-oxide-metal (MOM) capacitors, and metal-insulator-metal (MIM) capacitors. The pixel array 3010 may further include pixel transistors for controlling the operation of the photodetectors, such as controlling charge readout of switched photodetectors. The pixel array 3010 may be part of an image sensor that include various optical components associated with detection of light, such as reflectors, lenses, and anti-reflection coating layers.

The amplifier array 3020 includes one or more amplifiers 3022. The Amplifiers 3022 amplify the electrical signals generated by the individual pixels of the pixel array 3010. The amplifier 3022 may be a voltage-gain amplifier, which amplifies a voltage established by integration of photocurrent on the capacitors. The amplifier 3022 may be a charge-to-voltage amplifier that converts the charge stored on the capacitors into a voltage output. The amplifier 3022 may be a variable gain amplifier, which can be used in optimizing detection sensitivity over a range of optical signal magnitude received by the pixel array 3010. The amplifier 3022 may be a differential amplifier that, for example, amplifies a difference in voltage between the two outputs of a switched photodetector. Such differential detection scheme may provide improved ToF detection sensitivity.

Various implementations of the amplifier array 3020 may have different number of amplifiers 3022. In some implementations, each pixel of the pixel array 3010 is coupled with a dedicated amplifier 3022. Such configuration may allow simultaneous readout of all pixels, resulting in highest image data acquisition rate. In some implementations, each row or column of the pixel array shares a single amplifier 3022. For example, for an M×N pixel array 3010, there may be M or N amplifiers 3022. Such a shared configuration may improve scalability of the receiver unit 3000 to a large number of pixels (e.g., millions of pixels). In some implementations, each row or column may be further divided into subsections with amplifiers 3022 shared within the subsections. In some implementations, for a small pixel array 3010, a single amplifier 3022 may be shared among all pixels of the array. In general, a block of pixels from multiple rows and columns may be grouped, and blocks of pixels may share a single amplifier 3022. For example, for an M×N pixel array 3010, there may be K×L amplifiers 3022 in which K≤M and L≤N.

The ADC array 3030 includes one or more ADCs. The ADCs convert the analog voltage or current signals output by the amplifiers 3022 into digital outputs 3040 having N bits. The digital outputs 3040, for example, may be received by the processing unit 506 of FIG. 5A to perform ToF detection. The number of output bits N determines the resolution of the ADC, which may be set based on considerations of sensitivity and speed in conversion for a given application. Examples of various types of ADCs include flash ADC, successive-approximation-register ADC, and delta-sigma ADC. The ADC may be a differential ADC that, for example, converts a difference in amplified voltage between at the output of a differential amplifier 3022. Various implementations of the ADC array 3030, similar to the amplifier array 3020, may have different number of ADCs. The number of ADCs may be equal to (i.e., one-to-one correspondence) or less than (i.e., several amplifiers sharing one ADC) the number of amplifiers 3022 in the amplifier array 3020 depending on various design considerations, such as a desired conversion speed.

An imaging system such as a ToF imaging system 500 may be exposed to a wide range of optical signal magnitudes during operation. For example, the optical signal magnitude may be affected by ambient lighting condition, reflectivity of a target object, or distance of the imaging system 500 from the target object, and the signal magnitude can vary by several orders of magnitude over various operating conditions (e.g., a factor of 2 or more, a factor of 10 or more, or a factor of 100 or more). A change in optical signal magnitude typically results in a linearly proportional change in the photocurrent generated by the photodetectors of the pixels.

The pixel array 3010 operates by integrating the photocurrent generated by each of the photodetectors of the pixels on respective capacitors over a certain period of time (e.g., a nominal integration time) to generate an electrical signal proportional to the detected optical signal. For example, the capacitor may be charged to a preset voltage (e.g., 1.8 V) at the beginning of an image acquisition cycle, at which point the capacitor is storing a charge Q determined by the formula $Q=C*V$, where C is the capacitance of the capacitor and V is the voltage of the capacitor. Then the charged capacitor is discharged by the photocurrent Iph, which is defined as $Iph=\Delta Q/\Delta t$, i.e., change in an amount of charge Q in a given change in time t. The magnitude of the photocurrent Iph generated by the photodetector directly affects the rate at which the associated capacitor is discharged. The maximum integration time corresponds to the time $tmax=Q/Iph$, which is the time needed to completely discharge the capacitor. When the maximum integration time is shorter than the nominal integration time, and the integration over the nominal integration time completely discharges the capacitor as a result (and more generally, when the capacitor has been discharged to a second preset voltage), the pixel is said to be "corrupted" or "bloomed," at which point the electrical output of the pixel is no longer proportional to the received light input, resulting in distortion of acquired image or incorrect ToF measurements. As such, if the optical signal is sufficiently large to corrupt one or more pixels within a preset integration time period, the integration of the signal may be terminated prior to corruption of the pixels. Such early termination of the optical signal integration may result in generation of a sub-frame, which is a result of partial integration over a fraction of the nominal integration time. Multiple sub-frames may be acquired over the nominal integration time, and the multiple sub-frames may be post-processed to generate a single image frame.

Once integration of the optical signal is terminated, the electrical outputs of the pixels are amplified by the amplifiers 3022 and converted to digital outputs 3040 by the ADC array 3030 to generate a frame or a sub-frame. Once the conversion is completed, the capacitors are charged back up to the preset voltage, and the acquisition cycle is repeated. Because a large optical signal leads to a corresponding decrease in maximum integration time for each acquisition cycle, large optical input signal leads to a corresponding increase in the rate of generation of sub-frames and the digital output 3040. For some applications, such increase in data output may not be desired due to, for example, an increase in power consumption or an increase in system complexity necessary to support the increased data throughput. As such, a solution to increase the maximum integration time of the pixels, decrease output data rate of the ADCs, decrease output data rate of the ToF receiver unit 3000, or a combination thereof, is desired.

One approach to increasing the maximum integration time or decreasing output data rate is to increase the capacitance of the capacitors associated with each pixels of the pixel array 3010. Increasing the capacitance by a constant factor can increase the maximum integration time by approximately the same constant factor, and may increase a dynamic range of the ToF receiver unit. However, capacitors are physical structures fabricated in the device layer where the photodetectors are fabricated or in the backend interconnect layers, and capacitance typically scales linearly with its total area. As such, the capacitance of a capacitor monolithically integrated with the photodetector is limited by the available real estate within the sensor wafer in which the pixel array 3010 is fabricated. These issues can be solved by having additional capacitors be fabricated on a second wafer and bonded to the sensor wafer to further increase the capacitance of each of the pixels.

Figure 31A:
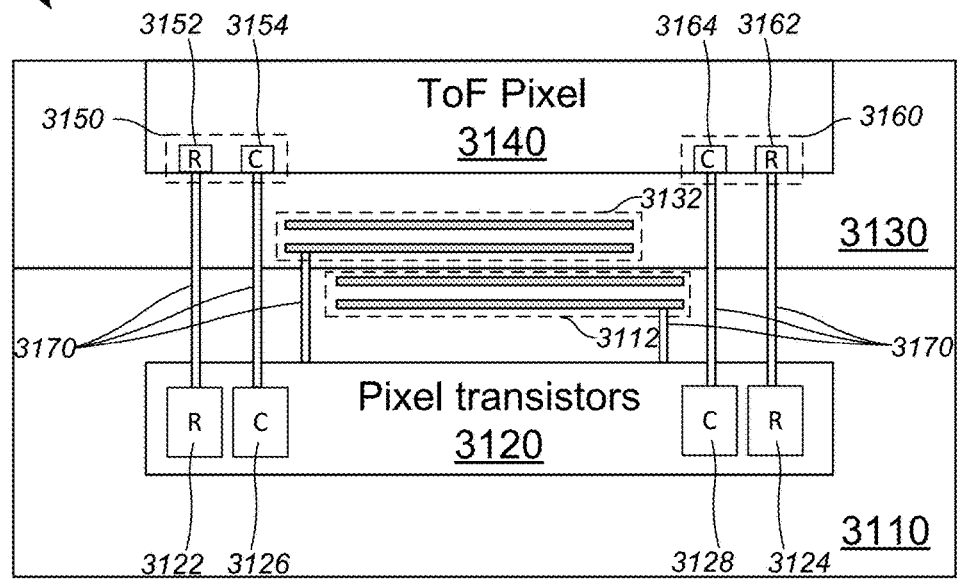
FIGS. 31A-31I show schematic and cross-sectional views of examples of ToF receiver unit with increased capacitance.
Figure 31B:
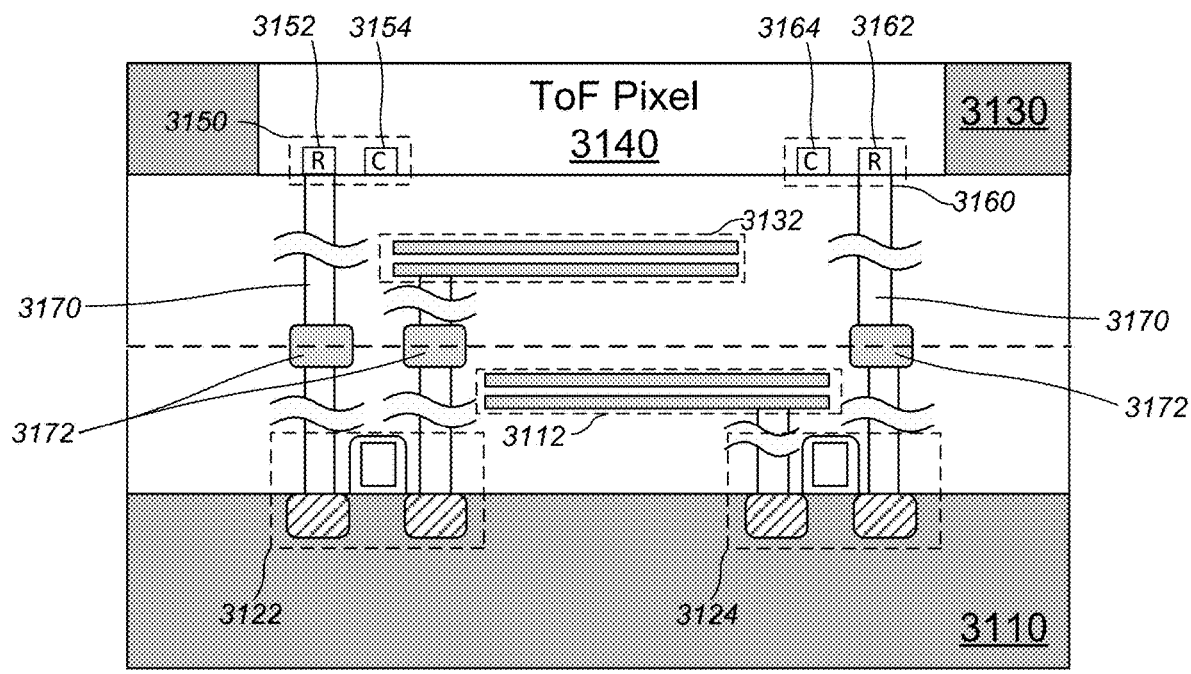

FIGS. 31A and 31B show a schematic view and a cross-sectional view of an example ToF receiver unit 3100 with increased capacitance. The ToF receiver unit 3100 includes an integrated circuit (IC) wafer 3110, a sensor wafer 3130, and interconnects 3170. The IC wafer 3110 includes a first capacitor 3112 and pixel transistors 3120. The sensor wafer 3130 includes a second capacitor 3132 and a ToF pixel 3140. The IC wafer 3110 and the sensor wafer 3130 are bonded together, for example, using a wafer bonding process, and the interconnects 3170 electrically couple the ToF pixel 3140, the first and second capacitors 3112 and 3132, and the pixel transistors 3120. By utilizing the space available for fabrication of the capacitors 3112 and 3132 in both the IC wafer 3110 and the sensor wafer 3130, the total capacitance available for integration of the ToF pixel 3140 may be increased by a factor of two relative to a configuration in which the first and second capacitors are both fabricated on a single wafer. Such increase in capacitance may increase the maximum integration time of the ToF pixel 3140, reducing the rate of generation of sub-frames and corresponding data throughput by the same factor.

The ToF pixel 3140 may be a switched photodetector, such as the switched photodetector 100. The ToF pixel 3140 includes a first switch 3150 and a second switch 3160, each having respective carrier readout (collection) terminal 3152 and 3162 ("R"), and carrier control (modulation) terminal 3154 and 3164 ("C"). The first switch 3150 may be similar, for example, to the first switch 108 of FIG. 1A, the carrier readout terminal 3152 may be similar to the n-doped region 126, and the carrier control terminal 3154 may be similar to the p-doped region 128. Similarly, the second switch 3160 may be similar, for example, to the second switch 110 of FIG. 1A, the carrier readout terminal 3162 may be similar to the n-doped region 136, and the carrier control terminal 3164 may be similar to the p-doped region 138. The ToF pixel 3140 may be a back-side illuminated (BSI) pixel in that the optical signal may enter the ToF pixel 3140 from the backside of the sensor wafer 3130 opposite to the side on which the ToF pixel 3140 is fabricated.

The pixel transistors 3120 are transistors configured to control the operation of the ToF pixel 3140. The pixel transistors 3120 includes first and second readout transistors 3122 and 3124 for collecting carriers from the readout terminals 3152 and 3162. The pixel transistors 3120 may include readout circuit having a 3T configuration (i.e., a three-transistor configuration having a reset, a source-follower, and a row-select transistors), or may include circuits similar to the readout circuits 124 and 134 shown in FIG. 1A. The pixel transistors 3120 may include control transistors 3126 and 3128 for providing control signals to the control terminals 3154 and 3164. The control signals provided by the control transistors 3126 and 3128 may be similar to the control signals 122 and 132 shown in FIG. 1A.

The first and second capacitors 3112 and 3132 may be implemented using standard semiconductor IC fabrication techniques. Examples of the first and second capacitor 3112 and 3132 include metal-oxide-metal (MOM) capacitors and metal-insulator-metal (MIM) capacitors. In some implementations, the oxide or insulator of the capacitors may be replaced with high-k dielectric constant materials such as Al2O3, HfO2, ZrO2, or La2O3. While the capacitors are illustrated as parallel plate capacitors, various structures having capacitance may be used as the capacitors 3112 and 3132, including floating diffusion capacitors and metal-oxide-semiconductor (MOS) capacitors. In general, the first and second capacitors 3112 and 3132 may each be implemented as a bank of capacitors in parallel for manufacturability or performance reasons.

Referring to FIG. 31B, the first and second capacitors 3112 and 3132 are electrically coupled to the input terminals (e.g., source or drain terminal) of the readout transistors 3124 and 3122, respectively. The first readout transistors 3122 collect the carriers from the carrier readout terminals 3152 and provide the collected carriers to the second capacitor 3132 through its output terminal (e.g., source or drain terminal). The second readout transistors 3124 collect the carriers from the carrier readout terminals 3162 and provide the collected carriers to the first capacitor 3112 through its output terminal (e.g., source or drain terminal). In this configuration, a voltage may be applied to gate terminals of the readout transistors 3122 and 3124 to control the transfer of the carriers from the ToF pixel 3140 to the respective capacitors 3132 and 3112.

While a particular association of the capacitor 3112 and 3132 to the readout terminals 3152 and 3162 has been described, in general, the association between the capacitors 3112 and 3132 and the readout terminals 3152 and 3162 may be swapped and operate in analogous manner. Respective terminals of the first and second capacitors 3112 and 3132 that are not connected to the readout terminals 3124 and 3122 may be, for example, grounded, floating, or connected to a power supply.

The IC wafer 3110 and the sensor wafer 3130 may be bonded in various ways. Examples on bonding techniques include metal to metal bonding, oxide to oxide bonding, and hybrid bonding. The interconnects 3170 may include bonding pads 3172, which provides electrical coupling between the portions of the interconnects 3170 formed in the IC wafer 3110 and the sensor wafer 3130. The bonding pads 3172 may be copper pillars or pads, and may provide mechanical coupling between the IC wafer 3110 and the sensor wafer 3130.

While a single ToF pixel 3140 is shown in FIGS. 31A and 31B for illustrative purposes, in general, the receiver unit 3100 may include an array of ToF pixels 3140 connected to an array of pixel transistors 3120.

While the ToF pixel 3140 having two switches 3150 and 3160 coupled to two capacitors 3132 and 3112 is shown in FIGS. 31A and 31B for illustrative purposes, in general, the ToF pixel 3140 may include three or more switches that are electrically coupled to three of more capacitors.

Figure 31C:
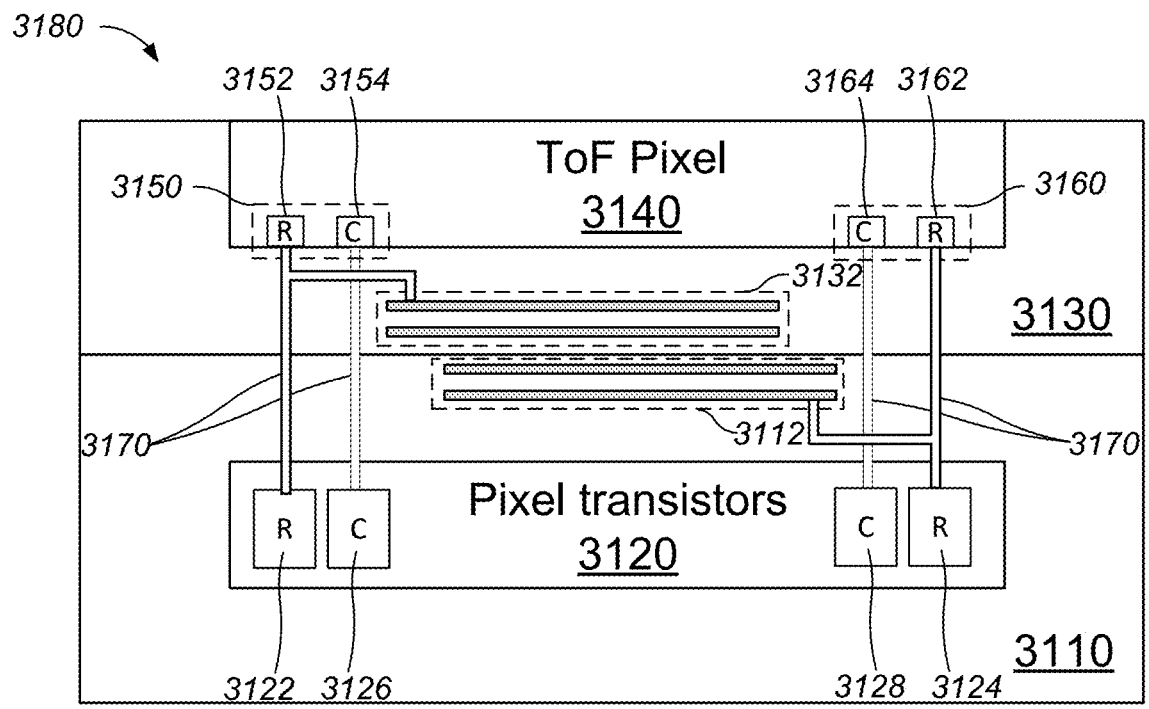

FIG. 31C show a schematic view of an example ToF receiver unit 3180 with increased capacitance. The ToF receiver unit 3180 is similar to the ToF receiver unit 3100 of FIG. 31A, but differs in that the first and second capacitors 3112 and 3132 are now directly electrically coupled to respective carrier readout terminals 3162 and 3152 without intervening transistors.

Figure 31D:
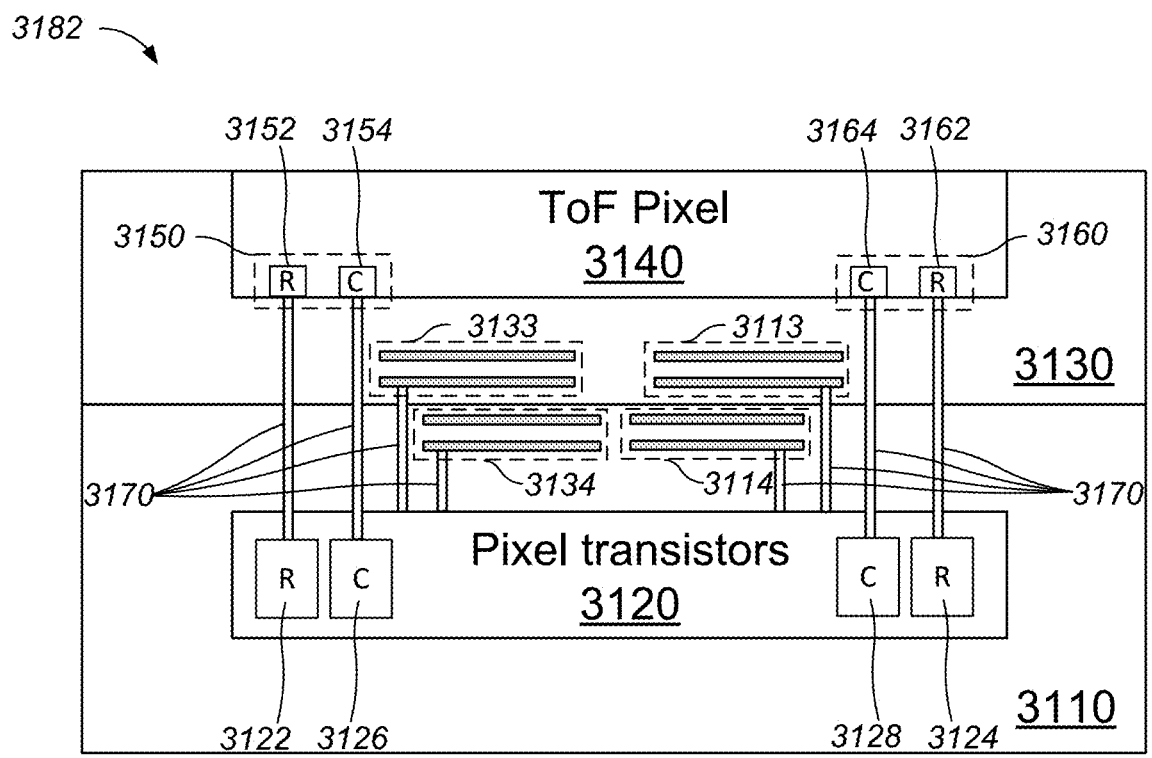

FIG. 31D show a schematic view of an example ToF receiver unit 3182 with increased capacitance. The ToF receiver unit 3180 is similar to the ToF receiver unit 3100 of FIG. 31A, but differs in that the first capacitor 3132 is split into first sub-capacitors 3133 and 3134, and the second capacitor 3112 is split into second sub-capacitors 3113 and 3114. The sub capacitors 3113 and 3133 are located in the sensor wafer 3130 and the sub capacitors 3114 and 3134 are located in the IC wafer 3110. The first sub-capacitors 3113 and 3114 are electrically connected in a parallel configuration to achieve similar increase in capacitance as the configuration show in FIG. 31A. The first sub-capacitors 3113 and 3114 are electrically coupled with the readout transistors 3124, and are configured to be charged or discharged by the carriers collected from the readout terminal 3162. Similarly, the second sub-capacitors 3133 and 3134 are electrically connected in a parallel configuration to achieve similar increase in capacitance as the configuration show in FIG. 31A. The second sub-capacitors 3133 and 3134 are electrically coupled with the readout transistors 3122, and are configured to be charged or discharged by the carriers collected from the readout terminal 3152.

In general, the IC wafer 3110 and the sensor wafer 3130 are fabricated independent of each other. For example, the two wafers 3110 and 3130 may be fabricated using different processing techniques, different process nodes, by different foundries, and/or at different times, all of which may affect the capacitance of a capacitor fabricated in the wafers 3110 or 3130 due to finite manufacturing process tolerance and variability. By splitting the first capacitor associated with the readout terminal 3162 into sub-capacitor 3113 located in the sensor wafer 3130 and sub-capacitor 3114 located in the IC wafer, and similarly for the second capacitor associated with the readout terminal 3152 into sub-capacitors 3133 and 3134, any variations in capacitors of one wafer affects the total first or second capacitances in equal amounts, thereby helping to reduce or eliminate potential imbalance in the two capacitances resulting from any variability or mismatch between the IC wafer 3110 and the sensor wafer 3130.

Figure 31E:
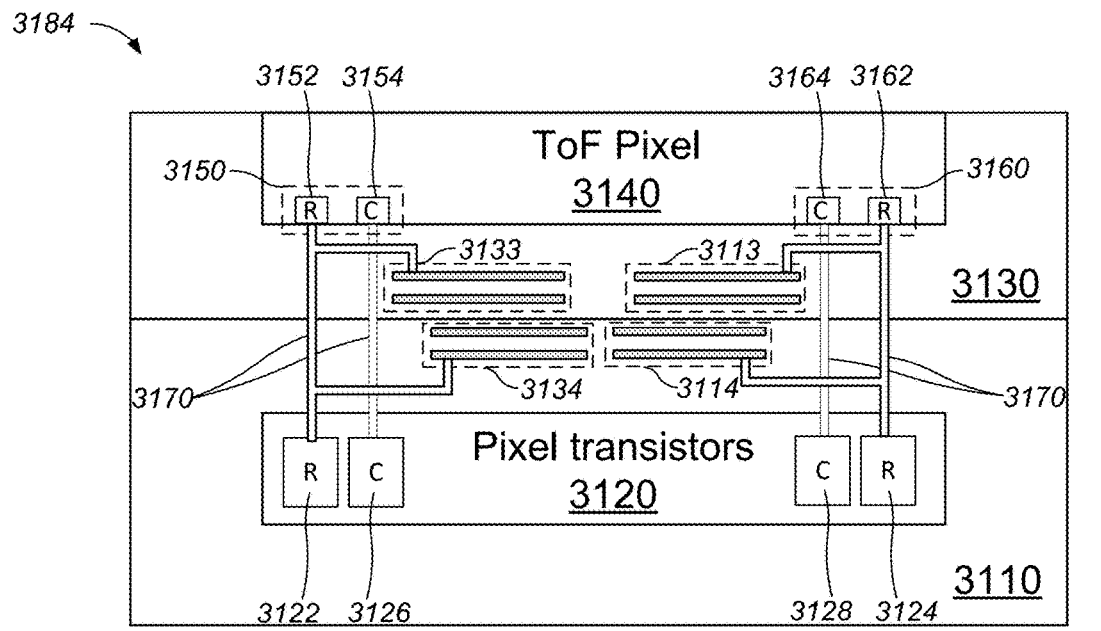

FIG. 31E show a schematic view of an example ToF receiver unit 3184 with increased capacitance. The ToF receiver unit 3184 is similar the ToF receiver unit 3182 of FIG. 31D, but differs in that the first sub-capacitors 3113 and 3114 and the second sub-capacitors 3133 and 3134 are now directly electrically coupled to respective carrier readout terminals 3162 and 3152 without intervening transistors.

Figure 31F:
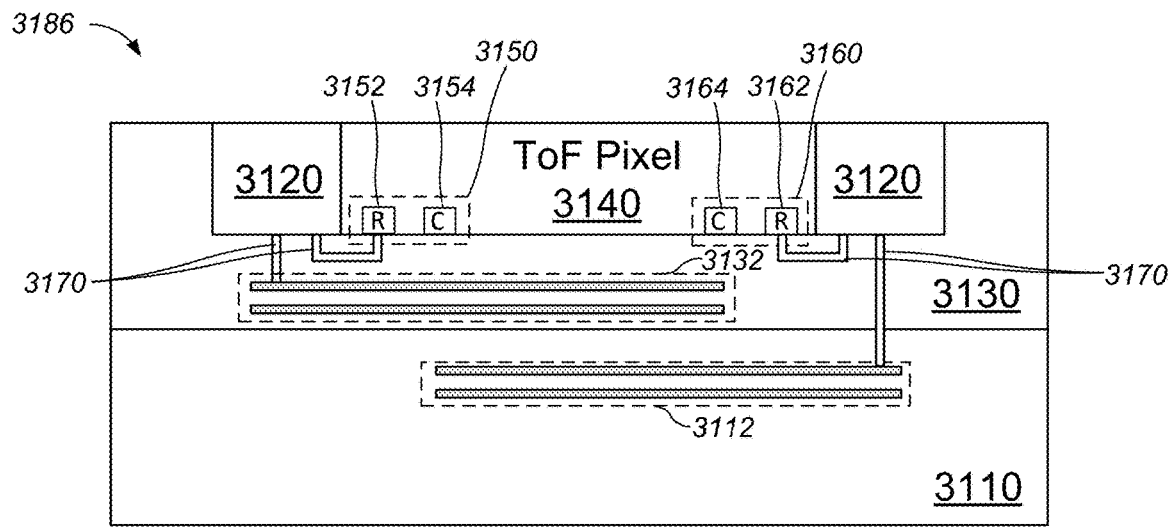

FIG. 31F show a schematic view of an example ToF receiver unit 3186 with increased capacitance. The ToF receiver unit 3186 is similar to the ToF receiver unit 3100 of FIG. 31A, but differs in that the pixel transistors 3120 have been moved from the IC wafer 3110 into the sensor wafer 3130. In some cases, the pixel transistors 3120 may be moved into unoccupied spaces in the sensor wafer 3130 that surround the ToF pixel 3140. Such placement of the pixel transistors 3120 may improve performance of the receiver unit 3186, and/or free up space in the IC wafer 3110 for other components of the receiver unit 3186, such as additional capacitors, memories, amplifiers, or ADCs.

Figure 31G:
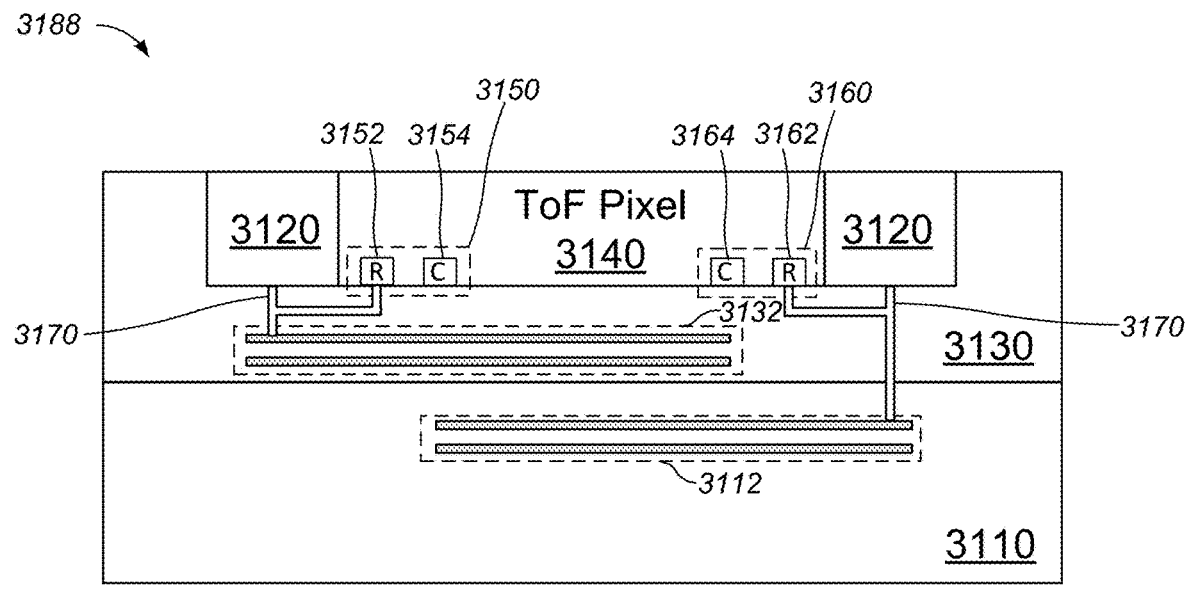

FIG. 31G show a schematic view of an example ToF receiver unit 3188 with increased capacitance. The ToF receiver unit 3188 is similar to the ToF receiver unit 3180 of FIG. 31C, but differs in that the pixel transistors 3120 have been moved from the IC wafer 3110 into the sensor wafer 3130. In some cases, the pixel transistors 3120 may be moved into unoccupied spaces in the sensor wafer 3130 that surround the ToF pixel 3140. Such placement of the pixel transistors 3120 may improve performance of the receiver unit 3188, and/or free up space in the IC wafer 3110 for other components of the receiver unit 3188, such as additional capacitors, memories, amplifiers, or ADCs.

Figure 31H:
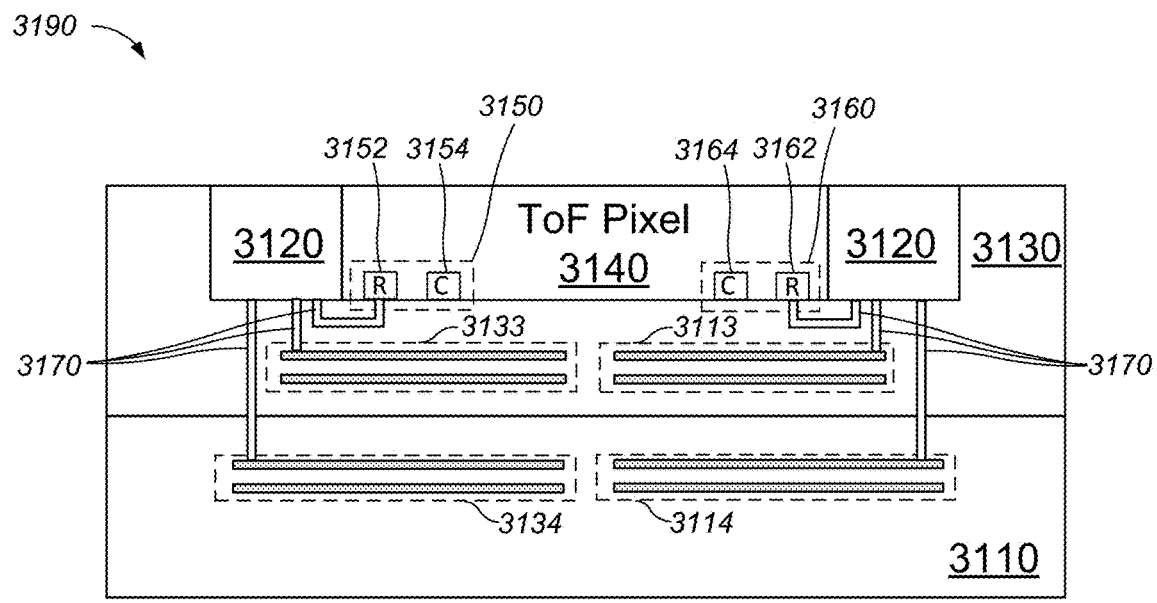

FIG. 31H show a schematic view of an example ToF receiver unit 3190 with increased capacitance. The ToF receiver unit 3190 is similar to the ToF receiver unit 3182 of FIG. 31D, but differs in that the pixel transistors 3120 have been moved from the IC wafer 3110 into the sensor wafer 3130. In some cases, the pixel transistors 3120 may be moved into unoccupied spaces in the sensor wafer 3130 that surround the ToF pixel 3140. Such placement of the pixel transistors 3120 may improve performance of the receiver unit 3190, and/or free up space in the IC wafer 3110 for other components of the receiver unit 3190, such as additional capacitors, memories, amplifiers, or ADCs.

Figure 31I:
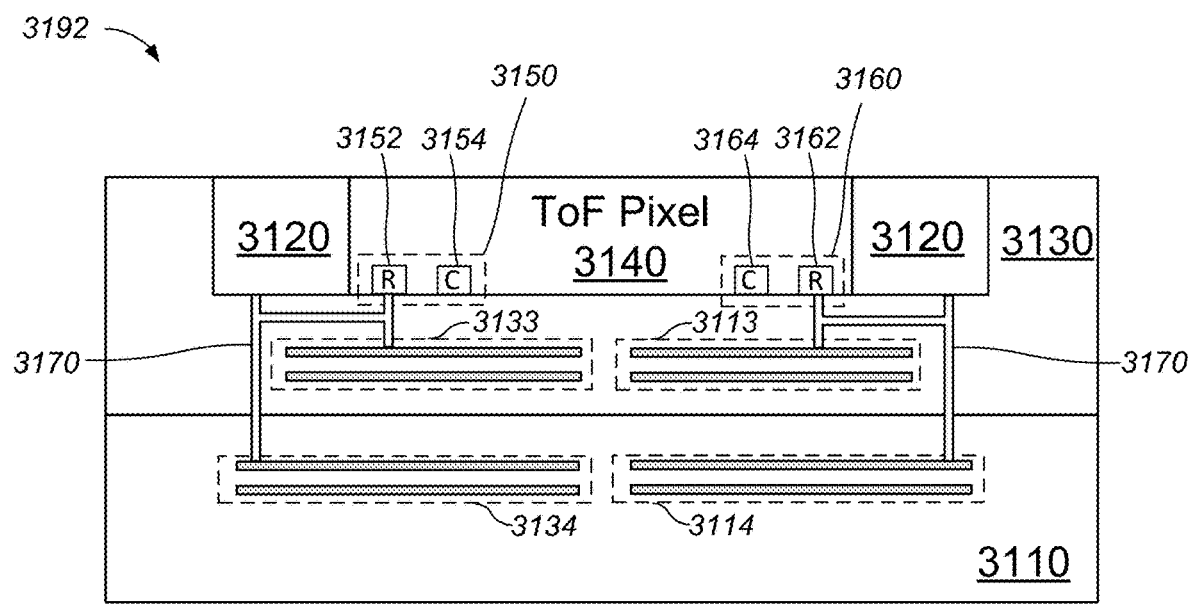

FIG. 31I show a schematic view of an example ToF receiver unit 3192 with increased capacitance. The ToF receiver unit 3192 is similar to the ToF receiver unit 3184 of FIG. 31E, but differs in that the pixel transistors 3120 have been moved from the IC wafer 3110 into the sensor wafer 3130. In some cases, the pixel transistors 3120 may be moved into unoccupied spaces in the sensor wafer 3130 that surround the ToF pixel 3140. Such placement of the pixel transistors 3120 may improve performance of the receiver unit 3192, and/or free up space in the IC wafer 3110 for other components of the receiver unit 3192, such as additional capacitors, memories, amplifiers, or ADCs.

In general, the pixel transistors 3120 in ToF receiver units 3100 of FIGS. 31A and 31B, 3182 of FIG. 31D, 3186 of FIG. 31F, and 3190 of FIG. 31H, can be controlled to select a suitable total capacitance value for a target integration time while minimizing the noises from the following amplifiers array 3020 and the ADCs 3030.

Figure 32:
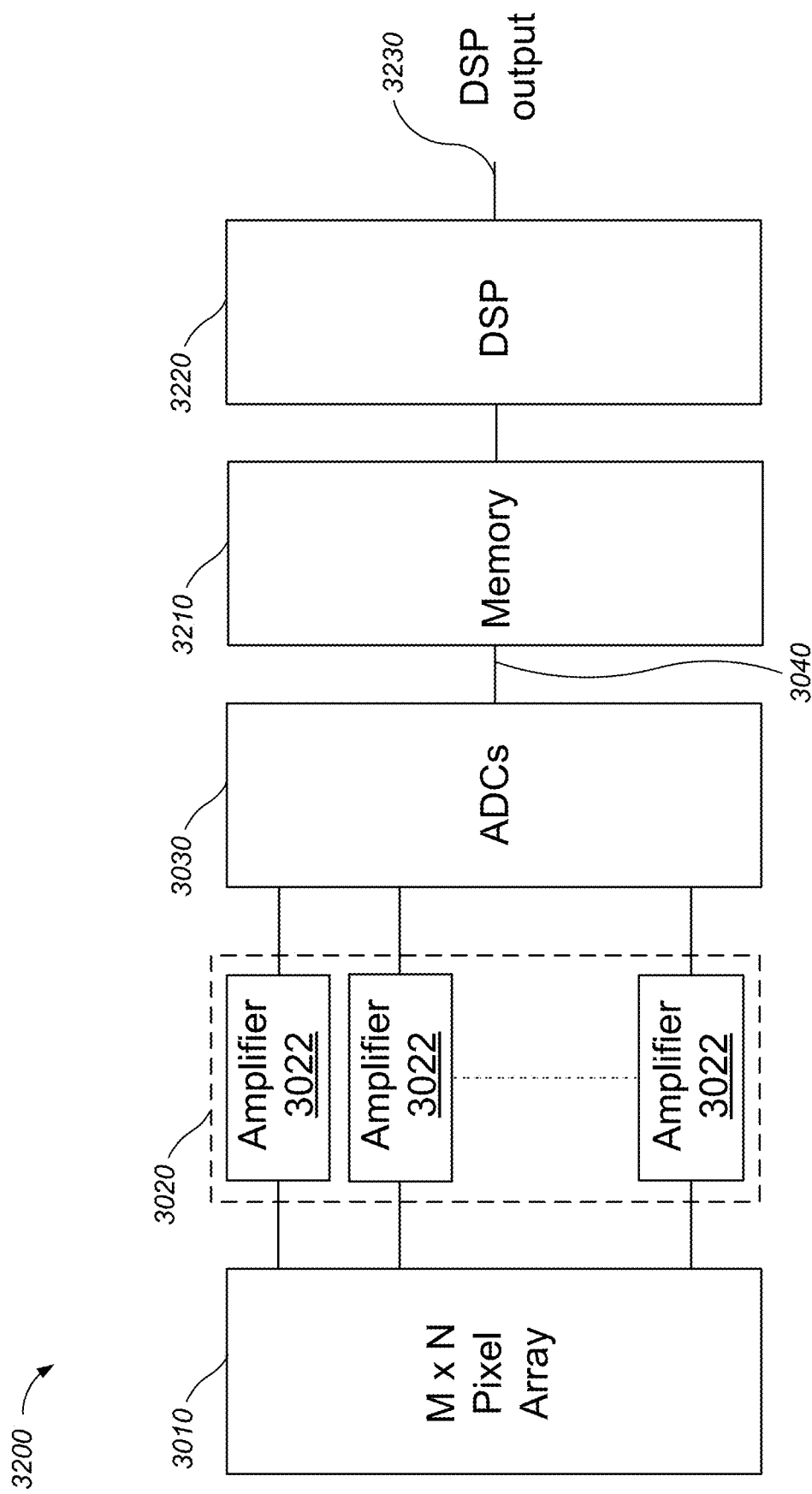
FIG. 32 shows a block diagram of an example receiver unit for ToF detection.

FIG. 32 shows a block diagram of an example receiver unit 3200 for ToF detection. The ToF receiver unit 3200 is similar to the ToF receiver unit 3000 of FIG. 30, but further includes a memory module 3210 and a digital signal processing (DSP) module 3220. The memory module 3210 is electrically coupled to the digital output 3040 of the ADC 3030 and to the input of the DSP module 3220. The DSP module 3220 outputs digitally processed data as DSP output 3230.

The memory module 3210 is configured to store the digital outputs 3040 of the ADC 3030 corresponding to the amplified electrical signals from the pixel array 3010. The memory module 3210 may store multiple digital outputs corresponding to the sub-frames generated by input optical signal of large magnitude, buffering the sub-frames prior to outputting or for further processing of the digital output 3040. For example, the receiver unit 3200 may generate data at a rate that is higher than the rate at which the data can be transferred to a system receiving the DSP output 3230. Such increase in data generation rate may be, for example, due to high optical signal magnitude, or a burst-mode acquisition of the ToF image frames. Under such conditions, the memory module 3210 may store the excess data while the receiver unit 3200 transmits the DSP output 3230 to the data receiving system.

The DSP module 3220 is configured to digitally process the digital data stored by the memory module 3210. The DSP module 3220 may be configured to perform, among others, various arithmetic operations, Boolean operations, or specialized digital operations such as Fast Fourier Transform (FFT) on the data received from the memory module 3210. For example, the DSP module 3220 may process multiple sub-frames stored in the memory module 3210 into a single complete frame or a portion of the complete frame containing a region of interest to be output to the data receiving system. By processing multiple sub-frames, generating a single complete frame or a portion of the complete frame containing a region of interest, and outputting the single complete frame or the portion of the complete frame containing the region of interest to the data receiving system, the total external data throughput of the receiver unit 3200 can be reduced. In some implementations, the total external data throughput of the receiver unit 3200 may be reduced by a factor corresponding to the number of sub-frames. As another example, the DSP module 3220 may process the data stored into the memory module 3210 to determine and filter depth information from the ToF measurements.

The memory module 3210 and the DSP module 3220 may be implemented alone or in combination with various configurations of ToF receivers with increased capacitances such as those described in relation to FIGS. 31A-31I. Combination of the memory module 3210 and the DSP module 3220 and the increased capacitances may reduce external data throughput and reduce the number of generated sub-frames. Reduction in the number of sub-frames may reduce the requirement on the storage capacity of the memory module 3210. Further, the reduction of the number of sub-frames may reduce the number of processing operations performed by the DSP module 3220. Such reduction in number of sub-frames and corresponding reduction in the memory capacity and/or the processing operations may result in a reduced power consumption by the ToF receiver unit.

In some implementations, the DSP module 3220 may include the processing unit 506 of FIG. 5A. The DSP module 3220 may be implemented, for example, as a general purpose processor or as an application specific integrated circuit.

Figure 33A:
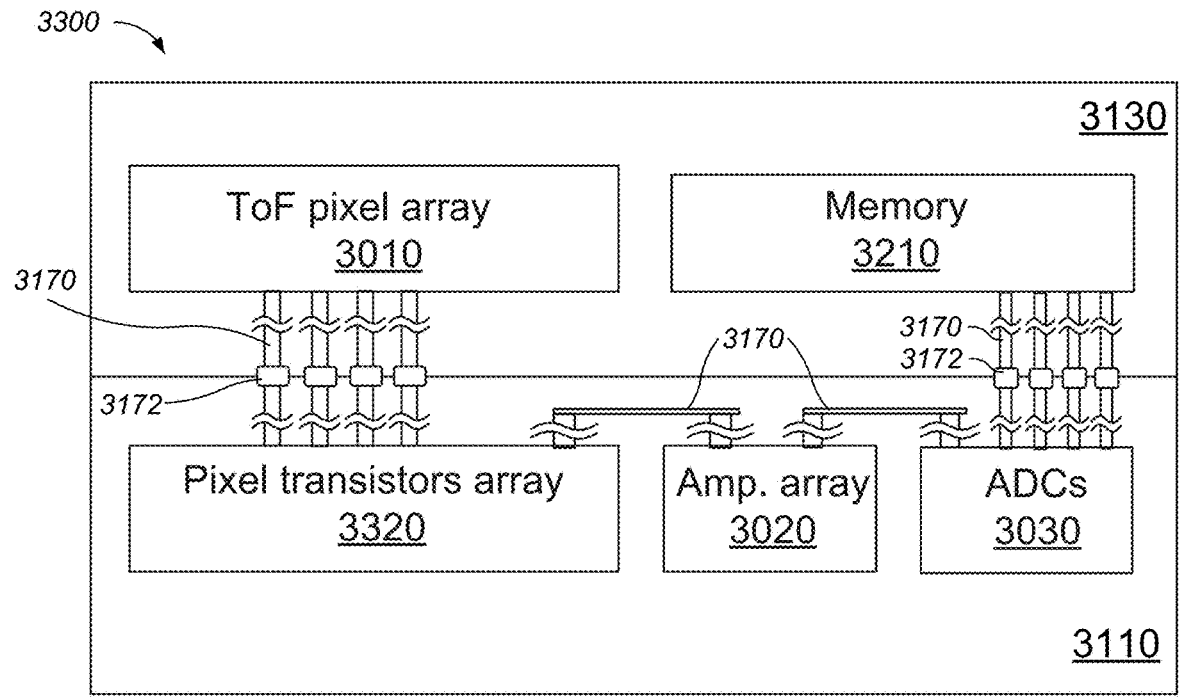
FIGS. 33A-33E show cross-sectional schematic views of example receiver units for ToF detection.

FIG. 33A shows a cross-sectional schematic view of an example receiver unit 3300 for ToF detection. The receiver unit 3300 includes the IC wafer 3110 and the sensor wafer 3130. The IC wafer 3110 includes the pixel transistors array 3320, the amplifier array 3020, and the ADCs 3030. The sensor wafer 3130 includes the ToF pixel array 3010 and the memory module 3210. The pixel transistors array 3320 is an array of the pixel transistors 3120 described in relation to FIG. 31A. The IC wafer 3110 and the sensor wafer 3130 are bonded to each other through wafer bonding. The interconnects 3170 and the bonding pads 3172 electrically couple the various components of the receiver unit 3300.

The memory module 3210 may be distributed around unoccupied spaces in the sensor wafer 3130 that surround the ToF pixel array 3010. For example, in a BSI-configuration receiver unit 3300, the areas within sensor wafer 3130 that are located above the amplifier array 3020 and the ADCs 3030 may be unoccupied. By placing the memory module 3210 in unoccupied spaces located above the amplifier array 3020 and the ADCs 3030, performance of the receiver unit 3300 may be improved without increasing the size of the receiver unit 3300.

The memory module 3210 may be implemented in various configurations and using various memory technologies. Examples of memory technologies include static random access memory (SRAM), dynamic random access memory (DRAM), flash memory, resistive RAM (ReRAM), magnetic RAM (MRAM), phase change RAM (PRAM), and ferroelectric RAM (FeRAM). Different memory technologies typically share a common architecture of a bit-storing element coupled with a read/write transistor. For example, a DRAM bit includes a capacitor for storing charges associated with a bit, and a transistor that reads from or writes into the capacitor. As another example, a SRAM bit includes a flip-flop for storing states associated with a bit, and two transistors that read from or write into the flip-flop. Similarly, ReRAM has a variable resistance storage element, MRAM has a magnetic storage element, PRAM has a phase change storage element, and FeRAM has a ferroelectric storage element for storing a bit. In some implementations, two or more memory technologies may be combined and work in conjunction with each other. In the implementation shown in FIG. 33A, the memory module 3210 includes both the read/write transistors and the associated bit storing element. In some implementations, additional processing circuits may be included to further extend the functionalities of the memory module 3210. For example, digital adders may be included to further process the bits stored by the memory.

Figure 33B:
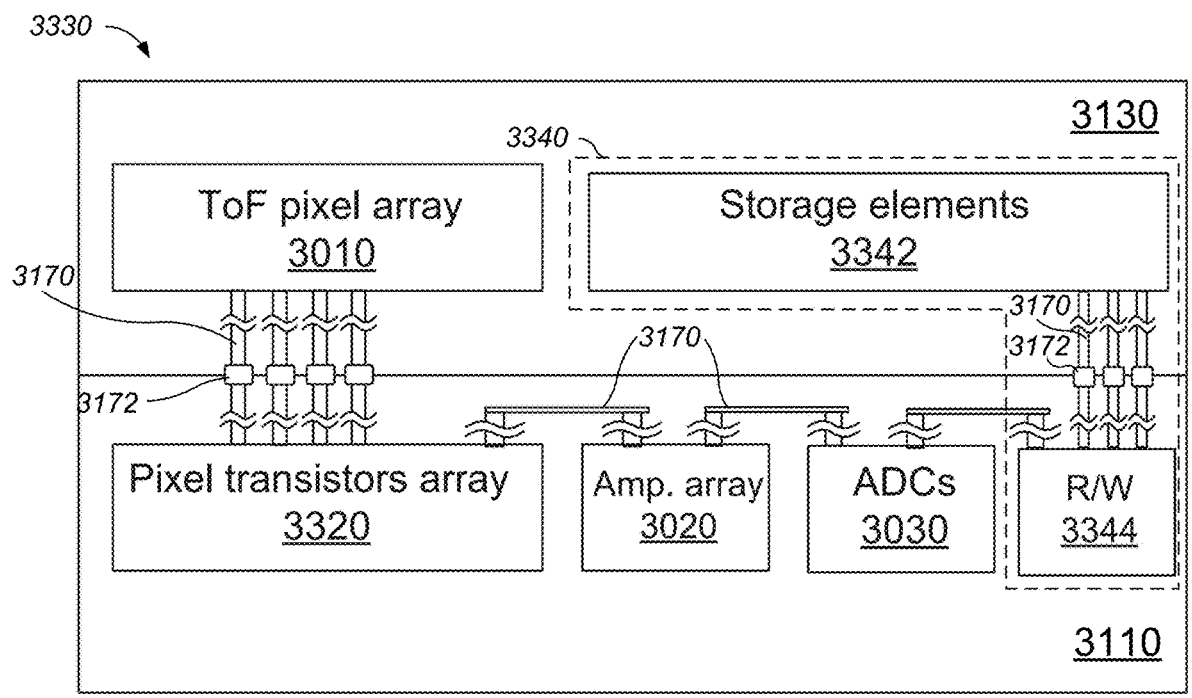

FIG. 33B shows a cross-sectional schematic view of an example receiver unit 3330 for ToF detection. The receiver unit 3330 is similar to the receiver unit 3300 of FIG. 33A, but differs in that the memory module 3210 is replaced by a distributed memory module 3340. The distributed memory module 3340 includes a storage element sub-block 3342 and a read/write transistor sub-block 3344. The storage sub-block 3342 is located in the sensor wafer 3130, and the transistor sub-block is located in the IC wafer 3110. In some implementations, additional processing circuits such as digital adders may be included in the read/write transistor sub-block 3344 to further process the bits stored by the memory.

Storage elements 3342 are typically fabricated using specialized technologies and/or materials. For example, the capacitors of DRAM are typically fabricated using specialized processes such as deep-trench etching into a silicon substrate, which may not be compatible with the manufacturing process used for fabricating the IC wafer 3110. Further, the manufacturing process used for fabricating the IC wafer 3110 may be better optimized for fabrication of transistors, such as the read/write transistors 3344. For example, the manufacturing process used for the IC wafer 3110 may be a more advanced process node having a smaller minimum feature size than that of the sensor wafer 3130. As such, decoupling the fabrication of the storage elements 3342 and the read/write transistors 3344 may improve performance of the memory module 3340 by allowing independent optimization of the performances of the two sub-blocks 3342 and 3344, and reduce manufacturing process complexity for the sensor wafer 3130 and the IC wafer 3110.

Figure 33C:
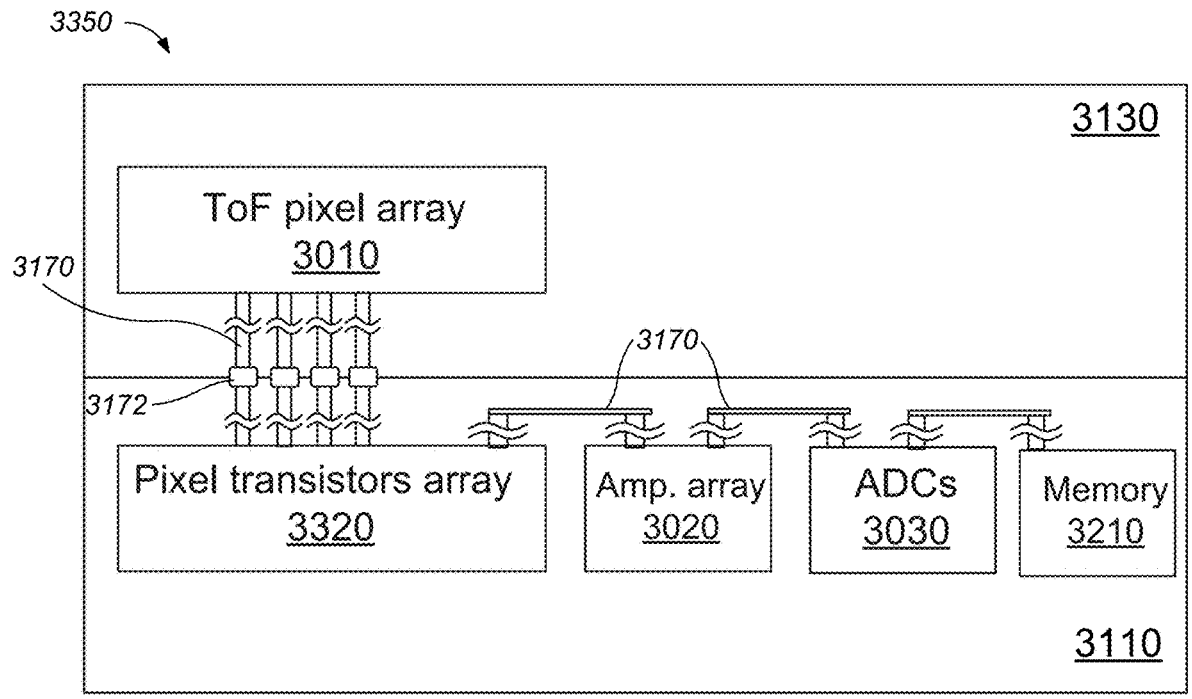

FIG. 33C shows a cross-sectional schematic view of an example receiver unit 3350 for ToF detection. The receiver unit 3350 is similar to the receiver unit 3300 of FIG. 33A, but differs in that the memory module 3210 is now located in the IC wafer 3110. For some memory technologies such as SRAM and flash, for a given process node, complete memory modules may be provided as an intellectual property (IP) core by CMOS foundries or third party vendors. Incorporation of these IP cores to implement the memory module 3210 of the IC wafer 3110 may reduce research and development efforts.

Figure 33D:
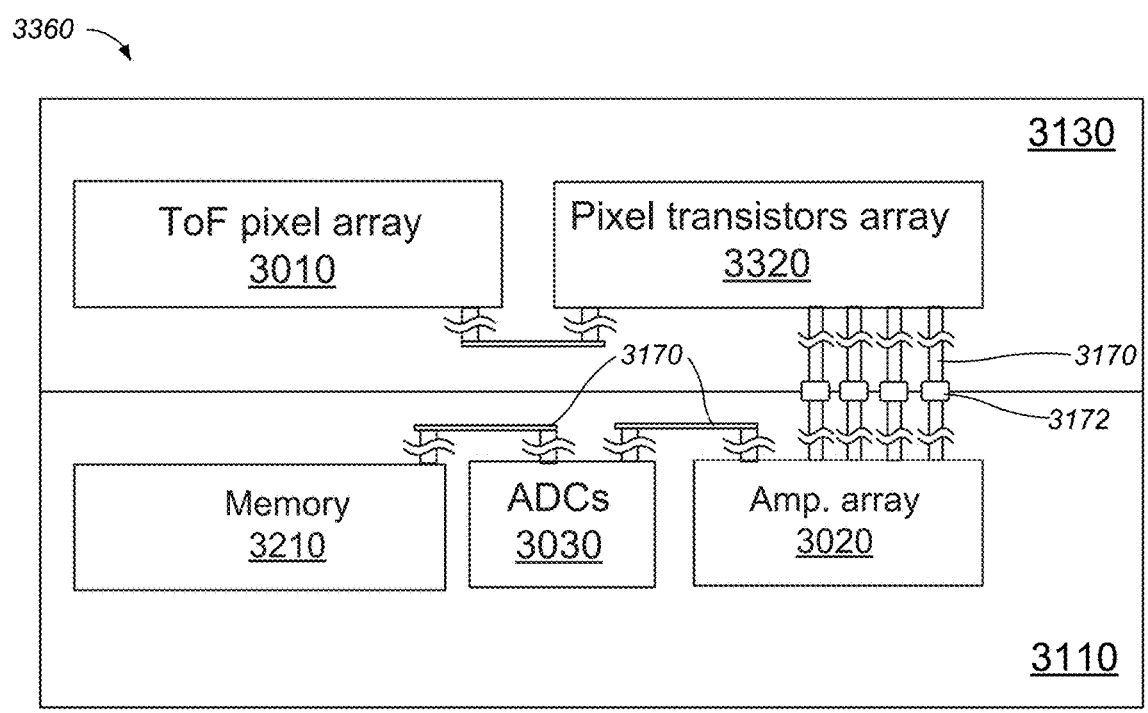

FIG. 33D shows a cross-sectional schematic view of an example receiver unit 3360 for ToF detection. The receiver unit 3360 is similar to the receiver unit 3350 of FIG. 33C, but differs in that the pixel transistor array 3320 is now located in the sensor wafer 3130. Placement of the pixel transistors array 3320 in the sensor wafer 3130 may allow improved space utilization within the IC wafer 3110. For example, the memory module 3210 may be placed on a location below the ToF pixel array 3010, which may be unoccupied as the amplifier array 3020 and the ADCs 3030 are located below the pixel transistors array 3320 to simplify electrical connections between those components.

Figure 33E:
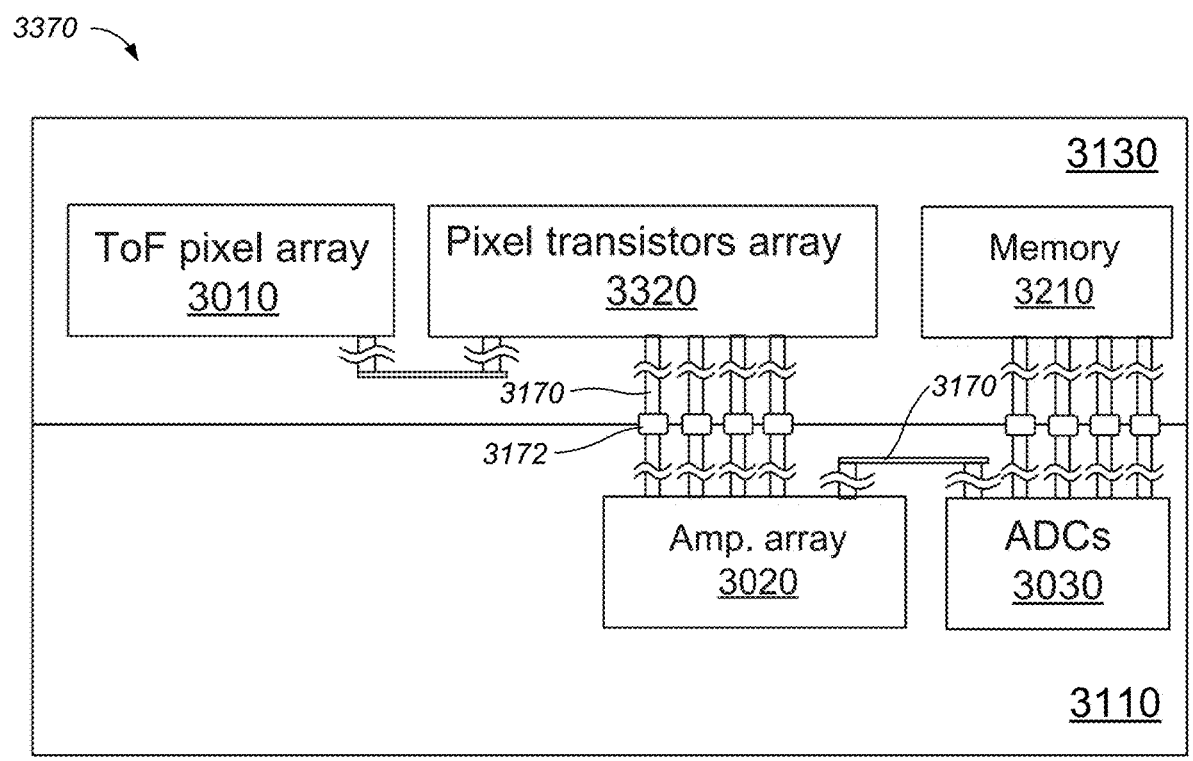

FIG. 33E shows a cross-sectional schematic view of an example receiver unit 3370 for ToF detection. The receiver unit 3370 is similar to the receiver unit 3360 of FIG. 33D, but differs in that the memory module 3210 is now located in the sensor wafer 3130.

While the ToF pixel array 3010, the pixel transistors array 3320, the memory module 3210, and ADCs 3030, and the amplifier array 3020 have been shown as schematic blocks for illustrative purposes, in general, portions of each of those components may be distributed across respective wafers 3110 and 3130. For example, a ToF pixel 3140 of the ToF pixel array 3010 and pixel transistors 3120 of the pixel transistors array 3320 may be distributed across the wafers 3110 and/or 3130, and the memory bits of the memory module 3210 or 3340 may be distributed across the wafers 3110 and/or 3130 in spaces not occupied by the ToF pixel array 3010 or the pixel transistors array 3320.

In general, additional electrical and optical components may be added to the receiver units described in relation to FIGS. 33A-33E. Examples of electrical components include resistors, inductors, data processing circuits (e.g., processors, FPGA, ASIC), biasing circuits (e.g., to provide bias voltage to the sensor wafer 3130 and/or the control terminals 3154 and 3164 of the ToF pixel 3140), and light source driver circuits (e.g., to provide electrical pulses to the transmitter unit 502 for generation of optical pulses). Examples of optical components include anti reflection coating (ARC), microlens, bandpass filters, and reflectors. Examples of microlens include micro ball lens, Fresnel zone plates, and integrated silicon microlens.

In general, an intermediate layer may be present between the IC wafer 3110 and the sensor wafer 3130. The intermediate layer may provide various benefits, such as improvements in electrical coupling between the two wafers, improvement in the bonding quality and yield of the two wafers, and improvement in the optical performance of the receiver units. The intermediate layer may be formed from various materials such as dielectric, polymer, and optical index matching material.

While two-way bonding of the IC wafer 3110 and the sensor wafer 3130 has been described in relation to FIGS. 33A-33E, in general, a receiver unit can be formed by bonding of three or more wafers. For example, additional IC wafers can be bonded to integrate additional capacitors to further increase the capacitances associated with the pixel array 3010. As another example, additional IC wafers can be bonded to integrate additional memory elements to further increase the memory capacity of the memory module 3210.

In general, the sensor wafer 3130 of the receiver units described in relation to FIGS. 33A-33E may be either front-side illuminated sensor wafer or back-side illuminated sensor wafer.

In general, the sensor wafer 3130, the ToF pixels 3140, or both can be formed from group III-V compound semiconductor materials, group IV alloy semiconductor materials, or a combination thereof.

Figure 34:
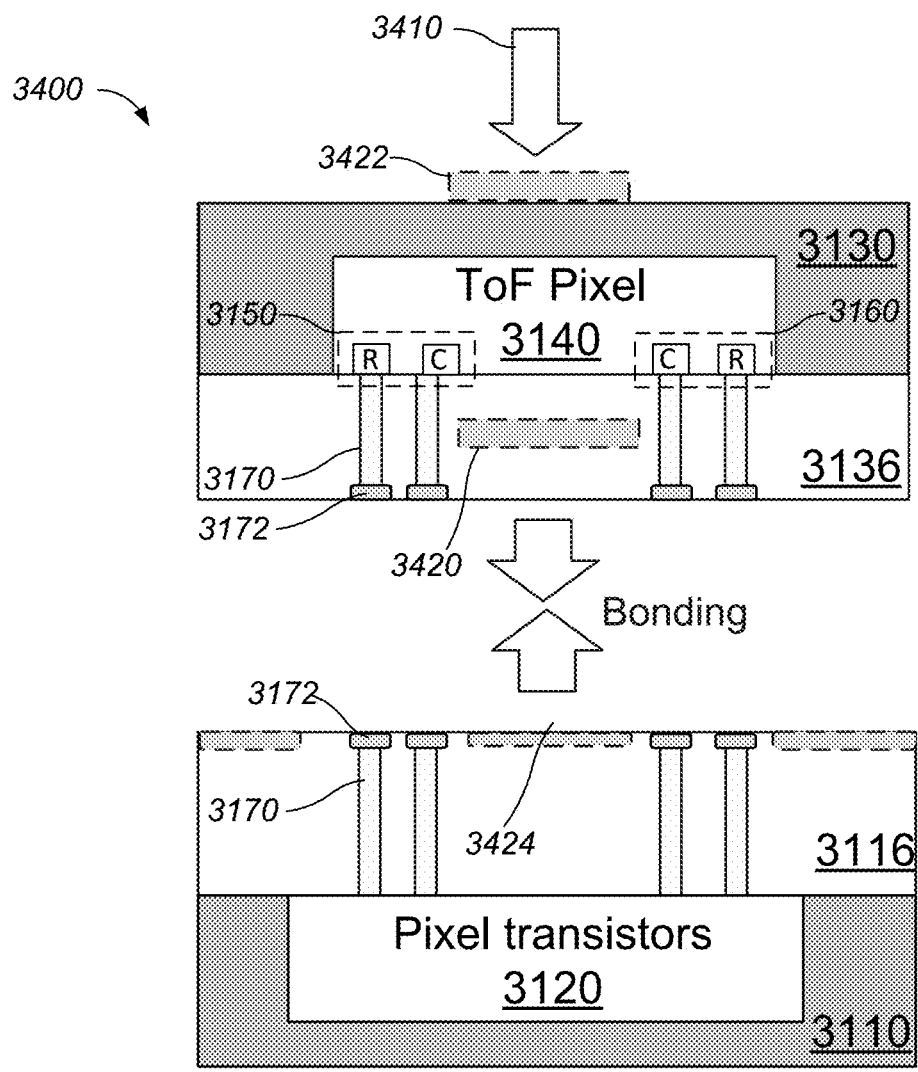
FIG. 34 shows a cross-sectional schematic view of an example bonding process of an example receiver unit for ToF detection.

FIG. 34 shows a cross-sectional schematic view of an example bonding process of an example receiver unit 3400 for ToF detection. The sensor wafer 3130 includes the ToF pixel 3140 and a backend layer 3136. The IC wafer 3110 includes the pixel transistors 3120 and a backend layer 3116. The backend layers 3116 and 3136 includes the interconnects 3170 and the bonding pads 3172, which are formed on the respective front sides of the wafers 3110 and 3130. The surfaces of the backend layers 3116 and 3136 include dielectric surfaces and metallic surfaces of the bonding pads 3172. Prior to bonding, sensor wafer is inverted such that the bonding pads 3172 of the sensor wafer 3130 faces the bonding pads 3172 of the IC wafer 3110. The two wafers are brought into contact in a controlled manner, which may involve controlling of the force, temperature, and forming environment. The combination of the dielectric surfaces and the metallic surfaces allows for hybrid bonding of the wafers 3110 and 3130, resulting in both electrical and mechanical coupling between the two wafers.

The inversion of the sensor wafer 3130 for wafer bonding allows receiving of optical signal 3410 through the back side of the sensor wafer 3130. The sensor wafer 3130 may be a silicon wafer, which is transparent to the infrared wavelengths (e.g., >1.1 µm). As such, infrared optical signal 3410 may reach the ToF pixel 3140 through the back side of the sensor wafer 3130. Such configuration is referred to as a back-side illuminated (BSI) sensor.

In some implementations, the backend layer 3136 of the sensor wafer 3130 may include a mirror 3420. The mirror 3420 is located below the light absorption region of the ToF pixel 3140. As such, any light that is not absorbed by the ToF pixel 3140 as it passes through the pixel 3140 is reflected by the mirror 3420, and reflected back toward the ToF pixel 3140, which is further absorbed by the ToF pixel 3140. The mirror 3420 may be, for example, metal mirror, a dielectric mirror, or a distributed Bragg reflector. The mirror 3420 may be a combination of a dielectric layer (e.g., silicon oxide or silicon nitride) followed by a metal layer. In some implementations, the mirror 3420 may be a concave mirror configured to reflect light toward a focal point located within the ToF pixel 3140.

In some implementations, the sensor wafer 3130 may include a partial mirror 3422. The partial mirror 3422 is formed on the back side of the sensor wafer 3130, and allows a portion of light to pass through into the ToF pixel 3140. The partial mirror 3422 may create a destructive interference at the interface between the partial mirror 3422 and air, such that the light reflected by the mirror 3420 toward the partial mirror 3422 is reflected back toward the ToF pixel 3140. When such condition is satisfied, the partial mirror 3422 in combination with the mirror 3420 forms a resonant cavity, which allows multiple reflection light between the two mirrors 3420 and 3422. The formed resonant cavity may improve the detection efficiency of the ToF pixel 3140 at the resonant wavelength of the resonant cavity. The partial mirror 3422 may be, for example, a dielectric mirror or a distributed Bragg reflector. The partial mirror 3422 may have a transmissivity that is substantially equal to a roundtrip attenuation of the light passing through the ToF pixel 3140 and reflected by the mirror 3420.

In some implementations, the backend layer 3116 of the IC wafer 3110 may include a mirror 3424. After bonding of the sensor wafer 3130 and the IC wafer 3110, the mirror 3424 is located below the light absorption region of the ToF pixel 3140. As such, any light that is not absorbed by the ToF pixel 3140 as it passes through the pixel 3140 is reflected by the mirror 3424, and reflected back toward the ToF pixel 3140, which in further absorbed by the ToF pixel 3140. The mirror 3424 may be, for example, metal mirror, a dielectric mirror, or a distributed Bragg reflector. The mirror 3424 may be a combination of a dielectric layer (e.g., silicon oxide or silicon nitride) followed by a metal layer. In some implementations, the mirror 3424 may be a concave mirror configured to reflect light toward a focal point located within the ToF pixel 3140.

In the previous sections, approaches to increasing integration time through increasing capacitance have been described. An important consideration when determining integration time is a dark current of the photodetector, which is a current that flows in absence of an optical signal and ambience light. In general, signal to noise ratio (SNR) of optical measurements made through photodetectors, such as ToF measurements made through switched photodetectors, are negatively influenced by the presence of the dark current. For example, the SNR of an optical measurement through a photodetector is linearly proportional to the integration time. Further, the integration time for a given capacitance may be limited by the dark current, as the dark current continuously discharges the capacitor charge even in absence of the optical signal and ambient light.

The dark current of a photodetector is typically an exponential function of the reverse bias voltage established across the cathode and anode of the photodetector. As such, reducing the reverse bias voltage in a controlled manner while retaining the overall operation of the photodetector may lead to improved SNR performance of the photodetector.

Figure 35:
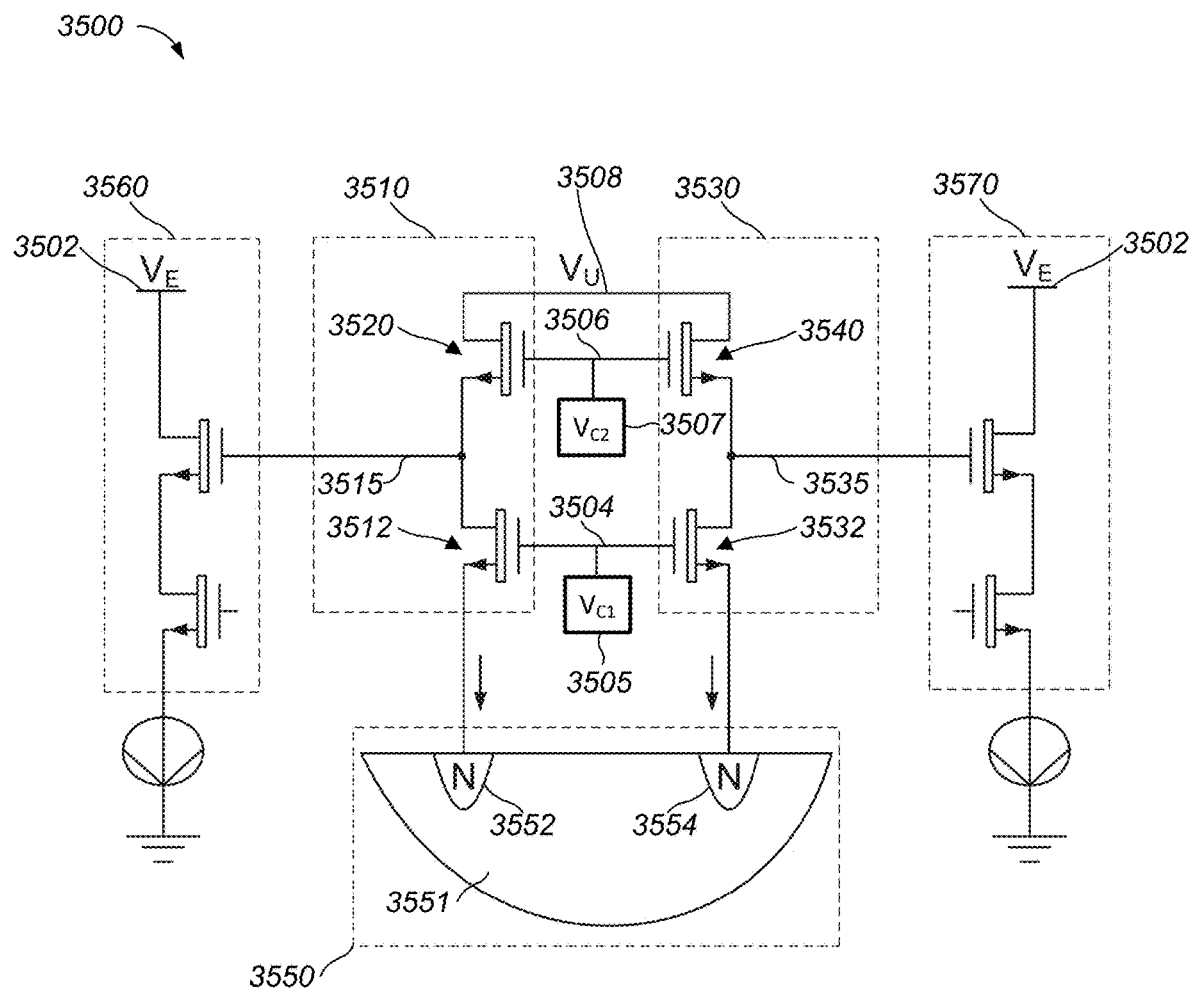
FIG. 35 shows a schematic diagram of a circuit for operating a ToF pixel.

FIG. 35 shows a schematic diagram of a circuit 3500 for operating a ToF pixel. The circuit 3500 includes a first readout subcircuit 3510 and a second readout subcircuit 3530 coupled to a switched photodetector 3550. The first readout subcircuit 3510 includes a first MOSFET transistor 3512 and a second MOSFET transistor 3520. The second readout subcircuit 3530 includes a third MOSFET transistor 3532 and a fourth MOSFET transistor 3540. The first readout subcircuit 3510 is coupled to a first source follower circuit 3560, and the second readout subcircuit 3530 is coupled to a second source follower circuit 3570. The first readout subcircuit 3510 and the first source follower circuit 3560 may be referred to as a first readout circuit, and the second readout subcircuit 3530 and the second source follower circuit 3570 may be referred to as a second readout circuit.

The switched photodetector 3550 includes a body 3551, a first readout terminal 3552 and a second readout terminal 3554. The switched photodetector 3550 may be implemented as any of the previously described switched photodetectors such as the switched photodetector 100 of FIG. 1A. The body 3551 may be similar to the light absorption layer 106 or the substrate 202, 302, and 402, and may be doped with p-type dopants. The first and second readout terminals 3552 and 3554 may be n-doped regions, which may be similar, for example, to the n-doped regions 126 and 136 of FIG. 1A. The photocurrent generated by the switched photodetector 3550 may be collected by either the first readout terminal 3552 or the second readout terminal 3554 based on the control operation of the switched photodetector 3550.

Each of the MOSFET transistors 3512, 3520, 3532, and 3540 includes a source terminal, a drain terminal, and a gate terminal. The source terminal and the drain terminal may be identical in the underlying structure, but distinguished based on the direction of flow of the current through the transistors. For example, for an N-type MOSFET ("NMOS transistor") having a P-type channel region, the current may flow from the drain terminal to the source terminal through the channel region, whereas for a P-type MOSFET ("PMOS transistor") having an N-type channel region, the current may flow from the source terminal to the drain terminal through the channel region. As the designation of the source and drain nomenclature is based on convention and as the underlying structure may be similar or identical, the source and drain terminals may be referred to as a first channel terminal and a second channel terminal when describing the connectivity between the MOSFETs and other circuit elements.

The gate terminal controls the flow of current through the source and the drain terminals. For example, a control voltage larger than a threshold voltage Vth may allow current to flow through the source and drain terminals. Such mode of operation of the MOSFET transistors may be referred to as operating in a saturation region or a triode region of operation, depending on voltages of the source and drain terminals relative to the gate terminal. In the saturation region, the current flowing through the source and drain terminals is not strongly affected by changes in the difference between the source and drain voltages (i.e., output impedance of the transistor is high). In the triode region, the current flowing through the source and drain terminals is approximately linearly proportional to the difference between the source and drain voltages (i.e., the transistor operates similarly to a resistor). A control voltage smaller than the threshold voltage may reduce the flow of current through the source and drain terminals. For example, the flow of current may be reduced exponentially as the control voltage is reduced below the threshold voltage. Such mode of operation of the MOSFET transistors may be referred to as operating in a subthreshold region of operation.

For the purpose of illustration, the circuit 3500 is implemented using N-type MOSFET transistors. With respect to the first readout subcircuit 3510, the source terminal of the first MOSFET 3512 is coupled to the first readout terminal 3552. The drain terminal of the first MOSFET 3512 is coupled to the source terminal of the second MOSFET 3520, and this node of coupling may be referred to as a first output node 3515 of the first readout subcircuit 3510. A capacitor may be coupled to the first output node 3515, which may be similar to the capacitors 3112 and 3132 of FIGS. 31A and 31B. The drain terminal of the second MOSFET 3520 is coupled to a first supply node 3508. Analogously, with respect to the second readout subcircuit 3530, the source terminal of the third MOSFET 3532 is coupled to the second readout terminal 3554. The drain terminal of the third MOSFET 3532 is coupled to the source terminal of the fourth MOSFET 3540, and this node of coupling may be referred to as a second output node 3535 of the second readout subcircuit 3530. A capacitor may be coupled to the second output node 3535, which may be similar to the capacitors 3112 and 3132 of FIGS. 31A and 31B. The drain terminal of the fourth MOSFET 3540 is coupled to the first supply node 3508.

The first supply node 3508 supplies a first supply voltage to the first and the second readout subcircuits 3510 and 3530. A second supply node 3502 supplies a second supply voltage to the first and the second source follower circuits 3560 and 3570. One or more supply voltage sources may provide suitable first and second supply voltages to the first and second supply nodes 3508 and 3502, which may depend on various factors including specific process node, circuit design, characteristics of the switched photodetector 3550, reset voltage of the capacitor coupled to the first output node 3515, and charge-to-voltage conversion gain. The first supply node 3508 may be referred to as a VU node, and the first supply voltage of the VU node may be a user-defined voltage generated by, for example, an on-chip integrated circuit block. The second supply node 3502 may be referred to as a VE node, and the second supply voltage of the VE node may be an externally-defined voltage generated by, for example, an off-chip power supply.

During operation of the ToF pixel, the first output node 3515 and the second output node 3535 are charged to a preset voltage through the second and fourth MOSFETs 3520 and 3540. For example, by applying a second control voltage 3506 (Vc2) that causes the second and fourth MOSFETs 3520 and 3540 to operate in the saturation or triode region, current may flow from the first supply node 3508 to the respective output nodes 3515 and 3535 and charge the nodes to a preset voltage. A second control voltage source 3507 coupled to the gate terminals of the second and fourth transistor 3520 and 3540 can be used to apply the second control voltage 3506. The second control voltage 3506 may be controlled to vary the preset voltage to which the output nodes 3515 and 3535 are charged (e.g., set to the supply voltage or a fraction of the supply voltage). Once the charging of the output nodes 3515 and 3535 is complete, the second control voltage 3506 may be set (e.g., to 0 V) to turn off second and fourth MOSFETs 3520 and 3540, which decouples the output nodes 3515 and 3535 from the first supply node 3508. This charging operation may be referred to as a reset operation of the switched photodetector 3550, and the second and fourth MOSFETs 3520 and 3540 may be referred to as reset transistors. The reset operation may be a step within the readout step of the ToF pixel.

Once the charging is complete, integration of the electrical signal generated by the switched photodetector 3550 may begin. The first and third MOSFETs 3512 and 3532 may be controlled to initiate and terminate the integration by generating, through a first control voltage source 3505 coupled to the gate terminals of the MOSFETs 3512 and 3532, a first control voltage 3504 (Vc1) coupled to respective gate terminals. For example, the first control voltage 3504 may be set through the control voltage source 3505 to operate the first and third MOSFETs 3512 and 3532 in the triode regions. In the triode region operation, the photocurrent generated by the switched photodetector 3550 may flow through the drain and source terminals of the MOSFETs 3512 and 3532 and through the readout terminals 3552 and 3554. Such flow of the photocurrent through the readout terminals 3552 and 3554 may be integrated at the output nodes 3515 and 3535 by discharging the respective capacitances that have been charged to the preset voltage during the reset operation.

Operation of the first and third MOSFETs 3512 and 3532 in the triode region is analogous to coupling the output nodes 3515 and 3535 to respective readout terminals 3552 and 3554 through respective resistors ("effective resistors") put in place of the first and the third MOSFETs 3512 and 3532. The resistances of such effective resistors are typically of modest values (e.g., 10 ohms to 10,000 ohms) that do not present significant voltage drops in response to current flowing through the photodetector. For example, the photodetector current, which may be a combination of photocurrent and dark current, is typically a small current that ranges from pA to μA, and the resulting voltage drops across the resistors are relatively small as well (e.g., ranging from nV to mV). As such, the voltages of the readout terminals 3552 and 3554 are similar to the voltages of the output nodes 3515 and 3535 within a small voltage drop. As the voltages of the output nodes 3515 and 3535 have been charged to a preset voltage that may approach the first supply voltage of the first supply node 3508, the readout terminals 3552 and 3554 may experience similar voltages, resulting in a reverse bias across the junctions of the switched photodetector 3550 that may be larger than the minimum reverse bias needed for proper operation of the switched photodetector 3550. Such excessive reverse bias results in increased dark current, which may reduce the SNR of the output generated by the circuit 3500.

Photodetectors of various design and material composition may benefit from controlling of the reverse bias voltage.

Among materials for forming the absorption region of a photodetector, germanium maybe more susceptible to dark current generation relative to silicon due to a higher material defect density that is typically associated with germanium absorption region grown on silicon substrate. As such, germanium-based switched photodetector 3550 may be well suited to benefit from the controlling of the reverse bias voltage through the first control voltage 3504 and the resulting reduction in the dark current.

The reverse bias established across the junctions of the switched photodetector 3550 may be reduced by decoupling the readout terminals 3552 and 3554 from the respective output nodes 3515 and 3535 during the integration time. Such decoupling may be achieved by operating the first and third MOSFETs 3512 and 3532 in the saturation region or the subthreshold region. Operation in the saturation region or the subthreshold region allow the photocurrent generated by the switched photodetector 3550 to flow through the drain and source terminals of the MOSFETs 3512 and 3532 and through the readout terminals 3552 and 3554. However, due to the operating principles of the first and the third MOSFETs 3512 and 3532, the effective resistances, or the output impedances, of the first and the third MOSFETs 3512 and 3532 operating in saturation or subthreshold regions are significantly higher than output impedances of the first and the third MOSFETs 3512 and 3532 operating in the triode region. High output impedance decouples the output nodes 3515 and 3535 from the readout terminals 3552 and 3554, which allows the voltages of the readout terminals 3552 and 3554 to be different from (e.g., significantly lower than) the voltages of the output nodes 3515 and 3535. The voltages at the readout terminals 3552 and 3554 are determined at least in part by the first control voltage 3504 and the threshold voltages of the first and the third MOSFETs 3512 and 3532 operating in the saturation or subthreshold regions. The threshold voltages may be determined by the design and structural parameters of the MOSFETs such as channel doping concentration and gate oxide thickness, and may range, for example, from 0.1 V to 1V. Lowering the first control voltage 3504 reduces the voltages at the readout terminals 3552 and 3554, which reduces the reverse biases across the junctions of the switched photodetector 3550. As a result, the dark current of the switched photodetector 3550 may be reduced, and SNR of the output generated by the circuit 3500 may be improved.

The first and third MOSFETs 3512 and 3532 may be controlled to operate in the saturation region or the subthreshold region by controlling, through the first control voltage source 3505, the first control voltage 3504. For example, MOSFETs can be operated in the saturation region by setting the voltage difference between the gate terminal and the source terminal (VGS) to be greater than the threshold voltage (VTH) while maintaining the voltage difference between the drain terminal and the source terminal (VDS) to be greater than VGS-VTH. As another example, MOSFETs can be operated in the subthreshold region by setting the voltage difference between the gate terminal and the source terminal (VGS) to be smaller than the threshold voltage VTH. In general, the first control voltage 3504 may be varied to control the voltage difference between the output nodes 3515 and 3535 and the readout terminals 3552 and 3554. In some implementations, the first control voltage 3504 may be increased to reduce the voltage difference, and vice versa. In some implementations, the first control voltage 3504 may control the voltage difference between the output nodes 3515 and 3535 and the readout terminals 3552 and 3554 to be equal to or greater than 10%, 30%, or 50% of the first supply voltage of the first supply node 3508. In some implementations, the first control voltage 3504 may control the voltages of the readout terminals 3552 and 3554 to be at least 100 mV smaller than the voltages of the output nodes 3515 and 3535.

When the first and third MOSFETs 3512 and 3532 are operated in either the saturation region or the subthreshold region, the MOSFETs 3512 and 3532 may be operating as current buffers that decoupled the source voltage from the drain voltage.

After a preset integration time, the first control voltage 3504 may be set (e.g., to 0 V) to turn off the first and third MOSFETs 3512 and 3532, which stops the photocurrent from flowing through the respective MOSFETs 3512 and 3532, stopping the integration. The preset integration time may be a variable integration time as described in relation to FIG. 30. The initiation and termination of the integration may be referred to as shutter operation, and the first and third MOSFETs 3512 and 3532 may be referred to as shutter MOSFETs.

Once integration has been completed, the output nodes 3515 and 3535 hold output voltages that is inversely proportional to the photocurrent that flowed through the respective readout terminals 3552 and 3554 over the integration period. The output voltages may be buffered for further processing by the source follower circuits 3560 and 3570. For example, the buffered output voltages may be supplied to the amplifiers 3022 of FIG. 30. Additional operation details of the source follower circuits 3560 and 3570 will be described in relation to FIGS. 37A and 37B.

While an N-type implementation of the circuit 3500 have been described, in general, the circuit 3500 may be implemented as a P-type circuit. For example, the MOSFETs 3512, 3520, 3532, and 3540 may be P-type MOSFETs, the source follower circuits 3560 and 3570 may be P-type source followers, the body 3551 of the switched photodetector 3550 (e.g., the absorption region) may be N-doped, and the readout terminals 3552 and 3554 may be P-doped regions. In some implementations, the MOSFETs 3512, 3520, 3532, and 3540 may have different polarities. For example, for N-type readout terminals 3552 and 3554, the MOSFETs 3512 and 3532 may be N-type and MOSFETs 3520 and 3540 may be P-type. As another example, for P-type readout terminals 3552 and 3554, the MOSFETs 3512 and 3532 may be P-type and MOSFETs 3520 and 3540 may be N-type.

So far, various implementations of the switched photodetectors, ToF pixels, and receiver units have been described. Now, apparatuses for testing the performance of the switched photodetectors, ToF pixels, or receiver units will be described.

FIG. 36A shows a schematic side view of an example testing apparatus 3600. The testing apparatus 3600 includes a probe card 3610, an illuminator board 3620, and mechanical supports 3650. The probe card 3610 includes probe pins 3612 and an RF connector 3614. The illuminator board 3620 includes an illumination module 3622, a heat sink 3624, thermal vias 3626, driving electronics 3628, RF connectors 3614, bias connectors 3630, an optical mount 3632, and optical elements 3634. The illuminator board 3620 is mounted on the probe card 3610 through the mechanical supports 3650. The probe card 3610 may be a printed circuit board (PCB).

The probe card 3610 is an apparatus used in testing of electrical devices on a semiconductor substrate 3602. Typically, the semiconductor substrate 3602 contains hundreds to thousands of dies, each die being a device such as the receiver units described in relation to FIGS. 33A-33E. Due to manufacturing variations, some dies may be defective or may not meet the performance specification necessary to be sold as a product. As such, determining known good dies (KGD) by testing the dies on the substrate 3602 prior to singulation of the dies, and further processing only the known good dies may save manufacturing cost.

The probe card 3610 makes a temporary electrical connection to a die formed on the substrate 3602 through the probe pins 3612. The die being tested is referred to as a device under test (DUT) 3604. The probe pins 3612 are arranged to match the electrical contact points of the DUT 3604. By aligning the probe card 3610 to DUT 3604 and brining the DUT 3604 into contact with the probe pins 3612, multiple electrical connections ranging from tens to hundreds of connections can be simultaneously established. Various electrical signals including power, ground, biases, digital inputs/outputs, and analog inputs/outputs may be coupled onto and out from the DUT 3604 through the probe pins 3612. Once testing is done for the DUT 3604, the substrate 3602 is shifted to align and contact the next DUT 3604 for testing. Such operation may be automated using an automated wafer prober.

The probe pins 3612 may be formed from various metals based on factors such as contact resistance requirement, durability requirement, and material of the contact pads on the DUT 3604. Example materials for the probe pins 3612 include tungsten, tungsten alloys, palladium, platinum, and gold. The probe pins may be, for example, individually formed needles or micro electro-mechanical system-based (MEMS) array of contact elements.

Testing of optoelectronic devices such as switched photodetectors, ToF pixels, and receiver units may require optical signals to be provided as test inputs, which cannot be provided through the probe pins 3612. As such, the testing apparatus 3600 includes the illuminator board 3620 configured to generate optical test signals 3636 to facilitate testing. The optical test signal 3636 may be, for example, modulated optical signal suitable for ToF detection, such as the light pulses 2812 described in relation to FIGS. 28A-28C. As another example, the optical test signal 3636 may be an unmodulated light of known optical power. Such optical test signal 3636 may be used to determine the responsivity of the switched photodetectors or the overall light detection efficiency of the receiver units.

Modulated optical test signal 3636 may be generated by the illumination module 3622. The illumination module 3622 may be, for example, a specialized module for generation of the modulated optical test signal 3636. For example, the illumination module 3622 may be the transmitter unit 2802 described in relation to FIGS. 28A-28C. The illumination module 3622 may also be a general purpose optical signal generator, such as a laser diode or a LED and associated driving circuitries. The illumination module is mounted on a mounting area located on the front side of the illuminator board 3620 that faces the substrate 3602. The mounting area includes thermal vias 3626, which conduct the heat generated by the illumination module 3622 through the illuminator board 3620. For example, the thermal vias 3626 may be metal vias filled with metal or various thermally conductive fill materials. The heat generated by the illumination module 3622 is dissipated by the heat sink 3624 attached on the side of the illuminator board 3620 opposite to the illumination module 3622. Thermal interface material, such as thermal glue or thermal paste may be applied at the interface between the illuminator board 3620 and the heat sink 3624 to enhance the thermal conduction between the two.

The functional testing of the DUT 3604 may require the optical test signal 3636 to be modulated to have a specific waveform, be in synchronization with the operation of the DUT 3604, or both. For example, for testing of a ToF receiver unit such as the receiver unit 2804, the optical test signal 3636 should be light pulses that have a pulse duration determined by the receiver unit 2804 and are phase aligned with the operation of the readout circuits of the receiver unit 2804. Such optical test signal 3636 may be generated by providing to the illuminator board 3620 one or more control signals generated by the DUT 3604. For example, the control signal may be an analog or RF signal for modulating the light source of the illumination module 3622. The driving electronics 3628 may receive the control signal and condition (e.g., amplify, buffer) the control signal for driving of the illumination module 3622. As another example, the control signals may be a trigger signal that marks the timing for emitting the pulses and associated digital signals that define other characteristics of the pulse such as shape, duration, and amplitude.

The control signal generated by the DUT 3604 is first coupled to the probe card 3610 through the probe pins 3612. The control signal is then routed to an RF connector 3614 of the probe card 3610. A RF cable 3638 couples the RF connector 3614 of the probe card 3610 to a RF connector 3614 of the illuminator board 3620, coupling the control signal onto the illuminator board. The control signal is then provided to the illumination module 3622 through the illuminator board 3620.

The illumination module 3622 may require additional electrical inputs such as additional control signals, bias signals, and power inputs. Such additional electrical inputs may be provided through an electrical connector 3630.

The light output by the illumination module 3622 may be processed and/or filtered to generate the optical test signal 3636. For example, the optical elements 3634 may be mounted onto the optical mount 3632 to process the optical test signal 3636. Examples of the optical elements include polarization filters, wavelengths filters, attenuators, pupil lenses, and collimators, and apertures. Such optical elements made be mounted, removed, or swapped out from the optical mount to vary the optical test signal 3636.

FIG. 36B shows a schematic side view of an example testing apparatus 3660. The testing apparatus 3660 is similar to the testing apparatus 3600 of FIG. 36A, but differs in that the RF connectors 3614 are now coupled to each other with a rigid RF connection 3639, and the illuminator board 3620 is electrically coupled to the probe card 3610 through one or more electrical connection 3631. The replacement of the RF cable 3638 with the rigid RF connection 3639 may improve compactness of the testing apparatus 3660, which may be an important consideration when fitting the testing apparatus 3660 in a space-constrained production testing environment. Further, the rigid RF connection 3639 of FIG. 36B may provide improve phase stability of the control signal relative to the RF cable 3638 of FIG. 36A.

While the illuminator board 3620 and the probe card 3610 have been shown as separate elements in FIGS. 36A and 36B, in some implementations, the illuminator board 3620 may be directly integrated onto the probe card 3610 as a single unit. In some implementations, the illuminator board 3620 may be mounted on a structure other than the probe card 3610. For example, the illuminator board 3620 may be mounted onto a testing chamber or a wafer prober.

Testing performance characteristics of a time-of-flight receiver such as the receiver unit 2804 of FIG. 28A may include testing performance characteristics of individual pixels of the ToF receiver. Examples of performance parameters to be tested include dark current as well as quantum efficiency and demodulation contrast of the optical signal detected by the switched photodetectors.

Testing of such parameters at the individual pixel level may be done through dedicated external electrical access points such as test key structures with bonding or probing pads. However, such approach may increase size or complexity of the ToF receiver, negatively impact the performance of the ToF pixels, and/or increase production testing time and complexity. Alternatively, such testing may be performed through circuits integrated in the ToF receiver, such as ADCs. Use of circuits integrated in the ToF receiver may reduce or eliminate a need for additional bonding/probing pads for testing of the ToF receiver, reduce production testing complexity and time, and/or improve testing accuracy due to elimination of testing variability and noise involved in direct analog measurements of sensitive signals from the individual pixels.

Figure 37A:
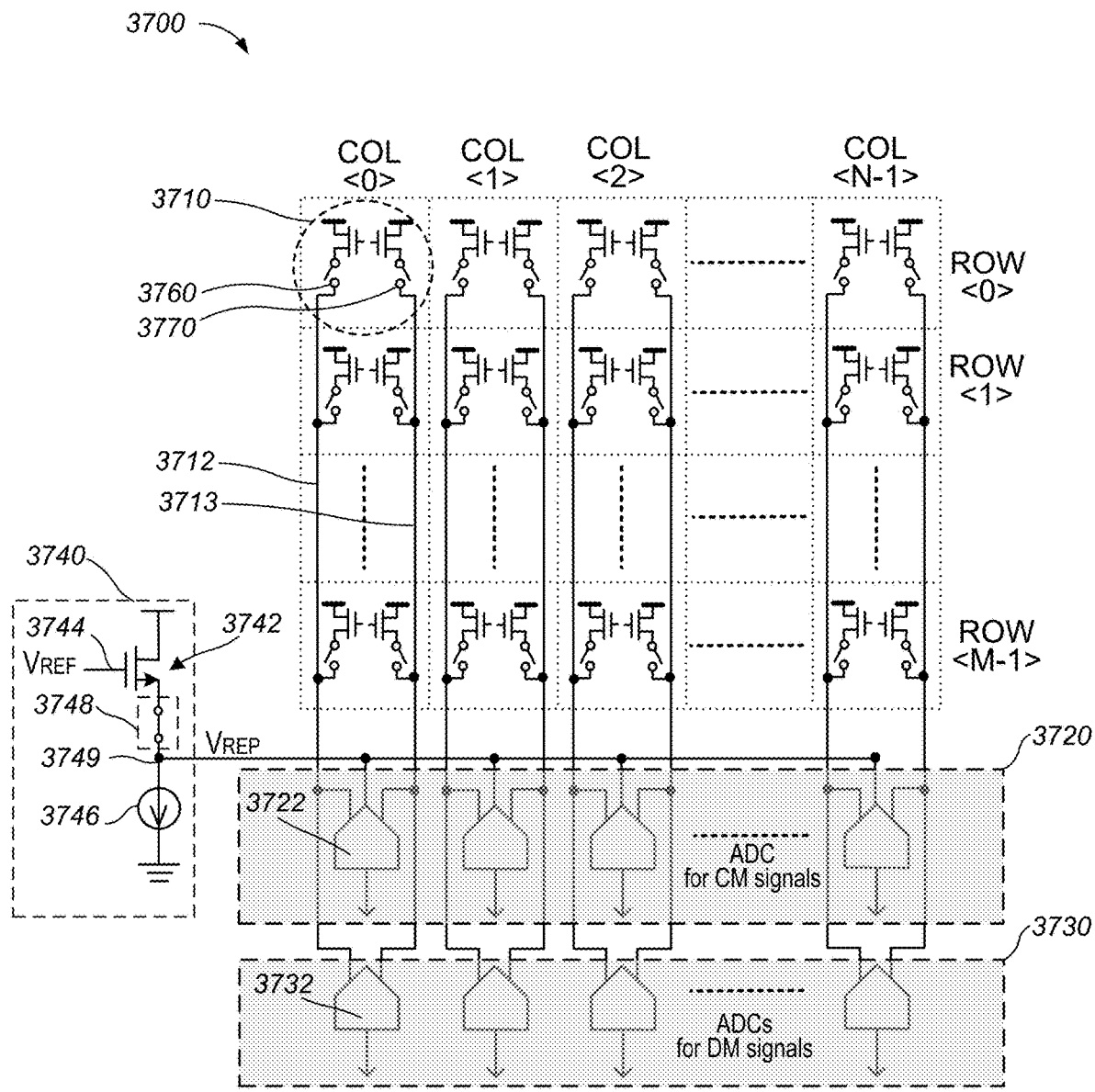
FIG. 37A shows a schematic diagram of a circuit for digitizing measurements from ToF pixels.

FIG. 37A shows a schematic diagram of a circuit 3700 for digitizing measurements from ToF pixels. The circuit 3700 includes an array of pixel circuits 3710, a row of common-mode ADCs 3720 having common-mode ADCs 3722, a row of differential-mode ADCs 3730 having differential-mode ADCs 3732, and a replica circuit 3740. The pixel circuits 3710 are arrayed as an M by N array with M rows and N columns. The pixel circuits 3710 each have first and second output terminals 3760 and 3770. The first and second output terminals 3760 and 3770 of the pixel circuits 3710 along each of the columns are electrically coupled to respective shared column buses 3712 and 3713. The shared column buses 3712 and 3713 are electrically coupled to corresponding common-mode ADCs 3722 and differential-mode ADCs 3732. The shared column buses are each coupled to corresponding current sources, which is omitted in the diagram for clarity. A replica output terminal 3749 of the replica circuit 3740 presents a replica voltage VREP and is electrically coupled to an input of the common-mode ADCs 3722.

Figure 37B:
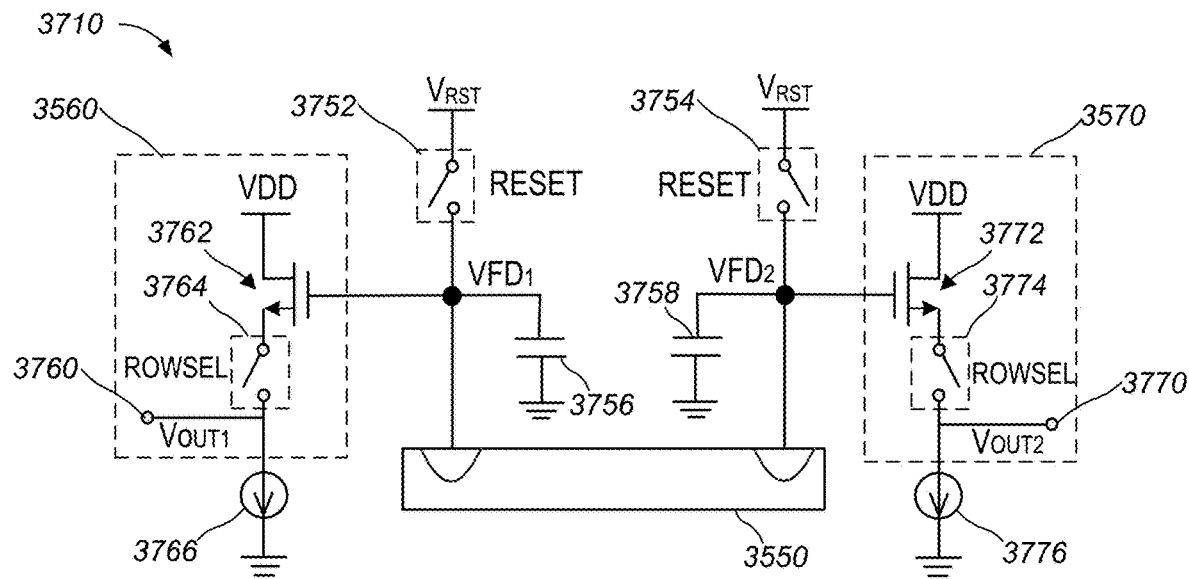
FIGS. 37B and 37C show schematic diagrams of examples of a pixel circuit.

FIG. 37B shows a schematic diagram of the pixel circuit 3710. The pixel circuit 3710 includes reset switches 3752 and 3754, capacitors 3756 and 3758, the switched photodetector 3550, and source follower circuits 3560 and 3570. The circuit 3710 may be similar to the circuit 3500 of FIG. 35, but differs in that the MOSFET transistors 3512 and 3532 have been omitted, and capacitors 3756 and 3758 have been added. The reset switches 3752 and 3754 may be implemented as the MOSFET transistors 3520 and 3540 of FIG. 35, and a RESET control signal configured to control the operation of the reset switches 3752 and 3754 may be implemented as the second control voltage 3506.

The first source follower circuit 3560 includes a first input MOSFET transistor 3762 and a first select switch 3764. A gate terminal of the first input MOSFET 3762 is coupled to the capacitor 3756. A source terminal of the first input MOSFET 3762 is coupled to the select switch 3764, which controls the electrical coupling of the first input MOSFET 3762 to the first output terminal 3760. The select switch 3764 may be implemented, for example, as a MOSFET transistor. A first current source 3766 is electrically coupled to the output terminal 3760, and may be shared among a column of pixel circuits 3710 through the shared column bus 3712.

The second source follower circuit 3570 includes a second input MOSFET transistor 3772 and a second select switch 3774. A gate terminal of the second input MOSFET 3772 is coupled to the capacitor 3758. A source terminal of the second input MOSFET 3772 is coupled to the select switch 3774, which controls the electrical coupling of the second input MOSFET 3772 to the second output terminal 3770. The select switch 3774 may be implemented, for example, as a MOSFET transistor. A second current source 3776 is electrically coupled to the output terminal 3770, and may be shared among a column of pixel circuits 3710 through the shared column bus 3713.

The capacitors 3756 and 3758 stores the signal generated by the switched photodetector 3550, and holds respective voltages VFD1 and VFD2. The source follower circuits 3560 and 3570 receive voltage inputs VFD1 and VFD2, and provide buffered signals that corresponds to VFD1 and VFD2 as VOUT1 at the first output terminal 3760 and as VOUT2 at the second output terminal 3770. For example, VOUT1 and VOUT2 may correspond to VFD1 and VFD2 minus a constant offset voltage, which may be determined based on various factors such as a threshold voltage and/or an overdrive voltage of MOSFETs of the source follower circuits, and a bias current generated by the current sources 3766 and 3776.

Figure 37C:
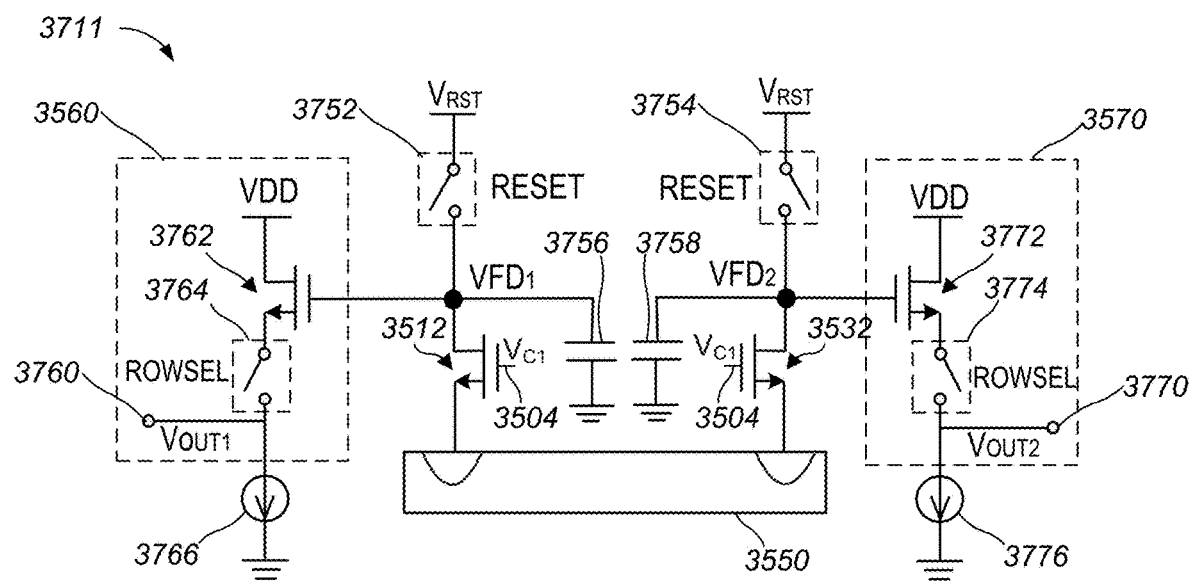

FIG. 37C shows a schematic diagram of a pixel circuit 3711. The pixel circuit 3711 is similar to the pixel circuit 3710, but differs in that the circuit 3711 further includes the first and third MOSFET transistors 3512 and 3532 of the circuit 3500 of FIG. 35. The operations of the pixel circuit 3711 is analogous to the operation of the pixel circuit 3710, and the operation of the circuit 3500 with respect to the first and third MOSFETs 3512 and 3532.

Now referring to both FIGS. 37A and 37B, the first and second output terminals 3760 and 3770 of each of the pixel circuits 3710 are coupled to the shared column buses 3712 and 3713, and the select switches 3764 and 3774 of each of the pixel circuits 3710 are controlled through a control signal (e.g., ROWSEL) configured to couple at least one pair of input transistors 3762 and 3772 to the shared column buses 3712 and 3713. For example, a ROWSEL control signal may turn on (i.e., close) the select switches 3764 and 3774 of the pixel circuits of a row ROW<0> while turning off (i.e., opening) the select switches 3764 and 3774 of the pixel circuit of other rows ROW<1> through ROW<M-1>. In turn, the column buses 3712 and 3713 of the circuit 3700 couple the output voltages Vout1 and Vout2 to the inputs of the common-mode ADCs 3722 and differential-mode ADCs 3732.

A time-of-flight measurement technique involves integrating ToF light signals (e.g., light pulses 2812) over an integration period. The voltages VFD1 and VFD2 of the capacitors 3756 and 3758 (e.g., floating-diffusion, MOM, MIM, or MOS capacitors) may change at different rates during the integration period. A difference VFD1-VFD2 between the two voltages, referred to as the differential-mode (DM) voltage, typically corresponds to a ToF signal to be processed for determination of the ToF information. A common-mode (CM) voltage, defined as k*(VFD1+VFD2) where k is a non-zero proportionality factor such as 0.5, may be used as an indicator of the capacity of the capacitors 3756 and 3758, such as the well capacity of floating diffusion capacitors.

A longer integration time typically results in a higher DM voltage, which may improve the depth accuracy from the ToF measurement. However, the longer integration time typically results in a lower CM voltage, as the capacitors 3756 and 3758 are discharged by the photocurrent for a longer period of time. When the CM voltage drops below a minimum operation voltage of the pixel circuits, the output signals of the pixel circuits may become corrupted. For example, CM voltage below a minimum operation voltage of a floating diffusion capacitor may lead to escaping of electrons from the floating diffusion well, which may lead to a phenomenon known as blooming. As such, care should be taken to prevent CM voltage from dropping below a specific voltage, which may be a design-dependent parameter based on, for example, the minimum operation voltage of the pixel circuit multiplied by a factor larger than one to provide an operating margin above the minimum voltage. One way of preventing the CM voltage from dropping below the specific voltage is to monitor the CM voltage using the common-mode ADCs 3722, and terminate the integration when the CM voltage reaches the specific voltage. The specific voltage may be set, for example, by a reference voltage VREF at a gate terminal 3744 of the replica circuit 3740.

Integration time may be dynamically adjusted based on the monitoring of the CM voltage. For example, if the CM voltage is determined through the common-mode ADCs 3722 to be higher than the reference voltage after a time period (e.g., nominal integration time), the integration time may be extended, which may improve depth accuracy of the resulting measurement. As another example, if the CM voltage is determined through the common-mode ADCs 3722 to be lower than the reference voltage within a time period (e.g., nominal integration time), the integration time may be shortened to prevent corruption of the measurement, such as blooming.

Contributors to the CM voltage include dark current of the switched photodetectors of the pixels and ambient photocurrent generated by the switched photodetectors from ambient light that are not the ToF light signals. Different pixels of the circuit 3700 may have different dark current or responsivity due to process variations. Further, different pixels may receive varying amount of ambient light. As such, different pixels may have different CM voltage throughout an integration period. Therefore, detecting the CM voltage for every pixel may be advantageous.

Figure 37D:
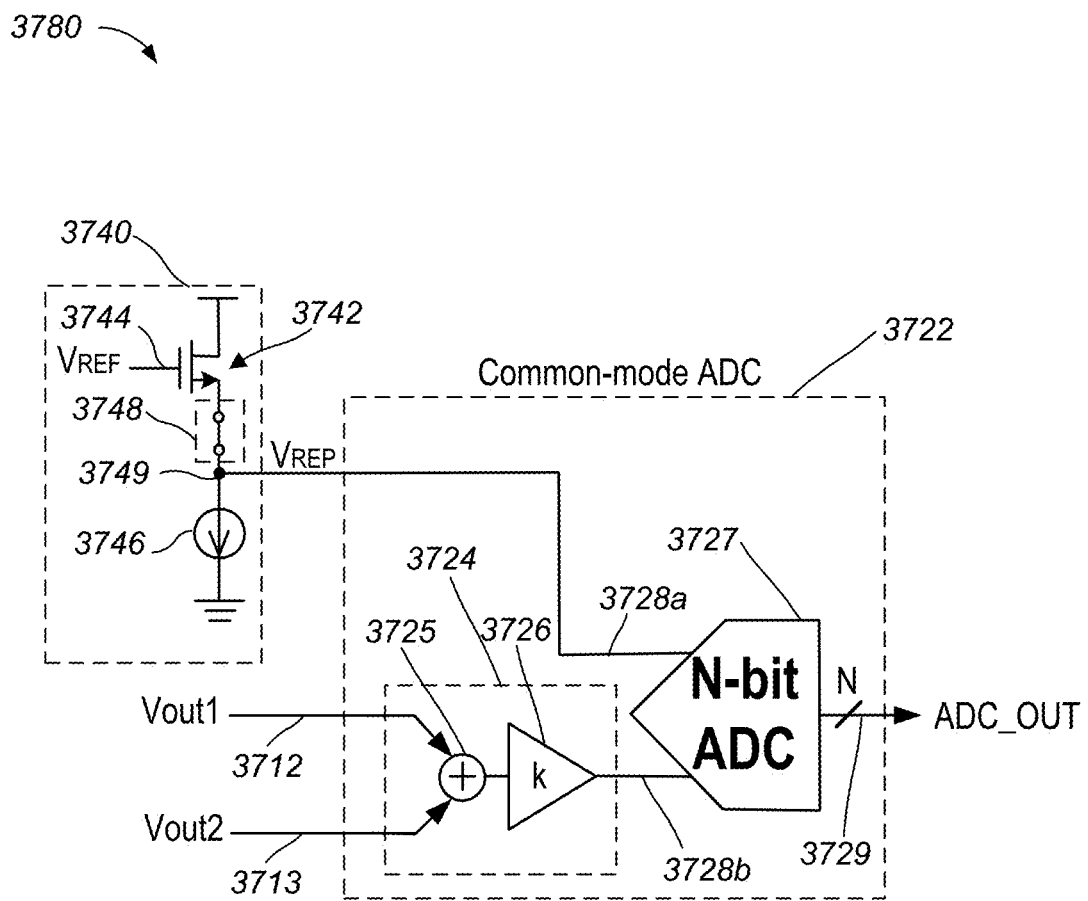
FIG. 37D shows a schematic diagram of an example common-mode detection circuit.

FIG. 37D shows a schematic diagram of a common-mode detection circuit 3780. The CM detection circuit includes the replica circuit 3740 and the common-mode ADC 3722. CM voltage detection for every pixel may be achieved, for example, by implementing an array of the common-mode ADCs 3722 as shown, for example, in FIG. 37A.

The common-mode ADC 3722 includes a common mode generator 3724 and an N-bit ADC 3727. The common mode generator 3724 includes a summing junction 3725 and a multiplier 3726. In some implementations, the multiplier 3726 may be a proportionality factor k of 0.5, and the combination of the summing junction 3725 and the multiplier 3726 may provide a transfer function of 0.5*(Vout1+Vout2). In this case, the multiplier 3726 is configured to generate an output voltage of amplitude that is 50% of the input signal. The multiplier 3726 may be implemented, for example, as an operational-amplifier multiplier or as a resistive voltage divider. Other implementations of the common mode generator 3724 are possible. For example, an operational-amplifier based averaging circuit may be used to generate an average of the two input voltages Vout1 and Vout2.

The N-bit ADC 3727 may be a differential analog-to-digital converter with N bits of conversion resolution. The ADC 3727 operates by generating a difference of the two inputs voltages present at its two input terminals 3728a and 3728b, and converting the difference voltage to one of 2N fractions of a full scale of the ADC 3727. In some implementations, the ADC 3727 may be a 1-bit ADC 3727. In such cases, digitalized output at output terminal 3729 of the ADC 3727 may be either a 1 or a 0, indicating which of the two inputs signals at the terminals 3728a and 3728b is larger. Such operation of a 1-bit ADC may be analogous to operation of a comparator. The complexity of the ADC 3727 generally depends on its resolution N, with lower N typically corresponding to lower circuit complexity, size, power consumption, or combination thereof. As such, use of a low-resolution ADC 3727 maybe beneficial to reduce overall complexity, size, power consumption, or combination thereof of the circuit 3700.

The replica circuit 3740 includes an input MOSFET transistor 3742, a current source 3746, and a switch 3748. The replica circuit 3740 is similar in operation to the source follower circuits 3560 and 3570 of FIG. 37B. The reference voltage VREF is provided to the gate terminal 3744 of the input MOSFET 3742, and an output voltage VREP that corresponds to the reference voltage VREF is generated at the replica output terminal 3749. The replica circuit is configured such that the transfer function between the VREF provided at the gate terminal 3744 and the VREP generated at the replica output terminal 3749 is identical or substantially similar (e.g., within 1%, 2%, 5%, 10%, or within process variation window) to the transfer function of the source follower circuits 3560 and 3570. Such a matched transfer function allows direct comparison of the voltages VFD1 and VFD2 present at the input terminals of the source follower circuits 3560 and 3570 with the reference voltage VREF, as any nonlinearity or voltage offsets in the outputs of the pixel circuits 3710 are equally present in the output of the replica circuit 3740. As such, the replica voltage VREP may be used as a proxy for comparing against, monitoring, and/or controlling the CM voltage present at the capacitors 3756 and 3758.

To enhance matching between the source follower circuits 3560 and 3570 and the replica circuit 3740, the input MOSFET 3742, the current source 3746, and the switch 3748 may be similar or identical in design to the MOSFETs 3762/3772, select switch 3764/3774, and the current source 3766/3776.

Figure 37E:
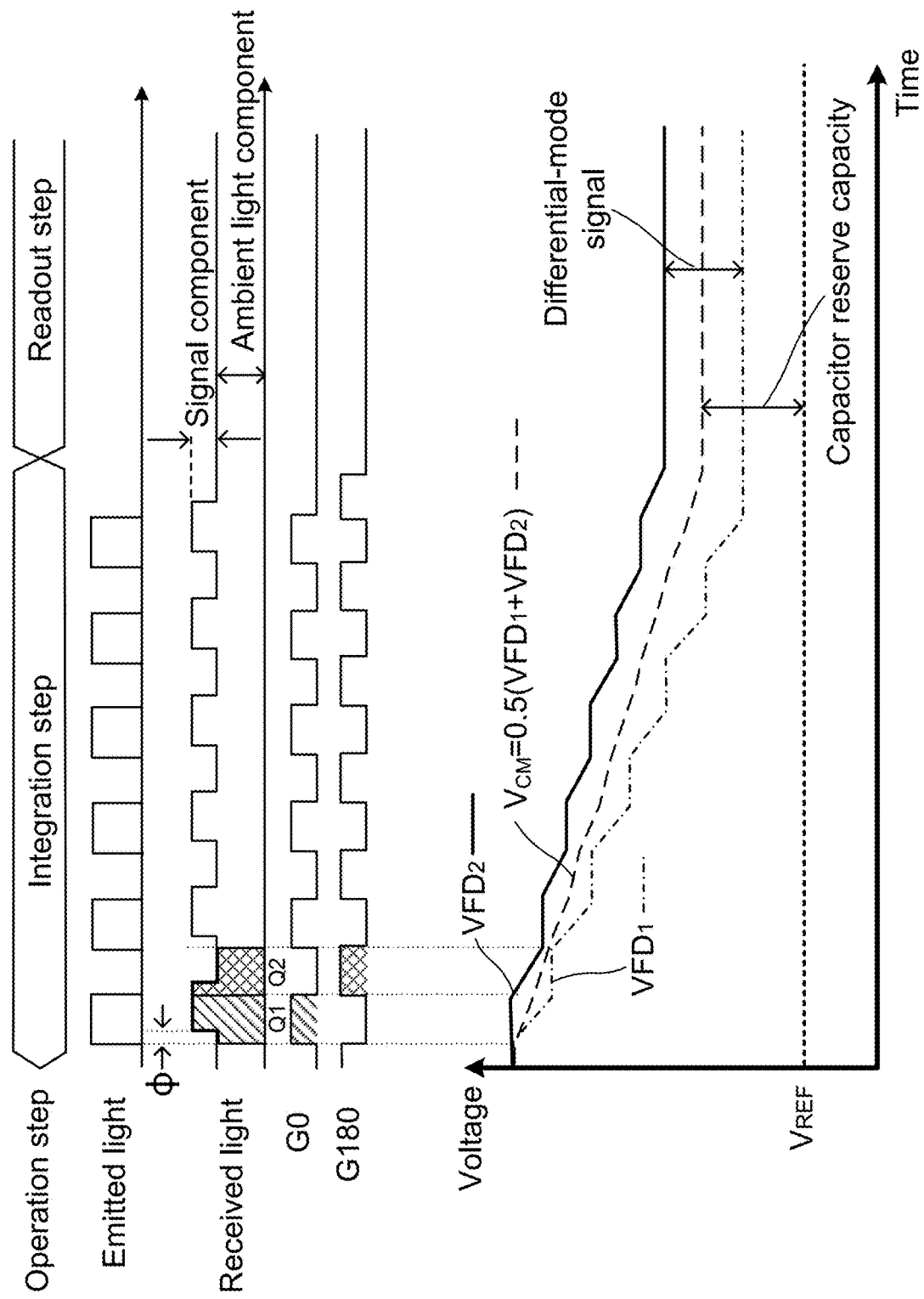
FIG. 37E shows an example timing diagram associated with operation of the circuit of FIG. 37A.

FIG. 37E shows an example timing diagram associated with operation of the circuit 3700. The circuit 3700 may have two operation steps—integration step, and readout step. The operation of the circuit 3700 may be controlled, for example, by the receiver unit 2804 or the processing unit 2806 of the imaging system 2800. In the integrations step, a ToF transmitter unit, such as the transmitter unit 2802 of FIG. 28A, may emit light pulses. The pixel circuit 3710 may receive light that includes both ambient light and a reflection of the emitted light pulses. The reflected pulses have a phase shift of Φ corresponding to the round-trip phase. In general, the relative proportion of the ambient light and the reflected light pulses may depend on various factors such as reflectivity of the object being measured, distance from the object, brightness of the measurement environment, and spectral characteristics of the ambient light.

The pixel circuit 3710 and the switched photodetector 3550 of the pixel circuit 3710 are controlled using a first control signal G0 and a second control signal G180 such that the capacitor 3756 collects charges Q1 in a phase synchronized manner with the emitted light pulses, and the capacitor 3758 collects charges Q2 in an out-of-phase manner (e.g., with a 180 degree phase offset) with respect to the emitted light pulses. For example, the control terminals 3154 and 3164 of the ToF pixel 3140 of FIGS. 31A-31I may be used to control the collection of the charges Q1 and Q2 through application of the control signals G0 and G180.

At the beginning of the integration step, the capacitors 3756 and 3758 are charged to a preset voltage. At this time, VFD1 corresponding to the voltage of the first capacitor 3756 and VFD2 corresponding to the voltage of the second capacitor 3758 are the same, and the common-mode voltage is equal to VFD1 or VFD2. When the first pulse of emitting light is reflected and received by the switched photodetector 3550, charges Q1 corresponding to the portion of the reflected light that falls within the first phase window marked by the first control signal G0 (e.g., 0 to 180 degrees) are integrated by the first capacitor 3756. As a result, VFD1 decreases while G0 is high as Q1 is discharged from the first capacitor 3756, and VFD2 remains approximately unchanged throughout the first phase window, as the charges are mostly being directed to the first capacitor 3756.

Then, the control signal G0 becomes low and the control signal G180 becomes high, during which charges Q2 corresponding to the portion of the reflected light that falls within the second phase window marked by the second control signal G180 (e.g., 180 to 360 degrees) are integrated by the second capacitor 3758. As a result, VFD2 decreases while G180 is high as Q2 is discharged from the second capacitor 3758, and VFD1 remains approximately unchanged throughout the second phase window, as the charges are mostly being directed to the second capacitor 3758.

The discharging of the first and second capacitors 3756 and 3758 continues over the integration step, resulting in a common-mode voltage and a differential-mode voltage at the end of the integration period. The common-mode voltage includes contributions from the dark current and the photo-generated current that includes the signal component and the ambient light component. As such, the common-mode voltage is generally proportional or corresponds to a magnitude of the current generated by the switched photodetector 3550 over the integration period. It is noted that the ambient light component and the dark current are typically substantially constant over the integration step, which may be 100s of μs to milliseconds in duration. As such, the ambient light component and the dark current are typically integrated in equal amounts in both the first and second capacitors 3756 and 3758, and contributes to the common-mode voltage but not the differential-mode voltage.

Once the integration step is completed, the circuit 3700 enters the readout step, during which the rows of the pixel circuits 3710 are sequentially read out and digitized by the rows of common-mode ADCs 3720 and differential-mode ADCs 3730. The output of the common-mode ADCs 3722 corresponds to VCM, which may be used, among others, as an indicator of the reserve capacity of the capacitors 3756 and 3758, dark current of the photodetector, and ambient light level. The output of the differential-mode ADCs 3732 corresponds to the differential-mode signal, which may contain time-of flight information that can be used to determine a distance of an object from the ToF imaging system.

One of the advantages of the circuit 3700 in including separate rows of common-mode and differential-mode ADCs 3720 and 3730 is that the common-mode voltage and the differential-mode voltage may be measured concurrently without incurring delays due to the dedicated ADCs for respective purposes. In contrast, additional delays are expected in a serial measurement approach, which may involve digitization of one of the outputs of the pixel circuit 3710 (e.g., Vout1) followed by digitization of the other output (e.g., Vout2), and calculating the common-mode voltage in the digital domain. As such, the concurrent measurement capability of the circuit 3700 may have a higher frame rate than a comparable circuit implementing a serial measurement approach.

The resolution of the common-mode ADCs 3722 can be tailored to the specific requirements for common-mode voltage monitoring, which are generally lower than the resolution needed for the differential-mode ADCs. As such, complexity and size of the common-mode ADCs 3722 may be optimized for a given application. For example, common-mode monitoring during the integration step may be implemented to dynamically control the integration period. Such monitoring may require multiple common-mode voltage measurements within the integration period. Fast ADC conversion rate needed for such an application may be achieved by implementing a low bit (e.g., ranging from 1 to 6 bits) common-mode ADCs 3722.

The common-mode and differential-mode voltage measurement capability of the circuit 3700 may be used during the production testing of the circuit 3700. During a typical image sensor production testing, performance of each pixel is verified. This production testing may be used to screen out bad pixels with performance parameters that fall outside the specification. Such production testing data can be analyzed to determine a statistical trend, which may be used to adjust the production process to improve yield.

Figure 37F:
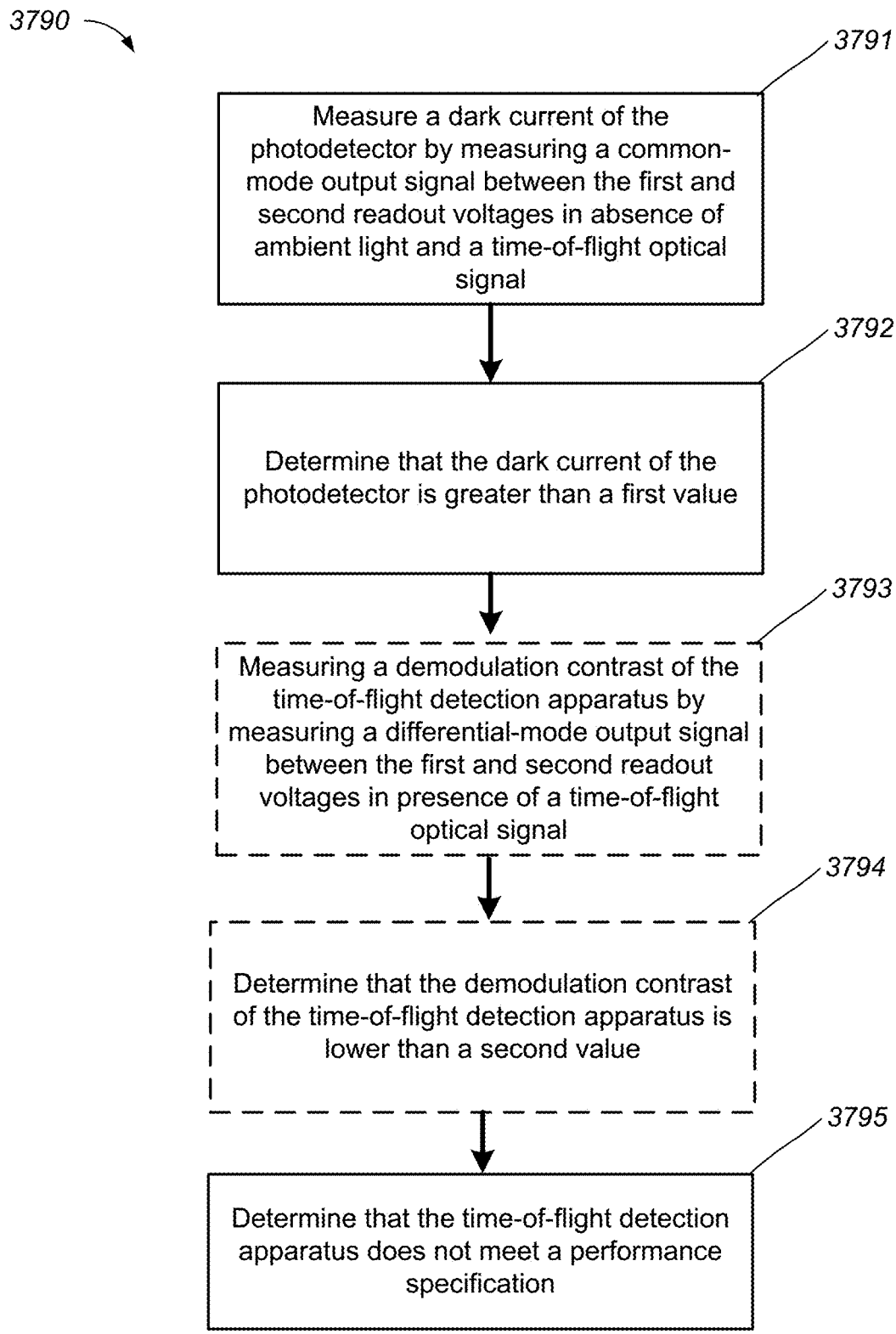
FIG. 37F shows an example of a flow diagram for characterizing performance of a ToF detection apparatus.

FIG. 37F shows an example of a flow diagram 3790 for characterizing performance of a time-of-flight detection apparatus including a photodetector having a first readout terminal coupled with a first readout circuit and configured to output a first readout voltage, and a second readout terminal coupled with a second readout circuit and configured to output a second readout voltage. The process 3790 may be performed by a system such as the testing apparatuses 3600 and 3660.

The system measures a dark current of the photodetector by measuring a common-mode output signal between the first and second readout voltages in absence of ambient light and a time-of-flight optical signal (3791). One of the key performance parameter of the pixels of an image sensor, such as the ToF detection apparatus, is the dark current. The dark current may be indirectly measured by the system using the common-mode ADCs 3722. The common-mode voltage may be primarily generated from ambient photocurrent and pixel dark current. As such, performing a CM voltage measurement in absence of light, such as ambient light and ToF optical signal (e.g., light pulses), results in a CM voltage that corresponds to the dark current of the pixel. A post-processing of the N-bit output of the common-mode ADC 3722 based on known design factors of the circuit 3700 (e.g., parasitic capacitances) and operating parameters (e.g., integration time period, reference voltage, and replica voltage) can be performed to determine (e.g., infer, back calculate) the dark current of the pixel.

In some implementations, the value of the dark current may be determined to a desired accuracy using a low-resolution common-mode ADC 3722, such as a 1-bit common-mode ADC 3722. For example, the step 3791 may include the step of (i) performing, through a 1-bit ADC, one or more measurements of the common-mode output signal between the first and second readout voltages in absence of ambient light and the time-of-flight optical signal, and (ii) determining the dark current based on the one or more measurements of the common-mode output signal. The measurements of the dark current may be performed under different test conditions. For example, each of the one or more measurements may correspond to different integration times.

For a given dark current, longer integration times will lead to further discharging of the capacitors 3756 and 3758 and a lower common-mode voltage. The 1-bit common-mode ADC 3722 compares the common-mode voltage VCM with the reference voltage VREF input to the replica circuit 3740. For example, the output of the common-mode ADC 3722 may be 1 when the CM voltage is higher than the replica voltage. In the case where the integration times are progressively increased, the ADC outputs for dark current measurements at different integration times may initially be 1s. When the output of the common-mode ADC 3722 changes from 1 to 0 indicating that the CM voltage is lower than the replica voltage, the system may determine the integration time corresponding to the transition from 1 to 0, and use that integration time period to determine the dark current. For example, when the output was a 1 for an integration time of 90 μs but a 0 for the next integration time of 100 μs, the system may use the mid-point 95 μs between the integration time periods as the switching point.

The system may determine an estimate of the dark current based on known design factors of the circuit 3700 (e.g., capacitance of the capacitors 3756 and 3758) and operating parameters (e.g., preset voltage of the capacitors, reference voltage, and replica voltage). For example, the dark current may be estimated by the equation Idark=C*ΔV/tint, where C is the total capacitance of the capacitors 3756 and 3758, ΔV is the difference between the preset voltage of the capacitors and the reference voltage, and tint is the integration time period when output of the common-mode ADC 3722 switched from 1 to 0. The accuracy of the dark current measurement through a 1-bit ADC can be further improved by performing additional measurements with multiple integration times to narrow down and find an improved estimate of the integration time in which the output of the ADC has switched from 1 to 0.

In general, the integration times for the multiple measurements of dark current through the 1-bit ADC may be varied in different ways. For example, successive approximation technique may be used.

While dark current measurement based on variable integration time has been described, in some implementations, the replica voltage provided to the common-mode ADC 3722 may be varied in place of the integration time period for analogous operation.

In some implementations, ambient photocurrent can be determined through the CM voltage measurement by performing the CM voltage measurement in presence of ambient light. The dark current component of the CM voltage may be subtracted from the measured CM voltage to determine the ambient photocurrent from the CM voltage.

The system determines that the dark current of the photodetector is greater than a first value (3792). For example, the first value may be a maximum allowed dark current specification for the pixels of the image sensor.

In some implementations, the system measures a demodulation contrast of the time-of-flight detection apparatus by measuring a differential-mode output signal between the first and second readout voltages in presence of a time-of-flight optical signal (3793). The demodulation contrast represents how efficiently a switched photodetector, for example, shown in FIG. 1A, to guide the generated photocurrent toward the n-doped region 126 when the switch 108 is on and the switch 110 is off, or toward the n-doped region 136 when the switch 110 is on and the switch 108 is off. The differential-mode output signal is generally proportional to demodulation contrast, quantum efficiency, time-of-flight optical signal power, and integration time. As such, multiple measurements under different testing conditions such as different optical signal powers can be performed to determine the demodulation contrast. Different optical signal powers may be provided, for example, through adjusting duty cycles or extinction ratios. A post-processing of the output of the differential-mode ADC 3732 based on known design factors of the circuit 3700 (e.g., parasitic capacitances) and operating parameters (e.g., integration time period, laser power) can be performed to determine the demodulation contrast of the pixel.

In some implementations, the system determines that the demodulation contrast of the time-of-flight detection apparatus is lower than a second value (3794). For example, the second value may be a minimum allowed demodulation contrast specification for the pixels of the image sensor.

The system determines that the time-of-flight detection apparatus does not meet a performance specification (3795). For example, the determination may be based on the determination of step 3792 that the dark current of the photodetector is greater than the first value. As another example, the determination may be based on the determination of step 3794 that the demodulation contrast of the time-of-flight detection apparatus is lower than a second value. In general, when a measured performance parameter of the ToF detection apparatus does not meet one or more of the performance specifications, the apparatus is determined to not meet the performance specification and to have failed the production testing.

So far, various aspects of the components associated with and testing of the receiver unit 2804 of the imaging system 2800 of FIG. 28A have been described. Now, a driving circuitry associated with the transmitter unit 2802 of FIG. 28A will be described.

Referring back to FIGS. 28B and 28C, the transmitter unit 2802 may emit light pulses 2812 modulated at the frequency fm with a preset duty cycle. An increase of the frequency fm, a reduction of the duty cycle, or a combination thereof may improve the performance of the imaging system 2800. Such increase in fm or reduction in the duty cycle can be achieved by improving the bandwidth of the transmitter unit 2802.

Figure 38A:
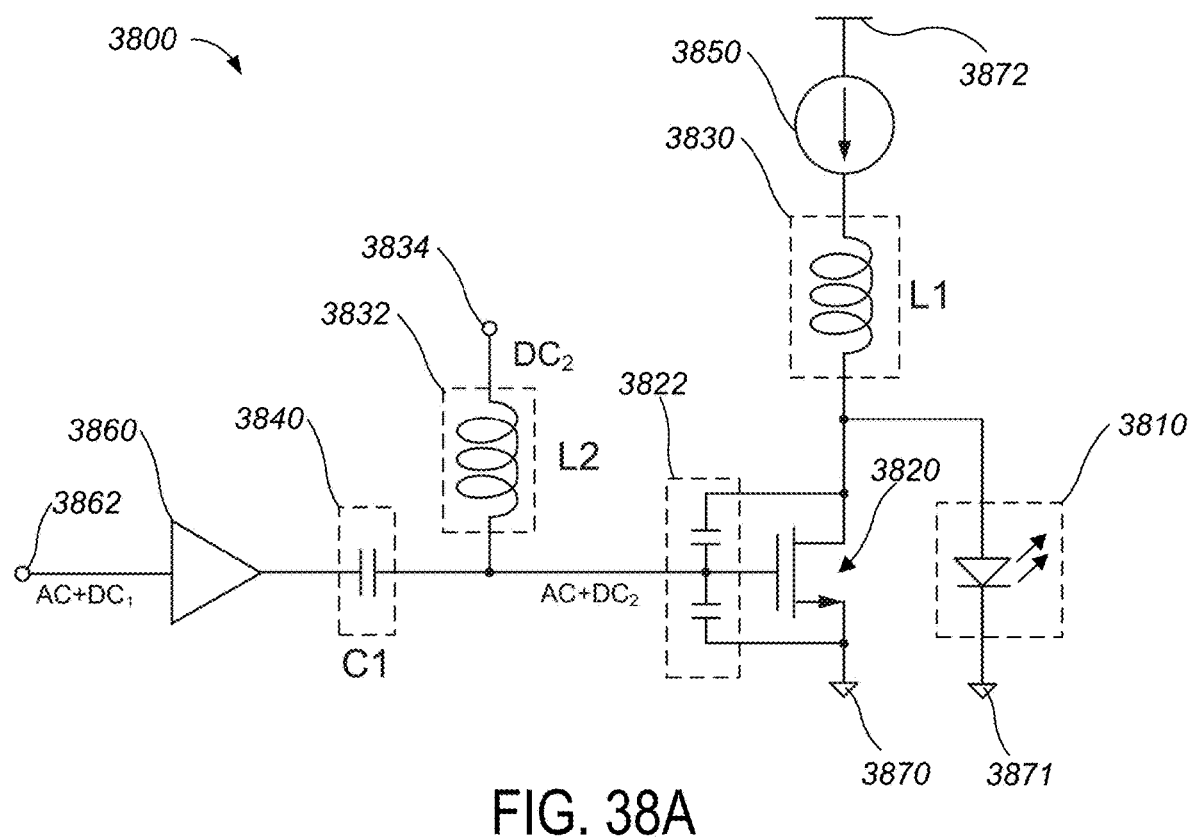
FIGS. 38A and 38B show schematic diagrams of circuits for operating a light emitting device.

FIG. 38A shows a schematic diagram of a circuit 3800 for operating a light emitting device. The circuit 3800 includes a light emitting device 3810, a MOSFET transistor 3820, a first inductor 3830, a second inductor 3832, a first capacitor 3840, a current source 3850, and an input buffer 3860. An input signal applied to an input node 3862 of the input buffer 3860. An output terminal of the input buffer 3860 is coupled to a first terminal of the first capacitor 3840. A second terminal of the first capacitor 3840 is coupled to a first terminal of the second inductor 3832 and a gate terminal of the MOSFET 3820. A second terminal of the second inductor 3832 is supplied with a DC bias voltage 3834. A source terminal of the MOSFET 3820 is coupled to a first supply voltage node 3870, and a first terminal (e.g., a cathode) of the light emitting device 3810 is coupled to a second supply voltage node 3871. The first and second supply voltage nodes 3870 and 3871 may be a common ground node. A drain terminal of the MOSFET 3820 and a second terminal (e.g., an anode) of the light emitting device 3810 are coupled to a first terminal of the first inductor 3830. The current source 3850 is coupled to a supply voltage node 3872 and a second terminal of the first inductor 3830.

The basic principle of operation of the circuit 3800 is as follows. The input signal applied to the input node 3862 of the input buffer 3860 is buffered by the input buffer 3860 and output to the first capacitor 3840. The input signal at the input node 3862 is typically a time-varying signal, and may have a DC component DC1 in addition to an AC component. The input buffer 3860 may independently contribute a DC component to the buffered input signal. As a result, the output of the input buffer 3860 may contain both a DC component and an AC component. The first capacitor couples the buffered input signal by blocking a low frequency component of the buffered input signal. As such, the first capacitor 3840 may be referred to as a DC-blocking capacitor or an AC-coupling capacitor. A first capacitance of the first capacitor 3840 may be set based on, for example, a desired low frequency cutoff. As a result of the AC-coupling, the signal present at the second terminal of the first capacitor 3840 does not have the DC1 component.

Typically, the gate terminal of the MOSFET 3820 needs to be biased to a correct DC bias voltage for proper operation. The DC bias of the MOSFET 3820 may affect the duty cycle of the light generated by the light emitting device 3810. As such, setting of the DC bias can be used to modify the duty cycle or correct for duty cycle distortion that deviates from a desired duty cycle (e.g., 50%). Such DC bias is set through the second inductor 3832. The second inductor 3832 presents a low impedance path for a DC bias voltage 3834 (DC2) coupled to its second terminal while simultaneously presenting a high impedance path for the AC component. A second inductance of the second inductor 3832 may be set based on, for example, the frequency of the AC component of the input signal received at the input node 3862. The first capacitor 1540 and the second inductor 3832 may be referred to as a bias-T. Due to the operations of the first capacitor 3840 and the second inductor 3832, a signal containing the AC component of the input signal supplied to the input node of the input buffer 3860 and the DC component DC2 supplied to the second terminal of the second inductor 3852 is input to the gate terminal of the MOSFET 3820. The input signal to the gate terminal operates to turn on or turn off the MOSFET 3820. For example, when the gate terminal input signal is above the threshold voltage of the MOSFET 3820, the MOSFET 3820 is turned on, and vice versa.

The MOSFET 3820 is coupled to the first terminal of the first inductor 3830 in parallel with the light emitting device 3810. As such, a current provided by the current source 3850 and flowing through the first inductor 3830 may flow through the MOSFET 3820, the light emitting device 3810, or combination thereof based on the electrical impedances of the two elements. For example, the MOSFET 3820 in an ON-state may present a significantly lower impedance than the light emitting device 3810. As such, a large portion of the current flows through the MOSFET 3820 when the MOSFET 3820 is in its ON-state. Conversely, the MOSFET 3820 in an OFF-state may present a significantly higher impedance than the light emitting device 3810. As such, a large portion of the current flows through the light emitting device 3810 when the MOSFET 3820 is in its OFF-state. Such switching of the flow of the current may be referred to as shunt switching. Based on the characteristics of the MOSFET 3820 and the light emitting device 3810, the relative impedances between the two components may approximate the asymptotic case where the majority of the current (e.g., 90%, 99%, 99.9%) flows through either the MOSFET 3820 or the light emitting device 3810.

When the MOSFET 3820 is being switched on or off, effective impedance of the electrical load as experienced by the current source 3850 changes rapidly, which may have a destabilizing effect on the constant current operation of the current source 3850. The first inductor 3830 may limit the temporal rate of change of the current flowing through, thereby operating as a stabilizing element that helps maintain the current at a constant level through such switching transients.

The light emitting device 3810 may be a light emitting diode, a laser diode, an array of light emitting diodes, or an array of laser diodes. In general, the light output by the light emitting device 3810, such as a laser diode, increases in proportion with an increase in the current supplied to the device. As such, the size or area of the MOSFET 3820 may be increased for higher current handling capacity to allow switching of higher amount of current. However, an increase in the size of area of the MOSFET 3820 increases a parasitic capacitance 3822 associated with the MOSFET 3820. For example, the parasitic capacitance 3822 may include a parasitic capacitor between the gate terminal and the source terminal (CGS) and a parasitic capacitor between the gate terminal and the drain terminal (CGD). Such parasitic capacitance 3822 increases a capacitive loading of the MOSFET 3820, reducing the operational bandwidth (e.g., switching speed) of the MOSFET 3820.

The second inductor 3832, in addition to providing a path for setting the DC bias of the MOSFET 3820, may form an LC tank in combination with the parasitic capacitances 3822. The second inductance of the second inductor 3832 may be set such that a resonance frequency of the LC tank matches the desired operational frequency of the circuit 3800. For example, the resonance frequency of the LC tank may be set to the fundamental frequency of the input signal (e.g., the frequency fm). The resonance of the LC tank may partially or completely cancel the effects of the parasitic capacitance 3822, increasing the operational bandwidth of the MOSFET 3820 and thereby the operation bandwidth of the circuit 3800. For example, the operation bandwidth of the circuit 3800 may range from 100 MHz to 1 GHz.

While an implementation of the circuit 3800 including the current source 3850 has been described, in some implementations, the current source 3850 may be omitted such that the supply voltage node 3872 supplies the current to the light emitting device 3810.

Figure 38B:
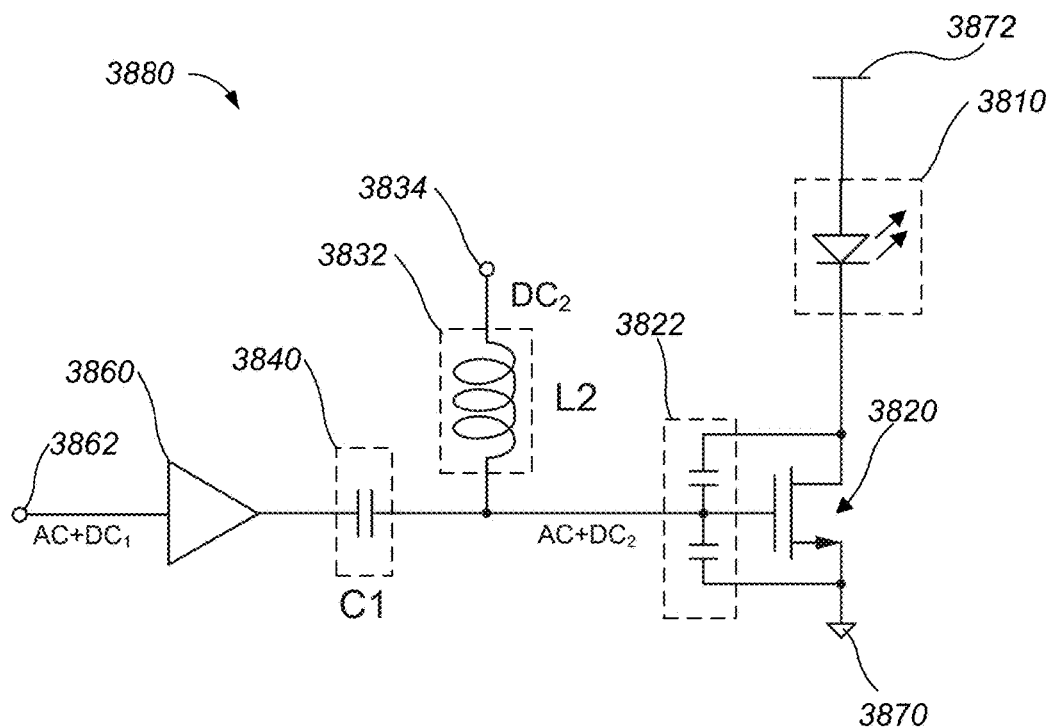

FIG. 38B shows a schematic diagram of a circuit 3880 for operating the light emitting device 3810. The circuit 3880 is similar to the circuit 3800, but differs in that the light emitting device 3810 is now connected in series with the MOSFET 3820, and the current source 3850 and the first inductor 3830 have been omitted. The drain terminal of the MOSFET 3820 is coupled to the first terminal (e.g., a cathode) of the light emitting device 3810, and the second terminal (e.g., an anode) of the light emitting device 3810 is coupled with the supply voltage node 3872. The circuit 3880 controls the operation of the light emitting device 3810 by series-switching of the current flowing through the light emitting device 3810.

When the MOSFET 3820 is in the ON-state, a current is allowed to flow through a conduction path from the supply voltage node 3872 (e.g., VDD) to the supply voltage node 3870 (e.g., GND) through the light emitting device 3810 and the MOSFET 3820. Conversely, the MOSFET 3820 in the OFF-state blocks current from flowing through itself, thereby cutting off the flow of current through the light emitting device 3810. The series-switching configuration of circuit 3880 may be advantageous as it includes less electrical components relative to the shunt-switching configuration of circuit 3800.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. A circuit, comprising:
a photodetector comprising a first readout terminal and a second readout terminal different than the first readout terminal;
a first readout subcircuit comprising a first MOSFET transistor and a second MOSFET transistor, the first MOSFET transistor comprising a first gate terminal coupled with a first control voltage source, a first channel terminal, and a second channel terminal coupled with the first readout terminal of the photodetector, and the second MOSFET transistor comprising a second gate terminal coupled with a second control voltage source, a third channel terminal coupled with a supply voltage node, and a fourth channel terminal coupled with the first channel terminal; and
a second readout subcircuit comprising a third MOSFET transistor and a fourth MOSFET transistor, the third MOSFET transistor comprising a third gate terminal coupled with the first control voltage source, a fifth channel terminal, and a sixth channel terminal coupled with the second readout terminal of the photodetector, and the fourth MOSFET transistor comprising a fourth gate terminal coupled with the second control voltage source, a seventh channel terminal coupled with the supply voltage node, and an eighth channel terminal coupled with the fifth channel terminal.

2. The circuit of claim 1, wherein:
the first readout terminal is a first n-doped region;
the second readout terminal is a second n-doped region;
the first MOSFET transistor is a first n-type MOSFET transistor; and
the third MOSFET transistor is a second n-type MOSFET transistor.

3. The circuit of claim 2, wherein:
the first n-doped region is partially or fully surrounded by a first p-well; and
the second n-doped region is partially or fully surrounded by a second p-well.

4. The circuit of claim 1, wherein:
the first readout terminal is a first p-doped region;
the second readout terminal is a second p-doped region;
the first MOSFET transistor is a first p-type MOSFET transistor; and
the third MOSFET transistor is a second p-type MOSFET transistor.

5. The circuit of claim 4, wherein:
the first p-doped region is partially or fully surrounded by a first n-well; and
the second p-doped region is partially or fully surrounded by a second n-well.

6. The circuit of claim 1, wherein:
the first MOSFET is configured to generate a first voltage difference between the first channel terminal and the second channel terminal; and
the third MOSFET is configured to generate a second voltage difference between the fifth channel terminal and the sixth channel terminal.

7. The circuit of claim 1, wherein:
the second MOSFET and the fourth MOSFET are configured to generate a first preset voltage on the fourth channel terminal and a second preset voltage on the eighth channel terminal respectively.

8. The circuit of claim 1, further comprising:
a first source follower, coupled to the first channel terminal, configured to generate a first readout voltage; and
a second source follower, coupled to the second channel terminal, configured to generate a second readout voltage.

9. The circuit of claim 8, further comprising:
a common-mode analog-to-digital converter, coupled to the first source follower and the second source follower, configured to generate a first digital output signal according to the first readout voltage and the second readout voltage.

10. The circuit of claim 8, further comprising:
a differential-mode analog-to-digital converter, coupled to the first source follower and the second source follower, configured to generate a second digital output signal according to the first readout voltage and the second readout voltage.

11. A circuit, comprising:
a photodetector comprising a first readout terminal and a second readout terminal different than the first readout terminal; and
a first readout subcircuit comprising a first MOSFET transistor and a second MOSFET transistor, the first MOSFET transistor comprising a first gate terminal coupled with a first control voltage source, a first channel terminal, and a second channel terminal coupled with the first readout terminal of the photodetector, and the second MOSFET transistor comprising a second gate terminal coupled with a second control voltage source, a third channel terminal coupled with a supply voltage node, and a fourth channel terminal coupled with the first channel terminal.

12. The circuit of claim 11, wherein:
the first readout terminal is a first n-doped region; and
the first MOSFET transistor is a first n-type MOSFET transistor.

13. The circuit of claim 12, wherein:
the first n-doped region is partially or fully surrounded by a first p-well.

14. The circuit of claim 11, wherein:
the first readout terminal is a first p-doped region; and
the first MOSFET transistor is a first p-type MOSFET transistor.

15. The circuit of claim 14, wherein:
the first p-doped region is partially or fully surrounded by a first n-well.

16. The circuit of claim 11, wherein:
during operation of the circuit, the first control voltage source generates a first control voltage configured to create a first voltage difference between a supply voltage of the supply voltage node and a first voltage of the first readout terminal.

17. The circuit of claim 11, wherein:
the first MOSFET is configured to generate a first voltage difference between the first channel terminal and the second channel terminal.

18. The circuit of claim 11, wherein:
the second MOSFET is configured to generate a first preset voltage on the fourth channel terminal.

19. The circuit of claim 11, further comprising:
a first source follower, coupled to the first channel terminal, configured to generate a first readout voltage.

* * * * *